United States Patent
Fiske

(10) Patent No.: US 11,928,553 B2
(45) Date of Patent: *Mar. 12, 2024

(54) SECURE NON-DETERMINISTIC, SELF-MODIFIABLE COMPUTING MACHINE

(71) Applicant: Michael Stephen Fiske, San Francisco, CA (US)

(72) Inventor: Michael Stephen Fiske, San Francisco, CA (US)

(73) Assignee: Aemea Inc., Las Vegas, NV (US)

( * ) Notice: Subject to any disclaimer, the term of this patent is extended or adjusted under 35 U.S.C. 154(b) by 351 days.

This patent is subject to a terminal disclaimer.

(21) Appl. No.: 17/402,520

(22) Filed: Aug. 14, 2021

(65) Prior Publication Data

US 2022/0019930 A1 Jan. 20, 2022

Related U.S. Application Data

(63) Continuation-in-part of application No. 16/365,694, filed on Mar. 27, 2019, now Pat. No. 11,093,614, (Continued)

(51) Int. Cl.
*G06N 10/00* (2022.01)
*G06F 7/58* (2006.01)
(Continued)

(52) U.S. Cl.
CPC .............. *G06N 10/00* (2019.01); *G06F 7/588* (2013.01); *H01L 29/66984* (2013.01); *H04B 10/70* (2013.01); *B82Y 10/00* (2013.01)

(58) Field of Classification Search
CPC ........ G06F 21/567; G06F 21/72; G06F 21/75; G06F 2221/034; G06N 10/00
See application file for complete search history.

(56) References Cited

U.S. PATENT DOCUMENTS 6,626,960 B1 * 9/2003 Gillam ................ G06F 40/177
382/229
6,742,164 B1 * 5/2004 Gillam ................ G06F 40/268
715/255
(Continued)

FOREIGN PATENT DOCUMENTS

WO WO-2016094840 A2 * 6/2016 ............. G06F 21/53

OTHER PUBLICATIONS

Jennewein et al., "Quantum Cryptography with Entangled Photons", Physical Review Letters vol. 84, No. 20, pp. 4729-4732, May 15, 2000 (Year: 2000).*

*Primary Examiner* — John B King

(57) ABSTRACT

Based upon the principles of randomness and self-modification a novel computing machine is constructed. This computing machine executes computations, so that it is difficult to apprehend by an adversary and hijack with malware. These methods can also be used to help thwart reverse engineering of proprietary algorithms, hardware design and other areas of intellectual property.

Using quantum randomness in the random instructions and self-modification in the meta instructions, creates computations that are incomputable by a digital computer. In an embodiment, a more powerful computational procedure is created than a computational procedure equivalent to a digital computer procedure. Current digital computer algorithms and procedures can be constructed or designed with ex-machine programs, that are specified by standard instructions, random instructions and meta instructions. A novel computer is invented so that a program's execution is difficult to apprehend.

25 Claims, 35 Drawing Sheets

Related U.S. Application Data which is a continuation-in-part of application No. 14/643,774, filed on Mar. 10, 2015, now Pat. No. 10,268,843, which is a continuation-in-part of application No. 13/373,948, filed on Dec. 6, 2011, now Pat. No. 9,032,537.

(60) Provisional application No. 62/682,979, filed on Jun. 10, 2018, provisional application No. 61/462,260, filed on Jan. 31, 2011.

(51) Int. Cl.
*H01L 29/66* (2006.01)
*H04B 10/70* (2013.01)
*B82Y 10/00* (2011.01)

(56) References Cited

U.S. PATENT DOCUMENTS

| | | | |
|---|---|---|---|
| 2001/0031050 A1* | 10/2001 | Domstedt | H04L 9/065 380/44 |
| 2002/0046147 A1* | 4/2002 | Livesay | G06Q 30/02 705/40 |
| 2003/0041230 A1* | 2/2003 | Rappoport | G06F 9/322 712/238 |
| 2004/0215708 A1* | 10/2004 | Higashi | H04L 63/1425 709/201 |
| 2005/0071720 A1* | 3/2005 | Dattaram Kadkade | G06F 30/3323 714/741 |
| 2010/0257544 A1* | 10/2010 | Kleban | G06F 9/461 715/700 |
| 2011/0066833 A1* | 3/2011 | Fiske | G06F 9/30003 708/603 |
| 2012/0096434 A1* | 4/2012 | Rama | G06F 8/70 717/120 |
| 2012/0198560 A1* | 8/2012 | Fiske | G06F 9/448 726/26 |
| 2014/0137188 A1* | 5/2014 | Bartholomay | H04L 63/0428 709/224 |
| 2015/0169893 A1* | 6/2015 | Desai | H04W 12/08 726/1 |
| 2015/0261541 A1* | 9/2015 | Fiske | G06F 9/30 712/226 |
| 2016/0004861 A1* | 1/2016 | Momot | G06F 21/552 726/23 |
| 2016/0062735 A1* | 3/2016 | Wilber | G06F 40/35 708/250 |

\* cited by examiner

Fire Pattern 0000

Elements     $X_0$   $X_1$   $X_2$   $X_3$

Elements $X_0, X_1, X_2$ and $X_3$ don't fire during window $\mathfrak{W}$.

Fire Pattern 0001

Elements     $X_0$   $X_1$   $X_2$   $X_3$

Only element $X_3$ fires during window $\mathfrak{W}$.

Fire Pattern 0010

Elements     $X_0$   $X_1$   $X_2$   $X_3$

Only element $X_2$ fires during window $\mathfrak{W}$.

Fire Pattern 0011

Only elements $X_2$ and $X_3$ fire during window $\mathfrak{W}$.

Fire Pattern 0100

Only element $X_1$ fires during window $\mathfrak{W}$.

Fire Pattern 0010 for $1 \oplus 0$

Fire Pattern 0010 for 0 ⊕ 1

Elements   $X_0$   $X_1$   $X_2$   $X_3$

Fire Pattern 1011 for 1 ⊕ 1

Elements   $X_0$   $X_1$   $X_2$   $X_3$

Fire Pattern 0100 for 0 ⊕ 0

Elements   $X_0$   $X_1$   $X_2$   $X_3$

Fire Pattern 0101 for $\neg(0 \wedge 0)$.

nand(0, 0) = 1

Fire Pattern 0101 for $\neg(1 \wedge 0)$.

nand(1, 0) = 1

Fire Pattern 0101 for $\neg(0 \wedge 1)$.

nand(0, 1) = 1

Fire Pattern 1010 for $\neg(1 \wedge 1)$.

nand(1, 1) = 0

FIG. 14
Turing Machine Configuration  $(q, k, T)$
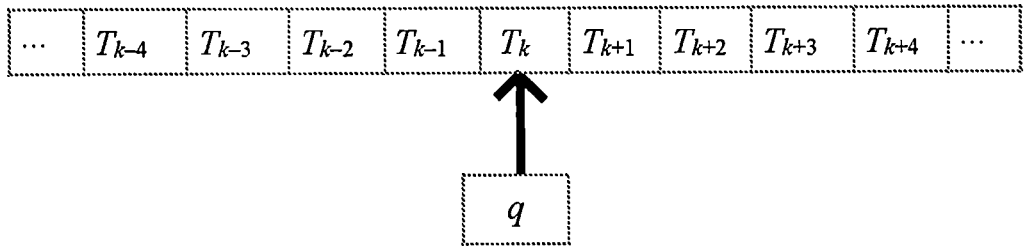
FIG. 15
| $q$ | ... | 1 | 2 | 1 | 2 | 1 | 2 | 1 | 2 | 2 | 2 | 2 | 1 | 2 | 2 | 2 | 2 | ... |
|---|---|---|---|---|---|---|---|---|---|---|---|---|---|---|---|---|---|---|
| $r$ | ... | 1 | 2 | 1 | 2 | 1 | 2 | 1 | 2 | 2 | 2 | 2 | 1 | 2 | 2 | 2 | 2 | ... |
| $s$ | ... | 1 | 2 | 1 | 2 | 1 | 2 | 1 | 2 | 2 | 2 | 2 | 1 | 2 | 2 | 2 | 2 | ... |
| $t$ | ... | 1 | 2 | 1 | 2 | 1 | 2 | 1 | 2 | 2 | 2 | 2 | 1 | 2 | 2 | 2 | 2 | ... |
| $u$ | ... | 1 | 2 | 1 | 2 | 1 | 2 | 1 | 2 | 2 | 2 | 2 | 1 | 2 | 2 | 2 | 2 | ... |
| $v$ | ... | 1 | 2 | 1 | 2 | 1 | 2 | 1 | 2 | 1 | 2 | 2 | 1 | 2 | 2 | 2 | 2 | ... |
| $w$ | ... | 1 | 2 | 1 | 2 | 1 | 2 | 1 | 2 | 1 | 2 | 2 | 1 | 2 | 2 | 2 | 2 | ... |
| $x$ | ... | 1 | 2 | 1 | 2 | 1 | 2 | 1 | 2 | 1 | 2 | 1 | 2 | 1 | 2 | 2 | 2 | ... |
| $q$ | ... | 1 | 2 | 1 | 2 | 1 | 2 | 1 | 2 | 1 | 2 | 1 | 2 | 1 | 2 | 2 | 2 | 2 | ... |
FIG. 16
Unit Square Coordinates
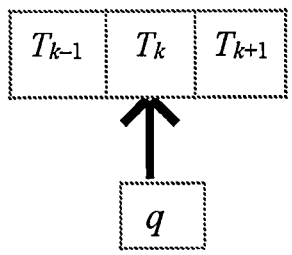

Left Affine Function

Right Affine Function

Edge Pattern Substitution Operator: Case A.

FIG. 20

Edge Pattern Substitution Operator: Case B.

| $p_0$ | $p_1$ | ... | ... | $p_{u-s}$ | ... | ... | $p_u$ | ... | $p_m$ |
|---|---|---|---|---|---|---|---|---|---|

| $v_0$ | $v_1$ | ... | $\underline{v_s}$ | ... | $v_{s+m-u}$ | $v_n$ |
|---|---|---|---|---|---|---|
| $w_0$ | $w_1$ | ... | $w_s$ | ... | $w_{s+m-u}$ | $w_n$ |

FIG. 21

Edge Pattern Substitution Operator: Case C.

| $v_0$ | ... | $v_{s-u}$ | ... | $\underline{v_s}$ | ... | $v_{s+m-u}$ | $v_n$ |
|---|---|---|---|---|---|---|---|
| $w_0$ | ... | $w_{s-u}$ | ... | $w_s$ | ... | $w_{s+m-u}$ | $w_n$ |

FIG. 22

Edge Pattern Substitution Operator: Case D.

| $p_0$ | | ... | | $p_u$ | ... | $p_{u+n-s}$ | | ... | $p_m$ |
|---|---|---|---|---|---|---|---|---|---|

| $v_0$ | ... | $v_{s-u}$ | ... | ... | $\underline{v_s}$ | ... | $v_n$ |
|---|---|---|---|---|---|---|---|
| $w_0$ | ... | $w_{s-u}$ | ... | ... | $w_s$ | ... | $w_n$ |

Light Emitting Diode: Semiconductor View

Light Emitting Diode

FIG. 26

Boolean Functions $f_k : \{0,1\} \times \{0,1\} \to \{0,1\}$

| Function | AEM Separation Rule(s) |
|---|---|
| $f_1 = \top$ | $(0, 0, -1, X_k) \leftrightarrow \dfrac{\{(0,0),(1,0),(0,1),(1,1)\}}{\emptyset}$ |
| $f_2 = \bot$ | $(0, 0, 1, X_k) \leftrightarrow \dfrac{\emptyset}{\{(0,0),(1,0),(0,1),(1,1)\}}$ |
| $f_3 = \mathbf{A}$ | $(2, 0, 1, X_k) \leftrightarrow \dfrac{\{(1,1),(1,0)\}}{\{(0,1),(0,0)\}}$ |
| $f_4 = \mathbf{B}$ | $(0, 2, 1, X_k) \leftrightarrow \dfrac{\{(1,1),(0,1)\}}{\{(1,0),(0,0)\}}$ |
| $f_5 = \neg \mathbf{A}$ | $(-2, 0, -1, X_k) \leftrightarrow \dfrac{\{(0,1),(0,0)\}}{\{(1,1),(1,0)\}}$ |
| $f_6 = \neg \mathbf{B}$ | $(0, -2, -1, X_k) \leftrightarrow \dfrac{\{(1,0),(0,0)\}}{\{(1,1),(0,1)\}}$ |
| $f_7 = \mathbf{A} \wedge \mathbf{B}$ | $(2, 2, 3, X_k) \leftrightarrow \dfrac{\{(1,1)\}}{\{(1,0),(0,1),(0,0)\}}$ |
| $f_8 = \mathbf{A} \vee \mathbf{B}$ | $(2, 2, 1, X_k) \leftrightarrow \dfrac{\{(1,0),(0,1),(1,1)\}}{\{(0,0)\}}$ |
| $f_9 = \mathbf{A} \to \mathbf{B}$ | $(-4, 2, -3, X_k) \leftrightarrow \dfrac{\{(0,0),(0,1),(1,1)\}}{\{(1,0)\}}$ |
| $f_{10} = \mathbf{A} \leftarrow \mathbf{B}$ | $(2, -4, -3, X_k) \leftrightarrow \dfrac{\{(0,0),(1,0),(1,1)\}}{\{(0,1)\}}$ |
| $f_{11} = \mathbf{A} \leftrightarrow \mathbf{B}$ | $(2, -4, -3, X_k)$ and $(-4, 2, -3, X_j)$ with $j \neq k$ |
| $f_{12} = \neg(\mathbf{A} \vee \mathbf{B})$ | $(-2, -2, -1, X_k) \leftrightarrow \dfrac{\{(0,0)\}}{\{(1,0),(0,1),(1,1)\}}$ |
| $f_{13} = \neg(\mathbf{A} \wedge \mathbf{B})$ | $(-2, -2, -3, X_k) \leftrightarrow \dfrac{\{(1,0),(0,1),(0,0)\}}{\{(1,1)\}}$ |
| $f_{14} = \mathbf{A} \oplus \mathbf{B}$ | $(2, 2, 1, X_k)$ and $(-2, -2, -3, X_j)$ with $j \neq k$ |
| $f_{15} = \mathbf{A} < \mathbf{B}$ | $(-2, 4, 3, X_k) \leftrightarrow \dfrac{\{(0,1)\}}{\{(0,0),(1,0),(1,1)\}}$ |
| $f_{16} = \mathbf{A} > \mathbf{B}$ | $(4, -2, 3, X_k) \leftrightarrow \dfrac{\{(1,0)\}}{\{(0,0),(0,1),(1,1)\}}$ |

FIG. 27

Minsky Universal Turing Machine with Program $\eta$

|   | $y$ | 0 | 1 | $A$ |
|---|---|---|---|---|
| $q_1$ | $(q_1, 0, L)$ | $(q_1, 0, L)$ | $(q_2, 1, L)$ | $(q_1, 1, L)$ |
| $q_2$ | $(q_1, 0, L)$ | $(q_2, y, R)$ | $(q_2, A, R)$ | $(q_6, y, R)$ |
| $q_3$ | $(q_3, y, L)$ | $(h, 0, h)$ | $(q_3, A, L)$ | $(q_4, 1, L)$ |
| $q_4$ | $(q_4, y, L)$ | $(q_5, y, R)$ | $(q_7, 1, L)$ | $(q_4, 1, L)$ |
| $q_5$ | $(q_5, y, R)$ | $(q_3, y, L)$ | $(q_5, A, R)$ | $(q_5, 1, R)$ |
| $q_6$ | $(q_6, y, R)$ | $(q_3, A, L)$ | $(q_6, A, R)$ | $(q_6, 1, R)$ |
| $q_7$ | $(q_7, 0, R)$ | $(q_6, y, R)$ | $(q_7, 1, R)$ | $(q_2, 0, R)$ |

State set $Q = \{q_1, q_2, q_3, q_4, q_5, q_6, q_7\}$.
Alphabet $\mathcal{A} = \{y, 0, 1, A\}$.

FIG. 28

Boolean Universal Turing Machine program $\overline{\eta} = (\overline{\eta}_0 \overline{\eta}_1 \overline{\eta}_2, \overline{\eta}_3 \overline{\eta}_4, \overline{\eta}_5)$

|   | 10 | 00 | 01 | 11 |
|---|---|---|---|---|
| 001 | (001, 00, 0) | (001, 00, 0) | (010, 01, 0) | (001, 01, 0) |
| 010 | (001, 00, 0) | (010, 10, 1) | (010, 11, 1) | (110, 10, 1) |
| 011 | (011, 10, 0) | (000, 00, $h$) | (011, 11, 0) | (100, 01, 0) |
| 100 | (100, 10, 0) | (101, 10, 1) | (111, 01, 0) | (100, 01, 0) |
| 101 | (101, 10, 1) | (011, 10, 0) | (101, 11, 1) | (101, 01, 1) |
| 110 | (110, 10, 1) | (011, 11, 0) | (110, 11, 1) | (110, 01, 1) |
| 111 | (111, 00, 1) | (110, 10, 1) | (111, 01, 1) | (010, 00, 1) |

State set $Q = \{001, 010, 011, 100, 101, 110, 111\}$.
Alphabet $\mathcal{A} = \{10, 00, 01, 11\}$.

FIG. 29

AEM Separation Rules for Level Set $\bar{\eta}_0^{-1}\{1\}$

| Fire Pattern | Element | $(U, A_i)$ | $(W, A_i)$ | $(X, A_i)$ | $(Y, A_i)$ | $(Z, A_i)$ | $\theta_{A_i}$ |
|---|---|---|---|---|---|---|---|
| 111 10 | $A_0$ | 2 | 2 | 2 | 2 | −2 | 7 |
| 111 01 | $A_1$ | 2 | 2 | 2 | −2 | 2 | 7 |
| 111 00 | $A_2$ | 2 | 2 | 2 | −2 | −2 | 5 |
| 110 11 | $A_3$ | 2 | 2 | −2 | 2 | 2 | 7 |
| 110 10 | $A_4$ | 2 | 2 | −2 | 2 | −2 | 5 |
| 110 01 | $A_5$ | 2 | 2 | −2 | −2 | 2 | 5 |
| 101 11 | $A_6$ | 2 | −2 | 2 | 2 | 2 | 7 |
| 101 10 | $A_7$ | 2 | −2 | 2 | 2 | −2 | 5 |
| 101 01 | $A_8$ | 2 | −2 | 2 | −2 | 2 | 5 |
| 100 11 | $A_9$ | 2 | −2 | −2 | 2 | 2 | 5 |
| 100 10 | $A_{10}$ | 2 | −2 | −2 | 2 | −2 | 3 |
| 100 01 | $A_{11}$ | 2 | −2 | −2 | −2 | 2 | 3 |
| 100 00 | $A_{12}$ | 2 | −2 | −2 | −2 | −2 | 1 |
| 011 11 | $A_{13}$ | −2 | 2 | 2 | 2 | 2 | 7 |
| 010 11 | $A_{14}$ | −2 | 2 | −2 | 2 | 2 | 5 |

FIG. 30

AEM Separation Rules for Level Set $\bar{\eta}_1^{-1}\{1\}$

| Fire Pattern | Element | $(U, B_i)$ | $(W, B_i)$ | $(X, B_i)$ | $(Y, B_i)$ | $(Z, B_i)$ | $\theta_{B_i}$ |
|---|---|---|---|---|---|---|---|
| 111 11 | $B_0$ | 2 | 2 | 2 | 2 | 2 | 9 |
| 111 10 | $B_1$ | 2 | 2 | 2 | 2 | −2 | 7 |
| 111 01 | $B_2$ | 2 | 2 | 2 | −2 | 2 | 7 |
| 111 00 | $B_3$ | 2 | 2 | 2 | −2 | −2 | 5 |
| 110 11 | $B_4$ | 2 | 2 | −2 | 2 | 2 | 7 |
| 110 10 | $B_5$ | 2 | 2 | −2 | 2 | −2 | 5 |
| 110 01 | $B_6$ | 2 | 2 | −2 | −2 | 2 | 5 |
| 110 00 | $B_7$ | 2 | 2 | −2 | −2 | −2 | 3 |
| 101 00 | $B_8$ | 2 | −2 | 2 | −2 | −2 | 3 |
| 100 01 | $B_9$ | 2 | −2 | −2 | −2 | 2 | 3 |
| 011 10 | $B_{10}$ | −2 | 2 | 2 | 2 | −2 | 5 |
| 011 01 | $B_{11}$ | −2 | 2 | 2 | −2 | 2 | 5 |
| 010 11 | $B_{12}$ | −2 | 2 | −2 | 2 | 2 | 5 |
| 010 01 | $B_{13}$ | −2 | 2 | −2 | −2 | 2 | 3 |
| 010 00 | $B_{14}$ | −2 | 2 | −2 | −2 | −2 | 1 |
| 001 01 | $B_{15}$ | −2 | −2 | 2 | −2 | 2 | 3 |

FIG. 31

AEM Separation Rules for Level Set $\overline{\eta}_2^{-1}\{1\}$

| Fire Pattern | Element | $(U, C_i)$ | $(W, C_i)$ | $(X, C_i)$ | $(Y, C_i)$ | $(Z, C_i)$ | $\theta_{C_i}$ |
|---|---|---|---|---|---|---|---|
| 111 10 | $C_0$ | 2 | 2 | 2 | 2 | −2 | 7 |
| 111 01 | $C_1$ | 2 | 2 | 2 | −2 | 2 | 7 |
| 110 00 | $C_2$ | 2 | 2 | −2 | −2 | −2 | 3 |
| 101 11 | $C_3$ | 2 | −2 | 2 | 2 | 2 | 7 |
| 101 10 | $C_4$ | 2 | −2 | 2 | 2 | −2 | 5 |
| 101 01 | $C_5$ | 2 | −2 | 2 | −2 | 2 | 5 |
| 101 00 | $C_6$ | 2 | −2 | 2 | −2 | −2 | 3 |
| 100 01 | $C_7$ | 2 | −2 | −2 | −2 | 2 | 3 |
| 100 00 | $C_8$ | 2 | −2 | −2 | −2 | −2 | 1 |
| 011 10 | $C_9$ | −2 | 2 | 2 | 2 | −2 | 5 |
| 011 01 | $C_{10}$ | −2 | 2 | 2 | −2 | 2 | 5 |
| 010 10 | $C_{11}$ | −2 | 2 | −2 | 2 | −2 | 3 |
| 001 11 | $C_{12}$ | −2 | −2 | 2 | 2 | 2 | 5 |
| 001 10 | $C_{13}$ | −2 | −2 | 2 | 2 | −2 | 3 |
| 001 00 | $C_{14}$ | −2 | −2 | 2 | −2 | −2 | 1 |

FIG. 32

AEM Separation Rules for Level Set $\overline{\eta}_3^{-1}\{1\}$

| Fire Pattern | Element | $(U, D_i)$ | $(W, D_i)$ | $(X, D_i)$ | $(Y, D_i)$ | $(Z, D_i)$ | $\theta_{D_i}$ |
|---|---|---|---|---|---|---|---|
| 111 00 | $D_0$ | 2 | 2 | 2 | −2 | −2 | 5 |
| 110 00 | $D_1$ | 2 | 2 | −2 | −2 | −2 | 3 |
| 110 01 | $D_2$ | 2 | 2 | −2 | −2 | 2 | 5 |
| 110 10 | $D_3$ | 2 | 2 | −2 | 2 | −2 | 5 |
| 101 00 | $D_4$ | 2 | −2 | 2 | −2 | −2 | 3 |
| 101 01 | $D_5$ | 2 | −2 | 2 | −2 | 2 | 5 |
| 101 10 | $D_6$ | 2 | −2 | 2 | 2 | −2 | 5 |
| 100 00 | $D_7$ | 2 | −2 | −2 | −2 | −2 | 1 |
| 100 10 | $D_8$ | 2 | −2 | −2 | 2 | −2 | 3 |
| 011 01 | $D_9$ | −2 | 2 | 2 | −2 | 2 | 5 |
| 011 10 | $D_{10}$ | −2 | 2 | 2 | 2 | −2 | 5 |
| 010 00 | $D_{11}$ | −2 | 2 | −2 | −2 | −2 | 1 |
| 010 01 | $D_{12}$ | −2 | 2 | −2 | −2 | 2 | 3 |
| 010 11 | $D_{13}$ | −2 | 2 | −2 | 2 | 2 | 5 |

FIG. 33

AEM Separation Rules for Level Set $\overline{\eta}_4^{-1}\{1\}$

| Fire Pattern | Element | $(U, E_i)$ | $(W, E_i)$ | $(X, E_i)$ | $(Y, E_i)$ | $(Z, E_i)$ | $\theta_{E_i}$ |
|---|---|---|---|---|---|---|---|
| 111 01 | $E_0$ | 2 | 2 | 2 | $-2$ | 2 | 7 |
| 110 11 | $E_1$ | 2 | 2 | $-2$ | 2 | 2 | 7 |
| 110 01 | $E_2$ | 2 | 2 | $-2$ | $-2$ | 2 | 5 |
| 110 00 | $E_3$ | 2 | 2 | $-2$ | $-2$ | $-2$ | 3 |
| 101 11 | $E_4$ | 2 | $-2$ | 2 | 2 | 2 | 7 |
| 101 01 | $E_5$ | 2 | $-2$ | 2 | $-2$ | 2 | 5 |
| 100 11 | $E_6$ | 2 | $-2$ | $-2$ | 2 | 2 | 5 |
| 100 01 | $E_7$ | 2 | $-2$ | $-2$ | $-2$ | 2 | 3 |
| 011 11 | $E_8$ | $-2$ | 2 | 2 | 2 | 2 | 7 |
| 011 01 | $E_9$ | $-2$ | 2 | 2 | $-2$ | 2 | 5 |
| 010 01 | $E_{10}$ | $-2$ | 2 | $-2$ | $-2$ | 2 | 3 |
| 001 11 | $E_{11}$ | $-2$ | $-2$ | 2 | 2 | 2 | 5 |
| 001 01 | $E_{12}$ | $-2$ | $-2$ | 2 | $-2$ | 2 | 3 |

FIG. 34

AEM Separation Rules for Level Set $\overline{\eta}_5^{-1}\{1\}$

| Fire Pattern | Element | $(U, F_i)$ | $(W, F_i)$ | $(X, F_i)$ | $(Y, F_i)$ | $(Z, F_i)$ | $\theta_{F_i}$ |
|---|---|---|---|---|---|---|---|
| 111 11 | $F_0$ | 2 | 2 | 2 | 2 | 2 | 9 |
| 111 10 | $F_1$ | 2 | 2 | 2 | 2 | $-2$ | 7 |
| 111 01 | $F_2$ | 2 | 2 | 2 | $-2$ | 2 | 7 |
| 111 00 | $F_3$ | 2 | 2 | 2 | $-2$ | $-2$ | 5 |
| 110 11 | $F_4$ | 2 | 2 | $-2$ | 2 | 2 | 7 |
| 110 10 | $F_5$ | 2 | 2 | $-2$ | 2 | $-2$ | 5 |
| 110 01 | $F_6$ | 2 | 2 | $-2$ | $-2$ | 2 | 5 |
| 101 11 | $F_7$ | 2 | $-2$ | 2 | 2 | 2 | 7 |
| 101 10 | $F_8$ | 2 | $-2$ | 2 | 2 | $-2$ | 5 |
| 101 01 | $F_9$ | 2 | $-2$ | 2 | $-2$ | 2 | 5 |
| 100 00 | $F_{10}$ | 2 | $-2$ | $-2$ | $-2$ | $-2$ | 1 |
| 010 11 | $F_{11}$ | $-2$ | 2 | $-2$ | 2 | 2 | 5 |
| 010 01 | $F_{12}$ | $-2$ | 2 | $-2$ | $-2$ | 2 | 3 |
| 010 00 | $F_{13}$ | $-2$ | 2 | $-2$ | $-2$ | $-2$ | 1 |

FIG. 35

Adding Four Bits: $X_0, X_1, X_2, X_3$

| $X_0$ | $X_1$ | $X_2$ | $X_3$ | $C_0$ | $C_1$ | $C_2$ | $C_3$ | $P_0$ | $P_1$ | $P_2$ |
|---|---|---|---|---|---|---|---|---|---|---|
| 0 | 0 | 0 | 0 | 0 | 0 | 0 | 0 | 0 | 0 | 0 |
| 0 | 0 | 0 | 1 | 1 | 0 | 0 | 0 | 1 | 0 | 0 |
| 0 | 0 | 1 | 0 | 1 | 0 | 0 | 0 | 1 | 0 | 0 |
| 0 | 1 | 0 | 0 | 1 | 0 | 0 | 0 | 1 | 0 | 0 |
| 1 | 0 | 0 | 0 | 1 | 0 | 0 | 0 | 1 | 0 | 0 |
| 0 | 0 | 1 | 1 | 1 | 1 | 0 | 0 | 0 | 1 | 0 |
| 0 | 1 | 0 | 1 | 1 | 1 | 0 | 0 | 0 | 1 | 0 |
| 1 | 0 | 0 | 1 | 1 | 1 | 0 | 0 | 0 | 1 | 0 |
| 0 | 1 | 1 | 0 | 1 | 1 | 0 | 0 | 0 | 1 | 0 |
| 1 | 0 | 1 | 0 | 1 | 1 | 0 | 0 | 0 | 1 | 0 |
| 1 | 1 | 0 | 0 | 1 | 1 | 0 | 0 | 0 | 1 | 0 |
| 0 | 1 | 1 | 1 | 1 | 1 | 1 | 0 | 1 | 1 | 0 |
| 1 | 0 | 1 | 1 | 1 | 1 | 1 | 0 | 1 | 1 | 0 |
| 1 | 1 | 0 | 1 | 1 | 1 | 1 | 0 | 1 | 1 | 0 |
| 1 | 1 | 1 | 0 | 1 | 1 | 1 | 0 | 1 | 1 | 0 |
| 1 | 1 | 1 | 1 | 1 | 1 | 1 | 1 | 0 | 0 | 1 |

FIG. 36

Adding Four Bits: $X_k$ to $C_j$ Amplitudes and $C_j$ Thresholds

| Element | $(X_k, C_0)$ | $(X_k, C_1)$ | $(X_k, C_2)$ | $(X_k, C_3)$ | $\theta_{C_0}$ | $\theta_{C_1}$ | $\theta_{C_2}$ | $\theta_{C_3}$ |
|---|---|---|---|---|---|---|---|---|
| $X_k$ | 2 | 2 | 2 | 2 | 1 | 3 | 5 | 7 | k index refers to $X_0, X_1, X_2, X_3$

FIG. 37

Adding Four Bits: $C_j$ to $P_i$ Amplitudes

| Element | $(C_0, P_0)$ | $(C_1, P_0)$ | $(C_2, P_0)$ | $(C_3, P_0)$ | $\theta_{P_0}$ |
|---|---|---|---|---|---|
| $P_0$ | 2 | −2 | 2 | −2 | 1 |

| Element | $(C_0, P_1)$ | $(C_1, P_1)$ | $(C_2, P_1)$ | $(C_3, P_1)$ | $\theta_{P_1}$ |
|---|---|---|---|---|---|
| $P_1$ | 0 | 2 | 2 | −4 | 1 |

| Element | $(C_0, P_2)$ | $(C_1, P_2)$ | $(C_2, P_2)$ | $(C_3, P_2)$ | $\theta_{P_2}$ |
|---|---|---|---|---|---|
| $P_2$ | 2 | 2 | 2 | 2 | 7 |

FIG. 38

Four Bit Multiplication

|     |     |     |          | $y_3$    | $y_2$    | $y_1$    | $y_0$    |
|-----|-----|-----|----------|----------|----------|----------|----------|
|     |     |     | *        | $z_3$    | $z_2$    | $z_1$    | $z_0$    |
|     |     |     |          | $y_3z_0$ | $y_2z_0$ | $y_1z_0$ | $y_0z_0$ |
|     |     |     | $y_3z_1$ | $y_2z_1$ | $y_1z_1$ | $y_0z_1$ |          |
|     |     | $y_3z_2$ | $y_2z_2$ | $y_1z_2$ | $y_0z_2$ |      |          |
|     | $y_3z_3$ | $y_2z_3$ | $y_1z_3$ | $y_0z_3$ |     |          |          |
| $e_7$ | $e_6$ | $e_5$ | $e_4$ | $e_3$ | $e_2$ | $e_1$ | $e_0$ |

FIG. 39

Element $E_0$ represents bit $e_0$. Amplitude and Threshold

| $(Y_0, E_0)$ | $(Z_0, E_0)$ | $\theta_{E_0}$ |
|---|---|---|
| 2 | 2 | 3 |

FIG. 40

$e_1$ Bit. $S_{10} \leftrightarrow y_1z_0$. $S_{01} \leftrightarrow y_0z_1$.

| $S_{10}$ | $S_{01}$ | $C_{01}$ | $C_{11}$ |
|---|---|---|---|
| 0 | 0 | 0 | 0 |
| 0 | 1 | 1 | 0 |
| 1 | 0 | 1 | 0 |
| 1 | 1 | 1 | 1 |

FIG. 41

$e_1$ Bit. $S_{jk}$ to $C_{il}$ Amplitudes and $C_{il}$ Thresholds

| $(S_{01}, C_{01})$ | $(S_{01}, C_{11})$ | $(S_{10}, C_{01})$ | $(S_{10}, C_{11})$ | $\theta_{C_{01}}$ | $\theta_{C_{11}}$ |
|---|---|---|---|---|---|
| 2 | 2 | 2 | 2 | 1 | 3 |

FIG. 42

Element $E_1$ represents bit $e_1$. Amplitude and Threshold

| $(C_{01}, E_1)$ | $(C_{11}, E_1)$ | $\theta_{E_1}$ |
|---|---|---|
| 2 | −2 | 1 |

FIG. 43

$e_2$ Bit. $S_{20} \leftrightarrow y_2 z_0$. $S_{11} \leftrightarrow y_1 z_1$. $S_{02} \leftrightarrow y_0 z_2$

| $S_{20}$ | $S_{11}$ | $S_{02}$ | $C_{11}$ | $C_{02}$ | $C_{12}$ | $C_{22}$ | $C_{32}$ | $P_{02}$ | $P_{12}$ | $P_{22}$ |
|---|---|---|---|---|---|---|---|---|---|---|
| 0 | 0 | 0 | 0 | 0 | 0 | 0 | 0 | 0 | 0 | 0 |
| 0 | 0 | 0 | 1 | 0 | 0 | 0 | 0 | 1 | 0 | 0 |
| 0 | 0 | 1 | 0 | 1 | 0 | 0 | 0 | 1 | 0 | 0 |
| 0 | 1 | 0 | 0 | 1 | 0 | 0 | 0 | 1 | 0 | 0 |
| 1 | 0 | 0 | 0 | 1 | 0 | 0 | 0 | 1 | 0 | 0 |
| 0 | 0 | 1 | 1 | 1 | 1 | 0 | 0 | 0 | 1 | 0 |
| 0 | 1 | 0 | 1 | 1 | 1 | 0 | 0 | 0 | 1 | 0 |
| 1 | 0 | 0 | 1 | 1 | 1 | 0 | 0 | 0 | 1 | 0 |
| 0 | 1 | 1 | 0 | 1 | 1 | 0 | 0 | 0 | 1 | 0 |
| 1 | 0 | 1 | 0 | 1 | 1 | 0 | 0 | 0 | 1 | 0 |
| 1 | 1 | 0 | 0 | 1 | 1 | 0 | 0 | 0 | 1 | 0 |
| 0 | 1 | 1 | 1 | 1 | 1 | 1 | 0 | 1 | 1 | 0 |
| 1 | 0 | 1 | 1 | 1 | 1 | 1 | 0 | 1 | 1 | 0 |
| 1 | 1 | 0 | 1 | 1 | 1 | 1 | 0 | 1 | 1 | 0 |
| 1 | 1 | 1 | 0 | 1 | 1 | 1 | 0 | 1 | 1 | 0 |
| 1 | 1 | 1 | 1 | 1 | 1 | 1 | 1 | 0 | 0 | 1 |

FIG. 44

$e_2$ Bit. $S_{jk}, C_{11}$ to $C_{i2}$ Amplitudes and $C_{i2}$ Thresholds

| $(S_{jk}, C_{02})$ | $(S_{jk}, C_{12})$ | $(S_{jk}, C_{22})$ | $(S_{jk}, C_{32})$ | $\theta_{C_{02}}$ | $\theta_{C_{12}}$ | $\theta_{C_{22}}$ | $\theta_{C_{32}}$ |
|---|---|---|---|---|---|---|---|
| 2 | 2 | 2 | 2 | 1 | 3 | 5 | 7 |

FIG. 45

$C_{j2}$ to $P_{i2}$ Amplitudes and $P_{i2}$ Thresholds

| Element | $(C_{02}, P_{02})$ | $(C_{12}, P_{02})$ | $(C_{22}, P_{02})$ | $(C_{32}, P_{02})$ | $\theta_{P_{02}}$ |
|---|---|---|---|---|---|
| $P_{02}$ | 2 | −2 | 2 | −2 | 1 |

| Element | $(C_{02}, P_{12})$ | $(C_{12}, P_{12})$ | $(C_{22}, P_{12})$ | $(C_{32}, P_{12})$ | $\theta_{P_{12}}$ |
|---|---|---|---|---|---|
| $P_{12}$ | 0 | 2 | 2 | −4 | 1 |

| Element | $(C_{02}, P_{22})$ | $(C_{12}, P_{22})$ | $(C_{22}, P_{22})$ | $(C_{32}, P_{22})$ | $\theta_{P_{22}}$ |
|---|---|---|---|---|---|
| $P_{22}$ | 2 | 2 | 2 | 2 | 7 |

FIG. 46

Element $E_2$ represents bit $e_2$. Amplitude and Threshold

| $(P_{02}, E_2)$ | $\theta_{E_2}$ |
|---|---|
| 2 | 1 |

FIG. 47

$e_3$ Bit. $S_{jk} \leftrightarrow y_j z_k$ where $j + k = 3$.

| $S_{30}$ | $S_{21}$ | $S_{12}$ | $S_{03}$ | $P_{12}$ | $C_{03}$ | $C_{13}$ | $C_{23}$ | $C_{33}$ | $C_{43}$ | $P_{03}$ | $P_{13}$ | $P_{23}$ |
|---|---|---|---|---|---|---|---|---|---|---|---|---|
| 0 | 0 | 0 | 0 | 0 | 0 | 0 | 0 | 0 | 0 | 0 | 0 | 0 |
| 0 | 0 | 0 | 0 | 1 | 1 | 0 | 0 | 0 | 0 | 1 | 0 | 0 |
| 0 | 0 | 0 | 1 | 0 | 1 | 0 | 0 | 0 | 0 | 1 | 0 | 0 |
| 0 | 0 | 1 | 0 | 0 | 1 | 0 | 0 | 0 | 0 | 1 | 0 | 0 |
| 0 | 1 | 0 | 0 | 0 | 1 | 0 | 0 | 0 | 0 | 1 | 0 | 0 |
| 1 | 0 | 0 | 0 | 0 | 1 | 0 | 0 | 0 | 0 | 1 | 0 | 0 |
| 1 | 0 | 0 | 0 | 1 | 1 | 1 | 0 | 0 | 0 | 0 | 1 | 0 |
| 0 | 1 | 0 | 0 | 1 | 1 | 1 | 0 | 0 | 0 | 0 | 1 | 0 |
| 0 | 0 | 1 | 0 | 1 | 1 | 1 | 0 | 0 | 0 | 0 | 1 | 0 |
| 0 | 0 | 0 | 1 | 1 | 1 | 1 | 0 | 0 | 0 | 0 | 1 | 0 |
| 0 | 0 | 1 | 1 | 0 | 1 | 1 | 0 | 0 | 0 | 0 | 1 | 0 |
| 0 | 1 | 0 | 1 | 0 | 1 | 1 | 0 | 0 | 0 | 0 | 1 | 0 |
| 1 | 0 | 0 | 1 | 0 | 1 | 1 | 0 | 0 | 0 | 0 | 1 | 0 |
| 0 | 1 | 1 | 0 | 0 | 1 | 1 | 0 | 0 | 0 | 0 | 1 | 0 |
| 1 | 0 | 1 | 0 | 0 | 1 | 1 | 0 | 0 | 0 | 0 | 1 | 0 |
| 1 | 1 | 0 | 0 | 0 | 1 | 1 | 0 | 0 | 0 | 0 | 1 | 0 |
| 0 | 0 | 1 | 1 | 1 | 1 | 1 | 1 | 0 | 0 | 1 | 1 | 0 |
| 0 | 1 | 0 | 1 | 1 | 1 | 1 | 1 | 0 | 0 | 1 | 1 | 0 |
| 1 | 0 | 0 | 1 | 1 | 1 | 1 | 1 | 0 | 0 | 1 | 1 | 0 |
| 0 | 1 | 1 | 0 | 1 | 1 | 1 | 1 | 0 | 0 | 1 | 1 | 0 |
| 1 | 1 | 0 | 0 | 1 | 1 | 1 | 1 | 0 | 0 | 1 | 1 | 0 |
| 0 | 1 | 1 | 1 | 0 | 1 | 1 | 1 | 0 | 0 | 1 | 1 | 0 |
| 1 | 0 | 1 | 1 | 0 | 1 | 1 | 1 | 0 | 0 | 1 | 1 | 0 |
| 1 | 1 | 0 | 1 | 0 | 1 | 1 | 1 | 0 | 0 | 1 | 1 | 0 |
| 1 | 0 | 1 | 0 | 1 | 1 | 1 | 1 | 0 | 0 | 1 | 1 | 0 |
| 1 | 1 | 1 | 0 | 0 | 1 | 1 | 1 | 0 | 0 | 1 | 1 | 0 |
| 0 | 1 | 1 | 1 | 1 | 1 | 1 | 1 | 1 | 0 | 0 | 0 | 1 |
| 1 | 0 | 1 | 1 | 1 | 1 | 1 | 1 | 1 | 0 | 0 | 0 | 1 |
| 1 | 1 | 0 | 1 | 1 | 1 | 1 | 1 | 1 | 0 | 0 | 0 | 1 |
| 1 | 1 | 1 | 0 | 1 | 1 | 1 | 1 | 1 | 0 | 0 | 0 | 1 |
| 1 | 1 | 1 | 1 | 0 | 1 | 1 | 1 | 1 | 0 | 0 | 0 | 1 |
| 1 | 1 | 1 | 1 | 1 | 1 | 1 | 1 | 1 | 1 | 1 | 0 | 1 |

FIG. 48

$S_{jk}$ ($j + k = 3$). $S_{jk}$ to $C_{i3}$ connections and $C_{i3}$ thresholds.

| $(S_{jk}, C_{i3})$ | $\theta_{C_{03}}$ | $\theta_{C_{13}}$ | $\theta_{C_{23}}$ | $\theta_{C_{33}}$ | $\theta_{C_{43}}$ |
|---|---|---|---|---|---|
| 2 | 1 | 3 | 5 | 7 | 9 |

FIG. 49

$C_{j3}$ to $P_{i3}$ Amplitudes and $P_{i3}$ Thresholds

| $(C_{03}, P_{03})$ | $(C_{13}, P_{03})$ | $(C_{23}, P_{03})$ | $(C_{33}, P_{03})$ | $(C_{43}, P_{03})$ | $\theta_{P_{03}}$ |
|---|---|---|---|---|---|
| 2 | −2 | 2 | −2 | 2 | 1 |

| $(C_{03}, P_{13})$ | $(C_{13}, P_{13})$ | $(C_{23}, P_{13})$ | $(C_{33}, P_{13})$ | $(C_{43}, P_{13})$ | $\theta_{P_{13}}$ |
|---|---|---|---|---|---|
| 0 | 2 | 2 | −4 | 0 | 1 |

| $(C_{03}, P_{23})$ | $(C_{13}, P_{23})$ | $(C_{23}, P_{23})$ | $(C_{33}, P_{23})$ | $(C_{43}, P_{23})$ | $\theta_{P_{23}}$ |
|---|---|---|---|---|---|
| 2 | 2 | 2 | 2 | 2 | 7 |

FIG. 50

Element $E_3$ represents bit $e_3$. $S_{jk}$ ($j + k = 3$).

| $(P_{03}, E_3)$ | $\theta_{E_3}$ |
|---|---|
| 2 | 1 |

FIG. 51

$e_4$ Bit. $S_{31} \leftrightarrow y_3 z_1$. $S_{22} \leftrightarrow y_2 z_2$. $S_{13} \leftrightarrow y_1 z_3$.

| $S_{31}$ | $S_{22}$ | $S_{13}$ | $P_{22}$ | $P_{13}$ | $C_{04}$ | $C_{14}$ | $C_{24}$ | $C_{34}$ | $C_{44}$ | $P_{04}$ | $P_{14}$ | $P_{24}$ |
|---|---|---|---|---|---|---|---|---|---|---|---|---|
| 0 | 0 | 0 | 0 | 0 | 0 | 0 | 0 | 0 | 0 | 0 | 0 | 0 |
| 0 | 0 | 0 | 0 | 1 | 1 | 0 | 0 | 0 | 0 | 1 | 0 | 0 |
| 0 | 0 | 0 | 1 | 0 | 1 | 0 | 0 | 0 | 0 | 1 | 0 | 0 |
| 0 | 0 | 1 | 0 | 0 | 1 | 0 | 0 | 0 | 0 | 1 | 0 | 0 |
| 0 | 1 | 0 | 0 | 0 | 1 | 0 | 0 | 0 | 0 | 1 | 0 | 0 |
| 1 | 0 | 0 | 0 | 0 | 1 | 0 | 0 | 0 | 0 | 1 | 0 | 0 |
| 1 | 0 | 0 | 0 | 1 | 1 | 1 | 0 | 0 | 0 | 0 | 1 | 0 |
| 0 | 1 | 0 | 0 | 1 | 1 | 1 | 0 | 0 | 0 | 0 | 1 | 0 |
| 0 | 0 | 1 | 0 | 1 | 1 | 1 | 0 | 0 | 0 | 0 | 1 | 0 |
| 0 | 0 | 0 | 1 | 1 | 1 | 1 | 0 | 0 | 0 | 0 | 1 | 0 |
| 0 | 0 | 1 | 1 | 0 | 1 | 1 | 0 | 0 | 0 | 0 | 1 | 0 |
| 0 | 1 | 0 | 1 | 0 | 1 | 1 | 0 | 0 | 0 | 0 | 1 | 0 |
| 1 | 0 | 0 | 1 | 0 | 1 | 1 | 0 | 0 | 0 | 0 | 1 | 0 |
| 0 | 1 | 1 | 0 | 0 | 1 | 1 | 0 | 0 | 0 | 0 | 1 | 0 |
| 1 | 0 | 1 | 0 | 0 | 1 | 1 | 0 | 0 | 0 | 0 | 1 | 0 |
| 1 | 1 | 0 | 0 | 0 | 1 | 1 | 0 | 0 | 0 | 0 | 1 | 0 |
| 0 | 0 | 1 | 1 | 1 | 1 | 1 | 1 | 0 | 0 | 1 | 1 | 0 |
| 0 | 1 | 0 | 1 | 1 | 1 | 1 | 1 | 0 | 0 | 1 | 1 | 0 |
| 1 | 0 | 0 | 1 | 1 | 1 | 1 | 1 | 0 | 0 | 1 | 1 | 0 |
| 0 | 1 | 1 | 0 | 1 | 1 | 1 | 1 | 0 | 0 | 1 | 1 | 0 |
| 1 | 1 | 0 | 0 | 1 | 1 | 1 | 1 | 0 | 0 | 1 | 1 | 0 |
| 0 | 1 | 1 | 1 | 0 | 1 | 1 | 1 | 0 | 0 | 1 | 1 | 0 |
| 1 | 0 | 1 | 1 | 0 | 1 | 1 | 1 | 0 | 0 | 1 | 1 | 0 |
| 1 | 1 | 0 | 1 | 0 | 1 | 1 | 1 | 0 | 0 | 1 | 1 | 0 |
| 1 | 0 | 1 | 0 | 1 | 1 | 1 | 1 | 0 | 0 | 1 | 1 | 0 |
| 1 | 1 | 1 | 0 | 0 | 1 | 1 | 1 | 0 | 0 | 1 | 1 | 0 |
| 0 | 1 | 1 | 1 | 1 | 1 | 1 | 1 | 1 | 0 | 0 | 0 | 1 |
| 1 | 0 | 1 | 1 | 1 | 1 | 1 | 1 | 1 | 0 | 0 | 0 | 1 |
| 1 | 1 | 0 | 1 | 1 | 1 | 1 | 1 | 1 | 0 | 0 | 0 | 1 |
| 1 | 1 | 1 | 0 | 1 | 1 | 1 | 1 | 1 | 0 | 0 | 0 | 1 |
| 1 | 1 | 1 | 1 | 0 | 1 | 1 | 1 | 1 | 0 | 0 | 0 | 1 |
| 1 | 1 | 1 | 1 | 1 | 1 | 1 | 1 | 1 | 1 | 1 | 0 | 1 |

FIG. 52

$e_4$ Bit. $S_{jk}$ to $C_{i4}$ Amplitudes and $C_{i4}$ Thresholds

| $(S_{jk}, C_{i4})$ | $(P_{22}, C_{i4})$ | $(P_{13}, C_{i4})$ | $\theta_{C_{04}}$ | $\theta_{C_{14}}$ | $\theta_{C_{24}}$ | $\theta_{C_{34}}$ | $\theta_{C_{44}}$ |
|---|---|---|---|---|---|---|---|
| 2 | 2 | 2 | 1 | 3 | 5 | 7 | 9 |

FIG. 53

$C_{j4}$ to $P_{i4}$ Amplitudes and $P_{i4}$ Thresholds

| $(C_{04}, P_{04})$ | $(C_{14}, P_{04})$ | $(C_{24}, P_{04})$ | $(C_{34}, P_{04})$ | $(C_{44}, P_{04})$ | $\theta_{P_{04}}$ |
|---|---|---|---|---|---|
| 2 | −2 | 2 | −2 | 2 | 1 |

| $(C_{04}, P_{14})$ | $(C_{14}, P_{14})$ | $(C_{24}, P_{14})$ | $(C_{34}, P_{14})$ | $(C_{44}, P_{14})$ | $\theta_{P_{14}}$ |
|---|---|---|---|---|---|
| 0 | 2 | 2 | −4 | 0 | 1 |

| $(C_{04}, P_{24})$ | $(C_{14}, P_{24})$ | $(C_{24}, P_{24})$ | $(C_{34}, P_{24})$ | $(C_{44}, P_{24})$ | $\theta_{P_{24}}$ |
|---|---|---|---|---|---|
| 2 | 2 | 2 | 2 | 2 | 7 |

FIG. 54

Element $E_4$ represents bit $e_4$. $S_{jk}$ $(j + k = 4)$.

| $(P_{04}, E_4)$ | $\theta_{E_4}$ |
|---|---|
| 2 | 1 |

FIG. 55

$e_5$ Bit. $S_{32} \leftrightarrow y_3 z_2$. $S_{23} \leftrightarrow y_2 z_3$.

| $S_{32}$ | $S_{23}$ | $P_{14}$ | $P_{23}$ | $C_{05}$ | $C_{15}$ | $C_{25}$ | $C_{35}$ | $P_{05}$ | $P_{15}$ | $P_{25}$ |
|---|---|---|---|---|---|---|---|---|---|---|
| 0 | 0 | 0 | 0 | 0 | 0 | 0 | 0 | 0 | 0 | 0 |
| 0 | 0 | 0 | 1 | 0 | 0 | 0 | 0 | 1 | 0 | 0 |
| 0 | 0 | 1 | 0 | 1 | 0 | 0 | 0 | 1 | 0 | 0 |
| 0 | 1 | 0 | 0 | 1 | 0 | 0 | 0 | 1 | 0 | 0 |
| 1 | 0 | 0 | 0 | 1 | 0 | 0 | 0 | 1 | 0 | 0 |
| 0 | 0 | 1 | 1 | 1 | 1 | 0 | 0 | 0 | 1 | 0 |
| 0 | 1 | 0 | 1 | 1 | 1 | 0 | 0 | 0 | 1 | 0 |
| 1 | 0 | 0 | 1 | 1 | 1 | 0 | 0 | 0 | 1 | 0 |
| 0 | 1 | 1 | 0 | 1 | 1 | 0 | 0 | 0 | 1 | 0 |
| 1 | 0 | 1 | 0 | 1 | 1 | 0 | 0 | 0 | 1 | 0 |
| 1 | 1 | 0 | 0 | 1 | 1 | 0 | 0 | 0 | 1 | 0 |
| 0 | 1 | 1 | 1 | 1 | 1 | 1 | 0 | 1 | 1 | 0 |
| 1 | 0 | 1 | 1 | 1 | 1 | 1 | 0 | 1 | 1 | 0 |
| 1 | 1 | 0 | 1 | 1 | 1 | 1 | 0 | 1 | 1 | 0 |
| 1 | 1 | 1 | 0 | 1 | 1 | 1 | 0 | 1 | 1 | 0 |
| 1 | 1 | 1 | 1 | 1 | 1 | 1 | 1 | 0 | 0 | 1 |

FIG. 56

$e_5$ Bit. $S_{jk}$, $P_{14}$ and $P_{23}$ to $C_{i5}$ Amplitudes and $C_{i5}$ Thresholds

| $(S_{32}, C_{i5})$ | $(S_{23}, C_{i5})$ | $(P_{14}, C_{i5})$ | $(P_{23}, C_{i5})$ | $\theta_{C_{05}}$ | $\theta_{C_{15}}$ | $\theta_{C_{25}}$ | $\theta_{C_{35}}$ |
|---|---|---|---|---|---|---|---|
| 2 | 2 | 2 | 2 | 1 | 3 | 5 | 7 |

FIG. 57

$C_{j5}$ to $P_{i5}$ Amplitudes and $P_{i5}$ Thresholds

| $(C_{05}, P_{05})$ | $(C_{15}, P_{05})$ | $(C_{25}, P_{05})$ | $(C_{35}, P_{05})$ | $\theta_{P_{05}}$ |
|---|---|---|---|---|
| 2 | −2 | 2 | −2 | 1 |

| $(C_{05}, P_{15})$ | $(C_{15}, P_{15})$ | $(C_{25}, P_{15})$ | $(C_{35}, P_{15})$ | $\theta_{P_{15}}$ |
|---|---|---|---|---|
| 0 | 2 | 2 | −4 | 1 |

| $(C_{05}, P_{25})$ | $(C_{15}, P_{25})$ | $(C_{25}, P_{25})$ | $(C_{35}, P_{25})$ | $\theta_{P_{25}}$ |
|---|---|---|---|---|
| 2 | 2 | 2 | 2 | 7 |

FIG. 58

Element $E_5$ represents bit $e_5$. $S_{jk}$ ($j + k = 5$).

| $(P_{05}, E_5)$ | $\theta_{E_5}$ |
|---|---|
| 2 | 1 |

FIG. 59

$e_6$ Bit. $S_{33} \leftrightarrow y_3 z_3$.

| $S_{33}$ | $P_{15}$ | $P_{24}$ | $C_{06}$ | $C_{16}$ | $C_{26}$ | $P_{06}$ | $P_{16}$ |
|---|---|---|---|---|---|---|---|
| 0 | 0 | 0 | 0 | 0 | 0 | 0 | 0 |
| 0 | 0 | 1 | 1 | 0 | 0 | 1 | 0 |
| 0 | 1 | 0 | 1 | 0 | 0 | 1 | 0 |
| 1 | 0 | 0 | 1 | 0 | 0 | 1 | 0 |
| 0 | 1 | 1 | 1 | 1 | 0 | 0 | 1 |
| 1 | 0 | 1 | 1 | 1 | 0 | 0 | 1 |
| 1 | 1 | 0 | 1 | 1 | 0 | 0 | 1 |
| 1 | 1 | 1 | 1 | 1 | 1 | 1 | 1 |

FIG. 60

$e_6$ Bit. $S_{jk}$ to $C_{i6}$ Amplitudes and $C_{i6}$ Thresholds

| $(S_{33}, C_{i6})$ | $(P_{15}, C_{i6})$ | $(P_{24}, C_{i6})$ | $\theta_{C_{06}}$ | $\theta_{C_{16}}$ | $\theta_{C_{26}}$ |
|---|---|---|---|---|---|
| 2 | 2 | 2 | 1 | 3 | 5 |

FIG. 61

$C_{j6}$ to $P_{i6}$ Amplitudes and $P_{i6}$ Thresholds

| $(C_{06}, P_{06})$ | $(C_{16}, P_{06})$ | $(C_{26}, P_{06})$ | $\theta_{P_{06}}$ |
|---|---|---|---|
| 2 | −2 | 2 | 1 |

| $(C_{06}, P_{16})$ | $(C_{16}, P_{16})$ | $(C_{26}, P_{16})$ | $\theta_{P_{16}}$ |
|---|---|---|---|
| 0 | 2 | 2 | 1 |

FIG. 62

Element $E_6$ represents bit $e_6$. Amplitude and Threshold

| $(P_{06}, E_6)$ | $\theta_{E_6}$ |
|---|---|
| 2 | 1 |

FIG. 63

Four Bit Multiplication. 1110 * 0111

|   |   |   |   | 1 | 1 | 1 | 0 |
|---|---|---|---|---|---|---|---|
|   |   |   | * | 0 | 1 | 1 | 1 |
|   |   |   |   | 1 | 1 | 1 | 0 |
|   |   |   | 1 | 1 | 1 | 0 |   |
|   |   | 1 | 1 | 1 | 0 |   |   |
|   | 0 | 0 | 0 | 0 |   |   |   |
|   | 1 | 1 | 0 | 0 | 0 | 1 | 0 |
| $e_7$ | $e_6$ | $e_5$ | $e_4$ | $e_3$ | $e_2$ | $e_1$ | $e_0$ |

14 * 7 = 98 in Base 10.

FIG. 64

Four Bit Multiplication. 1011 * 1001

|   |   |   |   | 1 | 0 | 1 | 1 |
|---|---|---|---|---|---|---|---|
|   |   |   | * | 1 | 0 | 0 | 1 |
|   |   |   |   | 1 | 0 | 1 | 1 |
|   |   |   | 0 | 0 | 0 | 0 |   |
|   |   | 0 | 0 | 0 | 0 |   |   |
|   | 1 | 0 | 1 | 1 |   |   |   |
|   | 1 | 1 | 0 | 0 | 0 | 1 | 1 |
| $e_7$ | $e_6$ | $e_5$ | $e_4$ | $e_3$ | $e_2$ | $e_1$ | $e_0$ |

11 * 9 = 99 in Base 10.

FIG. 65

Four Bit Multiplication. 1111 * 1110

|   |   |   |   | 1 | 1 | 1 | 1 |
|---|---|---|---|---|---|---|---|
|   |   |   | * | 1 | 1 | 1 | 0 |
|   |   |   |   | 1 | 1 | 1 | 0 |
|   |   |   | 1 | 1 | 1 | 0 |   |
|   |   | 1 | 1 | 1 | 0 |   |   |
|   | 0 | 0 | 0 | 0 |   |   |   |
| 1 | 1 | 0 | 1 | 0 | 0 | 1 | 0 |
| $e_7$ | $e_6$ | $e_5$ | $e_4$ | $e_3$ | $e_2$ | $e_1$ | $e_0$ |

15 * 14 = 210 in Base 10.

FIG. 66

Four Bit Multiplication. 1111 * 1111

|   |   |   |   | 1 | 1 | 1 | 1 |
|---|---|---|---|---|---|---|---|
|   |   |   | * | 1 | 1 | 1 | 1 |
|   |   |   |   | 1 | 1 | 1 | 1 |
|   |   |   | 1 | 1 | 1 | 1 |   |
|   |   | 1 | 1 | 1 | 1 |   |   |
|   | 1 | 1 | 1 | 1 |   |   |   |
| 1 | 1 | 1 | 0 | 0 | 0 | 0 | 1 |
| $e_7$ | $e_6$ | $e_5$ | $e_4$ | $e_3$ | $e_2$ | $e_1$ | $e_0$ |

15 * 15 = 225 in Base 10.

Quantum Observables Rendering
Random Bits via Value Indefiniteness

A Graphical Representation of Q(x)
Traversing an Infinite Binary Tree
Q(x) accepts language $L_f$. $f: \mathbb{N} \longrightarrow \{0, 1\}$

FIG. 72
A Meta Instruction Execution. Step 1.
States $Q = \{0, 1, 2, 3, 4, 5, 6, 7\}$. Alphabet $A = \{\#, 0, 1\}$.
Meta Instruction $(\#, 0, |Q|-1, 1, 0, J)$ where
$J = (|Q|-1, 1, |Q|, \#, -1)$.
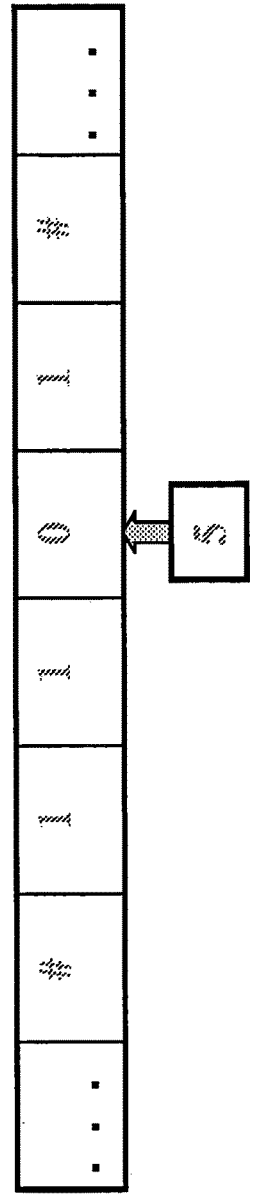
Instruction $(\#, 0, 7, 1, 0)$ is executed, since $|Q| = 8$.
$J = (7, 1, 8, \#, -1)$ is added to the standard instructions.
States $Q$ are updated to $Q = \{0, 1, 2, 3, 4, 5, 6, 7, 8\}$.
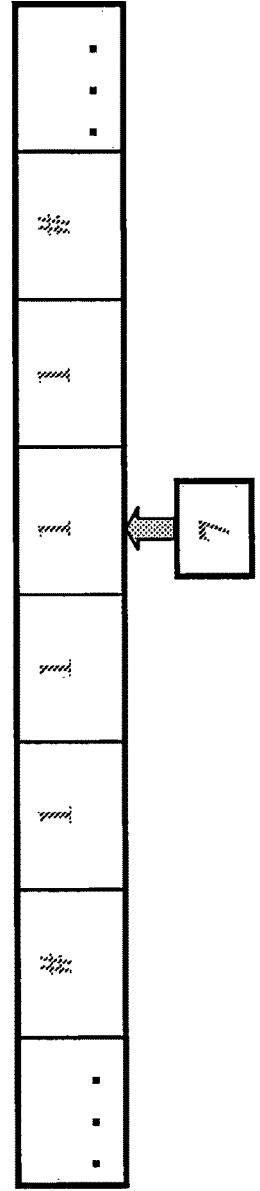

A Meta Instruction Execution. Computational Step 2.

States $Q = \{0, 1, 2, 3, 4, 5, 6, 7, 8\}$. Alphabet $A = \{\#, 0, 1\}$.

Instruction $J = (7, 1, 8, \#, -1)$ is executed.

SECURE NON-DETERMINISTIC, SELF-MODIFIABLE COMPUTING MACHINE

RELATED APPLICATIONS

This application claims priority benefit of U.S. Provisional Patent Application Ser. No. 61/462,260, entitled "Navajo Active Element Machine" filed Jan. 31, 2011, which is incorporated herein by reference. This application claims priority benefit of U.S. Provisional Patent Application Ser. No. 61/465,084, entitled "Unhackable Active Element Machine" filed Mar. 14, 2011, which is incorporated herein by reference. This application claims priority benefit of U.S. Provisional Patent Application Ser. No. 61/571,822, entitled "Unhackable Active Element Machine Using Randomness" filed Jul. 6, 2011, which is incorporated herein by reference. This application claims priority benefit of U.S. Provisional Patent Application Ser. No. 61/572,607, entitled "Unhackable Active Element Machine Unpredictable Firing Interpretations" filed Jul. 18, 2011, which is incorporated herein by reference. This application claims priority benefit of U.S. Provisional Patent Application Ser. No. 61/572,996, entitled "Unhackable Active Element Machine with Random Firing Interpretations and Level Sets" filed Jul. 26, 2011, which is incorporated herein by reference. This application claims priority benefit of U.S. Provisional Patent Application Ser. No. 61/626,703, entitled "Unhackable Active Element Machine with Turing Undecidable Firing Interpretations" filed Sep. 30, 2011, which is incorporated herein by reference. This application claims priority benefit of U.S. Provisional Patent Application Ser. No. 61/628,332, entitled "Unhackable Active Element Machine with Turing Incomputable Firing Interpretations" filed Oct. 28, 2011, which is incorporated herein by reference. This application claims priority benefit of U.S. Provisional Patent Application Ser. No. 61/628,826, entitled "Unhackable Active Element Machine with Turing Incomputable Computation" filed Nov. 7, 2011, which is incorporated herein by reference.

This application is a continuation-in-part of U.S. Non-provisional patent application Ser. No. 13/373,948, entitled "Secure Active Element machine", filed Dec. 6, 2011, which is incorporated herein by reference. This application is a continuation-in-part of European application EP 12 742 528.8, entitled "SECURE ACTIVE ELEMENT MACHINE", filed Jan. 31, 2012, which is incorporated herein by reference.

This application is a continuation-in-part of U.S. Non-provisional patent application Ser. No. 14/643,774, entitled "Non-Deterministic Secure Active Element Machine", filed Mar. 10, 2015. This application is a continuation-in-part of U.S. Non-provisional patent application Ser. No. 16/365,694, entitled "Secure Non-Deterministic Self-Modifiable Computing Machine", filed Mar. 27, 2019. This application claims priority benefit of U.S. Provisional Patent Application Ser. No. 62/682,979, entitled "Quantum Random Self-Modifiable Computer", filed Jun. 10, 2018.

FIELD

The specification generally relates to computing: computing hardware, machine-implemented methods, and machine-implemented systems.

BRIEF DESCRIPTION OF FIGURES AND TABLES

In the following figures, although they may depict various examples of the invention, the invention is not limited to the examples depicted in the figures.

FIG. 14 shows a deterministic machine configuration (q, k, T) with the machine in state q, machine head at memory address k (memory address of the digital computer) and containing alphabet symbol T(k) in memory address k (memory cell k of the digital computer).

FIG. 15 shows the window of execution for one cycle of a periodic point $p = [q, \overline{12\langle 1 \rangle 212222}]$ FIG. 16 shows the pertinent parts of the machine configuration used to determine the unit square domain of a left affine map (2.16) or right affine map (2.19).

FIG. 20 shows case B of the definition the Edge Pattern Substitution Operator.

FIG. 21 shows case C of the definition the Edge Pattern Substitution Operator.

FIG. 22 shows case D of the definition the Edge Pattern Substitution Operator.

FIG. 26 shows the level set rules for each boolean function $f: \{0, 1\} \times \{0, 1\} \to \{0, 1\}$. The level set rules help design an active element machine program that separate elements of $\{(0, 0), (1, 0), (0, 1), (1, 1)\}$.

FIG. 27 shows Minsky's universal deterministic machine.

FIG. 28 shows the Boolean version of the universal deterministic machine in FIG. 27.

FIG. 29 shows the level set rules for $\eta_0$: the $0^{th}$ bit of deterministic program $\eta$ in FIG. 28.

FIG. 30 shows the level set rules for $\eta_1$: the $1^{st}$ bit of deterministic program $\eta$ in FIG. 28.

FIG. 31 shows the level set rules for $\eta_2$: the $2^{nd}$ bit of deterministic program $\eta$ in FIG. 28.

FIG. 32 shows the level set rules for $\eta_3$: the $3^{rd}$ bit of deterministic program $\eta$ in FIG. 28.

FIG. 33 shows the level set rules for $\eta_4$: the $4^{th}$ bit of deterministic program $\eta$ in FIG. 28.

FIG. 34 shows the level set rules for $\eta_5$: the $5^{th}$ bit of deterministic program $\eta$ in FIG. 28.

FIG. 35 shows all sixteen firing patterns of elements $X_0$, $X_1$, $X_2$, $X_3$ which represents four bits that are added using elements $C_0$, $C_1$, $C_2$, $C_3$ and elements $P_0$, $P_1$, $P_2$, $P_3$.

FIG. 36 shows the amplitudes from elements $X_0$, $X_1$, $X_2$, $X_3$ to elements $C_0$, $C_1$, $C_2$, $C_3$ and thresholds for elements $C_0$, $C_1$, $C_2$, $C_3$.

FIG. 37 shows the amplitudes from elements $C_0$, $C_1$, $C_2$, $C_3$ to elements $P_0$, $P_1$, $P_2$, $P_3$ and thresholds for elements $P_0$, $P_1$, $P_2$, $P_3$.

FIG. 38 shows four bit multiplication where one four bit number is $y_3 y_2 y_1 y_0$ and the other four bit number is $z_3 z_2 z_1 z_0$ and the result is $e_7 e_6 e_5 e_4 e_3 e_2 e_1 e_0$ FIG. 39 shows the amplitude and threshold used to compute the value of $e_0$.

FIG. 40 shows the firing patterns for elements $S_{10}$ and $S_{01}$ representing the value of products $y_1 z_0$ and $y_0 z_1$.

FIG. 41 shows the amplitudes from elements $S_{10}$ and $S_{01}$ to elements $C_{01}$ and $C_{11}$ and the thresholds of $C_{01}$ and $C_{11}$.

FIG. 42 shows the amplitude and threshold used to compute the value of $e_1$.

FIG. 43 shows the firing patterns for elements $S_{20}$, $S_{11}$, $S_{02}$ and $C_1$.

FIG. 44 shows the amplitudes from elements $S_{20}$, $S_{11}$ $S_{02}$, $C_{11}$ to elements $C_{02}$, $C_{12}$, $C_{22}$ $C_{32}$ and thresholds of $C_{02}$, $C_{12}$, $C_{22}$ and $C_{32}$.

FIG. 45 shows the amplitudes from elements $C_{02}$, $C_{12}$, $C_{22}$, $C_{32}$ to elements $P_{02}$, $P_{12}$, $P_{22}$ and the thresholds of elements $P_{02}$, $P_{12}$, $P_{22}$.

FIG. 46 shows the amplitude and threshold used to compute the value of $e_2$.

FIG. 47 shows the firing patterns for elements $S_{30}$, $S_{21}$, $S_{12}$, $S_{03}$, $P_{12}$ representing the value of products $y_3 z_0$, $y_2 z_1$, $y_1 z_2$ and $y_0 z_3$ and the carry value.

FIG. 48 shows the amplitudes from elements $S_{30}$, $S_{21}$, $S_{12}$ and $S_{03}$ to elements $C_{03}$, $C_{13}$, $C_{23}$, $C_{33}$, and $C_{43}$.

FIG. 49 shows the amplitudes from elements $C_{03}$, $C_{13}$, $C_{23}$, $C_{33}$, and $C_{43}$ to elements $P_{03}$, $P_{13}$, $P_{23}$ and the thresholds of elements $P_{03}$, $P_{13}$, $P_{23}$. FIG. 50 shows the amplitude and threshold used to compute the value of $e_3$.

FIG. 51 shows the firing patterns for elements $S_{31}$, $S_{22}$, $S_{13}$, $P_{13}$, $P_{22}$.

FIG. 52 shows the amplitudes from elements $S_{31}$, $S_{22}$, $S_{13}$, $P_{13}$, $P_{22}$ to elements $C_{04}$, $C_{14}$, $C_{24}$, $C_{34}$, $C_{44}$ and the thresholds of $C_{04}$, $C_{14}$, $C_{24}$, $C_{34}$ and $C_{44}$.

FIG. 53 shows the amplitudes from elements $C_{04}$, $C_{14}$, $C_{24}$, $C_{34}$, and $C_{44}$ to elements $P_{04}$, $P_{14}$, $P_{24}$ and the thresholds of elements $P_{04}$, $P_{14}$, $P_{24}$.

FIG. 54 shows the amplitude and threshold used to compute the value of $e_4$.

FIG. 55 shows the firing patterns for elements $S_{32}$, $S_{23}$, $P_{14}$, $P_{23}$.

FIG. 56 shows the amplitudes from elements $S_{32}$, $S_{23}$, $P_{14}$, $P_{23}$ to elements $C_{05}$, $C_{15}$, $C_{25}$, $C_{35}$ and the thresholds of $C_{05}$, $C_{15}$, $C_{25}$, $C_{35}$.

FIG. 57 shows the amplitudes from elements $C_{05}$, $C_{15}$, $C_{25}$, $C_{35}$ to elements $P_{05}$, $P_{15}$, $P_{25}$ and the thresholds of elements $P_{05}$, $P_{15}$, $P_{25}$.

FIG. 58 shows the amplitude and threshold used to compute the value of $e_5$.

FIG. 59 shows the firing patterns for elements $S_{33}$, $P_{15}$, $P_{24}$.

FIG. 60 shows the amplitudes from elements $S_{33}$, $P_{15}$, $P_{24}$ to elements $C_{06}$, $C_{16}$, $C_{26}$ and the thresholds of $C_{06}$, $C_{16}$, $C_{26}$.

FIG. 61 shows the amplitudes from elements $C_{06}$, $C_{16}$, $C_{26}$ to elements $P_{06}$, $P_{16}$ and the thresholds of elements $P_{06}$, $P_{16}$.

FIG. 62 shows the amplitude and threshold used to compute the value of $e_6$.

FIG. 63 shows some details of the four bit multiplication 1110*0111.

FIG. 64 shows some details of the four bit multiplication 1011*1001.

FIG. 65 shows some details of the four bit multiplication 1111*1110.

FIG. 66 shows some details of the four bit multiplication 1111*1111.

Figure 69:
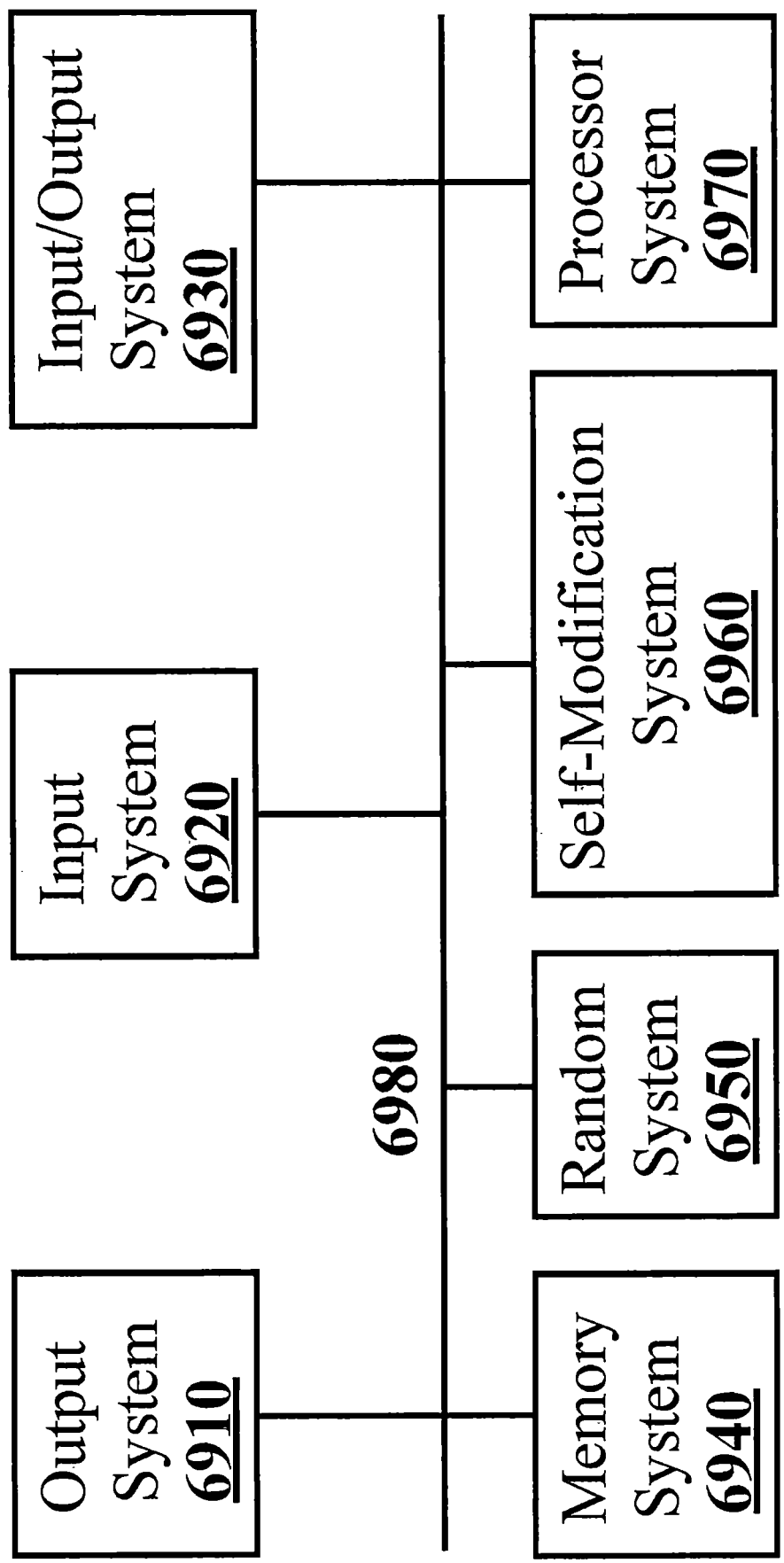

FIG. 69 shows a system level diagram of random self-modifiable computing machine. In an embodiment, processor system 6970 executes standard instructions 6710. Random system 6950 implements random measurements 6730, and executes random instructions 6740. Self-Modification system 6960 executes meta instructions 6720.

Figure 70:
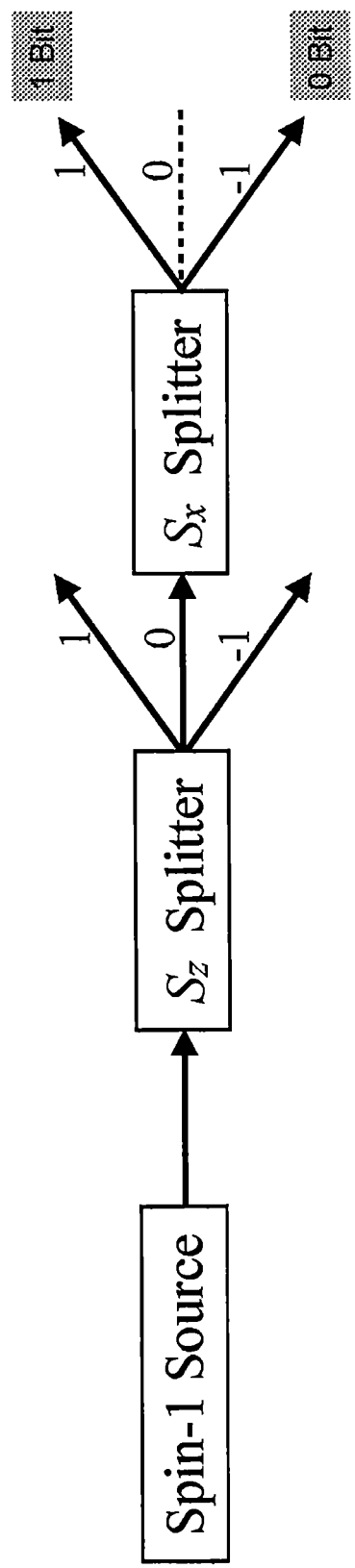

FIG. 70 shows a protocol for measuring quantum randomness, which helps create non-determinism that is useful in secure computation. The protocol helps design an unpredictable physical process which can generate random bits. The quantum observables render random bits via value indefiniteness. The source is obtained from spin-1 particles.

Figure 71:
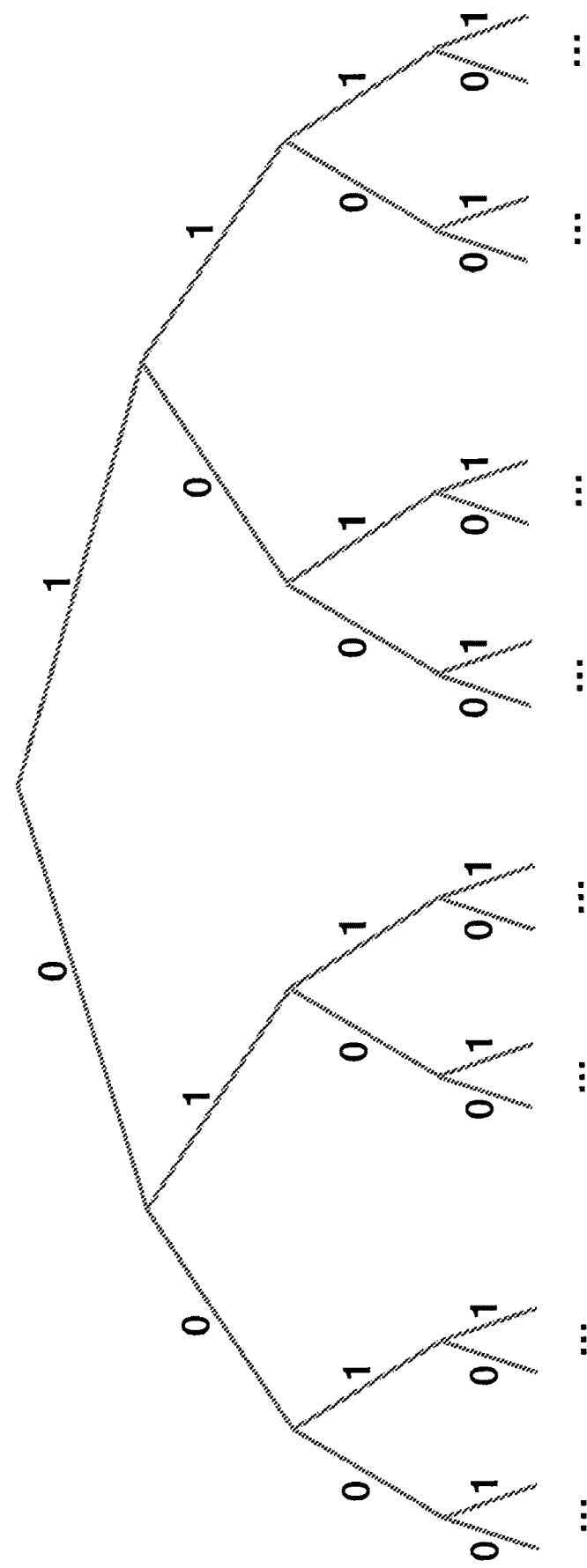

FIG. 71 shows how an infinite binary tree is traversed so that ex-machine $\mathfrak{Q}(x)$ can accept binary languages $L_f$ where $f: \mathbb{N} \to \{0,1\}$.

FIG. 72 shows meta instruction $(q, a_1, |Q|-1, a_1, y_1, J)$ executing the first computational step, where instruction $J=(|Q|-1, a_2, |Q|, a_2, y_2)$.

Figure 73:
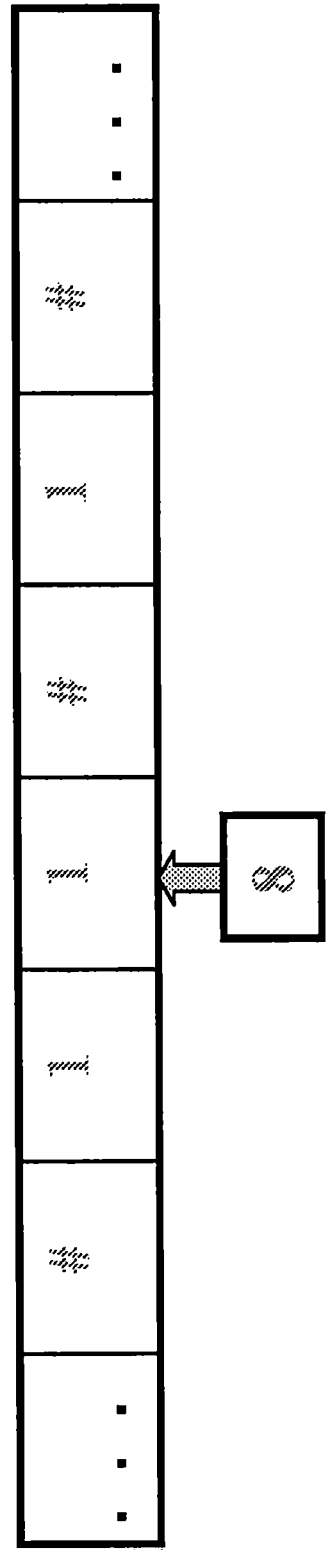

FIG. 73 shows the meta instruction $(q, a_1, |Q|-1, a_1, y_1, J)$ executing the second computational step, where instruction $J=(|Q|-1, a_2, |Q|, a_2, y_2)$.

BRIEF SUMMARY OF PRIOR ART
COMPUTING MODELS AND MACHINES

For completeness, a brief introduction to Turing machines is presented in a later section. In [33], Alan Turing introduces the Turing Machine, which is a basis for the current digital computer. Sturgis and Shepherdson present the register machine in [32] and demonstrate the register machine's computational equivalence to the Turing machine: a Turing machine can compute a function in a finite number of steps if and only if a register machine can also compute this function in a finite number of steps. The works [7], [20],

[21], [22] and [24] cover computability where other notions of computation equivalent to the Turing machine are also described.

In [23], McCulloch and Pitts present one of the early alternative computing models influenced by neurophysiology. In [27], Rosenblatt presents the perceptron model, which has a fixed number of perceptrons and has no feedback (cycles) in its computation. In [25], Minsky and Papert mathematically analyze the perceptron model and attempt to understand serial versus parallel computation by studying the capabilities of linear threshold predicates. In [16], Hopfield shows how to build a content addressable memory with neural networks that use feedback and where each neuron has two states. The number of neurons and connections are fixed during the computation. In [17], Hopfield presents an analog hardware neural network to perform analog computation on the Traveling-Salesman problem, which is NP-complete [12]. Good, suboptimal solutions to this problem are computed by the analog neural network within an elapsed time of only a few neural time constants.

In [18], Hopfield uses time to represent the values of variables. In the conclusion, he observes that the technique of using time delays is similar to that of using radial basis functions in computer science.

In [15], Hertz et al. discuss the Hopfield model and various computing models that extend his work. These models describe learning algorithms and use statistical mechanics to develop the stochastic Hopfield model. They use some statistical mechanics techniques to analyze the Hopfield model's memory capacity and the capacity of the simpler perceptron model.

For early developments on quantum computing models, see [3], [4], [9], [10], [21] and [22]. In [29], Shor discovers a quantum algorithm showing that prime factorization can be executed on quantum computers in polynomical time (i.e. considerably faster than any known classical algorithm). In [13], Grover discovers a quantum search algorithm among n objects that can be completed in $cn^{0.5}$ computational steps.

In [8], Deutsch argues that there is a physical assertion in the underlying Church-Turing hypothesis: Every finitely realizable physical system can be perfectly simulated by a universal model computing machine operating by finite means. Furthermore, Deutsch presents a quantum generalization of the class of Turing machines: a universal quantum computer that covers quantum parallelism and shows an increase in computing speed. This universal quantum computer does not demonstrate the computation of non-Turing computable functions. For the most part, these prior results on computing models have studied the model's speed of computation, memory capacity, learning ability or have demonstrated that a particular computing model is equivalent to the Turing machine (digital computer)—in terms of computability (see [7] pages 10-12).

Limitations and Deficiencies of Prior Art

What are the Limitations of Current Cybersecurity Approaches?

Some prior art (approaches) has tried to conceal and protect a computation by enclosing it in a physical barrier, or by using a virtual barrier, e.g. firewall, or private network. The prior art has not been successful at securing computers, networks and the Internet. Operating system weaknesses and the proliferation of mobile devices and Internet connectivity have enabled malware to circumvent these boundaries.

In regard to confidentiality of data, some prior art uses cryptography based on the P≠NP complexity assumption, which relies on large enough computing bounds to prevent breaking the cryptography. In the future, these approaches may be compromised by more advanced methods such as Shor's algorithm, executing on a quantum computing machine.

In the case of homomorphic cryptography <http://crypto.stanford.edu/craig/> its computing operations are many orders of magnitude too slow. Homomorphic cryptography assumes that the underlying encryption E operations obey the homomorphism ring laws $E(x+y)=E(x)+E(y)$ and $E(x)\cdot E(y)=E(x\cdot y)$ <http://tinyurl.com/4csspud>. If the encrypted execution is tampered with (changed), then this destroys the computation even though the adversary may be unable to decrypt it. This is analogous to a DDoS attack in that you don't have to be able to read confidential data to breach the cybersecurity of a system. Homomorphic cryptography executing on a register machine along with the rest of the prior art is still susceptible to fundamental register machine weaknesses discussed below.

Some prior art has used the evolution of programs executing on a register machine (von=Neumann architecture) architecture. [Fred Cohen, "Operating Systems Protection Through Program Evolution", IFIP-TC11 'Computers and Security' (1993) V12#6 (October 1993) pp. 565-584].

The von Neumann architecture is a computing model for a stored-program digital computer that uses a CPU and a separate structure (memory) to store both instructions and data. Generally, a single instruction is executed at a time in sequential order and there is no notion of time in von-Neumann machine instructions: This creates attack points for malware to exploit.

In the prior art, computer program instructions are computed the same way at different instances: fixed representation of the execution of a program instruction. For example, the current microprocessors have the fixed representation of the execution of a program instruction property. (See. http://en.wikipedia.org/wiki/Microprocessor.) The processors made by Intel, Qualcomm, Samsung, Texas Instrument and Motorola use a fixed representation of the execution of their program instructions. (See www.intel.com http://en.wikipedia.org/wiki/Intel_processor, http://www.qualcomm.com/, www.samsung.com and http://www.ti.com/).

The ARM architecture, which is licensed by many companies, uses a fixed representation of the execution of its program instructions. (See www.arm.com and http://en.wikipedia.org/wiki/Arm_instruction_set.) In the prior art, not only are the program instructions computed the same way at different instances, there are also a finite number of program instructions representable by the underlying processor architecture. This affects the compilation of a computer program written into the processor's (machine's) program instructions.

As a consequence, the compiled machine instructions generated from a program written in a programming language such as—C, JAVA, C++, Fortran, Go, assembly language, Ruby, Forth, LISP, Haskell, RISC machine instructions, java virtual machine, Python or even a Turing machine program—are computed the same way at different instances. This fixed representation of the execution of a program instruction property in the prior art makes it easier for malware to exploit security weaknesses in these computer programs.

Non-Deterministic, Self-Modifiable Machines

Consider two fundamental questions in computer science, which influence the design of current digital computers and play a fundamental role in hardware and machine-implemented software of the prior art:
1. What can a computing machine compute?
2. How many computational steps does a computational machine require to solve an instance of the 3-SAT problem? The 3-SAT problem [12] is the basis for the famous $P \stackrel{?}{=} NP$ problem [12].

Advantages Over the Prior Art

In the prior art, the two questions are typically conceived and implemented with hardware and software that compute according to the Turing machine (TM) [33] (i.e., standard digital computer [36]) model, which is the standard model of computation [7,8,12,20,24,33] in the prior art.

Figure 67:
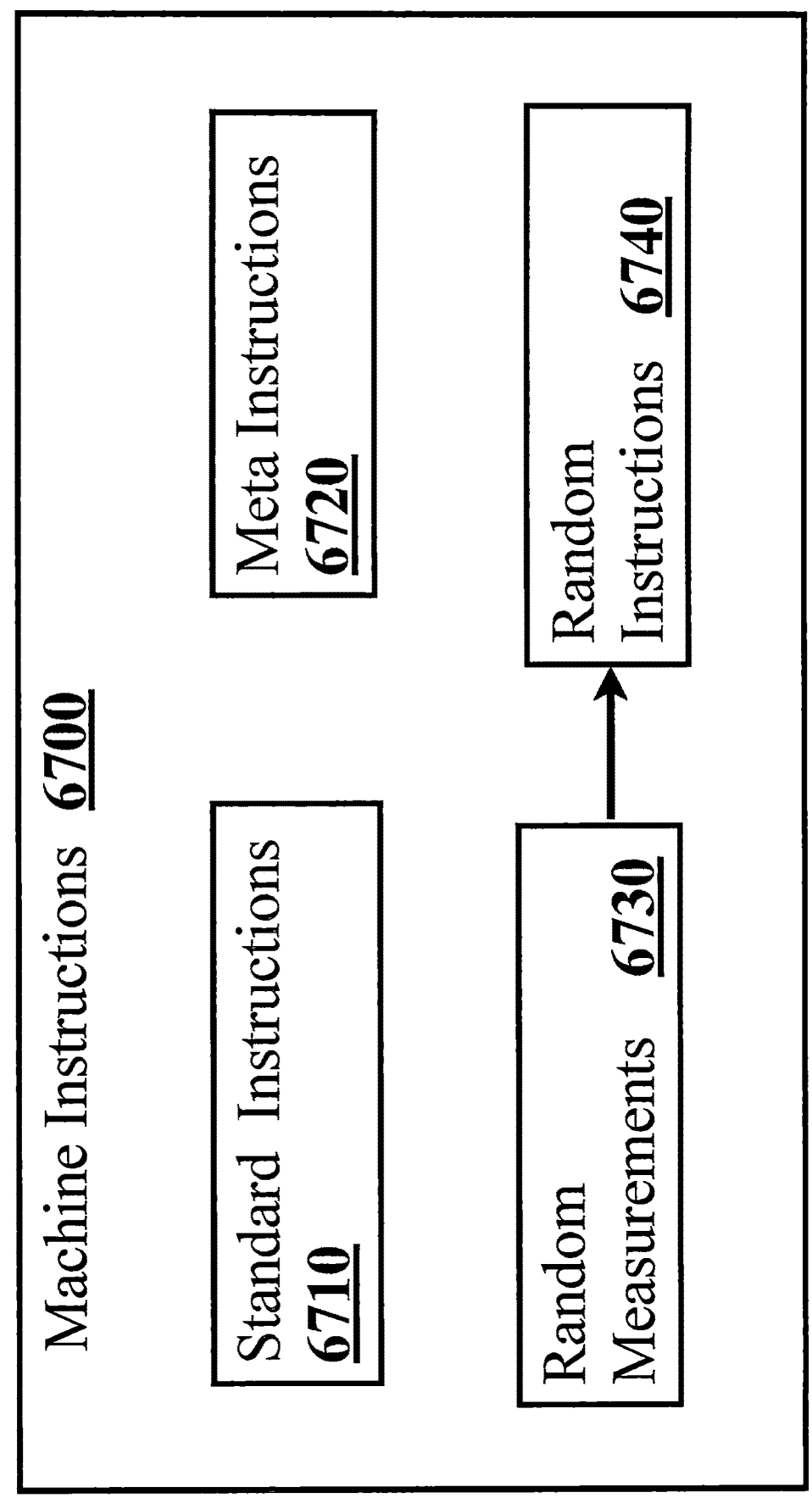
FIG. 67 shows an embodiment of a non-deterministic, self-modifiable computing machine. Machine 6700 consists of standard machine instructions (digital computer) 6710, meta instructions 6720, random measurements 6730, and random instructions 6740.

In this invention(s), embodiments advance beyond the prior art, by applying new machine-implemented methods and hardware to secure computation and cryptography. The machine embodiments bifurcate the first question into two questions. What is computation? What can computation compute? An machine computation adds two special types of instructions to the standard digital computer [36] instructions 6710, as shown in FIG. 67. Some embodiments are referred as an ex-machine—derived from the latin extra machinam—because ex-machine computation generates new dynamical behaviors that one may no longer recognize as a standard digital computer or typical machine.

One type of special machine instruction is meta instruction 6720 in FIG. 67. In some embodiments, meta instructions 6720 help make up Self-Modifiable system 6960, shown in FIG. 69. When an ex-machine executes a meta instruction, the meta instruction can add new states and add new instructions or replace instructions. Unlike a typical machine in the generic sense (e.g., the inclined plane, lever, pulley, wedge, wheel and axle, Archimedean screw, Galilean telescope, or bicycle), the meta instruction enables the complexity [28] of an ex-machine to increase.

The other special instruction is a random instruction 6740 in FIG. 67 that can be physically realized with quantum random measurements 6730. In some embodiments, a light emitting diode, shown in FIG. 24 and FIG. 25, emits photons that quantum random measurements 6730 detect. In other embodiments, random instruction 6740 can be realized with non-determinism, generated from a physical process such as atmospheric noise, sound, moisture, temperature measurements, pressure measurements, fluid turbulence, memory head read times in a digital computer due to air turbulence or friction in the hardware memory head, protein folding, Due to random instructions 6740, the execution behavior of two ex-machines may be distinct, even though the two ex-machines start their execution with the same input in memory, the same program instructions, the same initial machine states, and so on. Two distinct identical ex-machines may exhibit different execution behaviors even when started with identical initial conditions. When this property of the random instructions is combined with the appropriate use of meta instructions 6720, two identical machines with the same initial conditions can evolve to two different computations as the execution of each respective machine proceeds: this unpredictable behavior is quite useful in secure computations and cryptographic computations. This property makes it more challenging for an adversary to attack or tamper with the computation.

Some of the ex-machine programs provided here compute beyond the Turing barrier (i.e., beyond the computing capabilities of the digital computer). Computing beyond this barrier has advantages over the prior art, particularly for embodiments of secure computation and cryptographic computation. Furthermore, these embodiments provide machine programs for computing languages that a register machine, standard digital computer or Turing machine is not able to compute. In this invention(s), a countable set of ex-machines are explicitly specified, using standard instructions, meta instructions and random instructions. Every one of these ex-machines can evolve to compute a Turing incomputable language with probability measure 1, whenever the random measurements (trials) behave like unbiased Bernoulli trials. (A Turing machine [33] or digital computer [36] cannot compute a Turing incomputable language.)

Our invention describes a quantum random, self-modifiable computer that adds two special types of instructions to standard digital computer instructions [36] and [7,12,20,24, 32,33]. Before the quantum random and meta instructions are defined, we present some preliminary notation, and specification for standard instructions.

$\mathbb{Z}$ denotes the integers. $\mathbb{N}$ and $\mathbb{N}^+$ are the non-negative and positive integers, respectively. The finite set Q={0, 1, 2, . . . , n−1} ⊂ $\mathbb{N}$ represents the ex-machine states. This representation of the ex-machine states helps specify how new states are added to Q when a meta instruction is executed. Let $\mathfrak{U}$={$a_1$, . . . , $a_n$}, where each $a_i$ represents a distinct symbol. The set A={0, 1, #} ∪ $\mathfrak{U}$ consists of alphabet (memory) symbols, where # is the blank symbol and {0, 1, #} ∩ $\mathfrak{U}$ is the empty set. In some ex-machines, A={0, 1, #, Y, N, a}, where $a_1$=Y, $a_2$=N, $a_3$=a. In some ex-machines, A={0, 1, #}, where $\mathfrak{U}$ is the empty set. The alphabet symbols are read from and written from memory. The ex-machine memory T is represented by function T: $\mathbb{Z} \to A$ with an additional condition: before ex-machine execution starts, there exists an N>0 so that T(k)=# when |k|>N. In other words, this mathematical condition means all memory addresses contain blank symbols, except for a finite number of memory addresses. When this condition holds for memory T, we say that memory T is finitely bounded.

1.1 Standard Instructions

Machine Specification 1.1.

Execution of Standard Instructions 6710 in FIG. 67

The standard ex-machine instructions $\mathcal{S}$ satisfy $\mathcal{S} \subset Q \times A \times Q \times A \times \{-1, 0, 1\}$ and a uniqueness condition: If $(q_1, \alpha_1, r_1, a_1, y_1) \in \mathcal{S}$ and $(q_2, \alpha_2, r_2, a_2, y_2) \in \mathcal{S}$ and $(q_1, \alpha_1, r_1, a_1, y_1) \ne (q_2, \alpha_2, r_2, a_2, y_2)$, then $q_1 \ne q_2$ or $\alpha_1 \ne \alpha_2$. A standard instruction I=(q, a, r, α, y) is similar to a Turing machine tuple [7,33]. When the ex-machine is in state q and the memory head is scanning alphabet symbol a=T(k) at memory address k, instruction I is executed as follows:

The ex-machine state moves from state q to state r.
The ex-machine replaces alphabet symbol a with alphabet symbol α so that T(k)=α. The rest of the memory remains unchanged.
If y=−1, the ex-machine moves its memory head, pointing one memory cell to the left (lower) in memory and is subsequently scanning the alphabet symbol T(k−1) at memory address k−1.
If y=+1, the ex-machine moves its memory head, point one memory cell to the right (higher) in memory and is subsequently scanning the alphabet symbol T(k+1) at memory address k+1.
If y=0, the ex-machine does not moves its memory head and is subsequently scanning the alphabet symbol T(k)=α at memory address k.

In other embodiments, standard instructions 6710 in FIG. 67 may be expressed with C syntax such as x=x+1; or z=(x+1)*y. In some embodiments, one of the standard instructions 6710 may selected may be a loop with a body of machine instructions such as:

```
n = 5000;
for(i = 0; i < n; i++)
{
    . . . /* body of machine instructions, expressed in C. */
}
```

In some embodiments, random instruction 6740 may measure a random bit, called random_bit and then non-deterministically execute according to following code:

```
if(random_bit == 1)
    C_function_1( );
else if (random_bit == 0)
    C_function_2( );
```

Figure 68:
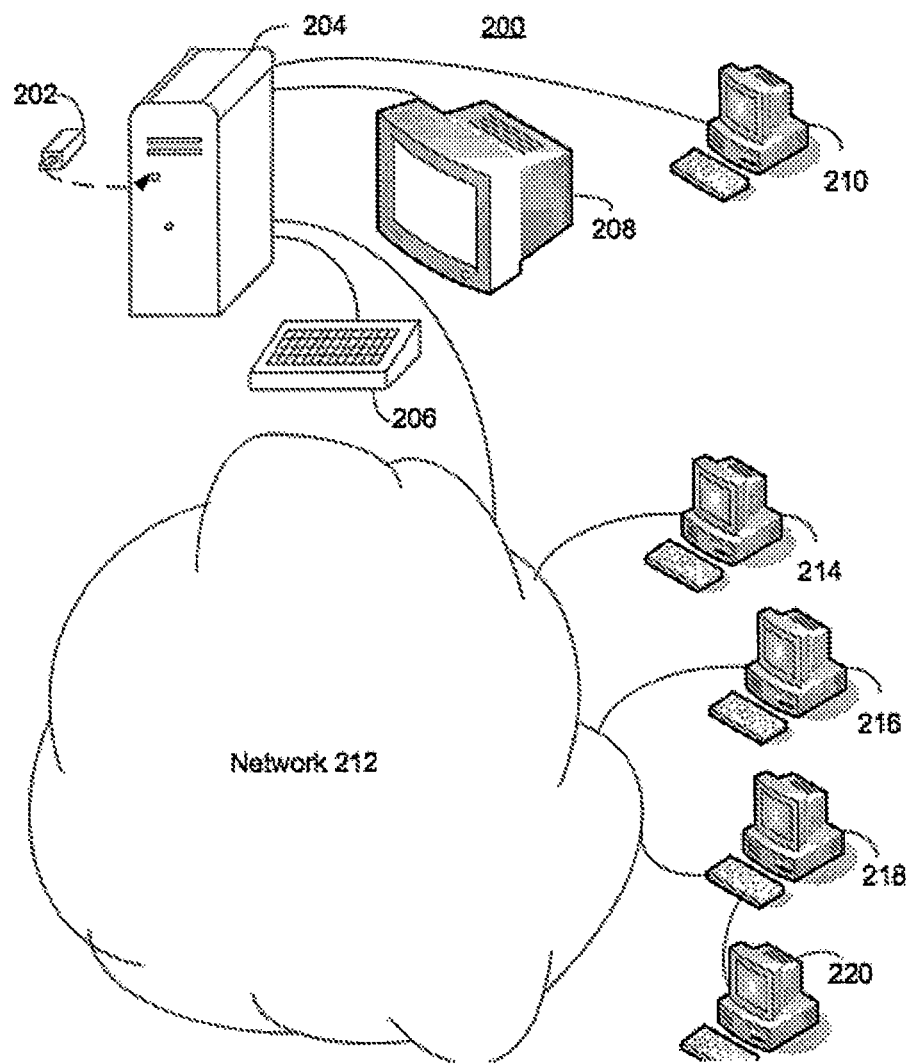
FIG. 68 shows a network of computers that contain hardware and software for implementing standard instructions 6710, meta instructions 6720 and quantum random measurements 6730, and quantum random instructions 6740.

In other embodiments, the standard instructions 6710 may have a programming language syntax such as assembly language, C++, Fortran, JAVA, JAVA virtual machine instructions, Go, Haskell, RISC machine instructions, Ruby, LISP and execute on hardware 204, shown in FIG. 68.

1 Ex-Machine Computer

A Turing machine [33] or digital computer program [36] has a fixed set of machine states Q, a finite alphabet A, a finitely bounded memory, and a finite set of standard ex-machine instructions that are executed according to specification 1.1. In other words, an ex-machine that uses only standard instructions [36] is computationally equivalent to a Turing machine. An ex-machine with only standard instructions is called a standard machine or digital computer. A standard machine has no unpredictability because it contains no random instructions. A standard machine does not modify its instructions as it is computing.

Random Instructions

The random instructions $\mathcal{R}$ are subsets of $Q \times A \times Q \times \{-1, 0, 1\} = \{(q, a, r, y): q, r$ are in Q and a in A and y in $\{-1, 0, 1\}\}$ that satisfy a uniqueness condition defined below.

Machine Specification 1.2.

Execution of Random Instructions 6740 in FIG. 67

In some embodiments, the random instructions $\mathcal{R}$ satisfy $\mathcal{R} \subset Q \times A \times Q \times \{-1, 0, 1\}$ and the following uniqueness condition: If $(q_1, \alpha_1, r_1, y_1) \in \mathcal{R}$ and $(q_2, \alpha_2, r_2, y_2) \in \mathcal{R}$ and $(q_1, \alpha_1, r_1, y_1) \neq (q_2, \alpha_2, r_2, y_2)$, then $q_1 \neq q_2$ or $\alpha_1 \neq \alpha_2$. When the machine head is reading alphabet symbol a from memory and the machine is in machine state q, the random instruction (q, a, r, y) executes as follows:

The machine measures a random source 6730 that returns a random bit $b \in \{0, 1\}$. (In some embodiments, the source of non-determinism is a quantum phenomena. In some embodiments, quantum measurements satisfy unbiased Bernoulli trial axioms 1 and 2.)

In memory, alphabet symbol a is replaced with random bit b.

(This is why A contains both symbols 0 and 1.)

The machine state changes to machine state r.

The machine moves its memory head left if y=−1, right if y=+1, or the memory head does not move if y=0.

Repeated independent trials are called random Bernoulli trials (William Feller. An Introduction to Probability Theory and Its Applications. Volume 1, 1968.) if there are only two possible outcomes for each trial (i.e., random measurement) and the probability of each outcome remains constant for all trials. Unbiased means the probability of both outcomes is the same. The random or non-deterministic properties can be expressed mathematically as follows.

Random Measurement Property 1.

Unbiased Trials.

Consider the bit sequence $(x_1\ x_2\ \ldots)$ in the infinite product space $\{0, 1\}^{\mathcal{N}}$. A single outcome $x_i$ of a bit sequence $(x_1\ x_2\ \ldots)$ generated by randomness is unbiased. The probability of measuring a 0 or a 1 are equal: $P(x_i=1)$ $P(x_i=0)=\frac{1}{2}$.

Random Measurement Property 2.

Stochastic Independence.

History has no effect on the next random measurement. Each outcome x, is independent of the history. No correlation exists between previous or future outcomes. This is expressed in terms of the conditional probabilities: $P(x_i=1|x_1=b_1, \ldots, x_{i-1}=b_{i-1})=\frac{1}{2}$ and $P(x_i=0|x_1=b_1, \ldots, x_{i-1}=b_{i-1})=\frac{1}{2}$ for each $b_i \in \{0, 1\}$.

Figure 23:
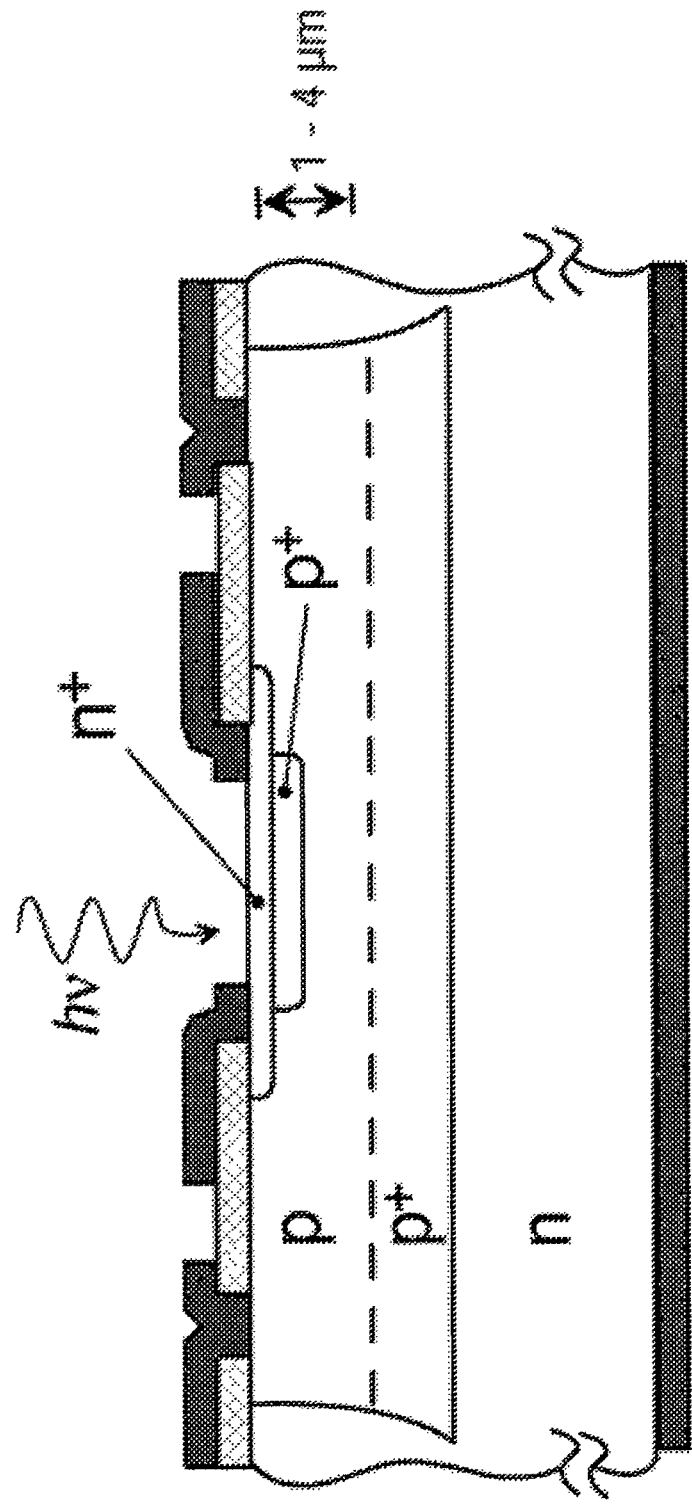
FIG. 23 shows a diagram of an embodiment of a semiconductor chip that can detect photons and generates a non-deterministic process.

In some embodiments, non-deterministic generator 142 in FIG. 23 has properties 1 and 2. In other embodiments, physical devices that are built with quantum observables according to FIG. 70 exhibit properties 1 and 2 when measurements are taken by the physical device. In some embodiments, spin-1 source, shown in FIG. 70, may come from electrons.

Section 2 provides a physical basis for the properties and a discussion of quantum randomness for some embodiments of non-determinism.

Machine instructions 1 lists a random walk machine that has only standard instructions and random instructions. Alphabet $A=\{0, 1, \#, E\}$. The states are $Q=\{0, 1, 2, 3, 4, 5, 6, h\}$, where the halting state h=7. A valid initial memory contains only blank symbols; that is, # ##. The valid initial state is 0.

There are three random instructions: (0, #, 0, 0), (1, #, 1, 0) and (4, #, 4, 0). The random instruction (0, #, 0, 0) is executed first. If the random source measures a 1, the machine jumps to state 4 and the memory head moves to the right of memory address 0. If the random source measures a 0, the machine jumps to state 1 and the memory head moves to the left of memory address 0. Instructions containing alphabet value E provide error checking for an invalid initial memory or initial state; in this case, the machine halts with an error.

Machine Instructions 1.

Random Walk

;; Comments follow two semicolons.

(0, #, 0, 0)
(0, 0, 1, 0, −1)
(0, 1, 4, 1, 1)
;; Continue random walk to the left of memory address 0
(1, #, 1, 0)
(1, 0, 1, 0, −1)
(1, 1, 2, #, 1)
(2, 0, 3, #, 1)
(2, #, h, E, 0)
(2, 1, h, E, 0)
;; Go back to state 0. Numbers of random 0's=number of random 1's.
(3, #, 0, #, −1)
;; Go back to state 1. Numbers of random 0's>number of random 1's.
(3, 0, 1, 0, −1)
(3, 1, h, E, 0)
;; Continue random walk to the right of memory address 0
(4, #, 4, 0)
(4, 1, 4, 1, 1)

(4, 0, 5, #, −1)
(5, 1, 6, #, −1)
(5, #, h, E, 0)
(5, 0, h, E, 0)
;; Go back to state 0. Numbers of random 0's=number of random 1's.
(6, #, 0, #, 1)
;; Go back to state 4. Numbers of random 1's>number of random 0's.
(6, 1, 4, 1, 1)
(6, 0, h, E, 0)

Below are 31 computational steps of the ex-machine's first execution. This random walk machine never halts when the initial memory is blank and the initial state is 0. The first random instruction executed is (0, #, 0, 0). The random source measured a 0, so the execution of this instruction is shown as (0, #, 0, 0_qr, 0). The second random instruction executed is (1, #, 1, 0). The random source measured a 1, so the execution of instruction (1, #, 1, 0) is shown as (1, #, 1, 1_qr, 0).

1st Execution of Random Walk Machine. Computational Steps 1-31.

| STATE | MEMORY | MEMORY ADDRESS | INSTRUCTION |
|---|---|---|---|
| 0 | ##### 0## | 0 | (0, #, 0, 0_qr, 0) |
| 1 | #### #0## | −1 | (0, 0, 1, 0, −1) |
| 1 | #### 10## | −1 | (1, #, 1, 1_qr, 0) |
| 2 | ##### 0## | 0 | (1, 1, 2, #, 1) |
| 3 | ###### ## | 1 | (2, 0, 3, #, 1) |
| 0 | ##### ### | 0 | (3, #, 0, #, −1) |
| 0 | ##### 0## | 0 | (0, #, 0, 0_qr, 0) |
| 1 | #### #0## | −1 | (0, 0, 1, 0, −1) |
| 1 | #### 00## | −1 | (1, #, 1, 0_qr, 0) |
| 1 | ### #00## | −2 | (1, 0, 1, 0, −1) |
| 1 | ### 000## | −2 | (1, #, 1, 0_qr, 0) |
| 1 | ## #000## | −3 | (1, 0, 1, 0, −1) |
| 1 | ## 1000## | −3 | (1, #, 1, 1_qr, 0) |
| 2 | ### 000## | −2 | (1, 1, 2, #, 1) |
| 3 | #### 00## | −1 | (2, 0, 3, #, 1) |
| 1 | ### #00## | −2 | (3, 0, 1, 0, −1) |
| 1 | ### 100## | −2 | (1, #, 1, 1_qr, 0) |
| 2 | #### 00## | −1 | (1, 1, 2, #, 1) |
| 3 | ##### 0## | 0 | (2, 0, 3, #, 1) |
| 1 | ##### 0## | −1 | (3, 0, 1, 0, −1) |
| 1 | #### 10## | −1 | (1, #, 1, 1_qr, 0) |
| 2 | #### #0## | 0 | (1, 1, 2, #, 1) |
| 3 | ###### ## | 1 | (2, 0, 3, #, 1) |
| 0 | ##### ### | 0 | (3, #, 0, #, −1) |
| 0 | ##### 0## | 0 | (0, #, 0, 0_qr, 0) |
| 1 | #### #0## | −1 | (0, 0, 1, 0, −1) |
| 1 | #### 00## | −1 | (1, #, 1, 0_qr, 0) |
| 1 | ### #00## | −2 | (1, 0, 1, 0, −1) |
| 1 | ### 000## | −2 | (1, #, 1, 0_qr, 0) |
| 1 | ## #000## | −3 | (1, 0, 1, 0, −1) |
| 1 | ## 1000## | −3 | (1, #, 1, 1_qr, 0) |

Below are the first 31 steps of the ex-machine's second execution. The first random instruction executed is (0, #, 0, 0). The random bit measured was 1, so the result of this instruction is shown as (0, #, 0, 1_qr, 0). The second random instruction executed is (1, #, 1, 0), which measured a 0, so the result of this instruction is shown as (1, #, 1, 0_qr, 0).

2nd Execution of Random Walk Machine. Computational Steps 1-31.

| STATE | MEMORY | MEMORY ADDRESS | INSTRUCTION |
|---|---|---|---|
| 0 | ## 1##### | 0 | (0, #, 0, 1_qr, 0) |
| 4 | ##1 ##### | 1 | (0, 1, 4, 1, 1) |
| 4 | ##1 0#### | 1 | (4, #, 4, 0_qr, 0) |
| 5 | ## 1##### | 0 | (4, 0, 5, #, −1) |
| 6 | # ####### | −1 | (5, 1, 6, #, −1) |
| 0 | ## ###### | 0 | (6, #, 0, #, 1) |
| 0 | ## 1##### | 0 | (0, #, 0, 1_qr, 0) |
| 4 | ##1 ##### | 1 | (0, 1, 4, 1, 1) |
| 4 | ##1 1#### | 1 | (4, #, 4, 1_qr, 0) |
| 4 | ##11 #### | 2 | (4, 1, 4, 1, 1) |
| 4 | ##11 1### | 2 | (4, #, 4, 1_qr, 0) |
| 4 | ##111 ### | 3 | (4, 1, 4, 1, 1) |
| 4 | ##111 1## | 3 | (4, #, 4, 1_qr, 0) |
| 4 | ##1111 ## | 4 | (4, 1, 4, 1, 1) |
| 4 | ##1111 0# | 4 | (4, #, 4, 0_qr, 0) |
| 5 | ##111 1## | 3 | (4, 0, 5, #, −1) |
| 6 | ##11 1### | 2 | (5, 1, 6, #, −1) |
| 4 | ##111 ### | 3 | (6, 1, 4, 1, 1) |
| 4 | ##111 0## | 3 | (4, #, 4, 0_qr, 0) |
| 5 | ##11 1### | 2 | (4, 0, 5, #, −1) |
| 6 | ##1 1#### | 1 | (5, 1, 6, #, −1) |
| 4 | ##11 #### | 2 | (6, 1, 4, 1, 1) |
| 4 | ##11 0### | 2 | (4, #, 4, 0_qr, 0) |
| 5 | ##1 1#### | 1 | (4, 0, 5, #, −1) |
| 6 | ## 1##### | 0 | (5, 1, 6, #, −1) |
| 4 | ##1 ##### | 1 | (6, 1, 4, 1, 1) |
| 4 | ##1 0#### | 1 | (4, #, 4, 0_qr, 0) |
| 5 | ## 1##### | 0 | (4, 0, 5, #, −1) |
| 6 | # ####### | −1 | (5, 1, 6, #, −1) |
| 0 | ## ###### | 0 | (6, #, 0, #, 1) |
| 0 | ## 0##### | 0 | (0, #, 0, 0_qr, 0) |
| 1 | # #0##### | −1 | (0, 0, 1, 0, −1) |

The first and second executions of the random walk ex-machine verify our statement in the introduction: in contrast with the Turing machine, the execution behavior of the same ex-machine may be distinct at two different instances, even though each instance of the ex-machine starts its execution with the same input, stored in memory, the same initial states and same initial instructions. Hence, the ex-machine is a discrete, non-autonomous dynamical system.

Meta Instructions

Meta instructions are the second type of special instructions, as shown in 6720 of FIG. 67. The execution of a meta instruction enables the ex-machine to self-modify its instructions. This means that an ex-machine's meta instructions can add new states add new instructions or replace instructions. Formally, the meta instructions $\mathcal{M}$ satisfy $\mathcal{M} \subset \{(q, a, r, \alpha, y, J): q \in Q$ and $r \in Q \cup \{|Q|\}$ and $a, \alpha \in A$ and instruction $J \in \mathcal{S} \cup \mathcal{R}\}$.

Define $\mathcal{I} = \mathcal{S} \cup \mathcal{R} \cup \mathcal{M}$, as the set of standard, quantum random, and meta instructions. To help describe how a meta instruction modifies $\mathcal{I}$ in self-modification system 6960 of FIG. 69, the unique state, scanning symbol condition is defined. For any two distinct instructions chosen from $\mathcal{I}$ at least one of the first two coordinates must differ. More precisely, all 6 of the following uniqueness conditions must hold.

1. If $(q_1, \alpha_1, r_1, \beta_1, y_1)$ and $(q_2, \alpha_2, r2, \beta_2, y_2)$ are both in $\mathcal{S}$, then $q_1 \neq q_2$ or $\alpha_1 \neq \alpha_2$.
2. If $(q_1, \alpha_1, r_1, \beta_1, y_1) \in \mathcal{S}$ and $(q_2, \alpha_2, r_2, y) \in \mathcal{R}$, then $q_1 \neq q_2$ or $\alpha_1 \neq \alpha_2$.
3. If $(q_1, \alpha_1, r_1, y_1)$ and $(q_2, \alpha_2, r_2, y_2)$ are both in $\mathcal{S}$, then $q_1 \neq q_2$ or $\alpha_1 \neq \alpha_2$.
4. If $(q_1, \alpha_1, r_1, y_1) \in \mathcal{R}$ and $(q_2, \alpha_2, r_2, a_2, y_2, J_2) \in \mathcal{M}$, then $q_1 \neq q_2$ or $\alpha_1 \neq \alpha_2$.
5. If $(q_1, \alpha_1, r_1, \beta_1, y_1) \in \mathcal{S}$ and $(q_2, \alpha_2, r_2, a_2, y_2, J_2) \in \mathcal{M}$, then $q_1 \neq q_2$ or $\alpha_1 \neq \alpha_2$.
6. If $(q_1, \alpha_1, r_1, a_1, y_1, J_1)$ and $(q_2, \alpha_2, r_2, a_2, y_2, J_2)$ are both in $\mathcal{S}$, then $q_1 \neq q_2$ or $\alpha_1 \neq \alpha_2$.

Before a valid machine execution starts, a hardware machine, shown as a system in FIG. 69, should be designed so that the standard, quantum random and meta instructions $\mathcal{S} \cup \mathcal{SU} \, \mathcal{M}$ always satisfy the unique state, scanning symbol condition. This condition assures that there is no ambiguity on what machine instruction should be executed when the machine is in state q and is scanning symbol a in memory. An ambiguity could create a physical situation where no more instructions are executed: this is analogous to a flip-flop that has not yet settled upon a 0 or 1 output (i.e., Buridan's ass). Furthermore, the execution of a meta instruction preserves this uniqueness condition.

Specification 1.3 is an embodiment of self-modification system 6960 in FIG. 69. Specification 1.3 is also an embodiment of meta instructions 6720 in FIG. 67.

Machine Specification 1.3.
Execution of Meta Instructions 6720 in FIG. 67
A meta instruction (q, a, r, α, y, J) in $\mathcal{M}$ is executed as follows.

The first five coordinates (q, a, r, α, y) are executed as a standard instruction according to specification 1.1 with one caveat. State q may be expressed as $|Q|-c_1$ and state r may be expressed as $|Q|$ or $|Q|-c_2$, where $0 < c_1, c_2 \leq |Q|$. When (q, a, r, α, y) is executed, if q is expressed as $|Q|-c_1$, the value of q is instantiated to the current value of $|Q|$ minus $c_1$. Similarly, if r is expressed as $|Q|$ or $|Q|-c_2$, the value of state r is instantiated to the current value of $|Q|$ or $|Q|$ minus $c_2$, respectively.

Subsequently, instruction J modifies $\mathcal{I}$ where instruction J has one of the two forms: J (q, a, r, α, y) or J=(q, a, r, y).

For both forms, if $\mathcal{I} \cup \{J\}$ still satisfies the unique state, scanning symbol condition, then $\mathcal{I}$ is updated to $\mathcal{I} \cup \{J\}$.

Otherwise, there is an instruction I in $\mathcal{I}$ whose first two coordinates q, a, are equal to instruction J's first two coordinates. In this case, instruction J replaces instruction I in $\mathcal{I}$. That is, $\mathcal{I}$ is updated to $\mathcal{I} \cup \{J\} - \{I\}$.

In regard to specification 1.3, embodiment 1 shows how instruction I is added to $\mathcal{I}$ and how new states are instantiated and added to Q.

Machine Embodiment 1

Adding New Machine States

Consider the meta instruction (q, $a_1$, $|Q|-1$, $\alpha_1$, $y_1$, J), where J ($|Q|-1-1$, $a_2$, $|Q|$, $\alpha_2$, $y_2$). After the standard instruction (q, $a_1$, $|Q|-1$, $\alpha_1$, $y_1$) is executed, this meta instruction adds one new state $|Q|$ to the machine states Q and also adds the instruction J, instantiated with the current value of $|Q|$. FIG. 72 shows the execution of the first computational step for this meta instruction—for the specific values Q={0, 1, 2, 3, 4, 5, 6, 7}, A={#, 0, 1}, q=5, $a_1$=0, $a_1$=1, $y_1$=0, $a_2$=1, $\alpha_2$=#, and $y_2$=-1. States and alphabet symbols are shown in red and blue, respectively. FIG. 73 shows the execution of the second computational step for meta instruction (q, $a_1$, $|Q|-1$, $\alpha_1$, $y_1$, J), where J=($|Q|-1$, $a_2$, $|Q|$, $\alpha_2$, $y_2$). FIGS. 72 and 73 illustrate how new machine states are added to Q, as a result of executing the meta instruction.

In other embodiments, meta instructions 6720 in FIG. 67 may be implemented in hardware that can count the number of machine states and has instantiation hardware to instantiate a meta instruction based on the current number of states. In hardware, extra instructions created by the execution of a meta instruction can be stored in this hardware, implementing memory system 6940 of FIG. 69. In other embodiments, meta instructions 6720 in FIG. 67 may be implemented in a more abstract programming language. In some embodiments, meta instructions 6720 can be implemented the LISP programming language and executed on computing machine 204, shown in FIG. 68.

Below is an example of how meta instructions 6720 in FIG. 67 can be expressed in LISP. The following LISP code takes a lambda function, named y_plus_x with two arguments x and y and adds them. The code self-modifies lambda function y_plus_x, expressed as (lambda (y x) (+y x)) to construction a lambda function (lambda (x) (+x x)) that takes one argument x as input and doubles x.

```
;;
;; ex_fn.lsp
;;
;; Author: Michael Stephen Fiske
(set 'y_plus_x (lambda (y x) (+ y x)) )
(define (meta_replace_arg1_with_arg2 lambda_fn)
    (letn (
        (lambda_args (first lambda_fn) )
        (num_args (length lambda_args) )
        (arg1 (first lambda_args) )
        (body (rest lambda_fn) )
        (i 0)
        (arg2 nil)
        (fn_double_x nil)
        )
    (if (> num_args 1)
        (set 'arg2 (first (rest lambda_args)))
    )
    (println "Before self-modifying lambda_fn = " lambda_fn)
    (println "args: " lambda_args)
    (println "number of arguments: " num_args)
    (println "arg1: " arg1)
    (println "Before self-modification, lambda body: " body)
    (set-ref-all arg1 body arg2)
    (append (lambda) (list (list arg2)) body)
))
(define (meta_procedure lambda_fn lambda_modifier)
    (lambda_modifier lambda_fn)
)
(set 'double (meta_procedure y_plus_x meta_replace_arg1_with_arg2) )
(println "After self-modification, lambda function double = " double)
(println "(double 5) = " (double 5) )
double
```

The aforementioned LISP code produces the following output when executed:

```
Before self-modifying lambda_fn = (lambda (y x) (+ y x))
args: (y x)
number of arguments: 2
arg1: y
Before self-modification, lambda body: ((+ y x))
After self-modification, lambda function double = (lambda (x) (+ x x))
(double 5) = 10
```

In the final computational step, lambda function (lambda (x) (+x x)) is returned.

Let $\mathcal{X}$ be an ex-machine. The instantiation of $|Q|-1$ and $|Q|$ in a meta instruction I (shown in 6720 of FIG. 76) invokes self-reflection about $\mathcal{X}$'s current number of states, at the moment when $\mathcal{X}$ executes I. This simple type of self-reflection is straightforward in physical realizations. In particular, a physical implementation in our lab along with quantum random bits measured from a quantum random number generator [34] simulates all executions of the ex-machines provided herein.

Machine Specification 1.4.
Simple Meta Instructions

A simple meta instruction has one of the forms (q, a, $|Q|-c_2$, α, y), (q, a, $|Q|$, α, y), ($|Q|-c_1$, a, r, α, y), ($|Q|-c_1$, a, $|Q|-c_2$, α, y), ($|Q|-c_1$, a, $|Q|$, α, y), where $0 < c_1$, $c_2 \leq |Q|$. The expressions $|Q|-c_1$, $|Q|-_2$ and $|Q|$ are instantiated to a state based on the current value of $|Q|$ when the instruction is executed. In the embodiments in this section, ex-machines only self-reflect with the symbols $|Q|-1$ and $|Q|$. In other embodiments, an ex-machine may self-reflect with $|Q|+c$, where c is positive integer.

Machine Embodiment 2

Execution of Simple Meta Instructions
Let A={0, 1, #} and Q={0}. ex-machine $\mathfrak{X}$ has 3 simple meta instructions.
($|Q|-1$, #, $|Q|-1$, 1, 0)
($|Q|-1$, 1, $|Q|$, 0, 1)
($|Q|-1$, 0, $|Q|$, 0, 0)

With an initial blank memory and starting state of 0, the first four computational steps are shown below. In the first step, $\mathfrak{X}$ memory head is scanning a # and the ex-machine state is 0. Since $|Q|=1$, simple meta instruction ($|Q|-1$, #, $|Q|-1$, 1, 0) instantiates to (0, #, 0, 1, 0), and executes.

| STATE | MEMORY | MEMORY ADDRESS | INSTRUCTION | NEW INSTRUCTION |
|---|---|---|---|---|
| 0 | ##1### | 0 | (0, #, 0, 1, 0) | (0, #, 0, 1, 0) |
| 1 | ##0 ### | 1 | (0, 1, 1, 0, 1) | (0, 1, 1, 0, 1) |
| 1 | ##0 1## | 1 | (1, #, 1, 1, 0) | (1, #, 1, 1, 0) |
| 2 | ##00 ## | 2 | (1, 1, 2, 0, 1) | (1, 1, 2, 0, 1) |

In the second step, the memory head is scanning a 1 and the state is 0. Since $|Q|=1$, instruction ($|Q|-1$, 1, $|Q|$, 0, 1) instantiates to (0, 1, 1, 0, 1), executes and updates Q={0, 1}. In the third step, the memory head is scanning a # and the state is 1. Since $|Q|=2$, instruction ($|Q|-1$, #, $|Q|-1$, 1, 0) instantiates to (1, #, 1, 1, 0) and executes. In the fourth step, the memory head is scanning a 1 and the state is 1. Since $|Q|=2$, instruction ($|Q|-1$, 1, $|Q|$, 0, 1) instantiates to (1, 1, 2, 0, 1), executes and updates Q={0, 1, 2}. During these four steps, two simple meta instructions create four new instructions and add new states 1 and 2.

Machine Specification 1.5.
Finite Initial Conditions

A machine is said to have finite initial conditions if the following conditions are satisfied by the computing hardware shown in FIGS. 66, 67, and 68 before the machine starts its execution.
1. The number of machine states $|Q|$ is finite.
2. The number of alphabet symbols $|A|$ is finite.
3. The number of machine instructions $|\mathcal{I}|$ is finite.
4. The memory is finitely bounded.

It may be useful to think about the initial conditions of an ex-machine as analogous to the boundary value conditions of a differential equation. While trivial to verify, the purpose of remark 1.1 is to assure computations by an ex-machine execute on different types of hardware such as semiconductor chips, lasers using photons, biological implementations using proteins, DNA and RNA. See FIG. 23, FIG. 24, FIG. 25 and FIG. 67, FIG. 68 and FIG. 69.

Remark 1.1.
Finite Initial Conditions

If the machine starts its execution with finite initial conditions, then after the machine has executed l instructions for any positive integer l, the current number of states Q(l) is finite and the current set of instructions $\mathcal{I}(l)$ is finite. Also, the memory T is still finitely bounded and the number of measurements obtained from the random or non-deterministic source is finite.

Proof.

The remark follows immediately from specification 1.5 of finite initial conditions and machine instruction specifications 1.1, 1.2, and 1.3. In particular, the execution of one meta instruction adds at most one new instruction and one new state to Q. □

Specification 1.6 describes new ex-machines that can evolve from computations of prior ex-machines that have halted. The notion of evolving is useful because the random instructions 6740 and meta instructions 6720 can self-modify an ex-machine's instructions as it executes. In contrast with the ex-machine, after a digital computer program stops executing, its instructions have not changed.

This difference motivates the next specification, which is illustrated by the following. Consider an initial ex-machine $\mathfrak{X}_0$ that has 9 initial states and 15 initial instructions. $\mathfrak{X}_0$ starts executing on a finitely bounded memory $T_0$ and halts. When the ex-machine halts, it (now called $\mathfrak{X}_1$) has 14 states and 24 instructions and the current memory is $S_1$. We say that ex-machine $N_0$ with memory $T_0$ evolves to ex-machine $\mathfrak{X}_1$ with memory $S_1$.

Machine Specification 1.6.
Evolving an Ex-Machine

Let $T_0, T_1, T_2 \ldots T_{i-1}$ each be a finitely bounded memory. Consider ex-machine No with finite initial conditions in the ex-machine hardware. $\mathfrak{X}_0$ starts executing with memory $T_0$ and evolves to ex-machine $\mathfrak{X}_1$ with memory $S_1$. Subsequently, $\mathfrak{X}_1$ starts executing with memory $T_1$ and evolves to $\mathfrak{X}_2$ with memory $S_2$. This means that when ex-machine $\mathfrak{X}_1$ starts executing on memory $T_1$, its instructions are preserved after the halt with memory $S_1$. The ex-machine evolution continues until $\mathfrak{X}_{i-1}$ starts executing with memory $T_{i-1}$ and evolves to ex-machine $\mathfrak{X}_2$ with memory $S_2$. One says that ex-machine No with finitely bounded memories $T_0$, $T_1$, $T_2 \ldots T_{i-1}$ evolves to ex-machine $\mathfrak{X}_2$ after i halts.

When an ex-machine $\mathfrak{X}_0$ evolves to $\mathfrak{X}_1$ and subsequently $\mathfrak{X}_1$ evolves to $\mathfrak{X}_2$ and so on up to ex-machine $\mathfrak{X}_n$, then ex-machine $\mathfrak{X}_i$ is called an ancestor of ex-machine $\mathfrak{X}_j$ whenever $0 \leq i < j \leq n$. Similarly, ex-machine $\mathfrak{X}_j$ is called a descendant of ex-machine $\mathfrak{X}_i$ whenever $0 \leq i < j \leq n$. The sequence of ex-machines $\mathfrak{X}_0 \rightarrow \mathfrak{X}_1 \rightarrow \ldots \rightarrow \mathfrak{X}_n \ldots$ is called an evolutionary path. In some embodiments, this sequence of ex-machines may be stored on distinct computing hardware, as shown in machines 214, 216, 218 and 220 of FIG. 68. In an embodiment, token 202 may contain hardware shown FIGS. 23, 24, and 25. Token 202 may provide quantum random measurements or help implement quantum random instructions that are used by machines 214, 216, 218 and 220 of FIG. 68.

2 Non-Determinism and Randomness

In some embodiments, the computing machines described in this invention use non-determinism (i.e., see) as a computational tool to make the computation unpredictable. In some embodiments, quantum random measurements are used as a computational tool. Quantum randomness is a type of non-determinism. In Based on the DIEHARD statistical tests on our implementations, according to FIGS. 23, 24 and 25, the random instructions behave according to quantum random properties 1 and 2. These statistical properties are also supported by the empirical evidence of other quantum random sources [31,34,35].

In sections 3 and 4, the execution of the standard instructions, random instructions and meta instructions uses the property that for any m, all $2^m$ binary strings are equally likely to occur when a quantum random number generator takes m binary measurements. One, however, has to be careful not to misinterpret quantum random properties 1 and 2.

Consider the Champernowne sequence 01 00 01 10 11 000 001 010 011 100 101 110 111 0000 . . . , which is sometimes cited as a sequence that is Borel normal, yet still Turing computable. The book *An Introduction to Probability Theory and Its Applications*, (William Feller. Volume 1, Third Edition. John Wiley & Sons, New York, 1968; pp. 202-211, ISBN 0 471 25708-7.) discusses the mathematics of random walks. The Champernowne sequence catastrophically fails the expected number of changes of sign for a random walk as n→∞. Since all $2^m$ strings are equally likely, the expected value of changes of sign follows from the reflection principle and simple counting arguments, as shown in section III.5 of Feller's book.

Furthermore, most of the $2^m$ binary strings (i.e., binary strings of length m) have high Kolmogorov complexity. This fact leads to the following mathematical intuition that enables new computational behaviors that a standard digital computer cannot perform. The execution of quantum random instructions working together with meta instructions enables the ex-machine to increase its program complexity [28] as it evolves. In some cases, the increase in program complexity can increase the ex-machine's computational power as the ex-machine evolves. Also, notice the distinction here between the program complexity of the ex-machine and Kolmogorov complexity. The definition of Kolmogorov complexity only applies to standard machines. Moreover, the program complexity (e.g., the Shannon complexity |Q∥A|) stays fixed for standard machines. In contrast, an ex-machine's program complexity can increase without bound, when the ex-machine executes quantum random and meta instructions that productively work together. (For example, see ex-machine 1, called $\mathfrak{Q}(x)$.)

In terms of the ex-machine computation performed, how one of these binary strings is generated from some particular type of non-deterministic process is not the critical issue. Suppose the quantum random generator demonstrated measuring the spin of particles, certified by the strong Kochen-Specker theorem [5,6] outputs the 100-bit string $a_0$ $a_1$ . . . $a_{99}$=1011000010101111001100110011100010001110010-1010110111100000000100110010000110101011011-1001101010000 to ex-machine $\mathfrak{X}_1$.

Suppose a distinct quantum random generator using radioactive decay outputs the same 100-bit string $a_0$ $a_1$ . . . $a_{99}$ to a distinct ex-machine $\mathfrak{X}_2$. Suppose $\mathfrak{X}_1$ and $\mathfrak{X}_2$ have identical programs with the same initial tapes and same initial state. Even though radioactive decay was discovered over 100 years ago and its physical basis is still phenomenological, the execution behavior of $\mathfrak{X}_1$ and $\mathfrak{X}_2$ are indistinguishable for the first 100 executions of their quantum random instructions. In other words, ex-machines $\mathfrak{X}_1$ and $\mathfrak{X}_2$ exhibit execution behaviors that are independent of the quantum process that generates these two identical binary strings.

2.1 Mathematical Determinism and Unpredictability

Before some of the deeper theory on quantum randomness is reviewed, we take a step back to view randomness from a broader theoretical perspective. While we generally agree with the philosophy of Eagle (Antony Eagle. Randomness Is Unpredictability. British Journal of Philosophy of Science. 56, 2005, pp. 749-790.) that randomness is unpredictablity, embodiment 3 helps sharpen the differences between indeterminism and unpredictability.

Machine Embodiment 3

A Mathematical Gedankenexperiment

Our gedankenexperiment demonstrates a deterministic system which exhibits an extreme amount of unpredictability. This embodiment shows that a physical system whose mathematics is deterministic can still be an extremely unpredictable process if the measurements of the process has limited resolution. Some mathematical work is needed to define the dynamical system and summarize its mathematical properties before we can present the gedankenexperiment.

Consider the quadratic map $f: \mathbb{R} \to \mathbb{R}$, where $f(x)=9/2x(1-x)$. Set $I_0$ [0, 1/3] and $I_1=[1/3, 2/3]$. Set B=(1/3, 2/3). Define the set A={x∈[0, 1]: $f^n(x) \in I_0 \cup I_1$ for all n∈ℕ}. 0 is a fixed point of $f$ and $f^2(1/3)=f^2(2/3)=0$, so the boundary points of B lie in Λ. Furthermore, whenever x∈B, then $f(x)<0$ and $$\lim_{n\to\infty} f^n(x) = -\infty.$$

This means all orbits that exit Λ head off to −∞.

The inverse image $f^{-1}(B)$ is two open intervals $B_0 \subset I_0$ and $B_1 \subset I_1$ such that $f(B_0)=f(B_1)=B$. Topologically, $B_0$ behaves like Cantor's open middle third of $I_0$ and $B_1$ behaves like Cantor's open middle third of $I_1$. Repeating the inverse image indefinitely, define the set $$H = B \cup \bigcup_{k=1}^{\infty} f^{-k}(B).$$

Now H∪Λ=[0,1] and H∩Λ=∅.

Using dynamical systems notation, set $\Sigma_2=\{0, 0\}^{\mathbb{N}}$. Define the shift map $\sigma: \Sigma_2 \to \Sigma_2$, where $\sigma(a_0\ a_1\ \ldots\ ) = (a_1 a_2\ \ldots\ )$. For each x in Λ, x's trajectory in $I_0$ and $I_1$ corresponds to a unique point in $\Sigma_2$: define h:Λ→$\Sigma_2$ as h(x) $(a_0\ a_1\ \ldots\ )$ such that for each n∈ℕ, set $a_n=0$ if $f^n(x) \in I_0$ and $a_n=1$ if $f^n(x) \in I_1$.

For any two points $(a_0\ a_1\ \ldots\ )$ and $(b_0 b_1\ \ldots\ )$ in $\Sigma_2$, define the metric $d((a_0\ a_1\ \ldots\ ),$ $$(b_0 b_1 \ldots )) = \sum_{i=0}^{\infty} |a_i - b_i| 2^{-i}.$$

Via the standard topology on $\mathbb{R}$ inducing the subspace topology on Λ, it is straightforward to verify that h is a homeomorphism from Λ to $\Sigma_2$. Moreover, h∘$f$=σ∘h, so h is a topological conjugacy. The set H and the topological conjugacy h enable us to verify that Λ is a Cantor set. This means that Λ is uncountable, totally disconnected, compact and every point of Λ is a limit point of Λ.

We are ready to pose our mathematical gedankenexperiment. We make the following assumption about our mathematical observer. When our observer takes a physical measurement of a point x in $\Lambda_2$, she measures a 0 if x lies in $I_0$ and measures a 1 if x lies in $I_1$. We assume that she cannot make her observation any more accurate based on our idealization that is analogous to the following: measurements at the quantum level have limited resolution due to the wavelike properties of matter (Louis de Broglie. Recherches sur la theorie des quanta. Ph.D. Thesis. Paris, 1924.) Similarly, at the second observation, our observer measures a 0 if $f(x)$ lies in $I_0$ and 1 if $f(x)$ lies in $I_1$. Our observer continues to make these observations until she has measured whether $f^{k-1}(X)$ is in $I_0$ or in $I_1$. Before making her k+1st observation, can our observer make an effective prediction whether $f^k(X)$ lies in $I_0$ or $I_1$ that is correct for more than 50% of her predictions?

The answer is no when h(x) is a generic point (i.e., in the sense of Lebesgue measure) in $\Sigma_2$. Set $\mathcal{R}$ to the Martin-Löf random points in $\Sigma_2$. Then $\mathcal{R}$ has Lebesgue measure 1 (Feller, Volume 1) in $\Sigma_2$, so its complement $\Sigma_2 - \mathcal{R}$ has Lebesgue measure 0. For any x such that h(x) lies in $\mathcal{R}$, then our observer cannot predict the orbit of x with a Turing machine. Hence, via the topological conjugacy h, we see that for a generic point x in $\Lambda$, x's orbit between $I_0$ and $I_1$ is Martin-Löf random—even though $f$ is mathematically deterministic and $f$ is a Turing computable function.

Overall, the dynamical system $(f, \Lambda)$ is mathematically deterministic and each real number x in $\Lambda$ has a definite value. However, due to the lack of resolution in the observer's measurements, the orbit of generic point x is unpredictable—in the sense of Martin-Löf random.

2.2 Quantum Random Theory

The standard theory of quantum randomness stems from the seminal EPR paper. Einstein, Podolsky and Rosen propose a necessary condition for a complete theory of quantum mechanics: Every element of physical reality must have a counterpart in the physical theory. Furthermore, they state that elements of physical reality must be found by the results of experiments and measurements. While mentioning that there might be other ways of recognizing a physical reality, EPR propose the following as a reasonable criterion for a complete theory of quantum mechanics:

If, without in any way disturbing a system, one can predict with certainty (i.e., with probability equal to unity) the value of a physical quantity, then there exists an element of physical reality corresponding to this physical quantity.

They consider a quantum-mechanical description of a particle, having one degree of freedom. After some analysis, they conclude that a definite value of the coordinate, for a particle in the state given by $$\psi = e^{\frac{2\pi i}{h} p_0 x},$$

is not predictable, but may be obtained only by a direct measurement. However, such a measurement disturbs the particle and changes its state. They remind us that in quantum mechanics, when the momentum of the particle is known, its coordinate has no physical reality. This phenomenon has a more general mathematical condition that if the operators corresponding to two physical quantities, say A and B, do not commute, then a precise knowledge of one of them precludes a precise knowledge of the other. Hence, EPR reach the following conclusion:

(I) The quantum-mechanical description of physical reality given by the wave function is not complete. OR (II) When the operators corresponding to two physical quantities (e.g., position and momentum) do not commute (i.e. AB≠BA), the two quantities cannot have the same simultaneous reality.

EPR justifies this conclusion by reasoning that if both physical quantities had a simultaneous reality and consequently definite values, then these definite values would be part of the complete description. Moreover, if the wave function provides a complete description of physical reality, then the wave function would contain these definite values and the definite values would be predictable.

From their conclusion of I OR II, EPR assumes the negation of I—that the wave function does give a complete description of physical reality. They analyze two systems that interact over a finite interval of time. And show by a thought experiment of measuring each system via wave packet reduction that it is possible to assign two different wave functions to the same physical reality. Upon further analysis of two wave functions that are eigenfunctions of two non-commuting operators, they arrive at the conclusion that two physical quantities, with non-commuting operators can have simultaneous reality. From this contradiction or paradox (depending on one's perspective), they conclude that the quantum-mechanical description of reality is not complete.

In the paper—Can Quantum-Mechanical Description of Physical Reality be Considered Complete? Physical Review. 48, Oct. 15, 1935, pp. 696-702—Neil Bohr responds to the EPR paper. Via an analysis involving single slit experiments and double slit (two or more) experiments, Bohr explains how during position measurements that momentum is transferred between the object being observed and the measurement apparatus. Similarly, Bohr explains that during momentum measurements the object is dis-placed. Bohr also makes a similar observation about time and energy: "it is excluded in principle to control the energy which goes into the clocks without interfering essentially with their use as time indicators". Because at the quantum level it is impossible to control the interaction between the object being observed and the measurement apparatus, Bohr argues for a "final renunciation of the classical ideal of causality" and a "radical revision of physical reality".

From his experimental analysis, Bohr concludes that the meaning of EPR's expression without in any way disturbing the system creates an ambiguity in their argument. Bohr states: "There is essentially the question of an influence on the very conditions which define the possible types of predictions regarding the future behavior of the system. Since these conditions constitute an inherent element of the description of any phenomenon to which the term physical reality can be properly attached, we see that the argumentation of the mentioned authors does not justify their conclusion that quantum-mechanical description is essentially incomplete." Overall, the EPR versus Bohr-Born-Heisenberg position set the stage for understanding whether hidden variables can exist in the theory of quantum mechanics.

Embodiments of quantum random instructions utilize the lack of hidden variables because this contributes to the unpredictability of quantum random measurements. In some embodiments of the quantum random measurements used by the quantum random instructions, the lack of hidden variables are only associated with the quantum system being measured and in other embodiments the lack of hidden variables are associated with the measurement apparatus. In some embodiments, the value indefiniteness of measurement observables implies unpredictability. In some embodiments, the unpredictability of quantum measurements 6730 in FIG. 67 depend upon Kochen-Specker type theorems [5,6]. In some embodiments, the unpredictability of quantum measurements 6730 in FIG. 67 depend upon Bell type theorems [2].

In an embodiment of quantum random measurements 6730 shown in FIG. 67, a protocol for two sequential measurements that start with a spin-1 source is shown in FIG. 70. Spin-1 particles are prepared in the $S_z=0$ state. (From their eigenstate assumption, this operator has a definite value.) Specifically, the first measurement puts the particle in the $S_z=0$ eigenstate of the spin operator $S_z$. Since the preparation state is an eigenstate of the $S_x=0$ projector observable with eigenvalue 0, this outcome has a definite value and theoretically cannot be reached. The second measurement is performed in the eigenbasis of the $S_x$ operator with two outcomes $S_x=\pm 1$.

The $S_x=\pm 1$ outcomes can be assigned 0 and 1, respectively. Moreover, since $$\langle S_z = 0 | S_x = \pm 1 \rangle = \frac{1}{\sqrt{2}},$$

neither of the $S_x \pm 1$ outcomes can have a pre-determined definite value. As a consequence, bits 0 and 1 are generated independently (stochastic independence) with a 50/50 probability (unbiased). These are quantum random properties 1 and 2.

3 Computing Ex-Machine Languages

A class of ex-machines are defined as evolutions of the fundamental ex-machine $\mathfrak{Q}(x)$, whose 15 initial instructions are listed in ex-machine specification 1. These ex-machines compute languages L that are subsets of $\{a\}^* = \{a^n : n \in \mathbb{N}\}$. The expression $a^n$ represents a string of n consecutive a's. For example, $a_5 = aaaaa$ and $a^0$ is the empty string. Define the set of languages $$\mathfrak{L} = \bigcup_{L \subseteq \{a\}^*} \{L\}.$$

Machine Specification 3.1 defines a unique language in $\mathfrak{L}$ for each function $f: \mathbb{N} \to \{0, 1\}$.

Machine Specification 3.1.

Language $L_f$

Consider any function $f: \mathbb{N} \to \{0, 1\}$. This means $f$ is a member of the set $\{0, 1\}^\mathbb{N}$. Function $f$ induces the language $L_f = \{a^n : f(n) = 1\}$. In other words, for each non-negative integer n, string $a^n$ is in the language $L_f$ if and only if $f(n)=1$.

Trivially, $L_f$ is a language in $\mathfrak{L}$. Moreover, these functions $f$ generate all of $\mathfrak{L}$.

Remark 3.1.

$$\mathfrak{L} = \bigcup_{f \in \{0,1\}^\mathbb{N}} \{L_f\}$$

In order to define the halting syntax for the language in $\mathfrak{L}$ that an ex-machine computes, choose alphabet set A={#, 0, 1, N, Y, a}.

Machine Specification 3.2.

Language L in $\mathfrak{L}$ that Ex-Machine $\mathcal{X}$ Computes

Let $\mathcal{X}$ be an ex-machine. The language L in $\mathfrak{L}$ that $\mathcal{X}$ computes is defined as follows. A valid initial tape has the form # #$a^n$#. The valid initial tape # ## represents the empty string. After machine $\mathcal{X}$ starts executing with initial tape # #$a^n$#, string an is in $\mathcal{X}$'s language if ex-machine $\mathcal{X}$ halts with tape #$a^n$# Y#. String $a^n$ is not in $\mathcal{X}$'s language if $\mathcal{X}$ halts with tape #$a^n$# N#.

The use of special alphabet symbols (i.e., special memory values) Y and N—to decide whether $a^n$ is in the language or not in the language—follows [?].

For a particular string # #$a^m$#, some ex-machine IX could first halt with #$a^m$# N# and in a second computation with input # #$a_m$# could halt with #$a^m$# Y#. This oscillation of halting outputs could continue indefinitely and in some cases the oscillation can be aperiodic. In this case, $\mathcal{X}$'s language would not be well-defined according to machine specification 3.2. These types of ex-machines will not be specified in this invention.

There is a subtle difference between $\mathfrak{Q}(x)$ and an ex-machine IX whose halting output never stabilizes. In contrast to the Turing machine or a digital computer program, two different instances of the ex-machine $\mathfrak{Q}(x)$ can evolve to two different machines and compute distinct languages according to machine specification 3.2. However, after $\mathfrak{Q}(x)$ has evolved to a new machine $\mathfrak{Q}(a_0\, a_1 \ldots a_m\, x)$ as a result of a prior execution with input tape # #$a^m$#, then for each i with $0 \le i \le m$, machine $\mathfrak{Q}(a_0\, a_1 \ldots a_m\, x)$ always halts with the same output when presented with input tape # #$a^i$#. In other words, $\mathfrak{Q}(a_0\, a_1 \ldots a_m\, x)$'s halting output stabilizes on all input strings $a^i$ where $0 \le i \le m$. Furthermore, it is the ability of $\mathfrak{Q}(x)$ to exploit the non-autonomous behavior of its two quantum random instructions that enables an evolution of $\mathfrak{Q}(x)$ to compute languages that are Turing incomputable (i.e., not computable by a standard digital computer).

We designed ex-machines that compute subsets of $\{a\}^*$ rather than subsets of $\{0, 1\}^*$ because the resulting specification of $\mathfrak{Q}(x)$ is much simpler and more elegant. It is straightforward to list a standard machine that bijectively translates each an to a binary string in $\{0, 1\}^*$ as follows. The empty string in $\{a\}^*$ maps to the empty string in $\{0, 1\}^*$. Let $\psi$ represent this translation map. Hence, a $\xrightarrow{\psi}$ 0, aa $\xrightarrow{\psi}$ 1, aaa $\xrightarrow{\psi}$ 00, $a^4 \xrightarrow{\psi}$ 01, $a^5 \xrightarrow{\psi}$ 10, $a^6 \xrightarrow{\psi}$ 11, $a^7 \xrightarrow{\psi}$ 000, and so on. Similarly, an inverse translation standard machine computes the inverse of $\psi$. Hence 0 $\xrightarrow{\psi^{-1}}$ a, 1 $\xrightarrow{\psi^{-1}}$ aa, 00 $\xrightarrow{\psi^{-1}}$ aaa, and so on. The translation and inverse translation computations immediately transfer any results about the ex-machine computation of subsets of $\{a\}^*$ to corresponding subsets of $\{0, 1\}^*$ via $\psi$. In particular, the following remark is relevant for our discussion.

Remark 3.2.

Every subset of $\{a\}^*$ is computable by some ex-machine if and only if every subset of $\{0, 1\}^*$ is computable by some ex-machine.

Proof.

The remark immediately follows from the fact that the translation map $\psi$ and the inverse translation map $\psi^{-1}$ are computable with a standard machine. □

When the quantum randomness in $\mathfrak{Q}$'s two quantum random instructions satisfy property 1 (unbiased bernoulli trials) and property 2 (stochastic independence), for each $n \in \mathbb{N}$, all $2^n$ finite paths of length n—in the infinite, binary tree of FIG. 71—are equally likely. (See Feller, Introduction to Probability Theory and its Applications, volumes 1 and 2 for a comprehensive study of random walks.)

Moreover, there is a one-to-one correspondence between a function $f: \mathbb{N} \to \{0, 1\}$ and an infinite downward path in the infinite binary tree of FIG. 71. The beginning of a particular infinite downward path is shown in red; it starts as (0, 1, 1, 0 . . . ). Based on this one-to-one correspondence between functions $f: \mathbb{N} \to \{0,1\}$ and downward paths in the infinite binary tree, an examination of $\mathfrak{Q}(x)$'s execution behavior will show that Ǫ(x) can evolve to compute any language $L_f$ in £ when quantum random instructions (x, #, x, 0) and (x, a, t, 0) satisfy properties 1 and 2.

Machine Specification 1.

Ǫ(x)

A={#, 0, 1, N, Y, a}. States Q={0, h, n, y, t, v, w, x, 8} where halting state h=1, and states n=2, y=3, t=4, v=5, w=6, x=7. The initial state is always 0. The letters are used to represent machine states instead of explicit numbers because these states have special purposes. (This is for the reader's benefit.) State n indicates NO that the string is not in the machine's language. State y indicates YES that the string is in the machine's language. State x is used to generate a new random bit; this random bit determines the string corresponding to the current value of |Q|−1. The fifteen instructions of Ǫ(x) are shown below.

(0, #, 8, #, 1)
(8, #, x, #, 0)
(y, #, h, Y, 0)
(n, #, h, N, 0)
(x, #, x, 0)
(x, a, t, 0)
(x, 0, v, #, 0, (|Q|−1, #, n, #, 1))
(x, 1, w, #, 0, (|Q|−1, #, y, #, 1))
(t, 0, w, a, 0, (|Q|−1, #, n, #, 1))
(t, 1, w, a, 0, (|Q|−1, #, y, #, 1))
(v, #, n, #, 1, (|Q|−1, a, |Q|, a, 1))
(w, #, y, #, 1, (|Q|−1, a, |Q|, a, 1))
(w, a, ≡Q|, a, 1, (|Q|−1, a, |Q|, a, 1))
(|Q|−1, a, x, a, 0)
(|Q|−1, #, x, #, 0)

With initial state 0 and initial memory # #aaaa##, an execution of machine Ǫ(x) is shown below.

by instruction (12, #, n, #, 1). Lastly, instructions (9, #, y, #, 1), (10, #, n, #, 1), (11, #, y, #, 1), and (12, a, 13, a, 1) were added.

Furthermore, five new states 9, 10, 11, 12 and 13 are added to Q. After this computation halts, the machine states are Q={0, h, n, y, t, v, w, x, 8, 9, 10, 11, 12, 13} and the resulting ex-machine evolved to has 24 instructions. It is called Ǫ(11010 x).

Machine Instructions 2.

Ǫ(11010 x)
(0, #, 8, #, 1)
(y, #, h, Y, 0)
(n, #, h, N, 0)
(x, #, x, 0)
(x, a, t, 0)
(x, 0, v, #, 0, (|Q|−1, #, n, #, 1))
(x, 1, w, #, 0, (|Q|−1, #, y, #, 1))
(t, 0, w, a, 0, (|Q|−1, #, n, #, 1))
(t, 1, w, a, 0, (|Q|−1, #, y, #, 1))
(v, #, n, #, 1, (|Q|−1, a, |Q|, a, 1))
(w, #, y, #, 1, (|Q|−1, a, |Q|, a, 1))
(w, a, |Q|, a, 1, (|Q|−1, a, |Q|, a, 1))
(|Q|−1, a, x, a, 0)
(|Q|−1, #, x, #, 0)
(8, #, y, #, 1)
(8, a, 9, a, 1)
(9, #, y, #, 1)
(9, a, 10, a, 1)
(10, #, n, #, 1)
(10, a, 11, a, 1)
(11, #, v, #, 1)
(11, a, 12, a, 1)
(12, #, n, #, 1)
(12, a, 13, a, 1)

| STATE | MEMORY | ADDRESS | INSTRUCTION | NEW INSTRUCTION |
|---|---|---|---|---|
| 8 | ## aaaa### | 1 | (0, #, 8, #, 1) | |
| x | ## aaaa### | 1 | (8, a, x, a, 0) | |
| t | ## 1aaa### | 1 | (x, a, t, 1_qr, 0) | |
| w | ## aaaa### | 1 | (t, 1, w, a, 0, (|Q|−1, #, y, #, 1)) | (8, #, y, #, 1) |
| 9 | ##a aaaa### | 2 | (w, a, |Q|, a, 1, (|Q|−1, a, |Q|, a, 1)) | (8, a, 9, a, 1) |
| x | ##a aaa### | 2 | (9, a, x, a, 0) | (9, a, x, a, 0) |
| t | ##a 1aa### | 2 | (x, a, t, 1_qr, 0) | |
| w | ##a aaa### | 2 | (t, 1, w, a, 0, (|Q|−1, #, y, #, 1)) | (9, #, y, #, 1) |
| 10 | ##aa aa### | 3 | (w, a, |Q|, a, 1, (|Q|−1, a, |Q|, a, 1)) | (9, a, 10, a, 1) |
| x | ##aa aa### | 3 | (10, a, x, a, 0) | (10, a, x, a, 0) |
| t | ##aa 0a### | 3 | (x, a, t, 0_qr, 0) | |
| w | ##aa aa### | 3 | (t, 0, w, a, 0, (|Q|−1, #, n, #, 1)) | (10, #, n, #, 1) |
| 11 | ##aaa a### | 4 | (w, a, |Q|, a, 1, (|Q|−1, a, |Q|, a, 1)) | (10, a, 11, a, 1) |
| x | ##aaa a### | 4 | (11, a, x, a, 0) | (11, a, x, a, 0) |
| t | ##aaa 1### | 4 | (x, a, t, 1_qr, 0) | |
| w | ##aaa a### | 4 | (t, 1, w, a, 0, (|Q|−1, #, y, #, 1)) | (11, #, y, #, 1) |
| 12 | ##aaaa ### | 5 | (w, a, |Q|, a, 1, (|Q|−1, a, |Q|, a, 1)) | (11, a, 12, a, 1) |
| x | ##aaaa ### | 5 | (12, #, x, #, 0) | (12, #, x, #, 0) |
| x | ##aaaa 0## | 5 | (x, #, x, 0_qr, 0) | |
| v | ##aaaa ### | 5 | (x, 0, v, #, 0, (|Q|−1, #, n, #, 1)) | (12, #, n, #, 1) |
| n | ##aaaa# ## | 6 | (v, #, n, #, 1, (|Q|−1, a, |Q|, a, 1)) | (12, a, 13, a, 1) |
| h | ##aaaa# N# | 6 | (n, #, h, N, 0) | |

During this execution, Ǫ(x) replaces instruction (8, #, x, #, 0) with (8, #, y, #, 1). Meta instruction (w, a, |Q|, a, 1, (|Q|−1, a, |Q|, a, 1)) executes and replaces (8, a, x, a, 0) with new instruction (8, a, 9, a, 1). Also, simple meta instruction (|Q|−1, a, x, a, 0) temporarily added instructions (9, a, x, a, 0), (10, a, x, a, 0), and (11, a, x, a, 0).

Subsequently, these new instructions were replaced by (9, a, 10, a, 1), (10, a, 11, a, 1), and (11, a, 12, a, 1), respectively. Similarly, simple meta instruction (|Q|−1, #, x, #, 0) added instruction (12, #, x, #, 0) and this instruction was replaced New instructions (8, #, y, #, 1), (9, #, y, #, 1), and (11, #, y, #, 1) help Ǫ(11010 x) compute that the empty string, a and aaa are in its language, respectively. Similarly, the new instructions (10, #, n, #, 1) and (12, #, n, #, 1) help Ǫ(11010 x) compute that aa and aaaa are not in its language, respectively.

The zeroth, first, and third 1 in Ǫ(11010 x)'s name indicate that the empty string, a and aaa are in Ǫ(11010 x)'s language. The second and fourth 0 indicate strings aa and aaaa are not in its language. The symbol x indicates that all strings an with n≥5 have not yet been determined whether they are in $Ǭ(11010\ x)$'s language or not in its language.

Starting at state 0, ex-machine $Ǭ(11010\ x)$ computes that the empty string is in $Ǭ(11010\ x)$'s language.

| STATE | MEMORY | MEMORY ADDRESS | INSTRUCTION |
|---|---|---|---|
| 8 | ## ### | 1 | (0, #, 8, #, 1) |
| y | ### ## | 2 | (8, #, y, #, 1) |
| h | ### Y# | 2 | (y, #, h, Y, 0) |

Starting at state 0, ex-machine $Ǭ(11010\ x)$ computes that string a is in $Ǭ(11010\ x)$'s language.

| STATE | MEMORY | MEMORY ADDRESS | INSTRUCTION |
|---|---|---|---|
| 8 | ## a### | 1 | (0, #, 8, #, 1) |
| 9 | ##a ### | 2 | (8, a, 9, a, 1) |
| y | ##a# ## | 3 | (9, #, y, #, 1) |
| h | ##a# Y# | 3 | (y, #, h, Y, 0) |

Starting at state 0, $Ǭ(11010\ x)$ computes that string aa is not in $Ǭ(11010\ x)$'s language.

| STATE | MEMORY | MEMORY ADDRESS | INSTRUCTION |
|---|---|---|---|
| 8 | ## aa### | 1 | (0, #, 8, #, 1) |
| 9 | ##a a### | 2 | (8, a, 9, a, 1) |
| 10 | ##aa ### | 3 | (9, a, 10, a, 1) |
| n | ##aa# ## | 4 | (10, #, n, #, 1) |
| h | ##aa# N# | 4 | (n, #, h, N, 0) |

Starting at state 0, $Ǭ(11010\ x)$ computes that aaa is in $Ǭ(11010\ x)$'s language.

| STATE | MEMORY | MEMORY ADDRESS | INSTRUCTION |
|---|---|---|---|
| 8 | ## aaa### | 1 | (0, #, 8, #, 1) |
| 9 | ##a aa### | 2 | (8, a, 9, a, 1) |
| 10 | ##aa a### | 3 | (9, a, 10, a, 1) |
| 11 | ##aaa ### | 4 | (10, a, 11, a, 1) |
| Y | ##aaa# ## | 5 | (11, #, y, #, 1) |
| h | ##aaa# Y# | 5 | (y, #, h, Y, 0) |

Starting at state 0, $Ǭ(11010\ x)$ computes that aaaa is not in $Ǭ(11010\ x)$'s language.

| STATE | MEMORY | MEMORY ADDRESS | INSTRUCTION |
|---|---|---|---|
| 8 | ## aaaa#### | 1 | (0, #, 8, #, 1) |
| 9 | ##a aaaa#### | 2 | (8, a, 9, a, 1) |
| 10 | ##aa aa#### | 3 | (9, a, 10, a, 1) |
| 11 | ##aaa a#### | 4 | (10, a, 11, a, 1) |
| 12 | ##aaaa #### | 5 | (11, a, 12, a, 1) |
| n | ##aaaa# ### | 6 | (12, #, n, #, 1) |
| h | ##aaaa# N## | 6 | (n, #, h, N, 0) |

Note that for each of these executions, no new states were added and no instructions were added or replaced. Thus, for all subsequent executions, ex-machine $Ǭ(11010\ x)$ computes that the empty string, a and aaa are in its language. Similarly, strings aa and aaaa are not in $Ǭ(11010\ x)$'s language for all subsequent executions of $Ǭ(11010\ x)$.

Starting at state 0, we examine an execution of ex-machine $Ǭ(11010\ x)$ on input memory # #aaaaaaa##.

| STATE | MEMORY | ADDRESS | INSTRUCTION | NEW INSTRUCTION |
|---|---|---|---|---|
| 8 | ## aaaaaaa### | 1 | (0, #, 8, #, 1) | |
| 9 | ##a aaaaaa### | 2 | (8, a, 9, a, 1) | |
| 10 | ##aa aaaaa### | 3 | (9, a, 10, a, 1) | |
| 11 | ##aaa aaaa### | 4 | (10, a, 11, a, 1) | |
| 12 | ##aaaa aaa### | 5 | (11, a, 12, a, 1) | |
| 13 | ##aaaaa aa### | 6 | (12, a, 13, a, 1) | |
| x | ##aaaaa aa### | 6 | (13, a, x, a, 0) | |
| t | ##aaaaa 0a### | 6 | (x, a, t, 0_qr, 0) | |
| w | ##aaaaa aa### | 6 | (t, 0, w, a, 0, (|Q|-1, #, n, #, 1)) | (13, #, n, #, 1) |
| 14 | ##aaaaaa a### | 7 | (w, a, |Q|, a, 1, (|Q|-1, a, |Q|, a, 1)) | (13, a, 14, a, 1) |
| x | ##aaaaaa a### | 7 | (14, a, x, a, 0) | (14, a, x, a, 0) |
| t | ##aaaaaa 1### | 7 | (x, a, t, 1_qr, 0) | |
| w | ##aaaaaa a### | 7 | (t, 1, w, a, 0, (|Q|-1, #, y, #, 1)) | (14, #, y, #, 1) |
| 15 | ##aaaaaaa ### | 8 | (w, a, |Q|, a, 1, (|Q|-1, a, |Q|, a, 1)) | (14, a, 15, a, 1) |
| x | ##aaaaaaa ### | 8 | (15, #, x, #, 0) | (15, #, x, #, 0) |
| x | ##aaaaaaa 1## | 8 | (x, #, x, 1_qr, 0) | |
| w | ##aaaaaaa ### | 8 | (x, 1, w, #, 0, (|Q|-1, #, y, #, 1)) | (15, #, y, #, 1) |
| y | ##aaaaaaa# ## | 9 | (w, #, y, #, 1, (|Q|-1, a, |Q|, a, 1)) | (15, a, 16, a, 1) |
| h | ##aaaaaaa# Y# | 9 | (y, #, h, Y, 0) | |

Overall, during this execution ex-machine $Ǭ(11010\ x)$ evolved to ex-machine $Ǭ(11010\ 011\ x)$. Three quantum random instructions were executed. The first quantum random instruction (x, a, t, 0) measured a 0 so it is shown above as (x, a, t, 0_qr, 0). The result of this 0 bit measurement adds the instruction (13, #, n, #, 1), so that in all subsequent executions of ex-machine $Ǭ(11010\ 011\ x)$, string as is not in $Ǭ(11010\ 011\ x)$'s language. Similarly, the second quantum random instruction (x, a, t, 0) measured a 1 so it is shown above as (x, a, t, 1_qr, 0). The result of this 1 bit measurement adds the instruction (14, #, y, #, 1), so that in all subsequent executions, string $a^6$ is in $Ǭ(11010\ 011\ X)$'s language. Finally, the third quantum random instruction (x, #, x, 0) measured a 1 so it is shown above as (x, #, x, 1_qr, 0). The result of this 1 bit measurement adds the instruction (15, #, y, #, 1), so that in all subsequent executions, string $a^7$ is in $Ǭ(11010\ 011\ x)$'s language.

Lastly, starting at state 0, we examine a distinct execution of ex-machine $Q(11010\ x)$ on input memory $\#\ \#aaaaaaa\#\#$. A distinct execution of $Q(11010\ x)$ evolves to ex-machine $Q(11010\ 000\ x)$.

| STATE | MEMORY | ADDRESS | INSTRUCTION | NEW INSTRUCTION |
|---|---|---|---|---|
| 8 | ## aaaaaaa### | 1 | (0, #, 8, #, 1) | |
| 9 | ##a aaaaaa### | 2 | (8, a, 9, a, 1) | |
| 10 | ##aa aaaaa### | 3 | (9, a, 10, a, 1) | |
| 11 | ##aaa aaaa### | 4 | (10, a, 11, a, 1) | |
| 12 | ##aaaa aaa### | 5 | (11, a, 12, a, 1) | |
| 13 | ##aaaaa aa### | 6 | (12, a, 13, a, 1) | |
| x | ##aaaaaa a### | 6 | (13, a, x, a, 0) | |
| t | ##aaaaaa 0a### | 6 | (x, a, t, 0_qr, 0) | |
| w | ##aaaaaa aa### | 6 | (t, 0, w, a, 0, (\|Q\|−1, #, n, #, 1)) | (13, #, n, #, 1) |
| 14 | ##aaaaaaa a### | 7 | (w, a, \|Q\|, a, 1, (\|Q\|−1, a, \|Q\|, a, 1)) | (13, a, 14, a, 1) |
| x | ##aaaaaaa a### | 7 | (14, a, x, a, 0) | (14, a, x, a, 0) |
| t | ##aaaaaaa 0### | 7 | (x, a, t, 0_qr, 0) | |
| w | ##aaaaaaa a### | 7 | (t, 0, w, a, 0, (\|Q\|−1, #, n, #, 1)) | (14, #, n, #, 1) |
| 15 | ##aaaaaaaa ### | 8 | (w, a, \|Q\|, a, 1, (\|Q\|−1, a, \|Q\|, a, 1)) | (14, a, 15, a, 1) |
| x | ##aaaaaaaa ### | 8 | (15, #, x, #, 0) | (15, #, x, #, 0) |
| x | ##aaaaaaaa 0## | 8 | (x, #, x, 0_qr, 0) | |
| v | ##aaaaaaaa ### | 8 | (x, 0, v, #, 0, (\|Q\|−1, #, n, #, 1)) | (15, #, n, #, 1) |
| n | ##aaaaaaaa# ## | 9 | (v, #, n, #, 1, (\|Q\|−1, a, \|Q\|, a, 1)) | (15, a, 16, a, 1) |
| h | ##aaaaaaaa# N# | 9 | (n, #, h, N, 0) | |

Based on our previous examination of ex-machine $Q(x)$ evolving to $Q(11010\ x)$ and then subsequently $Q(11010\ x)$ evolving to $Q(11010\ 011\ x)$, ex-machine 2 specifies $Q(a_0\ a_1\ \ldots\ a_m\ x)$ in terms of initial machine states and initial machine instructions.

Machine Specification 2.

$Q(a_0\ a_1\ \ldots\ a_m\ x)$

Let $m \in \mathbb{N}$. Set $Q = \{0, h, n, y, t, v, w, x, 8, 9, 10, \ldots m+8, m+9\}$. For $0 \leq i \leq m$, each $a_i$ is 0 or 1. ex-machine $Q(a_0\ a_1\ \ldots\ a_m\ x)$'s instructions are shown below. Symbol $b_8 = y$ if $a_0 = 1$. Otherwise, symbol $b_8 = n$ if $a_0 = 0$. Similarly, symbol $b_9 = y$ if $a_1 = 1$. Otherwise, symbol $b_9 = n$ if $a_1 = 0$. And so on until reaching the second to the last instruction (m+8, #, $b_m+8$, #, 1), symbol $b_{m+8}$ y if $a_m = 1$. Otherwise, symbol $b_{m+8}$ n if $a_m = 0$.

(0, #, 8, #, 1)
(y, #, h, Y, 0)
(n, #, h, N, 0)
(x, #, x, 0)
(x, a, t, 0)
(x, 0, v, #, 0, (\|Q\|−1, #, n, #, 1))
(x, 1, w, #, 0, (\|Q\|−1, #, y, #, 1))
(t, 0, w, a, 0, (\|Q\|−1, #, n, #, 1))
(t, 1, w, a, 0, (\|Q\|−1, #, y, #, 1))
(v, #, n, #, 1, (\|Q\|−1, a, \|Q\|, a, 1))
(w, #, y, #, 1, (\|Q\|−1, a, \|Q\|, a, 1))
(w, a, \|Q\|, a, 1, (\|Q\|−1, a, \|Q\|, a, 1))
(\|Q\|−1, a, x, a, 0)
(\|Q\|−1, #, x, #, 0)
(8, #, $b_8$, #, 1)
(8, a, 9, a, 1)
(9, #, $b_9$, #, 1)
(9, a, 10, a, 1)
(10, #, $b_{10}$, #, 1)
(10, a, 11, a, 1)
. . .
(i+8, #, $b_{i+8}$, #, 1)
(i+8, a, i+9, a, 1)
. . .
(m+7, #, $b_{m+7}$, #, 1)
(m+7, a, m+8, a, 1)
(m+8, #, $b_{m+8}$, #, 1)
(m+8, a, m+9, a, 1)

Machine Computation Property 3.1.

Whenever i satisfies $0 \leq i \leq m$, string $a^i$ is in $Q(a_0\ a_1\ \ldots\ a_m\ x)$'s language if $a_i = 1$; string $a^i$ is not in $Q(a_0\ a_1\ \ldots\ a_m\ x)$'s language if $a_i = 0$. Whenever $n > m$, it has not yet been determined whether string $a^n$ is in $Q(a_0\ a_1\ \ldots\ a_m\ x)$'s language or not in its language.

Proof.

When $0 \leq i \leq m$, the first consequence follows immediately from the definition of $a^i$ being in $Q(a_0\ a_1\ \ldots\ a_m\ x)$'s language and from ex-machine 2. In instruction (i+8, #, $b_{i+8}$, #, 1) the state value of $b_{i+8}$ is y if $a_i = 1$ and $b_{i+8}$ is n if $a_i = 0$.

For the indeterminacy of strings $a^n$ when $n > m$, ex-machine $Q(a_0\ \ldots\ a_m\ x)$ executes its last instruction (m+8, a, m+9, a, 1) when it is scanning the mth a in $a^n$. Subsequently, for each a on the memory to the right (higher memory addresses) of $\#a^m$, ex-machine $Q(a_0\ \ldots\ a_m\ x)$ executes the quantum random instruction (x, a, t, 0).

If the execution of (x, a, t, 0) measures a 0, the two meta instructions (t, 0, w, a, 0, (\|Q\|−1, #, n, #, 1)) and (w, a, \|Q\|, a, 1, (\|Q\|−1, a, \|Q\|, a, 1)) are executed. If the next alphabet symbol to the right is an a, then a new standard instruction is executed that is instantiated from the simple meta instruction (\|Q\|−1, a, x, a, 0). If the memory address was pointing to the last a in $a^n$, then a new standard instruction is executed that is instantiated from the simple meta instruction (\|Q\|−1, #, x, #, 0).

If the execution of (x, a, t, 0) measures a 1, the two meta instructions (t, 1, w, a, 0, (\|Q\|−1, #, y, #, 1)) and (w, a, \|Q\|, a, 1, (\|Q\|−1, a, \|Q\|, a, 1)) are executed. If the next alphabet symbol to the right is an a, then a new standard instruction is executed that is instantiated from the simple meta instruction (\|Q\|−1, a, x, a, 0). If the memory address was pointing to the last a in $a^n$, then a new standard instruction is executed that is instantiated from the simple meta instruction (\|Q\|−1, #, x, #, 0).

In this way, for each a on the memory to the right (higher memory addresses) of $\#a^m$, the execution of the quantum random instruction (x, a, t, 0) determines whether each string $a^{m+k}$, satisfying $1 \leq k \leq n-m$, is in or not in $Q(a_0\ a_1\ \ldots\ a_n\ x)$'s language.

After the execution of (\|Q\|−1, #, x, #, 0), the memory address is pointing to a blank symbol, so the quantum random instruction (x, #, x, 0) is executed. If a 0 is measured by the quantum random source, the meta instructions (x, 0, v, #, 0, (| Q|−1, #, n, #, 1)) and (v, #, n, #, 1, (| Q|−1, a, | Q|, a, 1)) are executed. Then the last instruction executed is (n, #, h, N, 0) which indicates that $a''$ is not in $Q(a_0 \, a_1 \ldots a_n \, x)$'s language.

If the execution of (x, #, x, 0) measures a 1, the meta instructions (x, 1, w, #, 0, (| Q|−1, #, y, #, 1)) and (w, #, y, #, 1, (| Q|−1, a, | Q|, a, 1)) are executed. Then the last instruction executed is (y, #, h, Y, 0) which indicates that $a''$ is in $Q(a_0 \, a_1 \ldots a_n \, x)$'s language.

During the execution of the instructions, for each a on the memory to the right (higher memory addresses) of $\#a^m$, ex-machine $Q(a_0 \, a_1 \ldots a_m \, x)$ evolves to $Q(a_0 \, a_1 \ldots a_n \, x)$ according to the specification in ex-machine 2, where one substitutes n for m. □

Remark 3.3.

When the binary string $a_0 \, a_1 \ldots a_m$ is presented as input, the ex-machine instructions for $Q(a_0 \, a_1 \ldots a_m \, x)$, specified in ex-machine 2, are constructible (i.e., can be printed) with a standard machine.

In contrast with lemma 3.1, $Q(a_0 \, a_1 \ldots a_m \, x)$'s instructions are not executable with a standard machine when the input memory # $\#a^i\#$ satisfies i>m because meta and quantum random instructions are required. Thus, remark 3.3 distinguishes the construction of $Q(a_0 \, a_1 \ldots a_m \, x)$'s instructions from the execution of $Q(a_0 \, a_1 \ldots a_m \, x)$'s instructions.

Proof.

When given a finite list $(a_0 \, a_1 \ldots a_m)$, where each $a_1$ is 0 or 1, the code listing below constructs $Q(a_0 \, a_1 \ldots a_m \, x)$'s instructions. Starting with comment ;; Qx_builder.lsp, the code listing is expressed in a dialect of LISP, called new-LISP. (See www.newlisp.org). LISP was designed, based on the lambda calculus, developed by Alonzo Church. The appendix of [33] outlines a proof that the lambda calculus is computationally equivalent to digital computer instructions (i.e., standard machine instructions). The following 3 instructions print the ex-machine instructions for $Q(11010 \, x)$, listed in machine instructions 2.

```
(set 'a0_a1_dots_am (list 1 1 0 1 0) )
(set 'Qx_machine (build_Qx_machine a0_a1_dots_am) )
(print_xmachine Qx_machine) □
;; Qx_builder.lsp
(define (make_qr_instruction q_in a_in q_out move)
   (list (string q_in) (string a_in) (string q_out) (string move)) )
;; Move is −1, 0 or 1
(define (make_instruction q_in a_in q_out a_out move)
(list (string q_in) (string a_in)
      (string q_out) (string a_out) (string move)) )
(define (make_meta_instruction q_in a_in q_out a_out move_standard
      r_in b_in r_out b_out move_meta)
(list (string q_in) (string a_in)
      (string q_out) (string a_out) (string move_standard)
      (make_instruction r_in b_in r_out b_out move_meta) ) )
(define (initial_Qx_machine)
   (list
     (make_instruction "0" "#" "8" "#" 1)
     (make_instruction "8" "#" "x" "#" 0)
     ;; This means string a^i is in the language.
     (make_instruction "y" "#" "h" "Y" 0)
     ;; This means string a^i is NOT in the language.
     (make_instruction "n" "#" "h" "N" 0)
     (make_qr_instruction "x" "#" "x" 0)
     (make_qr_instruction "x" "a" "t" 0)
     (make_meta_instruction "x" "0" "y" "#" 0 "|Q|-1" "#" "n" "#" 1)
     (make_meta_instruction "x" "1" "w" "#" 0 "|Q|-1" "#" "y" "#" 1)
     (make_meta_instruction "t" "0" "w" "a" 0 "|Q|-1" "#" "n" "#" 1)
     (make_meta_instruction "t" "1" "w" "a" 0 "|Q|-1" "#" "y" "#" 1)
     (make_meta_instruction "v" "#" "n" "#" 1 "|Q|-1" "a" "|Q|" "a" 1)
     (make_meta_instruction "w" "#" "y" "#" 1 "|Q|-1" "a" "|Q|" "a" 1)
     (make_meta_instruction "w" "a" "|Q|" "a" 1 "|Q|-1" "a" "|Q|" "a" 1)
     (make_instruction "|Q|-1" "a" "x" "a" 0)
     (make_instruction "|Q|-1" "#" "x" "#" 0)
))
(define (add_instruction instruction q_list)
   (append q_list (list instruction) ) )
(define (check_a0_a1_dots_am a0_a1_dots_am)
   (if (list? a0_a1_dots_am)
       (dolist (a_i a0_a1_dots_am)
          (if (member a_i (list 0 1) )
              true
              (begin
                (println "ERROR! (build_Qx_machine
                 a0_a1_dots_am). a_i = "a_i)
                (exit)
              )
           )
           a0_a1_dots_am )
           nil
    ))
;;;;;;;;;;;;;; BUILD MACHINE Q(a0 a1 … am x)
;; a0_a1_dots_am has to be a list of 0's and 1's or '( )
(define (build_Qx_machine a0_a1_dots_am)
  (let
    ( (Qx_machine (initial_Qx_machine))
      (|Q| 8)
      (b_|Q| nil)
      (ins1 nil)
      (ins2 nil)
    )
    (set 'check (check_a0_a1_dots_am a0_a1_dots_am) )
    ;; if nil OR check is an empty list, remove instruction (8, #, x, #, 0)
    (if (or (not check) (empty? check) )
        true
        (set 'Qx_machine (append (list (Qx_machine 0))
        (rest (rest Qx_machine))))
    )
    (if (list? a0_a1_dots_am)
        (dolist (a_i a0_a1_dots_am)
           (if ( = a_i 1)
              (set 'b_ |Q| "y")
              (set 'b_ |Q| "n") )
           (set 'ins1 (make_instruction |Q| "#" b_|Q| "#" 1) )
           (set 'Qx_machine (add_instruction ins1 Qx_machine) )
           (set 'ins2 (make_instruction |Q| "a" (+ |Q| 1) "a" 1))
           (set 'Qx_machine (add_instruction ins2 Qx_machine) )
           (set '|Q| (+ |Q| 1) )
         )
    )
    Qx_machine
 ))
(define (print_elements instruction)
   (let
      ( (idx_ub (min 4 (− (length instruction) 1)) ) (i 0) )
      (for (i 0 idx_ub)
        (print (instruction i) )
        (if (< i idx_ub) (print ", "))
      )
    ))
(define (print_instruction instruction)
   (print "(")
   (if ( <= (length instruction) 5)
      (print_elements instruction)
      (begin
        (print_elements instruction)
        (print ", (")
        (print_elements (instruction 5) )
        (print ") ") ) )
    (println ") ") )
(define (print_xmachine x_machine)
   (println)
   (dolist (instruction x_machine)
      (print_instruction instruction))
   (println)
)
```

Machine Specification 3.3.

Define $\mathcal{U}$ as the union of $Q(x)$ and all ex-machines $Q(a_0 \ldots a_m x)$ for each $m \in \mathbb{N}$ and for each $a_0 \ldots a_m$ in $\{0, 1\}^{m+1}$. In other words, $$\mathfrak{U} = \{\mathfrak{Q}(x)\} \cup \bigcup_{m=0}^{\infty} \bigcup_{a_0 \ldots a_m \in \{0,1\}^{m+1}} \{\mathfrak{Q}(a_0 a_1 \ldots a_m x)\}.$$

Theorem 3.2.

Each language $L_f$ in $\mathfrak{L}$ can be computed by the evolving sequence of ex-machines $\mathfrak{Q}(x)$, $\mathfrak{Q}(f(0)\ x)$, $\mathfrak{Q}(f(0)\ f(1)\ x)$, ..., $\mathfrak{Q}(f(0)f(1)\ldots f(n)\ x)$, ....

Proof.

The theorem follows from ex-machine 1, ex-machine 2 and lemma 3.1. □

Machine Computation Property 3.3.

Given function $f: \mathbb{N} \to \{0, 1\}$, for any arbitrarily large n, the evolving sequence of ex-machines $\mathfrak{Q}(f(0)f(1)\ldots f(n)\ x)$, $\mathfrak{Q}(f(0)f(1)\ldots f(n)f(n+1)\ x)$, ... computes language $L_f$.

Machine Computation Property 3.4.

Moreover, for each n, all ex-machines $\mathfrak{Q}(x)$, $\mathfrak{Q}(f(0)x)$, $\mathfrak{Q}(f(0)\ f(1)\ x)$, ..., $\mathfrak{Q}(f(0)f(1)\ldots f(n)\ x)$ combined have used only a finite amount of memory, finite number of states, finite number of instructions, finite number of executions of instructions and only a finite amount of quantum random information measured by the quantum random instructions.

Proof.

For each n, the finite use of computational resources follows immediately from remark 2, specification 7 and the specification of ex-machine 2. □

A set X is called countable if there exists a bijection between X and $\mathbb{N}$. Since the set of all Turing machines is countable and each Turing machine only recognizes a single language most (in the sense of Cantor's hierarchy of infinities) languages $L_f$ are not computable with a Turing machine. More precisely, the cardinality of the set of languages $L_f$ computable with a Turing machine is $\aleph_0$, while the cardinality of the set of all languages $\mathfrak{L}$ is $\aleph_1$.

For each non-negative integer n, define the language tree $\mathcal{L}(a_0\ a_1 \ldots a_n)$ $\{L_f: f \in \{0, 1\}^{\mathbb{N}}$ and $f(i)\ a_i$, for i satisfying $0 \le i \le n\}$. Define the corresponding subset of $\{0, 1\}^{\mathbb{N}}$ as $\mathcal{S}(a_0\ a_1 \ldots a_n) = \{f \in \{0, 1\}^{\mathbb{N}}: f(i)\ a_i$ for i satisfying $0 \le i \le n\}$. Let $\Psi$ denote this 1-to-1 correspondence, where $\mathfrak{L} \overset{\Psi}{\leftrightarrow} \{0, 1\}^{\mathbb{N}}$ and $$\mathcal{L}(a_0\ a_1 \ldots a_n) \overset{\Psi}{\leftrightarrow} \mathcal{S}(a_0\ a_1 \ldots a_n).$$

Since the two quantum random axioms 1 and 2 are satisfied, each finite path $f(0)f(1)\ldots f(n)$ is equally likely and there are $2^{n+1}$ of these paths. Thus, each path of length n+1 has probability $2^{-(n+1)}$. These uniform probabilities on finite strings of the same length can be extended to the Lebesgue measure $\mu$ on probability space $\{0, 1\}^{\mathbb{N}}$. Hence each subset $\mathcal{S}(a_0\ a_1 \ldots a_n)$ has measure $2^{-(n+1)}$. That is, $\mu(\mathcal{S}(a_0\ a_1 \ldots a_n)) = 2^{-(n+1)}$ and $\mu(\{0, 1\}^{\mathbb{N}}) = 1$. Via the $\Psi$ correspondence between each language tree $\mathcal{L}(a_0\ a_1 \ldots a_n)$ and subset $\mathcal{S}(a_0\ a_1 \ldots a_n)$, uniform probability measure p induces a uniform probability measure $\nu$ on $\mathfrak{L}$, where $\nu(\mathcal{L}(a_0\ a_1 \ldots a_n)) = 2^{-(n+1)}$ and $\nu(\mathfrak{L}) = 1$.

Theorem 3.5.

For Functions $f: \mathbb{N} \to \{0, 1\}$, the Probability that Language $L_f$ is Turing Incomputable has Measure 1 in $(\nu, \mathfrak{L})$.

Proof.

The Turing machines are countable and therefore the number of functions $f: \mathbb{N} \to \{0, 1\}$ that are Turing computable is countable. Hence, via the $\Psi$ correspondence, the Turing computable languages $L_f$ have measure 0 in $\mathfrak{L}$. □

Moreover, the Martin-Löf random sequences $f: \mathbb{N} \to \{0, 1\}$ have Lebesgue measure 1 in $\{0,1\}^{\mathbb{N}}$ and are a proper subset of the Turing incomputable sequences.

Machine Computation Property 3.6.

$\mathfrak{Q}(x)$ is not a Turing machine. Each ex-machine $\mathfrak{Q}(a_0\ a_1 \ldots a_m\ x)$ in $\mathfrak{U}$ is not a Turing machine.

Proof.

$\mathfrak{Q}(x)$ can evolve to compute Turing incomputable languages on a set of probability measure 1 with respect to $(\nu, \mathfrak{L})$. Also, $\mathfrak{Q}(a_0\ a_1 \ldots a_m\ x)$ can evolve to compute Turing incomputable languages on a set of measure $2^{-(m+1)}$ with respect to $(\nu, \mathfrak{L})$. In contrast, each Turing machine only recognizes a single language, which has measure 0. In fact, the measure of all Turing computable languages is 0 in $\mathfrak{L}$. □

Remark 3.4.

The statements in theorem 3.5 and corollary 3.6 can be sharpened when deeper results are obtained for the quantum random source used by the quantum random instructions.

4 A Non-Deterministic Execution Machine

A brief, intuitive summary of a non-deterministic execution machine is provided first before the formal description in machine specification 4.1. Our non-deterministic execution machine should not be confused with the nondeterministic Turing machine that is described on pages 30 and 31 of [12].

Part of the motivation for our approach is that procedure 4 is easier to analyze and implement. Some embodiments of procedure 4 can be implemented using non-deterministic generator 142 in FIG. 23. In some embodiments, the non-deterministic generator 142 in FIG. 23 along with a source of photons shown in FIG. 24 and FIG. 25 can help implement procedure 4 with quantum random measurements 6730, shown in FIG. 67. Moreover, our non-deterministic execution machine can be emulated with an ex-machine.

In a standard digital computer, the computer program can be specified as a function; from a current machine configuration (q, k, T), where q is the machine state, k is the memory address being scanned and T is the memory, there is exactly one instruction to execute next or the Turing machine halts on this machine configuration.

Instead of a function, in embodiments of our invention(s) of a non-deterministic execution machine, the program $\mathcal{I}$ is a relation. From a particular machine configuration, there is ambiguity on the next instruction I in $\mathcal{I}$ to execute. This is computational advantage when the adversary does not know the purpose of the program $\mathcal{I}$. Measuring randomness with quantum random measurements 6730 in FIG. 67 helps select the next instruction to execute. In some embodiments, the quantum randomness is measured, using the non-deterministic hardware shown in FIGS. 23, 24, and 25.

Part of our non-deterministic execution machine specification is that each possible instruction has a likelihood of being executed. Some quantum randomness is measured with 6730 in FIG. 67 and the next instruction executed is selected according to this quantum measurement and each instruction's likelihood. In some embodiments, the quantum randomness is measured, using hardware that is designed according to the protocol in FIG. 70.

Before machine specifications are provided, some symbol definitions are reviewed. Symbol $\mathbb{N}^+$ is the positive integers. Recall that $\mathbb{Q}$ represents the rational numbers. [0, 1] is the closed interval of real numbers x such that $0 \le x \le 1$. The expression $x \notin X$ means element x is NOT a member of X. For example, $$-1 \notin \mathbb{N}, \quad \frac{3}{127} \in \mathbb{Q} \quad \text{and} \quad \frac{1+\sqrt{5}}{2} \notin \mathbb{Q}.$$

The symbol ∩ means intersection. Note $$\left\{-5, 0, \frac{3}{127}\right\} \cap \mathbb{Q} =$$

$$\left\{-5, 0, \frac{3}{127}\right\} \text{ and } \left\{-5, 0, \frac{1+\sqrt{5}}{2}, \pi\right\} \cap \mathbb{Q} = \{-5, 0\}.$$

Machine Specification 4.1.
A Non-Deterministic Execution Machine
A non-deterministic machine $\mathcal{N}$ is defined as follows:
Q is a finite set of states.
$\mathcal{F}$ is a set of final states and $\mathcal{F} \subset \mathcal{Q}$
When machine execution begins, the machine is in an initial state $q_0$ and $q_0 \in Q$.
$\mathcal{A}$ is a finite set of alphabet symbols that are read from and written to memory.
\# is a special alphabet symbol called the blank symbol that lies in $\mathcal{A}$.
The machine's memory T is represented as a function T: $\mathbb{Z} \to \mathcal{A}$. The alphabet symbol stored in the kth memory cell is T(k).
$\mathcal{I}$ is a next-instruction relation, which is a subset of Q× $\mathcal{A} \times Q \times \mathcal{A} \times \{-1, 0, +1\}$. $\mathcal{I}$ acts as a non-deterministic program where the non-determinism arises from how an instruction is selected from $\mathcal{I}$ before it is executed. Each instruction I that lies in the set $\mathcal{I}$ specifies how machine $\mathcal{N}$ executes a computational step. When machine $\mathcal{N}$ is in state q and scanning alphabet symbol α=T(k) at memory cell (address) k, an instruction (such that the first two coordinates of I are q and α, respectively) is non-deterministically selected. If instruction I=(q, α, r, β, y) is selected, then instruction I is executed as follows:
Machine $\mathcal{I}$ changes from machine state q to machine state r.
Machine $\mathcal{I}$ replaces alphabet symbol α with alphabet symbol β so that T(k)=β. The rest of the memory remains unchanged.
If y=−1, then machine N starts scanning one memory cell downward in memory and is subsequently scanning the alphabet symbol T(k−1), stored in memory address k−1.
If y=+1, then machine N starts scanning one memory cell upward in memory and is subsequently scanning the alphabet symbol T(k+1), stored in memory address k+1.
If y=0, then machine $\mathcal{I}$ continues to scan the same memory cell and subsequently is scanning alphabet symbol T(k)=β, stored in memory address k.
To assure $\mathcal{I}$ is a physically realizable machine, before machine $\mathcal{I}$ starts executing, there exist M>0 such that the memory contains only blank symbols (i.e., T(k)=\#) in all memory addresses, satisfying |k|>M.
$\mathcal{P} = \{p_1, p_2, \ldots, p_{|\mathcal{I}|}\}$ is a finite set of rational numbers, contained in $\mathbb{Q} \cap [0, 1]$, such that $|\mathcal{P}| = |\mathcal{I}|$, where $|\mathcal{I}|$ is the number of instructions in $\mathcal{I}$.
v: $\mathcal{I} \to \mathcal{P}$ is a bijective function. Let I be an instruction in $\mathcal{I}$. The purpose of v(I) is to help derive the likelihood of non-deterministically selecting instruction I as the next instruction to execute.
Non-deterministic machine 4.1 can be used to execute two different instances of a procedure with a different sequence of machine instructions 6700, as shown in FIG. 67.

Machine Specification 4.2.
Machine Configurations and Valid Computational Steps
A machine configuration $\mathcal{M}_i$ is a triplet (q, k, $T_i$) where q is a machine state, k is an integer which is the current memory address being scanned and $T_i$ represents the memory. Consider machine configuration $\mathcal{M}_{i+1} = (r, 1, T_{i+1})$.
Per machine specification 4.1, then $\mathcal{M}_i \overset{I}{\mapsto} \mathcal{M}_{i+1}$ is a valid computational step if instruction I=(q, α, r, β, y) in $\mathcal{I}$ and memories $T_i$ and $T_{i+1}$ satisfy the following four conditions:
1. v(I)>0.
2. $T_i(k) = \alpha$.
3. $T_{i+1}(k) = \beta$ and $T_{i+1}(j) = T_i(j)$ for all j≠k.
4. l=k+y.

Symbol $\mathbb{N}^+$ is the positive integers. Recall that $\mathbb{Q}$ represents the rational numbers. [0, 1] is the closed interval of real numbers x such that 0≤x≤1. The expression x∉X means element x is NOT a member of X. For example, $$-1 \notin \mathbb{N}, \quad \frac{3}{127} \in \mathbb{Q} \quad \text{and} \quad \frac{1+\sqrt{5}}{2} \notin \mathbb{Q}.$$

The symbol ∩ means intersection. Note $$\left\{-5, 0, \frac{3}{127}\right\} \cap \mathbb{Q} =$$

$$\left\{-5, 0, \frac{3}{127}\right\} \text{ and } \left\{-5, 0, \frac{1+\sqrt{5}}{2}, \pi\right\} \cap \mathbb{Q} = \{-5, 0\}.$$

The purpose of machine procedure 3 is to describe how a non-deterministic machine selects a machine instruction from the collection $\mathcal{J}$ of machine instructions 6700 as shown in FIG. 67. This non-deterministic selection of the next instruction is based on the machine specification (i.e., function) v: $\mathcal{I} \to \mathcal{P}$ and one or more quantum random measurements, executed by random instructions 6740. In our procedures, a line starting with ;; is a comment. Procedure 3 can be implemented as a computing system (FIG. 69) with standard instructions 6710, meta instructions 6720, and random instructions 6740, as shown in FIG. 67. Combining procedure 3 and recognizing that the other parts of machine specification 4.1 are contained in the standard, meta, and random instructions, non-deterministic, self-modifiable (e.g., ex-machine) computation can execute the non-deterministic execution machine in machine specification 4.1.
Machine Instructions 3.

;; The instructions in $\mathcal{J}$ are indexed as $\{J_1, J_2, \ldots, J_m\}$, where $\mathcal{J} \subset \mathcal{I}$.

set $\sigma = \sum_{i=1}^{m} v(J_i)$

;; The interval [0, 1) is subdivided into subintervals with rational endpoints.
set i = 1
set x = 0 set $\delta_i = \frac{v(J_1)}{\sigma}$ while( i ≤ m )
{
  set $L_i = [x, x + \delta_i)$
  increment i set $\delta_i = \dfrac{v(J_i)}{\sigma}$ update x to x + δ
} set $\delta = \dfrac{1}{2} \min\{\delta_1, \delta_2, \ldots, \delta_m\}$ compute n > 0 so that $2^{-n} < \delta$
using a non-deterministic generator, sample n bits $b_1, b_2, \ldots, b_n$ set $x = \sum_{i=1}^{n} b_i \, 2^{-i}$ select instruction $J_k$ such that x lies in interval $L_k$

---

In some embodiments, machine instructions (procedure) 4 can be implemented with standard instructions 6710, meta instructions 6720, and random instructions 6740, as shown in FIG. 67. Random instructions 6740 take quantum random measurements 6740, while executing. In some embodiments, quantum random measurements 6740 are measured according to protocol in FIG. 70. In other embodiments, random measurements 6740 are measured with non-deterministic generator 142, shown in FIG. 23.

In some embodiments, machine instructions non-deterministically selected may be represented in a C programming language syntax. In some embodiments, some of the instructions non-deterministically selected to execute have the C syntax such as x=1; or z=x*y;. In some embodiments, one of instructions selected may be a loop with a body of machine instructions such as:

```
for(i = 0; i < 100; i++)
{
    .../* body of machine instructions, expressed in C. */
}
```

In some embodiments, a random instruction may measure a random bit, called random_bit and then non-deterministically execute according to the following code:

```
if (random_bit == 1)
    C_function_1 ( );
else if (random_bit == 0)
    C_function_2 ( );
```

In other embodiments, the machine instructions may have a programming language syntax such as JAVA, Go Haskell, C++, RISC machine instructions, JAVA virtual machine, Ruby, LISP Machine Instructions 4.

```
;; |F| is the number of final states in F = {f_1, f_2, ..., f_{|F|}}.
;; q_0 is an initial machine state and q_0 ∉ F
;; The symbols s_1, s_2, ... s_{|F|} are the final state scores.
;; Final state score s_i tallies how many times final state f_i is reached.
;; a_i is the alphabet symbol stored at memory address i before the
    inner loop is entered.
;; ε is the reliability threshold. ε ∈ ℚ such that 0 < ε < 1 and is
    usually very small.
;; r is the variable that stores the current reliability value.
    for each q in Q
        for each a in A
        {
            store in J_{q,a} all instructions I in I ∩ (Q × A × Q × A ×
            {−1, 0, +1}) where instruction I's 1st coordinate is q, I's 2nd
            coordinate is a and v(I) > 0
        }
;; Initialize each score to 0 before entering the outer loop.
set s_1 = 0  set s_2 = 0  ...  set s_{|F|} = 0
;; Initialize n = c where c > 1. The procedure works independent of c.
set n = |Q| |A|
set r = 1 + ε
while ( r ≥ ε )
{   ;; When 0 ≤ i < m, T(i) = a_i and T(k) = # whenever k < 0 or
    k ≥ m.
    store word a_0 a_1 ... a_{m−1} in memory
    start scanning memory address k = 0
    initialize machine state q = q_0
    set j = 1 set $r = \dfrac{1}{\lceil \log_2(n) \rceil}$ set d = 1   ;; — d is the membership degree of the random
    instructions selected.
    set d_{max} = 0
    while ( j ≤ n AND q ∉ F )
    {
        Set a = T(k), where k is the current memory address bein scanned.
        randomly select instruction I_j from J_{q,a} by executing procedure 3
        Per definition 4.1 execute instruction I_j = (q, α_j, r_j, β_j, y), which
        updates state q = r_j, writes β_j in tape square k and moves tape head
        location k to y + k.
        set d equal to d * v(I_j)
        if new machine state q is a final state f_i
        { set $\sigma = \sum_{l=1}^{|F|} s_l$  set $\gamma_i = \dfrac{s_i}{\sigma}$  set $\kappa_i = \dfrac{s_i + 1}{\sigma + 1}$  set $\delta_i = |\kappa_i - \gamma_i|$ if δ_i > r set r = δ_i
            if d > d_{max} set d_{max} = d
            increment score s_i
        }
        increment j
    }
    increment n
}
```

In machine instructions (procedure) 4, the ex-machine that implements the pseudocode executes a particular non-deterministic machine a finite number of times and if a final state is reached, the procedure increments the corresponding final state score. After the final state scores have been tallied such that they converge inside the reliability interval (0, ε), then the ex-machine execution is completed and the ex-machine halts.

Machine Instructions 5.

```
INPUT: Machine is in state q_0 and the memory is initialized
to ... ## a_0 a_1 ... a_{m−1} ## ...
    for each q in Q
        for each a in A
        {
            store in J_{q,a} all instructions I in I ∩
            (Q × A × Q × A × {−1, 0, +1}) where
            instruction I's 1st coordinate is q, I's 2nd coordinate
            is a and v(I) > 0
        }
;; Initialize n = N where N > 1.
set n = N
set l = 1
while ( l ≤ r )
```

-continued

```
{
  ;; When 0 ≤ i < m, T(i) = a_i, and T(k) = #
  whenever k < 0 or k ≥ m.
  store word a_0 a_1 ... a_{m-1} in memory
  start scanning memory address k = 0
  initialize machine state q = q_0
  set j = 1
  set d = 1 # d is the membership degree of the
  random instructions selected.
  set d_max = 0
  while ( j ≤ n AND q ∉ F )
  {
    Set a = T(k), where k is the current memory address
    being scanned.
    randomly select instruction I_j from J_{q,a} by
    executing procedure 3.
    Per specification 4.1 execute instruction I_j =
    (q, α_j, r_j, β_j, x), which updates state
    q = r_j, writes β_j in tape square k and moves to
    memory address k to x + k.
    set d equal to d*v (I_j).
    if new machine state q is final state f_i
    {
      if d > d_max set d_max = d
    }
    increment j
  }
  increment l
}
OUTPUT: d_max
```

Machine instructions 5 is useful for executing a computational procedure so that each instance of the procedure executes a different sequence of instructions and in a different order. This unpredictability of the execution of instructions makes it difficult for an adversary to comprehend the computation. Machine instructions 5 can be executed with a finite sequence of standard, meta and random instructions as shown in FIG. 67.

In the following analysis, the likelihood of procedure (machine instructions) 4 finding the maximum is estimated.

Machine Computation Property 4.1.

For each x, let $v_x = v(I_x)$. Consider the acceptable computational path $$\mathcal{M}_0 \overset{I_{j_1}}{\mapsto} \mathcal{M}_1 \overset{I_{j_2}}{\mapsto} \mathcal{M}_2 \cdots \mathcal{M}_{N-1} \overset{I_{j_N}}{\mapsto} \mathcal{M}_N$$

such that machine configuration $\mathcal{M}_N$ is in final state $q_f$ and $p = v_{j_1} * v_{j_2} * \ldots * v_{j_N}$ is a maximum. The expected number of times that inner loop in procedure 5 executes acceptable path $$\mathcal{M}_0 \overset{I_{j_1}}{\mapsto} \mathcal{M}_1 \overset{I_{j_2}}{\mapsto} \mathcal{M}_2 \cdots \mathcal{M}_{N-1} \overset{I_{j_N}}{\mapsto} \mathcal{M}_N$$

is 0 when n<N and at least rp when n≥N.

Proof.

When n<N, it is impossible for the inner loop to execute the path $$\mathcal{M}_0 \overset{I_{j_1}}{\mapsto} \mathcal{M}_1 \overset{I_{j_2}}{\mapsto} \mathcal{M}_2 \cdots \mathcal{M}_{N-1} \overset{I_{j_N}}{\mapsto} \mathcal{M}_N,$$

so the expected number of times is 0. When n=N, the independence of each random sample that selects instruction $I_{j_i}$ and the fact that $$\mathcal{M}_0 \overset{I_{j_1}}{\mapsto} \mathcal{M}_1 \overset{I_{j_2}}{\mapsto} \mathcal{M}_2 \cdots \mathcal{M}_{N-1} \overset{I_{j_N}}{\mapsto} \mathcal{M}_N$$

is an acceptable path implies that the probability of executing this computational path is $p = v_{j_1} * v_{j_2} * \ldots * v_{j_N}$. When n>N, the probability of executing this path is still p because the inner loop exits if the final state in $\mathcal{M}_N$ is reached. □

Non-Deterministic Process and Quantum Random Hardware

Figure 24:
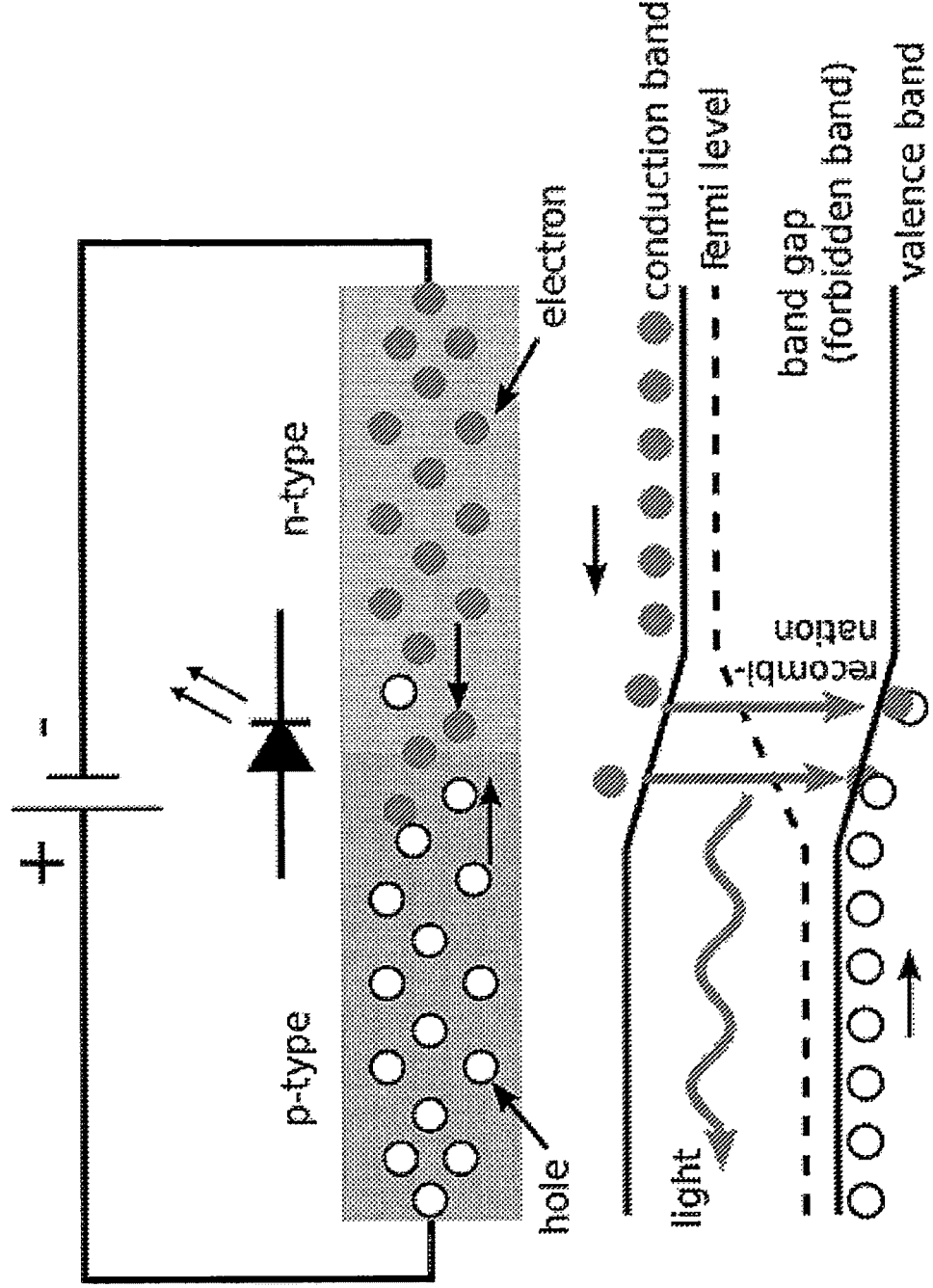
FIG. 24 shows a diagram of a semiconductor component of a light emitting diode that emits photons.
Figure 25:
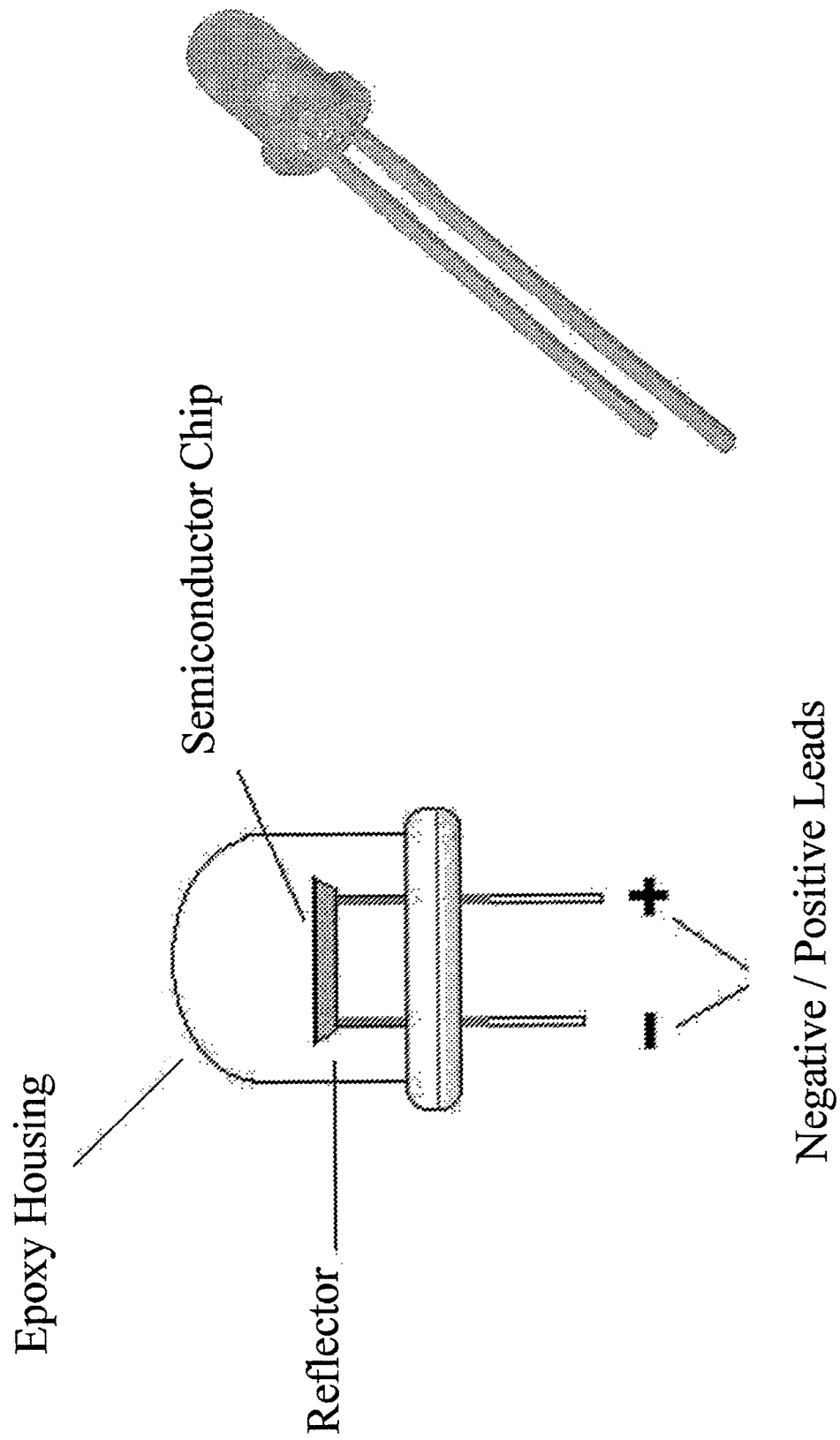
FIG. 25 shows a light emitting diode and some components.

Herein the term "process" refers to and expresses a broader notion than "algorithm". The formal notion of "Turing machine" and of "algorithm" was presented in Turing's paper [33] and refers to a finite deterministic machine that executes a finite number of instructions with finite memory. "Algorithm" is a deterministic process in the following sense: if the finite machine is completely known and the input to the deterministic machine is known, then the future behavior of the machine can be determined. There are quantum processes and other embodiments that measure quantum effects 6730 in FIG. 67 from photons (or other physically non-deterministic processes). One embodiment is shown in FIG. 23, FIG. 24 and FIG. 25. Quantum random measurements 6730 are used by random instructions 6740 in FIG. 67.

Some examples of physically non-deterministic processes are as follows. In some embodiments that utilize non-determinism, a semitransparent mirror may be used where photons that hit the mirror may take two or more paths in space. In one embodiment, if the photon is reflected then it takes on one bit value b that is a 0 or a 1; if the photon is transmitted, then it takes on the other bit value 1−b. In another embodiment, the spin of an electron may be sampled to generate the next non-deterministic bit.

In still another embodiment, a protein, composed of amino acids, spanning a cell membrane or artificial membrane, that has two or more conformations can be used to detect non-determinism: the protein conformation sampled may be used to generate a non-deterministic value in {0, . . . n−1} where the protein has n distinct conformations. In an alternative embodiment, one or more rhodopsin proteins could be used to detect the arrival times of photons and the differences of arrival times could generate non-deterministic bits. In some embodiments, a Geiger counter may be used to sample non-determinism. Lastly, any one of procedures in this specification may measure random events 6720 such as a quantum event (non-deterministic process). In some embodiments, these quantum events can be emitted by the light emitting diode (LED) device, shown in FIG. 24 and FIG. 25, and detected by the semiconductor device in FIG. 23, which are discussed further below.

In an embodiment, a transducer measures the quantum effects from the emission and detection of photons, wherein the randomness is created by the non-deterministic process of photon emission and photon detection. In some embodiments, light emitting diode shown in FIG. 24 and FIG. 25 emits photons that make up a non-deterministic process. The recognition of non-determinism observed by quantum random number generators and other quantum embodiments is based on experimental evidence and years of statistical testing. Furthermore, the quantum theory—derived from the Kochen-Specker theorem and its extensions [5, 6]—implies that the outcome of a quantum measurement cannot be known in advance and cannot be generated by a Turing machine (digital computer program). As a consequence, a physically non-deterministic process cannot be generated by an algorithm: namely, a sequence of operations executed by a digital computer program.

FIG. 23 shows an embodiment of a non-deterministic process arising from quantum events i.e., the arrival and detection of photons. In an embodiment, the photons are emitted by some photonic energy source. In an embodiment, FIG. 24 shows an LED (light emitting diode) that emits photons. Arrival times of photons are quantum events. The non-deterministic generator 142 in FIG. 23 shows an example of an embodiment of a non-deterministic process, detecting quantum events. The mathematical expression hv refers to the energy of the photon that arrives where h is Planck's constant and v is the frequency of the photon. In an embodiment, three consecutive arrival times $t_1 < t_2 < t_3$ of three detected consecutive photons may be compared. If $t_2 - t_1 > t_3 - t_2$, then non-deterministic generator 142 produces a 1 bit. If $t_2 - t_1 < t_3 - t_2$, then non-deterministic generator 142 produces a 0 bit. In the special case that $t_2 - t_1 = t_3 - t_2$, then no non-deterministic information is produced and three more arrival times are sampled by this non-deterministic process.

Non-Deterministic, Self-Modifiable Computation with an Active Element Machine

What are You Trying to Do? why is this Compelling?

Based upon the principles of Turing incomputability and connectedness and novel properties of the Active Element Machine, a malware-resistant computing machine is constructed. This novel computing machine is a non-Turing, non-register machine (non von-Neumann), called an active element machine (AEM). AEM programs are designed so that the purpose of the AEM computations are difficult to apprehend by an adversary and hijack with malware. As a method of protecting intellectual property, these methods can also be used to help thwart reverse engineering of proprietary algorithms, hardware design and other areas of intellectual property.

Limitations and Deficiencies of Prior Art

Some prior art has used the evolution of programs executing on a register machine (von=Neumann architecture) architecture. [Fred Cohen, "Operating Systems Protection Through Program Evolution", IFIP-TC11 'Computers and Security'(1993) V12#6 (October 1993) pp. 565-584].

The von Neumann architecture is a computing model for a stored-program digital computer that uses a CPU and a separate structure (memory) to store both instructions and data. Generally, a single instruction is executed at a time in sequential order and there is no notion of time in von-Neumann machine instructions: This creates attack points for malware to exploit. Some prior art has used obfuscated code that executes on a von-Neumann architecture. See <http://www.ioccc.org/main.html> on the International Obfuscated C code contest.

Some prior art relies on operating systems that execute on a register machine architecture. The register machine model creates a security vulnerability because its computing steps are disconnected. This topological property (disconnected) creates a fundamental mathematical weakness in the register machine so that register machine programs may be hijacked by malware. Next, this weakness is explained from the perspective of a digital computer program (computer science).

In DARPA's CRASH program <http://tinyurl.com/4khv28q>, they compared the number of lines of source code in security software written over twenty years versus malware written over the same period. The number of lines of code in security software grew from about 10,000 to 10 million lines; the number of lines of code in malware was almost constant at about 125 lines. It is our thesis that this insightful observation is a symptom of fundamental security weakness(es) in digital computer programs (prior art of register machines): It still takes about the same number of lines of malware code to hijack digital computer's program regardless of the program's size.

The sequential execution of single instructions in the register and von-Neumann machine make the digital computer susceptible to hijacking and sabotage. As an example, by inserting just one jmp WVCTF instruction into the program or changing the address of one legitimate jmp instruction to WVCTF, the purpose of the program can be hijacked.

| Malware Instructions (polymorphic variant) | | | |
|---|---|---|---|
| WVCTF: | mov | eax, | drl |
|  | jmp | Loc1 |  |
| Loc2: | mov | edi, | [eax] |
| LOWVCTF: | pop | ecx |  |
|  | jecxz | SFMM |  |
|  | inc | eax |  |
|  | mov | esi, | ecx |
|  | dec | eax |  |
|  | nop |  |  |
|  | mov | eax, | 0d601h |
|  | jmp | Loc3 |  |
| Loc1: | mov | ebx, | [eax + 10h] |
|  | jmp | Loc2 |  |
| Loc3: | pop | edx |  |
|  | pop | ecx |  |
|  | nop |  |  |
|  | call | edi |  |
|  | jmp | LOWVCTF |  |
| SFMM: | pop | ebx |  |
|  | Pop | eax |  |
|  | stc |  |  |

From a deterministic machine (DM) perspective, only one output state r of one DM program, command $\eta(q, a) = (r, b, x)$ needs to be changed to state m combined with additional hijacking DM commands adjoined to the original DM program. After visiting state m, these hijacking commands are executed, which enables the purpose of the original DM program to be hijacked.

Furthermore, once the digital computer program has been hijacked, if there is a friendly routine to check if the program is behaving properly, this safeguard routine will never get executed. As a consequence, the sequential execution of single instructions cripples the register machine program from defending and repairing itself. As an example of this fundamental security weakness of a digital computer, while some malware may have difficulty decrypting the computations of a homomorphic encryption operation, the malware can still hijack a register machine program computing homomorphic encryption operations and disable the program.

Brief Summary of Novelty and Advantages Over Prior Art

What is Novel about the Secure Active Element Machine?

A. A novel non-Turing computing machine—called the active element machine—is presented that has new capabilities. Turing machine, digital computer programs, register machine programs and standard neural networks have a finite prime directed edge complexity. (See definition 4.23.) A digital computer program or register machine program can be executed by a Turing or deterministic machine. (See [7], [20] and [24]).

An active element machine (AEM) that has unbounded prime directed edge complexity can be designed or programmed. This is important advantage because rules describing a AEM program are not constant as a function of time. Furthermore, these rules change unpredictably because the AEM program interpretation can be based on randomness and in some embodiments uses quantum randomness. In some embodiments, quantum randomness uses quantum optics or quantum phenomena from a semiconductor. The changing the rules property of the AEM programs with randomness makes it difficult for malware to apprehend the purpose of an AEM program.

B. Meta commands and the use of time enable the AEM to change its program as it executes, which makes the machine inherently self-modifying. In the AEM, self-modification of the connection topology and other parameters can occur during a normal run of the machine when solving computing problems. Traditional multi-element machines change their architecture only during training phases, e.g. when training neural networks or when evolving structures in genetic programming. The fact that self-modification happens during runtime is an important aspect for cybersecurity of the AEM. Constantly changing systems can be designed that are difficult to reverse engineer or to disable in an attack. When the AEM has enough redundancy and random behavior when self-modifying, multiple instances of an AEM—even if built for the same type of computing problems—all look different from the inside. As a result, machine learning capabilities are built right into the machine architecture. The self-modifying behavior also enables AEM programs to be designed that can repair themselves if they are sabotaged.

C. The inherent AEM parallelism and explicit use of time can be used to conceal the computation and greatly increase computing speed compared to the register machine. There are no sequential instructions in an AEM program. Multiple AEM commands can execute at the same time. As a result, AEM programs can be designed so that additional malware AEM commands added to the AEM program would not effect the intended behavior of the AEM program. This is part of the topological connectedness.

D. An infinite number of spatio-temporal firing interpretations can be used to represent the same underlying computation. As a result, at two different instances a Boolean function can be computed differently by an active element machine. This substantially increases the AEM's resistance to reverse engineering and apprehension of the purpose of an AEM program. This enables a computer program instruction to be executed differently at different instances. In some embodiments, these different instances are at different times. In some embodiments, these different instances of computing the program instruction are executed by different collections of active elements and connections in the machine. Some embodiments use random active element machine firing interpretations to compute a Boolean function differently at two different instances.

E. Incomputability is used instead of complexity. Incomputability means that a general Turing or Deterministic register machine algorithm can not unlock or solve an incomputable problem. This means that a digital computer program can not solve an incomputable problem. This creates a superior level of computational security.

F. Randomness in the AEM computing model. Because the AEM Interpretation approach relies on quantum randomness to dynamically generate random firing patterns, the AEM implementing this technique is no longer subject to current computability theory that assumes the deterministic machine or register machine as the computing model. This means that prior art methods and their lack of solutions for malware that depend on Turing's halting problem and undecidability no longer apply to the AEM in this context. This is another aspect of the AEM's non-Turing behavior (i.e. beyond a digital computer's capabilities) that provides useful novel cybersecurity capabilities.

In some embodiments, the quantum randomness utilized with the AEM helps create a more powerful computational procedure in the following way. An active element machine (AEM) that uses quantum randomness can deterministically execute a universal Turing machine (i.e. digital computer program that can execute any possible digital computer program) such that the firing patterns of the AEM are Turing incomputable. An active element machine (AEM) that uses quantum randomness deterministically executes digital computer instructions such that the firing patterns of the active element machine are Turing incomputable. This means that this security method will work for any digital computer program and the capability works for any digital computer hardware/software implementation and for digital computer programs written in C, C++, JAVA, Fortran, Assembly Language, Ruby, Forth, Haskell, RISC machine instructions (digital computer machine instructions, JVM (java virtual machine), Python and other digital computer languages.

Register machine instructions, Turing machine or digital computer instructions can be executed with active element machine instructions where it is Turing incomputable to understand what the active element machine computation is doing. In these embodiments, the active element machine computing behavior is non-Turing. This enhances the capability of a computational procedure: it secures the computational process (new secure computers) and helps protect a computation from malware.

Why is Now a Good Time?

a. It was recently discovered that an Active Element machine can exhibit non-Turing dynamical behavior. The use of prime directed edge complexity was discovered. Every Turing machine (digital computer program) has a finite prime directed edge complexity. (See 4.20 and 4.23.) An active element machine that has unbounded prime directed edge complexity can be designed using physical randomness. For example, the physical or quantum randomness can be realized with quantum optics or quantum effects in a semiconductor or another quantum phenomena.

b. The Meta command was discovered which enables the AEM to change its program as execution proceeds. This enables the machine to compute the same computational operation in an infinite number of ways and makes it conducive to machine learning and self-repair. The AEM can compute with a language that randomly evolves while the AEM program is executing.

c. It was recently realized that Active Element machine programs can be designed that are connected (in terms of topology), making them resistant to tampering and hijacking.

d. When a Turing machine or register machine (digital computer) executes an unbounded (non-halting) computation, the long term behavior of the program has recurrent points. This demonstrates the machine's predictable computing behavior which creates weaknesses and attack points for malware to exploit. This recurrent behavior in Turing machine and register machine is described in the section titled IMMORTAL ORBIT and RECURRENT POINTS.

e. Randomness can be generated from physical processes using quantum phenomena i.e. quantum optics, quantum tunneling in a semiconductor or other quantum phenomena. Using quantum randomness as a part of the active element machine exhibits non-Turing computing behavior. This non-Turing computing behavior generates random AEM firing interpretations that are difficult for malware to comprehend.

What is Novel about the New Applications that can be Built?

In some embodiments, an AEM can execute on current computer hardware and in some embodiments is augmented. These novel methods using an AEM are resistant to hackers and malware apprehending the purpose of AEM program's computations and in terms of sabotaging the AEM program's purpose; sabotaging a computation's purpose is analogous to a denial of service or distributed denial of service attack. The machine has computing performance that is orders of magnitude faster when implemented with hardware that is specifically designed for AEM computation. The AEM is useful in applications where reliability, security and performance are of high importance: protecting and reliably executing the Domain Name Servers, securing and running critical infrastructure such as the electrical grid, oil refineries, pipelines, irrigation systems, financial exchanges, financial institutions and the cybersecurity system that coordinates activities inside institutions such as the government.

Summary of AEM Methods a. AEM firing patterns are randomly generated that are Turing incomputable to determine their computational purpose.

b. AEM representations can be created that are also topologically connected.

c. AEM parallelism is used to solve computationally difficult tasks as shown in the section titled An AEM Program Computes a Ramsey Number.

d. Turing machine computation (digital computer computation) is topologically disconnected as shown by the affine map correspondence in 2.25.

Synthesis of Multiple Methods

In some embodiments, multiple methods are used and the solution is a synthesis of some of the following methods, A-E.

A. An AEM program—with input active elements fired according to $b_1 b_2 \ldots b_m$—accepts $[b_1 b_2 \ldots b_m]$ if active elements $E_1, E_2, \ldots, E_n$ exhibit a set or sequence of firing patterns. In some embodiments, this sequence of firing patterns has Turing incomputable interpretations using randomness.

B. AEM programs are created with an unbounded prime edge complexity. Turing and register machine programs have a finite prime directed edge complexity as shown in the section titled Prime Edge Complexity, Periodic Points & Repeating State Cycles.

C. AEM programs are created with no recurrent points when computation is unbounded with respect to time. This is useful for cybersecurity as it helps eliminate weaknesses for malware to exploit. When a Turing machine or register machine (digital computer) executes an unbounded (non-halting) computation, the long term behavior of the program has recurrent points. The recurrent behavior in a digital computer is described in the section titled Immortal Orbit and Recurrent Points.

D. Multiple AEM firing patterns are computed concurrently and then one can be selected according to an interpretation executed by a separate AEM machine. The AEM interpretation is kept hidden and changes over time. In some embodiments, evolutionary methods using randomness may help build AEMs that utilize incomputability and topological connectedness in their computations.

E. In some embodiments, AEMs programs represent the Boolean operations in a digital computer using multiple spatio-temporal firing patterns, which is further described in the detailed description. In some embodiments, level set methods on random AEM firing interpretations may be used that do not use Boolean functions. This enables a digital computer program instruction to be executed differently at different instances. In some embodiments, these different instances are at different times. In some embodiments, these different instances of computing the program instruction are executed by different collections of active elements and connections in the active element machine.

F. In some embodiments, the parallel computing speed increase of an AEM is substantial. As described in the section titled An AEM Program Computes a Ramsey Number, an AEM program is shown that computes a Ramsey number using the parallelism of the AEM. The computation of Ramsey numbers is an NP-hard problem [12].

Additional Detailed Description

Although various embodiments of the invention may have been motivated by various deficiencies with the prior art, which may be discussed or alluded to in one or more places in the specification, the embodiments of the invention do not necessarily address any of these deficiencies. In other words, different embodiments of the invention may address different deficiencies that may be discussed in the specification. Some embodiments may only partially address some deficiencies or just one deficiency that may be discussed in the specification, and some embodiments may not address any of these deficiencies.

Active Element Machine Description

An active element machine is composed of computational primitives called active elements. There are three kinds of active elements: Input, Computational and Output active elements. Input active elements receive information from the environment or another active element machine. This information received from the environment may be produced by a physical process, such as input from a user, such from a keyboard, mouse (or other pointing device), microphone, or touchpad.

In some embodiments, information from the environment may come from the physical process of photons originating from sunlight or other kinds of light traveling through space. In some embodiments, information from the environment may come from the physical process of sound. The sounds waves may be received by a sensor or transducer that causes one or more input elements to fire. In some embodiments, the acoustic transducer may be a part of the input elements and each input element may be more sensitive to a range of sound frequencies. In some embodiments, the sensor(s) or transducer(s) may be a part of one or more of the input elements and each input element may be more sensitive to a range of light frequencies analogous to the cones in the retina.

In some embodiments, information from the environment may come from the physical process of molecules present in the air or water. In some embodiments, sensor(s) or transducer(s) may be sensitive to particular molecules diffusing in the air or water, which is analogous to the molecular receptors in a person's nose. For example, one or more input elements may fire if a particular concentration of cinnamon molecules are detected by olfactory sensor(s).

In some embodiments, the information from the environment may originate from the physical process of pressure. In some embodiments, pressure information is transmitted to one or more of the input elements. In some embodiments, the sensor(s) that are a part of the input elements or connected to the input elements may be sensitive to pressure, which is analogous to a person's skin. In some embodiments, sensor sensitive to heat may be a part of the input elements or may be connected to the input elements. This is analogous to a person's skin detecting temperature.

Computational active elements receive messages from the input active elements and other computational active elements firing activity and transmit new messages to computational and output active elements. The output active elements receive messages from the input and computational active elements firing activity. Every active element is active in the sense that each one can receive and transmit messages simultaneously.

Each active element receives messages, formally called pulses, from other active elements and itself and transmits messages to other active elements and itself. If the messages received by active element $E_i$ at the same time sum to a value greater than the threshold and $E_i$'s refractory period has expired, then active element $E_i$ fires. When an active element $E_i$ fires, it sends messages to other active elements.

Let Z denote the integers. Define the extended integers as $K=\{m+kdT: m, k \in Z$ and $dT$ is a fixed infinitesimal$\}$. For more on infinitesimals, see [26] and [14]. The extended integers can also be expressed using the correspondence $m+ndT \leftrightarrow (m, n)$ where $(m, n)$ lies in $Z \times Z$. Then use the dictionary order $(m, n) < (k, l)$ if and only if $(m<k)$ OR $(m=k$ AND $n<l)$. Similarly, $m+ndT < k+ldT$ if and only if $(m<k)$ OR $(m=k$ AND $n<l)$.

Machine Architecture $\Gamma$, $\Omega$, and $\Delta$ are index sets that index the input, computational, and output active elements, respectively. Depending on the machine architecture, the intersections $\Gamma \cap \Omega$ and $\Omega \cap \Delta$ can be empty or non-empty. A machine architecture, denoted as M(J, E, D), consists of a collection of input active elements, denoted as $J=\{E_i : i \in \Gamma\}$; a collection of computational active elements $E=\{E_i : i \in \Omega\}$; and a collection of output active elements $D=\{E_i : i \in \Delta\}$.

Each computational and output active element, $E_i$, has the following components and properties.

A threshold $\theta_i$

A refractory period $r_i$ where $r_i > 0$.

A collection of pulse amplitudes $\{A_{ki} : k \in \Gamma \cup \Omega\}$.

A collection of transmission times $\{\tau_{ki} : k \in \Gamma \cup \Omega\}$, where $\tau_{ki} > 0$ for all $k \in \Gamma \cup \Omega$.

A function of time, $\Psi_i(t)$, representing the time active element $E_i$ last fired.

$\Psi_i(t) = \sup\{s : s < t$ and $g_i(s)=1\}$, where $g_i(s)$ is the output function of active element $E_i$ and is defined below. The sup is the least upper bound.

A binary output function, $g_i(t)$, representing whether active element $E_i$ fires at time t. The value of $g_i(t)=1$ if $\Sigma A_{ki}(t) > \theta_i$ where the sum ranges over all $k \in \Gamma \cup \Omega$ and $t \geq \Psi_i(t) + r_i$. In all other cases, $g_i(t)=0$. For example, $g_i(t)=0$, if $t < \Psi_i(t) + r_i$.

A set of firing times of active element $E_k$ within active element $E_i$'s integrating window, $W_{ki}(t)=\{s:$ active element $E_k$ fired at time s and $0 \leq t-s-\tau_{ki} < \omega_{ki}\}$. Let $|W_{ki}(t)|$ denote the number of elements in the set $W_{ki}(t)$. If $W_{ki}(t)=\emptyset$, then $|W_{ki}(t)|=0$.

A collection of input functions, $\{\varphi_{ki} : k \in \Gamma \cup \Omega\}$, each a function of time, and each representing pulses coming from computational active elements, and input active elements. The value of the input function is computed as $\varphi_{ki}(t) = |W_{ki}(t)| A_{ki}(t)$.

The refractory periods, transmission times and pulse widths are positive integers; and pulse amplitudes and thresholds are integers. These parameters are a function of i.e. $\theta_i(t)$, $r_i(t)$, $A_{ki}(t)$, $\omega_{ki}(t)$, $\tau_{ki}(t)$. The time t is an element of the extended integers K.

Input active elements that are not computational active elements have the same characteristics as computational active elements, except they have no inputs $\varphi_{ki}$ coming from active elements in this machine. In other words, they don't receive pulses from active elements in this machine. Input active elements are assumed to be externally firable. An external source such as the environment or an output active element from another distinct machine M(J, E, D) can cause an input active element to fire. The input active element can fire at any time as long as the current time minus the time the input active element last fired is greater than or equal to the input active element's refractory period.

An active element $E_i$ can be an input active element and a computational active element. Similarly, an active element can be an output active element and a computational active element. Alternatively, when an output active element $E_i$ is not a computational active element, where $i \in \Delta - \Omega$, then $E_i$ does not send pulses to active elements in this machine.

Some notions of the machine architecture are summarized. If $g_i(s)=1$, this means active element $E_i$ fired at time s. The refractory period $r_i$ is the amount of time that must elapse after active element $E_i$ just fired before $E_i$ can fire again. The transmission time $\tau_{ki}$ is the amount of time it takes for active element $E_i$ to find out that active element $E_k$ has fired. The pulse amplitude $A_{ki}$ represents the strength of the pulse that active element $E_k$ transmits to active element $E_i$ after active element $E_k$ has fired. After this pulse reaches $E_i$, the pulse width $\omega_{ki}$ represents how long the pulse lasts as input to active element $E_i$. At time s, the connection from $E_k$ to $E_i$ represents the triplet $(A_{ki}(s), \omega_{ki}(s), \tau_{ki}(s))$. If $A_{ki}=0$, then there is no connection from active element $E_k$ to active element $E_i$.

Refractory Period

In an embodiment, each computational element and output element has a refractory period $r_i$, where $r_i > 0$, which is a period of time that must elapse after last sending a message before it may send another message. In other words, the refractory period, $r_i$, is the amount of time that must elapse after active element $E_i$ just fired and before active element $E_i$ can fire again. In an alternative embodiment, refractory period $r_i$ could be zero, and the active element could send a message simultaneously with receiving a message and/or could handle multiple messages simultaneously.

Message Amplitude and Width

In an embodiment, each computational element and output element may be associated with a collection of message amplitudes, $\{A_{ki}\}_{k\varepsilon\Gamma\cup\Lambda}$, where the first of the two indices k and i denote the active element from which the message associated with amplitude $A_{ki}$ is sent, and the second index denotes the active element receiving the message. The amplitude, $A_{ki}$, represents the strength of the message that active element $E_k$ transmits to active element $E_i$ after active element $E_k$ has fired. There are many different measures of amplitude that may be used for the amplitude of a message. For example, the amplitude of a message may be represented by the maximum value of the message or the root mean square height of the message. The same message may be sent to multiple active elements that are either computational elements or output elements, as indicated by the subscript $k\varepsilon\Gamma\cup\Lambda$. However, each message may have a different amplitude $A_{ki}$. Similarly, each message may be associated with its own message width, $\{\omega_{ki}\}k\varepsilon\Gamma\cup\Lambda$, sent from active element $E_i$ to $E_k$, where $\omega_{ki}>0$ for all $k\varepsilon\Gamma\cup\Lambda$. After a message reaches active $E_i$, the message width $\omega_{ki}$ represents how long the message lasts as input to active element $E_i$.

Threshold

In an embodiment, any given active element may be capable of sending and receiving a message, in response to receiving one or more messages, which when summed together, have an amplitude that is greater than a threshold associated with the active element. For example, if the messages are pulses, each computational and output active element, $E_i$, may have a threshold, $\theta_i$, such that when a sum of the incoming pulses is greater than the threshold the active element fires (e.g., sends an output message). In an embodiment, when a sum of the incoming messages is lower than the threshold the active element does not fire. In another embodiment, it is possible to set the active element such that the active element fires when the sum of incoming messages is lower than the threshold; and when the sum of incoming messages is higher than the threshold, the active element does not fire.

In still another embodiment, there are two numbers $\alpha$ and $\theta$ where $\alpha\leq 0$ and such that if the sum of the incoming messages lie in $[\alpha, \theta]$, then the active element fires, but the active element does not fire if the sum lies outside of $[\alpha, \theta]$. In a variation of this embodiment, the active element fires if the sum of the incoming messages does not lie in $[\alpha, \theta]$ and does not fire if the sum lies in $[\alpha, \theta]$.

In another embodiment, the incoming pulses may be combined in other ways besides a sum. For example, if the product of the incoming pulses is greater than the threshold the active element may fire. Another alternative is for the active element to fire if the maximum of the incoming pulses is greater than the threshold. In still another alternative, the active element fires if the minimum of the incoming pulses is less than the threshold. In even another alternative if the convolution of the incoming pulses over some finite window of time is greater than the threshold, then the active element may fire.

Transmission Time

In an embodiment, each computational and output element may be associated with collection of transmission times, $\{\tau_{ki}\}_{k\varepsilon\Gamma\cup\Lambda}$, where $\tau_{ki}>0$ for all $k\varepsilon\Gamma\cup\Lambda$, which are the times that it takes a message to be sent from active element $E_k$ to active element $E_i$. The transmission time, $\tau_{ki}$, is the amount of time it takes for active element $E_i$ to find out that active element $E_k$ has fired. The transmission times, $\tau_{ki}$, may be chosen in the process of establishing the architecture.

Firing Function

In an embodiment, each active element is associated with a function of time, $\psi_i(t)$, representing the time t at which active element $E_i$ last fired. Mathematically, the function of time can be defined as $\psi_i(t)$=supremum $\{s\varepsilon R: s<t \text{ AND } g_i(s)=1\}$. The function $\psi_i(t)$ always has the value of the last time that the active element fired. In general, throughout this specification the variable t is used to represent the current time, while in contrast s is used as variable of time that is not necessarily the current time.

Set of Firing Times and the Integrating Window

In an embodiment, each active element is associated with a function of time $\Xi_{ki}(t)$, which is a set of recent firing times of active element $E_k$ that are within active element $E_i$'s integrating window. In other words, the set of firing times $\Xi_{ki}(t)=\{s\varepsilon R:$ active element k fired at time s and $0\leq t-s-\tau_{ki}<\omega_{ki}\}$. The integrating window is a duration of time during which the active element accepts messages. The integrating window may also be referred to as the window of computation. Other lengths of time could be chosen for the integrating window. In contrast to $\psi_i(t)$, $\Xi_{ki}(t)$ is not a function, but a set of values. Also, where as $\psi_i(t)$ has a value as long as active element $E_i$ fired at least once, $\Xi_{ki}(t)$ does not have any values (is an empty set) if the last time that active element $E_i$ fired is outside of the integrating window. In other words, if there are no firing times, s, that satisfy the inequality $0\leq t-s-\tau_{ki}<\omega_{ki}$, then $\Xi_{ki}(t)$ is the empty set. Let $|\Xi_{ki}(t)|$ denote the number of elements in the set $\Xi_{ki}(t)$. If $\Xi_{ki}(t)$ is the empty set, then $|\Xi_{ki}(t)|=0$. Similarly, if $\Xi_{ki}(t)$ has only one element in it then $\Xi_{ki}(t)=1$.

Input Function

In an embodiment, each input element and output element may have associated with it a collection of input functions, $\{\emptyset_{ki}(t)\}_{k\varepsilon\Gamma\cup\Lambda}$. Each input function may be a function of time, and may represent messages coming from computational elements and input elements. The value of input function $\emptyset_{ki}(t)$ is given by $\emptyset_{ki}(t)=|\Xi_{ki}(t)|A_{ki}$, because each time a message from active element $E_k$ reaches active element $E_i$, the amplitude of the message is added to the last message. The number of messages inside the integrating window is the same as the value of $|\Xi_{ki}(t)|$. Since for a static machine the amplitude of the message sent from active element k to i is always the same value, $A_{ki}$, therefore, the value $\emptyset_{ki}(t)$ equals $|\Xi_{ki}(t)|A_{ki}$.

Input elements that are not computational elements have the same characteristics as computational elements, except they have no input functions, $\emptyset_{ki}(t)$, coming from active elements in this machine. In other words, input elements do not receive messages from active elements in the machine with which the input element is associated. In an embodiment, input elements are assumed to be externally firable. An externally firable element is an element that an external element or machine can cause to fire. In an embodiment, an external source such as the environment or an output element from another distinct machine, M'(J', E', D') can cause an input element to fire. An input element can fire at any time as long as this time minus the time the input element last fired is greater than or equal to the input element's refractory period.

Output Function

An output function, $g_i(t)$, may represent whether the active element fires at time t. The function $g_i(t)$ is given by $$g_i(t) = \begin{cases} 1 & \text{if } \sum_{k \in \Gamma \cup \Lambda} \emptyset_{ki}(t) > \theta_i \text{ AND } t - \psi_i(t) \geq r_i \\ 0 & \text{otherwise} \end{cases}.$$

In other words, if the sum of the input functions $\emptyset_{ki}(t)$ is greater than the threshold, $\theta_i$, and time t is greater than or equal to the refractory period, $r_i$, plus the time, $\psi_i(t)$, that the active element last fired, then the active element $E_i$ fires, and $g_i(t)=1$. If $g_i(t_0)=1$, then active element $E_i$ fired at time $t_0$.

The fact that in an embodiment, output elements do not send messages to active elements in this machine is captured formally by the fact that the index k for the transmission times, message widths, message amplitudes, and input functions lies in $\Gamma \cup \Lambda$ and not in $\Delta$ in that embodiment.

Connections

The expression "connection" from k to i represents the triplet $(A_{ki}, \omega_{ki}, \tau_{ki})$. If $A_{ki}=0$, then there is no connection from active element $E_k$ to active element $E_i$. If $A_{ki} \neq 0$, then there is a non-zero connection from active element $E_k$ to active element $E_i$. In any given embodiment the active elements may have all of the above properties, only one of the above properties, or any combination of the above properties. In an embodiment, different active elements may have different combinations of the above properties. Alternatively, all of the active elements may have the same combination of the above properties.

Active Element Machine Programming Language

This section shows how to program an active element machine and how to change the machine architecture as program execution proceeds. It is helpful to define a programming language, influenced by S-expressions. There are five types of commands: Element, Connection, Fire, Program and Meta.

Syntax 1. AEM Program

In Backus-Naur form, an AEM program is defined as follows.

```
<AEM_program> ::= <cmd_sequence>
<cmd_sequence> ::= "" | <AEM_cmd><cmd_sequence> | <program_def><cmd_sequence>
<AEM_cmd> ::= <element_cmd> | <fire_cmd> | <meta_cmd> | <cnct_cmd> |
    <program_cmd>
<ename> ::= "" | <int> | <symbol>
<symbol> ::= <symbol_string> | (<ename> . . . <ename>)
<symbol_string> ::= "" | <char_symbol><str_tail>
<str_tail> ::= "" | <char_symbol><str_tail> | 0<str_tail> | <pos_int><str_tail>
<char_symbol> ::= <letter> | <special_char>
<letter> ::= <lower_case> | <upper_case>
<lower_case> ::= a | b | c | d | e | f | g | h | i | j | k | l | m | n | o | p | q | r | s | t | u | v | w | x | y | z
<upper_case> ::= A | B | C | D | E | F | G | H | I | J | K | L | M | N | O | P | Q | R | S | T | U | V | W |
    X | Y | Z
<special_char> ::= "" | _
```

These rules represent the extended integers, addition and subtraction.

```
<int> ::= <pos_int> | <neg_int> | 0
<neg_int> ::= - <pos_int>
```

```
<pos_int> ::= <non_zero><digits>
<digits> ::= <numeral> | <numeral><digits>
<non_zero> ::= 1 | 2 | 3 | 4 | 5 | 6 | 7 | 8 | 9
<numeral> ::= "" | <non_zero> | 0
<aint> ::= <aint> <math_op> <d> | <d> <math_op> <aint> | <d>
<math_op> ::= + | -
<d> ::= <int> | <symbol_string> | <infinitesimal>
<infinitesimal> ::= dT
```

Element Command.

An Element command specifies the time when an active element's values are updated or created. This command has the following Backus-Naur syntax.

<element_cmd>::=(Element (Time <aint>) (Name <ename>) (Threshold <int>) (Refractory <pos_int>) (Last <int>))

The keyword Time indicates the time value s at which the element is created or updated. In some embodiments the time value s is an extended integer. If the name symbol value is E, the keyword Name tags the name E of the active element. The keyword Threshold tags the threshold $\theta_E(s)$ assigned to E. Refractory indicates the refractory value $r_E(s)$. The keyword Last tags the last time fired value $\Psi(s)$. Sometimes the time value, name value, threshold value, refractory value, or last time fired value are referred to as parameter values.

Below is an example of an element command.

(Element (Time 2) (Name H) (Threshold −3) (Refractory 2) (Last 0))

At time 2, if active element H does not exist, then it is created. Active element H has its threshold set to −3, its refractory period set to 2, and its last time fired set to 0. After time 2, active element H exists indefinitely with threshold= −3, refractory=2 until a new Element command whose name value H is executed at a later time; in this case, the Threshold, Refractory and Last values specified in the new command are updated.

Connection Command.

A Connection command creates or updates a connection from one active element to another active element. This command has the following Backus-Naur syntax.

<cnct_cmd>::=(Connection (Time <aint>) (From <ename>) (To <ename>) [(Amp <int>) (Width <pos_int>) (Delay <pos_int>)])

The keyword Time indicates the time value s at which the connection is created or updated. In some embodiments the time value s is an extended integer. The keyword From indicates the name F of the active element that sends a pulse with these updated values. The keyword To tags the name T of the active element that receives a pulse with these updated values. The keyword Amp indicates the pulse amplitude value $\Delta_{FT}(s)$ that is assigned to this connection. The keyword Width indicates the pulse width value $\omega_{FT}(S)$. In some embodiments the pulse width value $\omega_{FT}(s)$ is an extended integer. The keyword Delay tags the transmission time TFT(S). In some embodiments the transmission time $T_{FT}(S)$ is an extended integer. Sometimes the time value, from name, to name, pulse amplitude value, pulse width value, or transmission time value are referred to as parameter values.

When the AEM clock reaches time s, F and T are name values that must be the name of an element that already has been created or updated before or at time s. Not all of the connection parameters need to be specified in a connection command. If the connection does not exist beforehand and the Width and Delay values are not specified appropriately, then the amplitude is set to zero and this zero connection has no effect on the AEM computation. Observe that the connection exists indefinitely with the same parameter values until a new connection is executed at a later time between From element F and To element T.

The following is an example of a connection command.
(Connection (Time 2) (From C) (To L) (Amp −7) (Width 1) (Delay 3))

At time 2, the connection from active element C to active element L has its amplitude set to −7, its pulse width set to 1, and its transmission time set to 3.

Fire Command.

The Fire command has the following Backus-Naur syntax.
<fire_cmd>::=(Fire (Time <aint>) (Name <ename>))

The Fire command fires the active element indicated by the Name tag at the time indicated by the Time tag. Sometimes the time value and name value are referred to as parameter values of the fire command. In some embodiments, the fire command is used to fire input active elements in order to communicate program input to the active element machine. An example is (Fire (Time 3) (Name C)), which fires active element C at t=3.

Program Command.

The Program command is convenient when a sequence of commands are used repeatedly. This command combines a sequence of commands into a single command. It has the following definition syntax.
<program_def>::=(Program <pname>[(Cmds <cmds>)] [(Args <args>)]
<cmd_sequence>)
<pname>=<ename>
<cmds>::=<cmd_name>|<cmd_name><cmds>
<cmd_name>::=Element
Connection|Fire|Meta|<pname>
<args>::=<symbol>|<symbol><args>

The Program command has the following execution syntax.
<program_cmd>::=(<pname>[(Cmds <cmds>)] [(Args <args_cmd>)])
<args_cmd>::=<ename>|<ename><args_cmd>

The FireN program is an example of definition syntax.

(Program FireN (Args t E)
 (Element (Time 0) (Name E)(Refractory 1)(Threshold 1) (Last 0))
 (Connection (Time 0) (From E) (To E)(Amp 2)(Width 1) (Delay 1))
 (Fire (Time 1) (Name E))
 (Connection (Time t+1) (From E) (To E) (Amp 0))
)

The execution of the command (FireN (Args 8 E1)) causes element E1 to fire 8 times at times 1, 2, 3, 4, 5, 6, 7, and 8 and then E1 stops firing at time=9.

Keywords clock and dT

The keyword clock evaluates to an integer, which is the current active element machine time. clock is an instance of <ename>. If the current AEM time is 5, then the command
(Element (Time clock) (Name clock) (Threshold 1) (Refractory 1) (Last −1))
is executed as
(Element (Time 5) (Name 5) (Threshold 1) (Refractory 1) (Last −1))

Once command (Element (Time clock) (Name clock) (Threshold 1) (Refractory 1) (Last −1)) is created, then at each time step this command is executed with the current time of the AEM. If this command is in the original AEM program before the clock starts at 0, then the following sequence of elements named 0, 1, 2, . . . will be created.
(Element (Time 0) (Name 0) (Threshold 1) (Refractory 1) (Last −1))
(Element (Time 1) (Name 1) (Threshold 1) (Refractory 1) (Last −1))
(Element (Time 2) (Name 2) (Threshold 1) (Refractory 1) (Last −1))
. . . .

The keyword dT represents a positive infinitesimal amount of time. If m and n are integers and 0≤m<n, then mdT<ndT. Furthermore, dT>0 and dT is less than every positive rational number. Similarly, −dT<0 and −dT is greater than every negative rational number. The purpose of dT is to prevent an inconsistency in the description of the machine architecture. For example, the use of dT helps remove the inconsistency of a To element about to receive a pulse from a From element at the same time that the connection is removed.

Meta command.

The Meta command causes a command to execute when an element fires within a window of time. This command has the following execution syntax.
<meta_cmd>::=(Meta (Name <ename>)[<win_time>]
<AEM_cmd>)
<win_time>::=(Window <aint><aint>)

To understand the behavior of the Meta command, consider the execution of
(Meta (Name E) (Window 1 w) (C (Args t a))
where E is the name of the active element. The keyword Window tags an interval i.e. a window of time. 1 is an integer, which locates one of the boundary points of the window of time. Usually, w is a positive integer, so the window of time is [l, l+w]. If w is a negative integer, then the window of time is [l+w, l].

The command C executes each time that E fires during the window of time, which is either [l, l+w] or [l+w, l], depending on the sign of w. If the window of time is omitted, then command C executes at any time that element E fires. In other words, effectively 1=−∞ and w=∞. Consider the example where the FireN command was defined before.
(FireN (Args 8 E1))
(Meta (Name E1) (Window 1 5) (C (Args clock a b)))

Command C is executed 6 times with arguments clock, a, b. The firing of E1 triggers the execution of command C.

In regard to the Meta command, the following assumption is analogous to the Turing machine tape being unbounded as Turing program execution proceeds. During execution of a finite active element program, an active element can fire and due to one or more Meta commands, new elements and connections can be added to the machine. As a consequence, at any time the active element machine only has a finite number of computing elements and connections but the number of elements and connections can be unbounded as a function of time as the active element program executes.

Active Element Machine Computation

In a prior section, the firing patterns of active elements are used to represent the computation of a boolean function. In the next three definitions, firing patterns, machine computation and interpretation are defined.

Firing Pattern

Consider active element $E_i$'s firing times in the interval of time $W=[t_1, t_2]$. Let $s_1$ be the earliest firing time of $E_i$ lying in W, and $s_n$ the latest firing time lying in W. Then $E_i$'s firing sequence $F(E_i, W)=[s_1, \ldots, s_n]=\{s \in W: g_i(s)=1\}$ is called a firing sequence of the active element $E_i$ over the window of time W. From active elements $\{E_i, E_2, \ldots, E_1\}$ create the tuple $(F(E_i, W), F(E_2, W), \ldots, F(E_n, W))$ which is called a firing pattern of the active elements $\{E_i, E_2, \ldots, E.\}$ within the window of time W.

At the machine level of interpretation, firing patterns (firing representations) express the input to, the computation of, and the output of an active element machine. At a more abstract level, firing patterns can represent an input symbol, an output symbol, a sequence of symbols, a spatio-temporal pattern, a number, or even a family of program instructions for another computing machine.

Sequence of Firing Patterns.

Let $W_1, \ldots, W_1$ be a sequence of time intervals. Let $F(E, W_1)=(F(E_i, W_1), F(E_2, W_1), \ldots, F(E_n, W_1))$ be a firing pattern of active elements $E=\{E_1, \ldots, E_n\}$ over the interval $W_1$. In general, let $F(E, W_k)=(F(E_i, W_k), F(E_2, W_k), \ldots F(E_n, W_k))$ be a firing pattern over the interval of time $W_k$. From these, a sequence of firing patterns, $[F(E, W_1), F(E, W_2), \ldots, F(E, W_n)]$ is created.

Machine Computation

Let $[F(E, W_1), F(E, W_2), \ldots, F(E, W_n)]$ be a sequence of firing patterns. $[F(E, S_1), F(E, S_2), \ldots, F(E, S_m)]$ is some other sequence of firing patterns. Suppose machine architecture M(I, E, O) has input active elements I fire with the pattern $[F(E, S_1), F(E, S_2), \ldots, F(E, S_m)]$ and consequently M's output active elements O fire according to $[F(E, W_1), F(E, W_2), \ldots, F(E, W_n)]$. In this case, the machine M computes $[F(E, W_1), F(E, W_2), \ldots, F(E, W_n)]$ from $[F(E, S_1), F(E, S_2), \ldots, F(E, S_m)]$.

An active element machine is an interpretation between two sequences of firing patterns if the machine computes the output sequence of firing patterns from the input sequence of firing patterns.

Concurrent Generation of AEM Commands

This section shows embodiments pertaining to two or more commands about to set parameter values of the same connection or same element at the same time. Consider two or more connection commands, connecting the same active elements, that are generated and scheduled to execute at the same time.

(Connection (Time t) (From A) (To B) (Amp 2) (Width 1) (Delay 1))

(Connection (Time t) (From A) (To B) (Amp −4) (Width 3) (Delay 7))

Then the simultaneous execution of these two commands can be handled by defining the outcome to be equivalent to the execution of only one connection command where the respective amplitudes, widths and transmission times are averaged.

(Connection (Time t) (From A) (To B) (Amp −1) (Width 2) (Delay 4))

In the general case, for n connection commands (Connection (Time t) (From A) (To B) (Amp a1) (Width w1) (Delay s1))

(Connection (Time t) (From A) (To B) (Amp a2) (Width w2) (Delay s2))

. . .

(Connection (Time t) (From A) (To B) (Amp an)(Width wn)(Delay sn))

resolve these to the execution of one connection command (Connection (Time t) (From A) (To B) (Amp a) (Width w) (Delay s))

where a, w and s are defined based on the application. These embodiments can be implemented in active element machine software, AEM hardware or a combination of AEM hardware and software.

For some embodiments of the AEM, averaging the respective amplitudes, widths and transmission times is useful.

a=(a1+a2+ . . . +an)/n w=(w1+w2+ . . . +wn)/n s=(s1+s2+ . . . +sn)/n

For embodiments that use averaging, they can be implemented in active element machine software, AEM hardware or a combination of AEM hardware and software.

For some embodiments, when there is noisy environmental data fed to the input elements and amplitudes, widths and transmission times are evolved and mutated, extremely large (in absolute value) amplitudes, widths and transmission times can arise that skew an average function. In these embodiments, computing the median of the amplitudes, widths and delays provides a simple method to address skewed amplitude, width and transmission time values.

a=median(a1, a2, . . . , an)

w=median(w1, w2, . . . , wn)

s=median(s1, s2, . . . , sn)

Another alternative embodiment adds the parameter values.

a=a1+a2+ . . . +an w=w1+w2+ . . . +wn s=s1+s2+ . . . +sn

Similarly, consider when two or more element commands—that all specify the same active element E—are generated and scheduled to execute at the same time.

(Element (Time t) (Name E) (Threshold h1) (Refractory r1) (Last s1))

(Element (Time t) (Name E) (Threshold h2) (Refractory r2) (Last s2))

. . .

(Element (Time t) (Name E) (Threshold hn) (Refractory m) (Last sn))

resolve these to the execution of one element command, (Element (Time t) (Name E) (Threshold h) (Refractory r) (Last s))

where h, r and s are defined based on the application. Similar to the connection command, for theoretical studies of the AEM, the threshold, refractory and last time fired values can be averaged.

h=(h1+h2+ . . . +hn)/n r=(r1+r2+ . . . +rn)/n s=(s1+s2+ . . . +sn)/n

In autonomous embodiments, where evolution of parameter values occurs, the median can also help address skewed values in the element commands.

h=median(h1, h2, . . . , hn)
r=median(r1, r2, . . . , rn)
s=median(s1, s2, . . . , sn)

Another alternative is to add the parameter values.

h=h1+h2+ . . . +hn
r=r1+r2+ . . . +rn
s=s1+s2+ . . . +sn

Rules A, B, and C resolve concurrencies pertaining to the Fire, Meta and Program commands. Rule A. If two or more Fire commands attempt to fire element E at time t, then element E is fired just once at time t.

Rule B. Only one Meta command can be triggered by the firing of an active element. If a new Meta command is created and it happens to be triggered by the same element E as a prior Meta command, then the old Meta command is removed and the new Meta command is triggered by element E.

Rule C. If a Program command is called by a Meta command, then the Program's internal Element, Connection, Fire and Meta commands follow the previous concurrency rules defined. If a Program command exists within a Program command, then these rules are followed recursively on the nested Program command.

An AEM Program Computes A Ramsey Number

This section shows how to compute a Ramsey number with an AEM program. Ramsey theory can be intuitively described as structure which is preserved under finite decomposition. Applications of Ramsey theory include computer science, including lower bounds for parallel sorting, game theory and information theory. Progress on determining the basic Ramsey numbers r(k, l) has been slow. For positive integers k and l, r(k, l) denotes the least integer n such that if the edges of the complete graph $K_n$ are 2-colored with colors red and blue, then there always exists a complete subgraph $K_k$ containing all red edges or there exists a subgraph Ki containing all blue edges. To put our slow progress into perspective, arguably the best combinatorist of the 20th century, Paul Erdos asks us to imagine an alien force, vastly more powerful than us, landing on Earth and demanding the value of r(5, 5) or they will destroy our planet. In this case, Erdos claims that we should marshal all our computers and all our mathematicians and attempt to find the value. But suppose instead that they ask for r(6, 6). For r(6, 6), Erdos believes that we should attempt to destroy the aliens.

Theorem R. The Standard Finite Ramsey Theorem.

For any positive integers m, k, n, there is a least integer N(m, k, n) with the following property: no matter how we color each of the n-element subsets of S={1, 2, . . . , N} with one of k colors, there exists a subset Y of S with at least m elements, such that all n-element subsets of Y have the same color.

When G and H are simple graphs, there is a special case of theorem R. Define the Ramsey number r(G, H) to be the smallest N such that if the complete graph $K_N$ is colored red and blue, either the red subgraph contains G or the blue subgraph contains H. (A simple graph is an unweighted, undirected graph containing no graph loops or multiple edges. In a simple graph, the edges of the graph form a set and each edge is a pair of distinct vertices.) In [10], S. A. Burr proves that determining r(G, H) is an NP-hard problem.

An AEM program is shown that solves a special case of Theorem 3. Similar embodiments can compute larger Ramsey numbers. Consider the Ramsey number where each edge of the complete graph $K_6$ is colored red or blue. Then there is always at least one triangle, which contains only blue edges or only red edges. In terms of the standard Ramsey theorem, this is the special case N(3, 2, 2) where n=2 since we color edges (i.e. 2-element subsets); k=2 since we use two colors; and m=3 since the goal is to find a red or blue triangle. To demonstrate how an AEM program can be designed to compute N(3, 2, 2)=6, an AEM program is shown that verifies N(3, 2, 2) >5.

The symbols B and R represent blue and red, respectively. Indices are placed on B and R to denote active elements that correspond to the $K_5$ graph geometry. The indices come from graph geometry. Let E={{1,2}, {1,3}, {1,4}, {1,5}, {2,3}, {2,4}, {2,5}, {3,4}, {3,5}, {4,5}} denote the edge set of $K_5$.

The triangle set T={{1,2,3}, {1,2,4}, {1,2,5}, {1,3,4}, {1,3,5}, {1,4,5}, {2,3,4}, {2,3,5}, {2,4,5}, {3,4,5}}. Each edge is colored red or blue. Thus, the red edges are {{1,2}, {1,5}, {2,3}, {3,4}, {4,5}} and the blue edges are {{1,3}, {1,4}, {2,4}, {2,5}, {3,5}}. Number each group of AEM commands for $K_5$, based on the group's purpose. This is useful because these groups will be used when describing the computation for $K_6$.

1. The elements representing red and blue edges are established as follows.

(Element (Time 0) (Name R_12) (Threshold 1) (Refractory 1) (Last −1))
(Element (Time 0) (Name R_15) (Threshold 1) (Refractory 1) (Last −1))
(Element (Time 0) (Name R_23) (Threshold 1) (Refractory 1) (Last −1))
(Element (Time 0) (Name R_34) (Threshold 1) (Refractory 1) (Last −1))
(Element (Time 0) (Name R_45) (Threshold 1) (Refractory 1) (Last −1))
(Element (Time 0) (Name B_13) (Threshold 1) (Refractory 1) (Last −1))
(Element (Time 0) (Name B_14) (Threshold 1) (Refractory 1) (Last −1))
(Element (Time 0) (Name B_24) (Threshold 1) (Refractory 1) (Last −1))
(Element (Time 0) (Name B_25) (Threshold 1) (Refractory 1) (Last −1))
(Element (Time 0) (Name B_35) (Threshold 1) (Refractory 1) (Last −1))

2. Fire element R_24 if edge {j, k} is red.
(Fire (Time 0) (Name R_12))
(Fire (Time 0) (Name R_15))
(Fire (Time 0) (Name R_23))
(Fire (Time 0) (Name R_34))
(Fire (Time 0) (Name R_45))
Fire element B_jk if edge {j, k} is blue where j<k.
(Fire (Time 0) (Name B_13))
(Fire (Time 0) (Name B_14))
(Fire (Time 0) (Name B_24))
(Fire (Time 0) (Name B_25))
(Fire (Time 0) (Name B_35))

3. The following Meta commands cause these elements to keep firing after they have fired once.
(Meta (Name R_jk) (Window 0 1)
(Connection (Time 0) (From R_jk) (To R_jk) (Amp 2) (Width 1) (Delay 1)))
(Meta (Name B_jk) (Window 0 1)
(Connection (Time 0) (From B_jk) (To B_jk) (Amp 2) (Width 1) (Delay 1)))

4. To determine if a blue triangle exists on vertices {i, j, k}, where {i, j, k} ranges over T, three connections are created for each potential blue triangle.
  (Connection (Time 0) (From B_ij) (To B_ijk) (Amp 2) (Width 1) (Delay 1))
  (Connection (Time 0) (From B_jk) (To B_ijk) (Amp 2) (Width 1) (Delay 1))
  (Connection (Time 0) (From B_ik) (To B_ijk) (Amp 2) (Width 1) (Delay 1))
5. To determine if a red triangle exists on vertex set {i, j, k}, where {i, j, k} ranges
  over T, three connections are created for each potential red triangle.
  (Connection (Time 0) (From R_ij) (To R_ijk) (Amp 2) (Width 1) (Delay 1))
  (Connection (Time 0) (From R_jk) (To R_ijk) (Amp 2) (Width 1) (Delay 1))
  (Connection (Time 0) (From R_ik) (To R_ijk) (Amp 2) (Width 1) (Delay 1))
6. For each vertex set {i, j, k} in T, the following elements are created.
  (Element (Time 0) (Name R_ijk) (Threshold 5) (Refractory 1) (Last −1))
  (Element (Time 0) (Name B_ijk) (Threshold 5) (Refractory 1) (Last −1))

Because the threshold is 5, the element R_ijk only fires when all three elements R_ij, R_jk, R_ik fired one unit of time ago. Likewise, the element B_ijk only fires when all three elements B_ij, B_jk, B_ik fired one unit of time ago. From this, we observe that as of clock=3 i.e. 4 time steps, this AEM program determines that N(3, 2, 2)>5. This AEM computation uses $$|E|+2|T| = \frac{5!}{2!3!} + 2\frac{5!}{3!2!} = 30 \text{ active elements.}$$

Further, this AEM program creates and uses $3|T|+3|T|+|E|=70$ connections.

For $K_6$, the edge set E={{1, 2}, {1, 3}, {1, 4}, {1, 5}, {1, 6}, {2, 3}, {2, 4}, {2, 5}, {2, 6}, {3, 4}, {3, 5}, {3, 6}, {4, 5}, {4, 6}, {5, 6}}. The triangle set T={{1, 2, 3}, {1, 2, 4}, {1, 2, 5}, {1, 2, 6}, {1, 3, 4}, {1, 3, 5}, {1, 3, 6}, {1, 4, 5}, {1, 4, 6}, {1, 5, 6}, {2, 3, 4}, {2, 3, 5}, {2, 3, 6}, {2, 4, 5}, {2, 4, 6}, {2, 5, 6}, {3, 4, 5}, {3, 4, 6}, {3, 5, 6}, {4, 5, 6}}. For each 2-coloring of E, each edge is colored red or blue. There are $2^{|E|}$ 2-colorings of E. For this graph, $$|E| = \frac{6!}{2!4!}$$

To build a similar AEM program, the commands in groups 1 and 2 range over every possible 2-coloring of E. The remaining groups 3, 4, 5 and 6 are the same based on the AEM commands created in groups 1 and 2 for each particular 2-coloring.

This AEM program verifies that every 2-coloring of E contains at least one red triangle or one blue triangle i.e. N(3, 2, 2)=6. There are no optimizations using graph isomorphisms made here. If an AEM language construct is used for generating all active elements for each 2-coloring of E at time zero, then the resulting AEM program can determine the answer in 5 time steps. One more time step is needed, 215 additional connections and one additional element to verify that every one of the 215 AEM programs is indicating that it found a red or blue triangle. This AEM program—that determines the answer in 5 time steps—uses $2^{|E|}(|E|+2|T|)+1$ active elements and $2^{|E|}(3|T|+3|T|+|E|+1)$ connections, where $|E|=15$ and $|T|=20$. Some graph problems are related to the computation of Ramsey numbers.

A couple common graph problems are the traveling salesman problem and the traveling purchaser problem. (See <http://en.wikipedia.org/wiki/Taveling_salesman_problem> and <http://en.wikipedia.org/wiki/Taveling_purchaser_problem>.)

The traveling salesman problem can be expressed as a list of cities and their pairwise distances. The solution of the problem consists of finding the shortest possible tour that visits each city exactly once. Methods of solving the traveling salesman problem are useful for FedEx and other shipping companies where fuel costs and other shipping costs are substantial.

The traveling salesman problem has applications in planning, logistics, and the manufacture of microchips. Slightly modified, the traveling salesman problem appears as a sub-problem in many areas, such as DNA sequencing. In these applications, the concept city represents, for example, customers, soldering points, or DNA fragments, and the concept distance represents travelling times or cost, or a similarity measure between DNA fragments.

In embodiments similar to the computation of Ramsey numbers, the cities (customers, soldering points or DAN fragments) correspond to active elements and there is one connection between two cities for a possible tour that is being explored. In some embodiments, the thresholds of the two elements are used to account for the distance between the cities while exploring a path for a shortest possible tour. In other embodiments, the different distances between cities can be accounted for by using time.

Multiplying Numbers with an Active Element Machine

This section shows how to multiply numbers with an active element machine. Elements Y0, Y1, Y2, Y3 denote a four bit number and elements Z0, Z1 Z2, Z3 denote a four bit number. The corresponding bit values are $y_0$, $y_1$, $y_2$, $y_3$ and $z_0$, $z_1$, $z_2$, $z_3$. The multiplication of $y_3\ y_2\ y_1\ y_0 * z_3\ z_2\ z_1\ z_0$ is shown in Table 13. An active element program is constructed based on Table 13.

The following commands set up elements and connections to perform a four bit multiplication of $y_3\ y_2\ y_1\ y_0 * z_3\ z_2\ z_1\ z_0$ where the result of this multiplication $e_7\ e_6\ e_5\ e_4\ e_3\ e_2\ e_1\ e_0$ is stored in elements E7, E6, E5, E4, E3, E2, E1 and E0. The computation is encoded by the elements S_jk corresponds to the product $y_j\ z_k$ where S_jk fires if and only if $y_j=1$ and $z_k=1$. The elements C_jk help determine the value of $e_i$ represented by element $E_i$ where $j+k=i$.

First, two useful program commands are defined.

(Program set_element (Args s xk theta r L)
  (Element (Time s-2dT) (Name xk) (Threshold theta) (Refractory r) (Last L))
)
(Program set_connection (Args s f xk a w tau)
  (Connection (Time s-dT) (From f) (To xk) (Amp a) (Width w) (Delay tau))
)

The firing activity of element $E_0$ expresses the value of $e_0$. The elements and connections for the product $y_0 \, z_0$ which determine the value of $e_0$ are determined by the following three program commands.

(set_element s E0 3 1 s–2)
(set_connection s Y0 E0 2 1 1)
(set_connection s Z0 E0 2 1 1)

Table 14 shows the amplitude and threshold used to compute the value of $e_0$. Table 15 shows the firing patterns for elements $S_{10}$ and $S_{01}$ representing the value of products $y_1 \, z_0$ and $y_0 \, z_1$. Table 16 shows the amplitudes from elements $S_{10}$ and $S_{01}$ to elements $C_{01}$ and $C_{11}$ and the thresholds of $C_{01}$ and $C_{11}$. Table 17 shows the amplitudes from elements $C_{01}$ and $C_{11}$ to element $E_1$ and the threshold of $E_1$. The firing activity of element $E_1$ expresses the value of $e_1$. Below are active element machine commands that express the parameter values of these elements and connections shown in table 14, table 15, table 16 and table 17.

(set_element s S_10 3 1 s–2)
(set_connection s Y1 S_10 2 1 1)
(set_connection s Z0 S_10 2 1 1)
(set_element s S_01 3 1 s–2)
(set_connection s Y0 S_01 2 1 1)
(set_connection s Z1 S_01 2 1 1)
(set_element s C_01 1 1 s–2)
(set_element s C_11 3 1 s–2)
(set_connection s S_10 C_01 2 1 1)
(set_connection s S_10 C_11 2 1 1)
(set_connection s S_01 C_01 2 1 1)
(set_connection s S_01 C_11 2 1 1)
(set_element s E1 1 1 s–2)
(set_connection s C_01 E1 2 1 1)
(set_connection s C_11 E1 –2 1 1)

Table 18 shows the firing patterns for elements $S_{20}$, $S_{11}$, $S_{02}$ and $C_{11}$. Table 19 shows the amplitudes from elements $S_{20}$, $S_{11}$ $S_{02}$, $C_{11}$ to elements $C_{02}$, $C_{12}$, $C_{22}$ $C_{32}$ and the thresholds of $C_{02}$, $C_{12}$, $C_{22}$ and $C_{32}$. Table 20 shows the amplitudes from elements $C_{02}$, $C_{12}$, $C_{22}$, $C_{32}$ to elements $P_{02}$, $P_{12}$, $P_{22}$ and the thresholds of elements $P_{02}$, $P_{12}$, $P_{22}$. Table 21 shows the amplitude and threshold used to compute the value of $e_2$. The firing activity of element $E_2$ expresses the value of $e_2$. Below are active element machine commands that express the parameter values of the elements and connections indicated in table 18, table 19, table 20 and table 21.

(set_element s S_20 3 1 s–2)
(set_connection s Y2 S_20 2 1 1)
(set_connection s Z0 S_20 2 1 1)
(set_element s S_11 3 1 s–2)
(set_connection s Y1 S_11 2 1 1)
(set_connection s Z1 S_11 2 1 1)
(set_element s S_02 3 1 s–2)
(set_connection s Y0 S_02 2 1 1)
(set_connection s Z2 S_02 2 1 1)
(set_element s C_02 1 1 s–2)
(set_element s C_12 3 1 s–2)
(set_element s C_22 5 1 s–2)
(set_element s C_32 7 1 s–2)
(set_connection s S_20 C_02 2 1 1)
(set_connection s S_20 C_12 2 1 1)
(set_connection s S_20 C_22 2 1 1)
(set_connection s S_20 C_32 2 1 1)
(set_connection s S_11 C_02 2 11)
(set_connection s S_11 C_12 2 1 1)
(set_connection s S_11 C_22 2 11)
(set_connection s S_11 C_32 2 11)
(set_connection s S_02 C_02 2 1 1)
(set_connection s S_02 C_12 2 1 1)
(set_connection s S_02 C_22 2 1 1)
(set_connection s S_02 C_32 2 1 1)
(set_connection s C_11 C_02 2 11)
(set_connection s C_11 C_12 2 1 1)
(set_connection s C_11 C_22 2 11)
(set_connection s C_11 C_32 2 11)
(set_element s P_02 1 1 s–2)
(set_element s P_12 1 1 s–2)
(set_element s P_22 7 1 s–2)
(set_connection s C_02 P_02 2 1 1)
(set_connection s C_02 P_12 0 1 1)
(set_connection s C_02 P_22 2 1 1)
(set_connection s C_12 P_02 –2 1 1)
(set_connection s C_12 P_12 2 1 1)
(set_connection s C_12 P_22 2 1 1)
(set_connection s C_22 P_02 2 1 1)
(set_connection s C_22 P_12 2 1 1)
(set_connection s C_22 P_22 2 1 1)
(set_connection s C_32 P_02 –2 1 1)
(set_connection s C_32 P_12 –4 1 1)
(set_connection s C_32 P_22 2 1 1)
(set_element s E2 1 1 s–2)
(set_connection s P_02 E2 2 1 1)

Table 22 shows the firing patterns for elements $S_{30}$, $S_{21}$, $S_{12}$, $S_{03}$, $P_{12}$ representing the value of products $y_3 \, z_0$, $y_2 \, z_1$, $y_1 \, z_2$ and $y_0 \, z_3$ and the carry value. Table 23 shows the amplitudes from elements $S_{30}$, $S_{21}$, $S_{12}$ and $S_{03}$ to elements $C_{03}$, $C_{13}$, $C_{23}$, $C_{33}$, and $C_{43}$. Table 24 shows the amplitudes from elements $C_{03}$, $C_{13}$, $C_{23}$, $C_{33}$, and $C_{43}$ to elements $P_{03}$, $P_{13}$, $P_{23}$ and the thresholds of elements $P_{03}$, $P_{13}$, $P_{23}$. Table 25 shows the amplitude and threshold used to compute the value of $e_3$. The firing activity of element $E_3$ expresses the value of $e_3$. Below are active element machine commands that express the parameter values shown in table 22, table 23, table 24 and table 25.

(set_element s S_30 3 1 s–2)
(set_connection s Y3 S_30 2 1 1)
(set_connection s Z0 S_30 2 1 1)
(set_element s S_21 3 1 s–2)
(set_connection s Y2 S_21 2 1 1)
(set_connection s Z1 S_21 2 1 1)
(set_element s S_12 3 1 s–2)
(set_connection s Y1 S_12 2 1 1)
(set_connection s Z2 S_12 2 1 1)
(set_element s S_03 3 1 s–2)
(set_connection s Y0 S_0321 1)
(set_connection s Z3 S_03 2 11)
(set_element s C_03 1 1 s–2)
(set_element s C_13 3 1 s–2)
(set_element s C_23 5 1 s–2)
(set_element s C_33 7 1 s–2)
(set_element s C_43 9 1 s–2)
(set_connection s S_30 C_03 2 1 1)
(set_connection s S_30 C_13 2 1 1)
(set_connection s S_30 C_23 2 1 1)
(set_connection s S_30 C_33 2 1 1)
(set_connection s S_30 C_43 2 1 1)
(set_connection s S_21 C_03 2 1 1)
(set_connection s S_21 C_13 2 1 1)
(set_connection s S_21 C_23 2 1 1)
(set_connection s S_21 C_33 2 1 1)
(set_connection s S_21 C_43 2 1 1)
(set_connection s S_12 C_03 2 1 1)
(set_connection s S_12 C_13 2 1 1)
(set_connection s S_12 C_23 2 1 1)
(set_connection s S_12 C_33 2 1 1)

(set_connection s S_12 C_43 2 1 1)
(set_connection s S_03 C_03 2 1 1)
(set_connection s S_03 C_13 2 1 1)
(set_connection s S_03 C_23 2 1 1)
(set_connection s S_03 C_33 2 1 1)
(set_connection s S_03 C_43 2 1 1)
(set_connection s P_12 C_03 2 1 1)
(set_connection s P_12 C_13 2 1 1)
(set_connection s P_12 C_23 2 1 1)
(set_connection s P_12 C_33 2 1 1)
(set_connection s P_12 C_43 2 1 1)
(set_element s P_03 1 1 s−2)
(set_element s P_13 1 1 s−2)
(set_element s P_23 7 1 s−2)
(set_connection s C_03 P_03 2 1 1)
(set_connection s C_03 P_13 0 1 1)
(set_connection s C_03 P_23 2 1 1)
(set_connection s C_13 P_03 −2 1 1)
(set_connection s C_13 P_13 2 1 1)
(set_connection s C_13 P_23 2 1 1)
(set_connection s C_23 P_03 2 1 1)
(set_connection s C_23 P_13 2 1 1)
(set_connection s C_23 P_23 2 1 1)
(set_connection s C_33 P_03 −2 1 1)
(set_connection s C_33 P_13 −4 1 1)
(set_connection s C_33 P_23 2 1 1)
(set_connection s C_43 P_03 2 1 1)
(set_connection s C_43 P_13 0 1 1)
(set_connection s C_43 P_23 2 1 1)
(set_element s E3 1 1 s−2)
(set_connection s P_03 E3 2 1 1)

Table 26 shows the firing patterns for elements $S_{31}$, $S_{22}$, $S_{13}$, $P_{13}$, $P_{22}$. Table 27 shows the amplitudes from elements $S_{31}$, $S_{22}$, $S_{13}$, $P_{13}$, $P_{22}$ to elements $C_{04}$, $C_{14}$, $C_{24}$, $C_{34}$, $C_{44}$ and the thresholds of $C_{04}$, $C_{14}$, $C_{24}$, $C_{34}$ and $C_{44}$. Table 28 shows the amplitudes from elements $C_{04}$, $C_{14}$, $C_{24}$, $C_{34}$, and $C_{44}$ to elements $P_{04}$, $P_{14}$, $P_{24}$ and the thresholds of elements $P_{04}$, $P_{14}$, $P_{24}$. Table 29 shows the amplitude and threshold used to compute the value of $e_4$. The firing activity of element $E_4$ expresses the value of $e_4$. Below are active element machine commands that express the parameter values shown in table 26, table 27, table 28 and table 29.

(set_element s S_31 3 1 s−2)
(set_connection s Y3 S_31 2 1 1)
(set_connection s Z1 S_31 2 1 1)
(set_element s S_22 3 1 s−2)
(set_connection s Y2 S_22 2 1 1)
(set_connection s Z2 S_22 2 1 1)
(set_element s S_13 3 1 s−2)
(set_connection s Y1 S_13 2 1 1)
(set_connection s Z2 S_13 2 1 1)
(set_element s C_04 1 1 s−2)
(set_element s C_14 3 1 s−2)
(set_element s C_24 5 1 s−2)
(set_element s C_34 7 1 s−2)
(set_element s C_44 9 1 s−2)
(set_connection s S_31 C_04 2 1 1)
(set_connection s S_31 C_14 2 1 1)
(set_connection s S_31 C_24 2 1 1)
(set_connection s S_31 C_34 2 1 1)
(set_connection s S_31 C_44 2 1 1)
(set_connection s S_22 C_04 2 1 1)
(set_connection s S_22 C_14 2 1 1)
(set_connection s S_22 C_24 2 1 1)
(set_connection s S_22 C_34 2 1 1)
(set_connection s S_22 C_44 2 1 1)
(set_connection s S_13 C_04 2 1 1)
(set_connection s S_13 C_14 2 1 1)
(set_connection s S_13 C_24 2 1 1)
(set_connection s S_13 C_34 2 1 1)
(set_connection s S_13 C_44 2 1 1)
(set_connection s P_22 C_04 2 1 1)
(set_connection s P_22 C_14 2 1 1)
(set_connection s P_22 C_24 2 1 1)
(set_connection s P_22 C_34 2 1 1)
(set_connection s P_22 C_44 2 1 1)
(set_connection s P_13 C_04 2 1 1)
(set_connection s P_13 C_14 2 1 1)
(set_connection s P_13 C_24 2 1 1)
(set_connection s P_13 C_34 2 1 1)
(set_connection s P_13 C_44 2 1 1)
(set_element s P_04 1 1 s−2)
(set_element s P_14 1 1 s−2)
(set_element s P_24 7 1 s−2)
(set_connection s C_04 P_04 2 1 1)
(set_connection s C_04 P_14 0 1 1)
(set_connection s C_04 P_24 2 1 1)
(set_connection s C_14 P_04 −2 1 1)
(set_connection s C_14 P_14 2 1 1)
(set_connection s C_14 P_24 2 1 1)
(set_connection s C_24 P_04 2 1 1)
(set_connection s C_24 P_14 2 1 1)
(set_connection s C_24 P_24 2 1 1)
(set_connection s C_34 P_04 −2 1 1)
(set_connection s C_34 P_14 −4 1 1)
(set_connection s C_34 P_24 2 1 1)
(set_connection s C_44 P_04 2 1 1)
(set_connection s C_44 P_14 0 1 1)
(set_connection s C_44 P_24 2 1 1)
(set_element s E4 1 1 s−2)
(set_connection s P_04 E4 2 1 1)

Table 30 shows the firing patterns for elements $S_{32}$, $S_{23}$, $P_{14}$, $P_{23}$. Table 31 shows the amplitudes from elements $S_{32}$, $S_{23}$, $P_{14}$, $P_{23}$ to elements $C_{05}$, $C_{15}$, $C_{25}$, $C_{35}$ and the thresholds of $C_{05}$, $C_{15}$, $C_{25}$, $C_{35}$. Table 32 shows the amplitudes from elements $C_{05}$, $C_{15}$, $C_{25}$, $C_{35}$ to elements $P_{05}$, $P_{15}$, $P_{25}$ and the thresholds of elements $P_{05}$, $P_{15}$, $P_{25}$. Table 33 shows the amplitude and threshold used to compute the value of $e_5$. The firing activity of element $E_5$ expresses the value of $e_5$. Below are active element machine commands that express the parameter values shown in table 30, table 31, table 32 and table 33.

(set_element s S_32 3 1 s−2)
(set_connection s Y3 S_32 2 1 1)
(set_connection s Z2 S_32 2 1 1)
(set_element s S_23 3 1 s−2)
(set_connection s Y2 S_23 2 1 1)
(set_connection s Z3 S_23 2 1 1)
(set_element s C_05 1 1 s−2)
(set_element s C_15 3 1 s−2)
(set_element s C_25 5 1 s−2)
(set_element s C_35 7 1 s−2)
(set_connection s S_32 C_05 2 1 1)
(set_connection s S_32 C_15 2 1 1)
(set_connection s S_32 C_25 2 1 1)
(set_connection s S_32 C_35 2 1 1)
(set_connection s S_23 C_05 2 1 1)
(set_connection s S_23 C_15 2 1 1)
(set_connection s S_23 C_25 2 1 1)
(set_connection s S_23 C_35 2 1 1)
(set_connection s P_14 C_05 2 1 1)
(set_connection s P_14 C_15 2 1 1)
(set_connection s P_14 C_25 2 1 1)
(set_connection s P_14 C_35 2 1 1)

(set_connection s P_23 C_05 2 1 1)
(set_connection s P_23 C_15 2 1 1)
(set_connection s P_23 C_25 2 1 1)
(set_connection s P_23 C_35 2 1 1)
(set_element s P_05 1 1 s−2)
(set_element s P_15 1 1 s−2)
(set_element s P_25 7 1 s−2)
(set_connection s C_05 P_05 2 1 1)
(set_connection s C_05 P_15 0 1 1)
(set_connection s C_05 P_25 2 1 1)
(set_connection s C_15 P_05 −2 1 1)
(set_connection s C_15 P_15 2 1 1)
(set_connection s C_15 P_25 2 1 1)
(set_connection s C_25 P_05 2 1 1)
(set_connection s C_25 P_15 2 1 1)
(set_connection s C_25 P_25 2 1 1)
(set_connection s C_35 P_05 −2 1 1)
(set_connection s C_35 P_15 −4 1 1)
(set_connection s C_35 P_25 2 1 1)
(set_element s E5 1 1 s−2)
(set_connection s P_05 E5 2 1 1)

Table 34 shows the firing patterns for elements $S_{33}$, $P_{15}$, $P_{24}$. Table 35 shows the amplitudes from elements $S_{33}$, $P_{15}$, $P_{24}$ to elements $C_{06}$, $C_{16}$, $C_{26}$ and the thresholds of $C_{06}$, $C_{16}$, $C_{26}$. Table 36 shows the amplitudes from elements $C_{06}$, $C_{16}$, $C_{26}$ to elements $P_{06}$, $P_{16}$ and the thresholds of elements $P_{06}$, $P_{16}$. Table 37 shows the amplitude of the connection from element $P_{06}$ to element E6 and the threshold of E6. The firing activity of E6 expresses the value of $e_6$. Below are active element machine commands that express the parameter values shown in table 34, table 35, table 36 and table 37.

(set_element s S_33 3 1 s−2)
(set_connection s Y3 S_33 2 1 1)
(set_connection s Z3 S_33 2 1 1)
(set_element s C_06 1 1 s−2)
(set_element s C_16 3 1 s−2)
(set_element s C_26 5 1 s−2)
(set_connection s S_33 C_06 2 1 1)
(set_connection s S_33 C_16 2 1 1)
(set_connection s S_33 C_26 2 1 1)
(set_connection s P_15 C_06 2 1 1)
(set_connection s P_15 C_16 2 1 1)
(set_connection s P_15 C_26 2 1 1)
(set_connection s P_24 C_06 2 1 1)
(set_connection s P_24 C_16 2 1 1)
(set_connection s P_24 C_26 2 1 1)
(set_element s P_06 1 1 s−2)
(set_element s P_16 1 1 s−2)
(set_connection s C_06 P_06 2 1 1)
(set_connection s C_06 P_16 0 1 1)
(set_connection s C_16 P_06 −2 11)
(set_connection s C_16 P_16 2 11)
(set_connection s C_26 P_06 2 11)
(set_connection s C_26 P_16 2 11)
(set_element s E6 1 1 s−2)
(set_connection s P_06 E6 2 1 1)

The firing activity of element E7 represents bit $e_7$. When element $P_{16}$ is firing, this means that there is a carry so E7 should fire. The following commands accomplish this.

(set_element s E7 1 1 s−2)
(set_connection s P_16 E7 2 1 1)

Table 38 shows how the active element machine commands were designed to compute 1110*0111. Suppose that the AEM commands from the previous sections are called with s=2. Then $y_0$=0. $y_1$=1. $y_2$=1. $y_3$=1. $z_0$= 1. $z_1$=1. $z_2$=1. $z_3$=0. Thus, fire input elements $Y_1$, $Y_2$ and $Y_3$ at time 2. Similarly, fire input elements $Z_0$, $Z_1$ and $Z_2$ at time 2.

(set_element 2 Y1 1 1 0)
(set connection 2Y1 Y1 2 1+dT 1)
(fire (Time 2) (Name Y1))
(set_element 2 Y2 1 1 0)
(set_connection 2 Y2 Y2 2 1+dT 1)
(fire (Time 2) (Name Y2))
(set_element 2 Y3 1 1 0)
(set_connection 2Y3 Y3 2 1+dT 1)
(fire (Time 2) (Name Y3))
(set_element 2 Z0 1 1 0)
(set_connection 2 Z0 Z0 2 1+dT 1)
(fire (Time 2) (Name Z0))
(set_element 2 Z1 1 1 0)
(set_connection 2 Z1 Z1 2 1+dT 1)
(fire (Time 2) (Name Z1))
(set_element 2 Z2 1 1 0)
(set_connection 2 Z2 Z2 2 1+dT 1)
(fire (Time 2) (Name Z2))

Element $E_0$ never fires because $E_0$ only receives a pulse of amplitude 2 from $Z_0$ and has threshold 3. The fact that $E_0$ never fires represents that $e_0$=0.

In regard to the value of $e_1$, element $S_{10}$ fires at time 3 because $Y_1$ and $Z_0$ fire at time 2 and $S_{10}$ has a threshold of 3 and receives a pulse of amplitude 2 from $Y_1$ and $Z_0$. The following commands set these values.

(set_element s S_10 3 1 s−2)
(set_connection s Y1 S_10 2 1 1)
(set_connection s Z0 S_10 2 1 1)

Element $S_{01}$ does not fire at time 3 because it only receives a pulse of amplitude 2 from element $Z_1$ and has threshold 3. The firing of $S_{10}$ at time 3 causes $C_{01}$ to fire at time 4 because $C_{01}$'s threshold is 1. The following commands set up these element and connection values.

(set_element s C_01 1 1 s−2)
(set_connection s S_10 C_01 2 1 1)
The commands
(set_element s E1 1 1 s−2)
(set_connection s C_01 E1 2 1 1)

cause $E_1$ to fire at time 5 and $E_1$ continues to fire indefinitely because the input elements $Y_1$, $Y_2$, $Y_3$, $Z_0$, $Z_1$ and $Z_2$ continue to fire at time steps 3, 4, 5, 6, 7, 8, . . . . The firing of element $E_1$ indicates that $e_1$=1.

In regard to the value of $e_2$, since elements $Y_1$ and $Z_1$ fire at time 2, element $S_{11}$ fires at time 3. Since elements $Y_2$ and $Z_0$ fire at time 2, element $S_{20}$ also fires at time 3. From the following commands (set_element 2 C_02 1 1 0)
(set_element 2 C_12 3 1 0)
(set_connection 2 S_20 C_02 2 1 1)
(set_connection 2 S_20 C_12 2 1 1)
(set_connection 2 S_11 C_02 2 1 1)
(set_connection 2 S_11 C_12 2 1 1)

then elements $C_{02}$ and $C_{12}$ fire at time 4.

Element $P_{12}$ fires at time 5 because of the commands
(set_element 2 P_12 1 1 0)
(set_connection 2 C_12 P_12 2 1 1)
(set_connection 2 C_02 P_12 0 1 1)

Observe that element $P_{02}$ does not fire because $C_{12}$ sends a pulse with amplitude −2 and $C_{02}$ sends a pulse with amplitude 2 and element $P_{02}$ has threshold 1 as a consequence of command (set_element 2 P_02 1 1 0).

Since $P_{02}$ does not fire, element E2 does not fire as it threshold is 1 and the only connection to element $E_2$ is from $P_{02}$: (set_connection 2 P_02 E2 2 1 1). Since element $E_2$ does not fire, this indicates that $e_2$=0.

In regard to the value of $e_3$, since elements $Y_3$ and $Z_0$ fire at time 2, element $S_{30}$ fires at time 3. Since elements $Y_2$ and $Z_1$ fire at time 2, element $S_{21}$ fires at time 3. Since elements $Y_1$ and $Z_2$ fire at time 2, element $S_{12}$ fires at time 3. $S_{03}$ does not fire. From the following commands (set_element 2 C_03 1 1 0)
(set_element 2 C_13 3 1 0)
(set_element 2 C_23 5 1 0)
(set_element 2 C_33 7 1 0)
(set_connection 2 S_30 C_03 2 1 1)
(set_connection 2 S_30 C_13 2 1 1)
(set_connection 2 S_30 C_23 2 1 1)
(set_connection 2 S_30 C_33 2 11)
(set_connection 2 S_21 C_03 2 11)
(set_connection 2 S_21 C_13 2 11)
(set_connection 2 S_21 C_23 2 11)
(set_connection 2 S_21 C_33 2 11)
(set_connection 2 S_12 C_03 2 1 1)
(set_connection 2 S_12 C_13 2 1 1)
(set_connection 2 S_12 C_23 2 1 1)
(set_connection 2 S_12 C_33 2 11)
(set_connection 2 P_12 C_03 2 11)
(set_connection 2 P_12 C_13 2 11)
(set_connection 2 P_12 C_23 2 11)
(set_connection 2 P_12 C_33 2 11)

then elements $C_{03}$, $C_{13}$, $C_{23}$ fire at time 4 and they will continue to fire every time step 5, 6, 7, 8 . . . because the elements $Y_1$, $Y_2$, $Y_3$, $Z_0$, $Z_1$ and $Z_2$ continue to fire at time steps 3, 4, 5, 6, 7, 8, . . . .

As a result of $P_{12}$ firing at time 5, $C_{33}$ fires at time 6, so at time 7, only $P_{23}$ fires. As a result, the long term behavior (after time step 7) of $P_{03}$ does not fire. Thus, $E_3$ does not fire after time step 7, which indicates that $e_3$=0.

Similar to that of element $E_3$, in the long term element $E_4$ does not fire, which indicates that $e_4$=0. Similarly, in the long term element $E_5$ fires, which indicates that $e_5$=1. Similarly, in the long term element $E_6$ fires, which indicates that $e_6$=1. Similarly, in the long term element E7 does not fire, which indicates that $e_7$=0.

As a consequence, multiplication of 1110*0111 equals 1100010 in binary, which represents that 14*7=98 in base 10. This active element program can execute any multiplication of two four bit binary numbers. Similar to the multiplication just described, tables 39, 40 and 41 show the multiplication steps for 11*9=99; 15*14=210; and 15*15=225.

AEM Firing Patterns Execute a Digital Computer Program

In some embodiments, an AEM using randomness executes a universal Turing machine (digital computer program) or a von Neumann machine. In an embodiments, the randomness is generated from a non-deterministic physical process. In some embodiments, the randomness is generated using quantum events such as the emission and detection of photons. In some embodiments, the firing patterns of the active elements computing the execution of these machines are Turing incomputable. In some embodiments, the AEM accomplishes this by executing a universal Turing machine or von Neumann machine instructions with random firing interpretations. In some embodiments, if the state and tape contents of the universal Turing machine—represented by the AEM elements and connections—and the random bits generated from the random—in some embodiments, quantum—source are kept perfectly secret and no information is leaked about the dynamic connections in the AEM, then it is Turing incomputable to construct a translator Turing machine that maps the random firing interpretations back to the sequence of instructions executed by the universal Turing machine or von Neumann machine. As a consequence, in some embodiments, the AEM can deterministically execute any Turing machine (digital computer program) with active element firing patterns that are Turing incomputable. Since Turing incomputable AEM firing behavior can deterministically execute a universal Turing machine or digital computer with a finite active element machine using quantum randomness, this creates a novel computational procedure ([6], [32]). In [20], Lewis and Papadimitriou discuss the prior art notion of a digital computer's computational procedure:

Because the Turing machines can carry out any computation that can be carried out by any similar type of automata, and because these automata seem to capture the essential features of real computing machines, we take the Turing machine to be a precise formal equivalent of the intuitive notion of algorithm: nothing will be considered as an algorithm if it cannot be rendered as a Turing machine.

The principle that Turing machines are formal versions of algorithms and that no computational procedure will be considered as an algorithm unless it can be presented as a Turing machine is known as Church's thesis or the Church-Turing Thesis. It is a thesis, not a theorem, because it is not a mathematical result: It simply asserts that a certain informal concept corresponds to a certain mathematical object. It is theoretically possible, however, that Church's thesis could be overthrown at some future date, if someone were to propose an alternative model of computation that was publicly acceptable as fulfilling the requirement of finite labor at each step and yet was provably capable of carrying out computations that cannot be carried out by any Turing machine. No one considers this likely.

In a cryptographic system, Shannon [28] defines the notion of perfect secrecy. Perfect Secrecy is defined by requiring of a system that after a cryptogram is intercepted by the enemy the a posteriori probabilities of this cryptogram representing various messages be identically the same as the a priori probabilities of the same messages before the interception.

In this context, perfect secrecy means that no information is ever released or leaked about the state and the memory contents of the universal deterministic machine, the random bits generated from a quantum source and the dynamic connections of the active element machine.

In [19], Kocher et al. present differential power analysis. Differential power analysis obtains information about cryptographic computations executed by register machine hardware, by statistically analyzing the electromagnetic radiation leaked by the hardware during its computation. In some embodiments, when a quantum active element computing system is built so that its internal components remain perfectly secret or close to perfectly secret, then it may be extremely challenging for an adversary to carry out types of attacks such as differential power analysis.

Active Element Machine Interpretations of Boolean Functions

In this section, the same boolean function is computed by two or more distinct active element firing patterns, which can be executed at distinct times or by different circuits (two or more different parts) in the active element machine. These methods provide useful embodiments in a number of ways. They show how digital computer program computations can be computed differently at distinct instances. In some embodiments, distinct instances are two or more different times. In some embodiments, distinct instances use different elements and connections of the active element machine to differently compute the same Boolean function. The methods shown here demonstrate the use of level sets so that multiple active element machine firing patterns may compute the same boolean function or computer program instruction. Third, these methods demonstrate the utility of using multiple, dynamic firing interpretations to perform the same task—for example, execute a computer program—or represent the same knowledge.

The embodiments shown here enable one or more digital computer program instructions to be computed differently at different instances. In some embodiments, these different instances are different times. In some embodiments, these different instances of computing the program instruction are executed by different collections of active elements and connections in the active element machine. In some embodiments, the computer program may be an active element machine program.

The following procedure uses a non-deterministic physical process to either fire input element I or not fire I at time t=n where n is a natural number $\{0, 1, 2, 3, \ldots\}$. This random sequence of 0 and 1's can be generated by quantum optics, or quantum events in a semiconductor material or other physical phenomena. In some embodiments, the randomness is generated by a light emitting diode (FIGS. 24 and 25) and detected by a semiconductor chip that is a photodetector (FIG. 23). In some embodiments, the arrival times of photons act as the quantum events that help generate a random sequence of 0's and 1's. The procedure is used to help execute the same computation with multiple interpretations. In some embodiments, this same computation is a program instruction executed at two different instances.

Procedure 1. Randomness generates an AEM, representing a real number in the interval [0, 1]. Using a random process to fire or not fire one input element I at each unit of time, a finite active element program can represent a randomly generated real number in the unit interval [0, 1]. In some embodiments, the non-deterministic process is physically contained in the active element machine. In other embodiments, the emission part of the random process is separate from the active element machine.

The Meta command and a random sequence of bits creates active elements 0, 1, 2, . . . that store the binary representation $b_0\ b_1\ b_2\ \ldots$ of real number x lying in the interval [0, 1]. If input element I fires at time t=n, then $b_1$=1; thus, create active element n so that after t=n, element n fires every unit of time indefinitely. If input element I doesn't fire at time t=n, then $b_n$=0 and active element n is created so that it never fires. The following finite active element machine program exhibits this behavior.
  (Program C (Args t)
  (Connection (Time t) (From I) (To t) (Amp 2) (Width 1)
    (Delay 1))
  (Connection (Time t+1+dT) (From I) (To t) (Amp 0))
  (Connection (Time t) (From t) (To t) (Amp 2) (Width 1)
    (Delay 1)))
  (Element (Time clock) (Name clock)
  (Threshold 1) (Refractory 1) (Last −1))
  (Meta (Name I) (C (Args clock)))

Suppose a sequence of random bits—obtained from the environment or from a non-deterministic process inside the active element machine—begins with 1, 0, 1, . . . . Thus, input element I fires at times 0, 2, . . . . At time 0, the following commands are executed.
  (Element (Time 0) (Name 0) (Threshold 1) (Refractory 1)
    (Last −1))
  (C (Args 0))
The execution of (C (Args 0)) causes three connection commands to execute.
  (Connection (Time 0) (From I) (To 0) (Amp 2) (Width 1)
    (Delay 1))
  (Connection (Time 1+dT) (From I) (To 0) (Amp 0))
  (Connection (Time 0) (From 0) (To 0) (Amp 2) (Width 1)
    (Delay 1))
Because of the first connection command
  (Connection (Time 0) (From I) (To 0) (Amp 2) (Width 1)
    (Delay 1))
the firing of input element I at time 0 sends a pulse with amplitude 2 to element 0. Thus, element 0 fires at time 1. Then at time 1+dT, a moment after time 1, the connection from input element I to element 0 is removed. At time 0, a connection from element 0 to itself with amplitude 2 is created. As a result, element 0 continues to fire indefinitely, representing that $b_0$=1. At time 1, command
  (Element (Time 1) (Name 1) (Threshold 1) (Refractory 1)
    (Last −1))
is created. Since element 1 has no connections into it and threshold 1, element 1 never fires.

Thus $b_1$=0. At time 2, input element I fires, so the following commands are executed.
  (Element (Time 2) (Name 2) (Threshold 1) (Refractory 1)
    (Last −1))
  (C (Args 2))
The execution of (C (Args 2)) causes the three connection commands to execute.
  (Connection (Time 2) (From I) (To 2) (Amp 2) (Width 1)
    (Delay 1))
  (Connection (Time 3+dT) (From I) (To 2) (Amp 0))
  (Connection (Time 2) (From 2) (To 2) (Amp 2) (Width 1)
    (Delay 1))
Because of the first connection command
  (Connection (Time 2) (From I) (To 2) (Amp 2) (Width 1)
    (Delay 1))
the firing of input element I at time 2 sends a pulse with amplitude 2 to element 2. Thus, element 2 fires at time 3. Then at time 3+dT, a moment after time 3, the connection from input element I to element 2 is removed. At time 2, a connection from element 2 to itself with amplitude 2 is created. As a result, element 2 continues to fire indefinitely, representing that $b_2$=1.

Active Element Machine Firing Patterns

During a window of time, firing patterns can be put in 1-to-1 correspondence with the boolean functions $f: \{0, 1\}^n \to \{0, 1\}$. In the next section, the firing pattern methods explained here are combined with procedure 1 so that a randomly chosen firing pattern can compute the functions used to execute a universal Turing machine. Consider four active elements $X_0, X_1, X_2$ and $X_3$ during window of time W=[a, b]. The refractory periods of $X_0, X_1, X_2$ and $X_3$ are chosen so that each $X_k$ either fires or doesn't fire during window W. Thus, there are sixteen distinct firing patterns. Five of these firing patterns are shown in FIGS. 1, 2, 3, 4, and 5.

A one-to-one correspondence is constructed with the sixteen boolean functions of the form $f: \{0, 1\} \times \{0, 1\} \to \{0, 1\}$. These boolean functions comprise the binary operators: and $\wedge$, or $\vee$, xor $\oplus$, equal $\leftrightarrow$, and so on. One of these firing patterns is distinguished from the other fifteen by building the appropriate connections to element P, which in the general case represents the output of a boolean function $f$: $\{0, 1\}^n \rightarrow \{0, 1\}$. A key notion is that element P fires within the window of time W if and only if P receives a unique firing pattern from elements $X_0$, $X_1$, $X_2$ and $X_3$. (This is analogous to the notion of the grandmother nerve cell that only fires if you just saw your grandmother.) The following definition covers the Boolean interpretation explained here and also handles more complex types of interpretations.

Definition 2.1. Number of Firings During a Window

Let X denote the set of active elements $\{X_0, X_1, \ldots, X-1\}$ that determine the firing pattern during the window of time W. Then $|(X_k, W)|$=the number of times that element $X_k$ fired during window of time W. Thus, define the number of firings during window W as $$|(X, W)| = \sum_{k=0}^{n-1} |(X_k, W)|.$$

Figure 1:
FIG. 1 shows a fire pattern of 0000 for active elements $X_0$, $X_1$, $X_2$, and $X_3$. Elements $X_0$, $X_1$, $X_2$, and $X_3$ don't fire during window W.
Figure 2:
FIG. 2 shows a fire pattern of 0001 for active elements $X_0$, $X_1$, $X_2$, and $X_3$. During window W, elements $X_0$, $X_1$, $X_2$ don't fire and $X_3$ fires.
Figure 3:
FIG. 3 shows a fire pattern of 0010 for active elements $X_0$, $X_1$, $X_2$, and $X_3$. During window W, only element $X_2$ fires.
Figure 4:
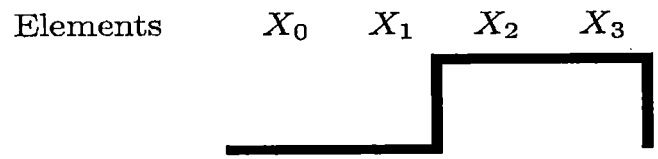
FIG. 4 shows a fire pattern of 0011 for active elements $X_0$, $X_1$, $X_2$, and $X_3$. During window W, only elements $X_2$ and $X_3$ fire.
Figure 5:
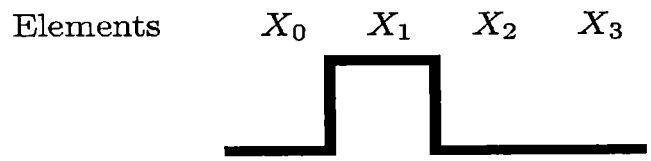
FIG. 5 shows a fire pattern of 0100 for active elements $X_0$, $X_1$, $X_2$, and $X_3$. During window W, only element $X_1$ fires.
Figure 6:
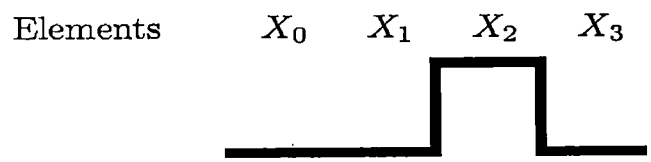
FIG. 6 shows a fire pattern of 0010 for active elements $X_0$, $X_1$, $X_2$, and $X_3$ used to compute $1 \oplus 0$.
Figure 7:
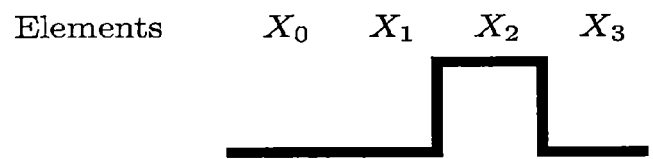
FIG. 7 shows a fire pattern of 0010 for active elements $X_0$, $X_1$, $X_2$, and $X_3$ used to compute $0 \oplus 1$.
Figure 8:
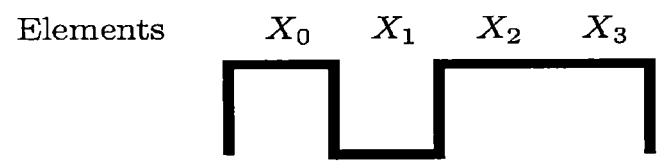
FIG. 8 shows a fire pattern of 1011 for active elements $X_0$, $X_1$, $X_2$, and $X_3$ used to compute $1 \oplus 1$.
Figure 9:
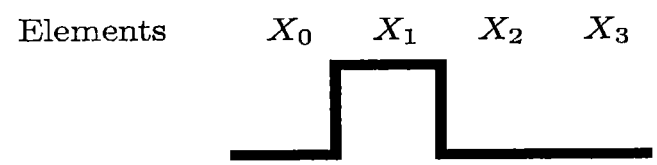
FIG. 9 shows a fire pattern of 0100 for active elements $X_0$, $X_1$, $X_2$, and $X_3$ used to compute $0 \oplus 0$.
Figure 10:
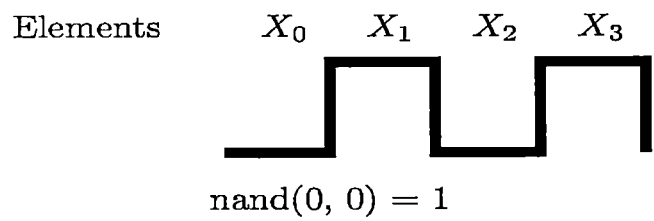
FIG. 10 shows a fire pattern of 0101 for active elements $X_0$, $X_1$, $X_2$, and $X_3$ used to compute $\neg(0 \wedge 0) = 1$.
Figure 11:
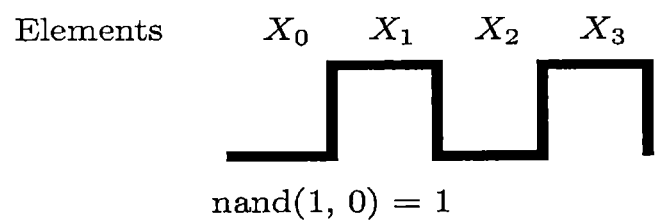
FIG. 11 shows a fire pattern of 0101 for active elements $X_0$, $X_1$, $X_2$, and $X_3$ used to compute $\neg(1 \wedge 0) = 1$.
Figure 12:
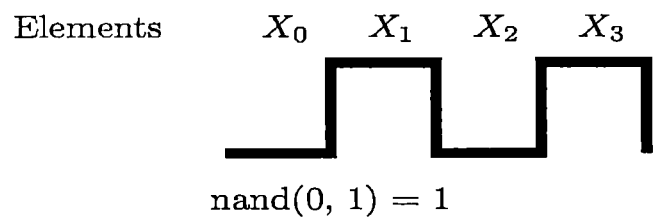
FIG. 12 shows a fire pattern of 0101 for active elements $X_0$, $X_1$, $X_2$, and $X_3$ used to compute $\neg(0 \wedge 1) = 1$.
Figure 13:
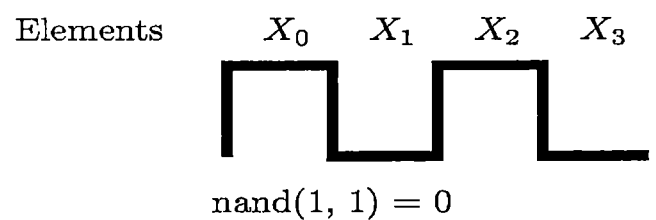
FIG. 13 shows a fire pattern of 1010 for active elements $X_0$, $X_1$, $X_2$, and $X_3$ used to compute $\neg(1 \wedge 1) = 0$.

Observe that $|(X, W)|=0$ for firing pattern 0000 shown in FIG. 1 and $|(X, W)|=2$ for firing pattern 0011. To isolate a firing pattern so that element P only fires if this unique firing pattern occurs, set the threshold of element P=$2|(X, W)|-1$.

The element command for P is:
(Element (Time a−dT) (Name P) (Threshold 2|(X, W)|−1) (Refractory b−a) (Last 2a−b)) Further, if element $X_k$ doesn't fire during window of time W, then set the amplitude of the connection from $X_k$ to P to −2. If element $X_k$ does fire during window of time W, then set the amplitude of the connection from $X_k$ to P equal to 2. For each element $X_k$, the pulse width is set to |W|=b−a. Each connection from $X_k$ to P is based on whether $X_k$ is supposed to fire or is not supposed to fire during W. If $X_k$ is supposed to fire during W, then the following connection is established.

(Connection (Time a−dT) (From X_k) (To P) (Amp 2) (Width b−a) (Delay 1))

If $X_k$ is not supposed to fire during W, then the following connection is established.

(Connection (Time a−dT) (From X_k) (To P) (Amp −2) (Width b−a) (Delay 1))

The firing pattern is already known because it is determined based on a random source of bits received by input elements, as discussed in procedure 1. Consequently, −2|(X, W)| is already known. How an active element circuit is designed to create a firing pattern that computes the appropriate boolean function is discussed in the following example.

Example. Computing ⊕ (Exclusive-OR) with Firing Pattern 0010

Consider firing pattern 0010. In other words, $X_2$ fires but the other elements do not fire. The AEM is supposed to compute the boolean function exclusive-or A⊕B=(A∨B)∧(¬A∨¬B). The goal here is to design an AEM circuit such that A⊕B=1 if and only if the firing pattern for $X_0$, $X_1$, $X_2$, $X_3$ is 0010. Following definition 2.1, as a result of the distinct firing pattern during W, if A⊕B=1 then P fires. If A⊕B=0 then P doesn't fire. Below are the commands that connect elements A and B to elements $X_0$, $X_1$, $X_2$, $X_3$.

(Connection (Time a−2) (From A) (To X_0) (Amp 2) (Width b−a+1) (Delay 2))
(Connection (Time a−2) (From B) (To X_0) (Amp 2) (Width b−a+1) (Delay 2))
(Element (Time a−2) (Name X_0) (Threshold 3) (Refractory b−a) (Last 2a−b))
(Connection (Time a−2) (From A) (To X_1) (Amp −2) (Width b−a+1) (Delay 2))
(Connection (Time a−2) (From B) (To X_1) (Amp −2) (Width b−a+1) (Delay 2))
(Element (Time a−2) (Name X_1) (Threshold −1) (Refractory b−a) (Last 2a−b))
(Connection (Time a−2) (From A) (To X_2) (Amp 2) (Width b−a+1) (Delay 2))
(Connection (Time a−2) (From B) (To X_2) (Amp 2) (Width b−a+1) (Delay 2))
(Element (Time a−2) (Name X_2) (Threshold 1) (Refractory b−a) (Last 2a−b))
(Connection (Time a−2) (From A) (To X_3) (Amp 2) (Width b−a+1) (Delay 2))
(Connection (Time a−2) (From B) (To X_3) (Amp 2) (Width b−a+1) (Delay 2))
(Element (Time a−2) (Name X_3) (Threshold 3) (Refractory b−a) (Last 2a−b))

There are four cases for A⊕B: 1⊕0, 0⊕1, 1⊕1 and 0⊕0. In regard to this, choose the refractory periods so that A and B either fire or don't fire at t=0. Recall that W=[a, b]. In this example, assume a=2 and b=3. Thus, all refractory periods of $X_0$, $X_1$, $X_2$, $X_3$ are 1 and all last time fireds are 1. All pulse widths are the length of the window W+1 which equals 2.

Case 1. Element A fires at time t=0 and element B doesn't fire at t=0. Element $X_0$ receives a pulse from A with amplitude 2 at time t=2. Element $X_1$ doesn't fire because its threshold=3. Element $X_1$ receives a pulse from A with amplitude −2 at time t=2. Element $X_1$ doesn't fire during W because $X_1$ has threshold=−1. Element $X_2$ receives a pulse from A with amplitude 2. Element $X_2$ fires at time t=2 because its threshold is 1. Element $X_3$ receives a pulse from A with amplitude 2 but doesn't fire during window W because $X_3$ has threshold=3.

Case 2. Element $X_0$ receives a pulse from B with amplitude 2 at time t=2. Element $X_0$ doesn't fire because its threshold=3. Element $X_1$ receives a pulse from B with amplitude −2 at time t=2. Element $X_1$ doesn't fire during W because $X_1$ has threshold=−1. Element $X_2$ receives a pulse from B with amplitude 2. Element $X_2$ fires at time t=2 because its threshold is 1. Element $X_3$ receives a pulse from B with amplitude 2, but doesn't fire during window W because $X_3$ has threshold=3.

Case 3. Element A fires at time t=0 and element B fires at t=0. Element $X_0$ receives two pulses from A and B each with amplitude 2 at time t=2. Element $X_0$ fires because its threshold=3. Element $X_1$ receives two pulses from A and B each with amplitude −2 at time t=2. Element $X_1$ doesn't fire during W because $X_1$ has threshold=−1. Element $X_2$ receives two pulses from A and B each with amplitude 2. Element $X_2$ fires at time t=2 because its threshold is 1. Element $X_3$ receives two pulses from A and B each with amplitude 2. Element $X_3$ fires at time t=2 because $X_3$ has threshold=3.

Case 4. Element A doesn't fire at time t=0 and element B doesn't fire at t=0. Thus, elements $X_0$, $X_2$ and $X_3$ do not fire because they have positive thresholds. Element $X_1$ fires at t=2 because it has threshold=−1.

For the desired firing pattern 0010, the threshold of P=2|(X, W)|−1=1.

Below is the element command for P.
(Element (Time 2−dT) (Name P) (Threshold 1) (Refractory 1) (Last 1)).

Below are the connection commands for making P fire if and only if firing pattern 0010 occurs during W.

(Connection (Time 2−dT) (From X_0) (To P) (Amp −2) (Width 1) (Delay 1))
(Connection (Time 2−dT) (From X_1) (To P) (Amp −2) (Width 1) (Delay 1))
(Connection (Time 2−dT) (From X_2) (To P) (Amp 2) (Width 1) (Delay 1))
(Connection (Time 2−dT) (From X_3) (To P) (Amp −2) (Width 1) (Delay 1))

For cases 1 and 2 (i.e., $1 \oplus 0$ and $0 \oplus 1$) only $X_2$ fires. A moment before $X_2$ fires at t=2 (i.e., −dT), the amplitude from $X_2$ to P is set to 2. At time t=2, a pulse with amplitude 2 is sent from $X_2$ to P, so P fires at time t=3 since its threshold=1. In other words, 100=1 or 001=1 has been computed. For case 3, $(1 \oplus 1)$, $X_0$, $X_2$ and $X_3$ fire. Thus, two pulses each with amplitude=−2 are sent from $X_0$ and $X_3$ to P. And one pulse with amplitude 2 is sent from $X_2$ to P. Thus, P doesn't fire. In other words, 101=0 has been computed. For case 4, $(0 \oplus 0)$, $X_1$ fires. One pulse with amplitude=−2 is sent to $X_2$. Thus, P doesn't fire. In other words, $0 \oplus 0 = 0$ has been computed.

Level Set Separation Rules

This section describes how any of the sixteen boolean functions are uniquely mapped to one of the sixteen firing patterns by an appropriate active element machine program. The domain $\{0, 1\} \times \{0, 1\}$ of the sixteen boolean functions has four members $\{(0, 0), (1, 0), (0, 1), (1, 1)\}$. Furthermore, for each active element $X_k$, separate these members based on the (amplitude from A to $X_k$, amplitude from B to $X_k$, threshold of $X_k$, element $X_k$) quadruplet. For example, the quadruplet $(0, 2, 1, X_1)$ separates $\{(1, 1), (0, 1)\}$ from $\{(1, 0), (0, 0)\}$ with respect to $X_1$. Recall that A=1 means A fires and B=1 means B fires. Then $X_1$ will fire with inputs $\{(1, 1), (0, 1)\}$ and $X_1$ will not fire with inputs $\{(1, 0), (0, 0)\}$. The separation rule is expressed as $$(0, 2, 1, X_1) \leftrightarrow \frac{\{(1, 1), (0, 1)\}}{\{(1, 0), (0, 0)\}}.$$

Similarly, $$(0, -2, -1, X_2) \leftrightarrow \frac{\{(1, 0), (0, 0)\}}{\{(1, 1), (0, 1)\}}$$

indicates that $X_2$ has threshold −1 and amplitudes 0 and −2 from A and B respectively. Further, $X_2$ will fire with inputs $\{(1, 0), (0, 0)\}$ and will not fire with inputs $\{(1, 1), (0, 1)\}$.

Table 1 shows how to compute all sixteen boolean functions $f_k: \{0, 1\} \times \{0, 1\} \to \{0, 1\}$. For each X, use one of 14 separation rules to map the level set $f_k^{-1}\{1\}$ or alternatively map the level set $f_k^{-1}\{0\}$ to one of the sixteen firing patterns represented by $X_0$, $X_1$, $X_2$ and $X_3$. The level set method works as follows.

Suppose the nand boolean function $f_{13} = \neg(A \wedge B)$ is to be computed with the firing pattern 0101. Observe that $f_{13}^{-1}\{1\} = \{(1, 0), (0, 1), (0, 0)\}$. Thus, the separation rules $$(2, 2, 3, X_k) \leftrightarrow \frac{\{(1, 1)\}}{\{(1, 0), (0, 1), (0, 0)\}}$$

for k in $\{0, 2\}$ work because $X_0$ and $X_2$ fire if and only if A fires and B fires. Similarly, $$(-2, -2, -3, X_j) \leftrightarrow \frac{\{(1, 0), (0, 1), (0, 0)\}}{\{(1, 1)\}}$$

for j in $\{1, 3\}$ work because $X_1$ and $X_3$ don't fire if and only if A fires and B fires. These rules generate the commands.

(Connection (Time a−2) (From A) (To X_0) (Amp 2) (Width b−a+1) (Delay 2))
(Connection (Time a−2) (From B) (To X_0) (Amp 2) (Width b−a+1) (Delay 2))
(Element (Time a−2) (Name X_0) (Threshold 3) (Refractory b−a) (Last 2a−b))
(Connection (Time a−2) (From A) (To X_1) (Amp −2) (Width b−a+1) (Delay 2))
(Connection (Time a−2) (From B) (To X_1) (Amp −2) (Width b−a+1) (Delay 2))
(Element (Time a−2) (Name X_1) (Threshold −3) (Refractory b−a) (Last 2a−b))
(Connection (Time a−2) (From A) (To X_2) (Amp 2) (Width b−a+1) (Delay 2))
(Connection (Time a−2) (From B) (To X_2) (Amp 2) (Width b−a+1) (Delay 2))
(Element (Time a−2) (Name X_2) (Threshold 3) (Refractory b−a) (Last 2a−b))
(Connection (Time a−2) (From A) (To X_3) (Amp −2) (Width b−a+1) (Delay 2))
(Connection (Time a−2) (From B) (To X_3) (Amp −2) (Width b−a+1) (Delay 2))
(Element (Time a−2) (Name X_3) (Threshold −3) (Refractory b−a) (Last 2a−b))

The five commands make element P fire if and only if firing pattern 0101 occurs.

(Element (Time 2−dT) (Name P) (Threshold 3) (Refractory 1) (Last 1))
(Connection (Time 2−dT) (From X_0) (To P) (Amp −2) (Width 1) (Delay 1))
(Connection (Time 2−dT) (From X_1) (To P) (Amp 2) (Width 1) (Delay 1))
(Connection (Time 2−dT) (From X_2) (To P) (Amp −2) (Width 1) (Delay 1))
(Connection (Time 2−dT) (From X_3) (To P) (Amp 2) (Width 1) (Delay 1))

Case 1: $\neg(0 \wedge 0)$. A doesn't fire and B doesn't fire. Thus, no pulses reach $X_1$ and $X_3$, who each have threshold −3. Thus, $X_1$ and $X_3$ fire. Similarly, no pulses reach $X_0$ and $X_2$, who each have threshold 3. Thus, the firing pattern 0101 shown in table 10 causes P to fire because element $X_1$ and $X_3$ each send a pulse with amplitude 2 to P which has threshold 3. Therefore, $\neg(0 \wedge 0)=1$ is computed.

Case 2: $\neg(1 \wedge 0)$. A fires and B doesn't fire. Thus, one pulse from A with amplitude 2 reaches $X_0$ and $X_2$, who each have threshold 3. Thus, $X_0$ and $X_2$ don't fire. Similarly, one pulse from A with amplitude −2 reaches $X_1$ and $X_3$, who each have threshold −3. Thus, the firing pattern 0101 shown in table 11 causes P to fire because element $X_1$ and $X_3$ each send a pulse with amplitude 2 to P which has threshold 3. Therefore, $\neg(1 \wedge 0)=1$ is computed.

Case 3: $\neg(0 \wedge 1)$. A doesn't fire and B fires. Thus, one pulse from B with amplitude 2 reaches $X_0$ and $X_2$, who each have threshold 3. Thus, $X_0$ and $X_2$ don't fire. Similarly, one pulse from B with amplitude −2 reaches $X_1$ and $X_3$, who each have threshold −3. Thus, the firing pattern 0101 shown in table 12 causes P to fire because element $X_1$ and $X_3$ each send a pulse with amplitude 2 to P which has threshold 3. Therefore, $\neg(0 \wedge 1)=1$ is computed.

Case 4: $\neg(1 \wedge 1)$. A fires and B fires. Thus, two pulses each with amplitude 2 reach $X_0$ and $X_2$, who each have threshold 3. Thus, $X_0$ and $X_2$ fire. Similarly, two pulses each with amplitude $-2$ reach $X_1$ and $X_3$, who each have threshold $-3$. As a result, $X_1$ and $X_3$ don't fire. Thus, the firing pattern 1010 shown in table 13 prevents P from firing because $X_0$ and $X_2$ each send a pulse with amplitude $-2$ to P which has threshold 3. Therefore, $\neg(1 \wedge 1)=0$ is computed.

Overall, any one of the sixteen boolean functions in table 1 are uniquely mapped to one of the sixteen firing patterns by an appropriate AEM program. These mappings can be chosen arbitrarily: as a consequence, each register machine instruction can be executed at different times using distinct AEM firing patterns.

Executing a Digital Computer with Random Firing Patterns

A universal Deterministic Machine (UDM) is a deterministic machine that can execute the computation of any deterministic Machine by reading the other deterministic machine's description and input from the UDM's tape. Table 2 shows Minsky's universal deterministic machine described in [24]. This means that this universal deterministic machine can execute any program that a digital computer, or distributed system of computers, or a von Neumann machine can execute.

The elements of $\{0, 1\}^2$ are denoted as $\{00, 01, 10, 11\}$. Create a one-to-one correspondence between the memory symbols in the alphabet of the universal deterministic machine and the elements in $\{0, 1\}^2$ as follows: $0 \leftrightarrow 00$, $1 \leftrightarrow 01$, $y \leftrightarrow 10$ and $A \leftrightarrow 11$. Furthermore, consider the following correspondence of the states with the elements of $\{0, 1\}^3$: $q_1 \leftrightarrow 001$, $q_2 \leftrightarrow 010$, $q_3 \leftrightarrow 011$, $q_4 \leftrightarrow 100$, $q_5 \leftrightarrow 101$, $q_6 \leftrightarrow 110$, $q_7 \leftrightarrow 111$ and the halting state $h \leftrightarrow 000$. Further consider $L \leftrightarrow 0$ and $R \leftrightarrow 1$ in $\{0, 1\}$. An active element machine is designed to compute the universal deterministic machine program i shown in table 3. Since the universal deterministic machine can execute any digital computer program, this demonstrates how to execute any digital computer program with a secure active element machine.

Following the methods in the previous section, multiple AEM firing interpretations are created that compute $\eta$. When the universal deterministic machine halts, $\eta(011, 00)=(000, 00, h)$, this special case is handled with a halting firing pattern $\mathsf{H}$ that the active element machine enters. Concatenate the three boolean variables U, W, X to represent the current state of the UDM. The two boolean variables Y, Z represent the current memory symbol being read. From table 3, observe that $\eta=(\eta_0\,\eta_1\,\eta_2,\eta_3\,\eta_4,\eta_5)$. For each k such that $0 \le k \le 5$, the level sets of the function $\eta_k: \{0, 1\}^3 \times \{0, 1\}^2 \to \{0, 1\}$ are shown below.

$\eta_0^{-1}(UWX, YZ)\{1\}=\{(111, 10), (111, 01), (111, 00), (110, 11), (110, 10), (110, 01), (101, 11), (101, 10), (101, 01), (100, 11), (100, 10), (100, 01), (100, 00), (011, 11) (010, 11)\}$ $\eta_0^{-1}(UWX, YZ)\{0\}=\{(111, 11), (110, 00), (101, 00), (011, 10), (011, 01), (011, 00), (010, 10), (010, 01), (010, 00), (001, 11), (001, 10), (001, 01), (001, 00), (000, 11), (000, 10), (000, 01), (000, 00)\}$ $\eta_1^{-1}(UWX, YZ)\{1\}=\{(111, 11), (111, 10), (111, 01), (111, 00), (110, 11), (110, 10), (110, 01), (110, 00), (101, 00), (100, 01), (011, 10), (011, 01), (010, 11), (010, 01), (010, 00), (001,01)\}$ $\eta_1^{-1}(UWX, YZ)\{0\}=\{(101, 11), (101, 10), (101, 01), (100, 11), (100, 10), (100, 00), (011, 11), (011, 00), (010, 10), (001, 11), (001, 10), (001, 00), (000, 11), (000, 10), (000, 01), (000, 00)\}$ $\eta_2^{-1}(UWX, YZ)\{1\}=\{(111, 10), (111, 01), (110, 00), (101, 11), (101, 10), (101, 01), (101, 00), (100, 01), (100, 00), (011, 10), (011, 01), (010, 10), (001, 11), (001, 10), (001, 00)\}$ $\eta_2^{-1}(UWX, YZ)\{0\}=\{(111, 11), (111, 00), (110, 11), (110, 10), (110, 01), (100, 11), (100, 10), (011, 11), (011, 00), (010, 11), (010, 01), (010, 00), (001, 01), (000, 11), (000, 10), (000, 01), (000, 00)\}$ $\eta_3^{-1}(UWX, YZ)\{1\}=\{(111, 00), (110, 00), (110, 01), (110, 10), (101, 00), (101, 01), (101, 10), (100, 00), (100, 10), (011, 01), (011, 10), (010, 11), (010, 01), (010, 00)\}$ $\eta_3^{-1}(UWX, YZ)\{0\}=\{(111, 01), (111, 10), (111, 11), (110, 11), (101, 11), (100, 01), (100, 11), (011, 00), (011, 11), (010, 10), (001, 00), (001, 01), (001, 10), (001, 11), (000, 01), (000, 10), (000, 11), (000, 00)\}$ $\eta_3^{-1}(UWX, YZ)\{1\}=\{(111, 01), (110, 11), (110, 01), (110, 00), (101, 11), (101, 01), (100, 11), (100, 01), (011, 11), (011, 01), (010, 01), (001, 11), (001, 01)\}$ $\eta_4^{-1}(UWX, YZ)\{0\}=\{(111, 11), (111, 10), (111, 00), (110, 10), (101, 10), (101, 00), (100, 10), (100, 00), (011, 10), (011, 00), (010, 11), (010, 10), (010, 00), (001, 10), (001, 00), (000, 11), (000, 10), (000, 01), (000, 00)\}$ $\eta_5^{-1}(UWX, YZ)\{1\}=\{(111, 11), (111, 10), (111, 01), (111, 00), (110, 11), (110, 10), (110, 01), (101, 11), (101, 10), (101, 01), (100, 00), (010, 11), (010, 01), (010, 00)\}$ $\eta_5^{-1}(UWX, YZ)\{0\}=\{(110, 00), (101, 00), (100, 11), (100, 10), (100, 01), (011, 11), (011, 10), (011, 01), (010, 10), (001, 11), (001, 10), (001, 01), (001, 00), (000, 11), (000, 10), (000, 01), (000, 00)\}$ The level set $\eta_5^{-1}(UWX, YZ)\{h\}=\{(011, 00)\}$ is the special case when the universal deterministic machine halts. At this time, the active element machine reaches a halting firing pattern H. The next example copies one element's firing state to another element's firing state, which helps assign the value of a random bit to an active element and perform other functions in the UDM.

Copy Program.

This active element program copies active element a's firing state to element b.

(Program copy (Args s t b a)
  (Element (Time s-1) (Name b) (Threshold 1) (Refractory 1) (Last s-1))
  (Connection (Time s-1)(From a) (To b)(Amp 0) (Width 0) (Delay 1))
  (Connection (Time s) (From a) (To b) (Amp 2) (Width 1) (Delay 1))
  (Connection (Time s) (From b) (To b) (Amp 2) (Width 1) (Delay 1))
  (Connection (Time t) (From a) (To b) (Amp 0) (Width 0) (Delay 1))
)

When the copy program is called, active element b fires if a fired during the window of time [s, t). Further, a connection is set up from b to b so that b will keep firing indefinitely. This enables b to store active element a's firing state. The following procedure describes the computation of the deterministic program $\eta$ with random firing interpretations.

Procedure 2. Computing Deterministic Program $\eta$ with Random Firing Patterns Consider function $\eta_3: \{0, 1\}^5 \to \{0, 1\}$ as previously defined. The following scheme for mapping boolean values 1 and 0 to the firing of an active element is used. If active element U fires during window W, then this corresponds to input U=1 in $\eta_3$; if active element U doesn't fire during window W, then this corresponds to input U=0 in $\eta_3$. When U fires, W doesn't fire, X fires, Y doesn't fire and Z doesn't fire, this corresponds to computing $\eta_3$ (101, 00). The value $1=\eta_3(101, 00)$ is the underlined bit in (011, 10, 0), which is located in row 101, column 00 of table 3. Procedure 1 and the separation rules in table 7 are synthesized so that $\eta_3$ is computed using random active element firing patterns.

In other words, the boolean function $\eta_3$ can be computed using an active element machine's dynamic interpretation. The dynamic part of the interpretation is determined by the random bits received from a quantum source. The firing activity of active element $P_3$ represents the value of $\eta_3$ (UWX, YZ). Fourteen random bits are read from a quantum random generator—for example, see [5]. These random bits are used to create a corresponding random firing pattern of active elements $R_0, R_1, \ldots R_{13}$. Meta commands dynamically build active elements and connections based on the separation rules in table 7 and the firing activity of elements $R_0, R_1, \ldots R_{13}$. These dynamically created active elements and connections determine the firing activity of active element $P_3$ based on the firing activity of active elements U, W, X, Y and Z. The details of this procedure are described below.

Read fourteen random bits $a_0, a_1, \ldots$ and $a_{13}$ from a quantum source. The values of these random bits are stored in active elements $R_0, R_1, \ldots R_{13}$. If random bit $a_k=1$, then $R_k$ fires; if random bit $a_k=0$, then $R_k$ doesn't fire.

Set up dynamical connections from active elements U, X, W, Y, Z to elements $D_0, D_1, \ldots D_{13}$. These connections are based on Meta commands that use the firing pattern from elements $R_0, R_1, \ldots R_{13}$.

```
(Program set_dynamic_C (Args s t f xk a w tau rk)
    (Connection (Time s-dT) (From f) (To xk) (Amp -a) (Width w) (Delay tau))
    (Meta (Name rk) (Window s t) (Connection (Time t) (From f) (To xk) (Amp a) (Width w)
        (Delay tau)))
)
(Program set_dynamic_E (Args s t xk theta r L rk)
    (Element (Time s-2dT) (Name xk) (Threshold -theta) (Refractory r) (Last L))
    (Meta (Name rk) (Window s t) (Element (Time t) (Name xk) (Threshold theta) (Refractory r)
        (Last L)))
)
```

For $D_0$, follow the first row of separation table 7, reading the amplitudes from U, W, X, Y, Z to $D_0$ and the threshold for $D_0$. Observe that at time s-dT program set_dynamic_C initializes the amplitudes of the connections to $A_{U,D0}=-2$, $A_{W,D0}=-2, A_{X,D0}=-2, A_{Y,D0}=2, A_{Z,D0}=2$ as if $R_0$ doesn't fire. If $R_0$ does fire, then the Meta command in set_dynamic_C dynamically flips the sign of each of these amplitudes: at time t, the amplitudes are flipped to $A_{U,D0}=2$, $A_{W,D0}=2$, $A_{X,D0}=2, A_{Y,D0}=-2, A_{Z,D0}=-2$.

Similarly, the meta command in set_dynamic_E initializes the threshold of $D_0$ to $\theta_{D0}=-5$ as if $R_0$ doesn't not fire. If $R_0$ does fire the meta command flips the sign of the threshold of $D_0$; for the $D_0$ case, the meta command sets $\theta_{D0}=5$.

(set_dynamic_E s t D0 5 1 s–2 R0)
(set_dynamic_C s t U D0 2 1 1 R0)
(set_dynamic_C s t W D0 2 1 1 R0)
(set_dynamic_C s t X D0 2 1 1 R0)
(set_dynamic_C s t Y D0 -2 1 1 R0)
(set_dynamic_C s t Z D0 -2 1 1 R0)

Similarly, for elements $D_1, \ldots, D_{13}$, the commands set_dynamic_E and set_dynamic_C dynamically set the element parameters and the connections from U, X, W, Y, Z to $D_1, \ldots, D_{13}$ based on the rest of the quantum random firing pattern $R_1, \ldots, R_{13}$.

(set_dynamic_E s t D1 3 1 s–2 R1)
(set_dynamic_C s t U D1 2 1 R1)
(set_dynamic_C s t W D1 2 1 R1)
(set_dynamic_C s t X D1 -2 1 R1)
(set_dynamic_C s t Y D1 -2 1 1 R1)
(set_dynamic_C s t Z D1 -2 1 1 R1)
(set_dynamic_E s t D2 5 1 s–2 R2)
(set_dynamic_C s t U D2 2 1 1 R2)
(set_dynamic_C s t W D2 2 1 1 R2)
(set_dynamic_C s t X D2 -2 1 1 R2)
(set_dynamic_C s t Y D2 -2 1 1 R2)
(set_dynamic_C s t Z D2 2 1 1 R2)
(set_dynamic_E s t D3 5 1 s–2 R3)
(set_dynamic_C s t U D3 2 1 1 R3)
(set_dynamic_C s t W D3 2 1 1 R3)
(set_dynamic_C s t X D3 -2 1 1 R3)
(set_dynamic_C s t Y D3 2 1 1 R3)
(set_dynamic_C s t Z D3 -2 1 1 R3)
(set_dynamic_E s t D4 3 1 s–2 R4)
(set_dynamic_C s t U D4 2 1 1 R4)
(set_dynamic_C s t W D4 -2 1 1 R4)
(set_dynamic_C s t X D4 2 1 1 R4)
(set_dynamic_C s t Y D4 -2 1 1 R4)
(set_dynamic_C s t Z D4 -2 1 1 R4)
(set_dynamic_E s t D5 5 1 s–2 R5)
(set_dynamic_C s t U D5 2 1 R5)
(set_dynamic_C s t W D5 -2 1 1 R5)
(set_dynamic_C s t X D5 2 1 R5)
(set_dynamic_C s t Y D5 -2 1 1 R5)
(set_dynamic_C s t Z D5 2 1 1 R5)
(set_dynamic_E s t D6 5 1 s–2 R6)
(set_dynamic_C s t U D6 2 1 1 R6)
(set_dynamic_C s t W D6 -2 1 1 R6)
(set_dynamic_C s t X D6 2 1 1 R6)
(set_dynamic_C s t Y D6 2 1 1 R6)
(set_dynamic_C s t Z D6 -2 1 1 R6)
(set_dynamic_E s t D7 11 s–2 R7)
(set_dynamic_C s t U D7 2 1 1 R7)
(set_dynamic_C s t W D7 -2 1 1 R7)
(set_dynamic_C s t X D7 -2 1 1 R7)
(set_dynamic_C s t Y D7 -2 1 1 R7)
(set_dynamic_C s t Z D7 -2 1 1 R7)
(set_dynamic_E s t D8 3 1 s–2 R8)
(set_dynamic_C s t U D8 2 1 1 R8)
(set_dynamic_C s t W D8 -2 1 1 R8)
(set_dynamic_C s t X D8 -2 1 1 R8)
(set_dynamic_C s t Y D8 2 1 1 R8)
(set_dynamic_C s t Z D8 -2 1 1 R8)
(set_dynamic_E s t D9 5 1 s–2 R9)
(set_dynamic_C s t U D9 -2 1 1 R9)
(set_dynamic_C s t W D9 2 1 1 R9)
(set_dynamic_C s t X D9 2 1 1 R9)
(set_dynamic_C s t Y D9 -2 1 1 R9)
(set_dynamic_C s t Z D9 2 1 1 R9)
(set_dynamic_E s t D10 5 1 s–2 R10)
(set_dynamic_C s t U D10 -2 1 1 R10)
(set_dynamic_C s t W D10 2 1 R10)
(set_dynamic_C s t X D10 2 1 1 R10)
(set_dynamic_C s t Y D10 2 1 R10)
(set_dynamic_C s t Z D10 -2 1 1 R10)
(set_dynamic_E s t D11 1 1 s–2 R11)

(set_dynamic_C s t U D11 −2 1 R11)
(set_dynamic_C s t W D11 2 1 R11)
(set_dynamic_C s t X D11 −2 1 R11)
(set_dynamic_C s t Y D11 −2 1 1 R11)
(set_dynamic_C s t Z D11 −2 1 1 R11)
(set_dynamic_E s t D12 3 1 s−2 R12)
(set_dynamic_C s t U D12 −2 1 1 R12)
(set_dynamic_C s t W D12 2 1 1 R12)
(set_dynamic_C s t X D12 −2 1 1 R12)
(set_dynamic_C s t Y D12 −2 1 1 R12)
(set_dynamic_C s t Z D12 2 1 1 R12)

(set_dynamic_E s t D13 5 1 s−2 R13)
(set_dynamic_C s t U D13 −2 1 1 R13)
(set_dynamic_C s t W D13 2 1 1 R13)
(set_dynamic_C s t X D13 −2 1 1 R13)
(set_dynamic_C s t Y D13 2 1 1 R13)
(set_dynamic_C s t Z D13 2 1 1 R13)

Set up connections to active elements $G_0, G_1, G_2, \ldots G_{14}$ which represent the number of elements in $\{R_0, R_1, R_2, \ldots R_{13}\}$ that are firing. If 0 are firing, then only $G_0$ is firing. Otherwise, if k>0 elements in $\{R_0, R_1, R_2, \ldots R_{13}\}$ are firing, then only $G_1, G_2, \ldots G_k$ are firing.

```
(Program firing_count (Args G a b theta)
   (Element (Time a-2dT) (Name G) (Threshold theta) (Refractory b-a) (Last 2a-b))
   (Connection (Time a-dT) (From R0) (To G) (Amp 2) (Width b-a) (Delay 1))
   (Connection (Time a-dT) (From R1) (To G) (Amp 2) (Width b-a) (Delay 1))
   (Connection (Time a-dT) (From R2) (To G) (Amp 2) (Width b-a) (Delay 1))
   (Connection (Time a-dT) (From R3) (To G) (Amp 2) (Width b-a) (Delay 1))
   (Connection (Time a-dT) (From R4) (To G) (Amp 2) (Width b-a) (Delay 1))
   (Connection (Time a-dT) (From R5) (To G) (Amp 2) (Width b-a) (Delay 1))
   (Connection (Time a-dT) (From R6) (To G) (Amp 2) (Width b-a) (Delay 1))
   (Connection (Time a-dT) (From R7) (To G) (Amp 2) (Width b-a) (Delay 1))
   (Connection (Time a-dT) (From R8) (To G) (Amp 2) (Width b-a) (Delay 1))
   (Connection (Time a-dT) (From R9) (To G) (Amp 2) (Width b-a) (Delay 1))
   (Connection (Time a-dT) (From R10) (To G) (Amp 2) (Width b-a) (Delay 1))
   (Connection (Time a-dT) (From R11) (To G) (Amp 2) (Width b-a) (Delay 1))
   (Connection (Time a-dT) (From R12) (To G) (Amp 2) (Width b-a) (Delay 1))
   (Connection (Time a-dT) (From R13) (To G) (Amp 2) (Width b-a) (Delay 1))
)
(firing_count G0 a b -1)
(firing_count G1 a b 1)
(firing_count G2 a b 3)
(firing_count G3 a b 5)
(firing_count G4 a b 7)
(firing_count G5 a b 9)
(firing_count G6 a b 11)
(firing_count G7 a b 13)
(firing_count G8 a b 15)
(firing_count G9 a b 17)
(firing_count G10 a b 19)
(firing_count G11 a b 21)
(firing_count G12 a b 23)
(firing_count G13 a b 25)
(firing_count G14 a b 27)
```

$P_3$ is the output of $\eta_3$. Initialize element $P_3$'s threshold based on meta commands that use the information from elements $G_0, G_1, \ldots G_{13}$. Observe that t+dT<t+ 2 dT< ... <t+15 dT so the infinitesimal dT and the meta commands set the threshold $P_3$ to −2(14−k)+1 where k is the number of firings. For example, if nine of the randomly chosen bits are high, then $G_9$ will fire, so the threshold of $P_3$ is set to −9. If five of the random bits are high, then the threshold of $P_3$ is set to −17. Each element of the level set creates a firing pattern of $D_0, D_1, \ldots D_{13}$ equal to the complement of the random firing pattern $R_0, R_1, \ldots R_{13}$ (i.e., $D_k$ fires if and only if $R_k$ does not fire).

```
(Program set_P_threshold (Args G P s t a b theta kdT)
   (Meta (Name G) (Window s t)
       (Element (Time t+kdT) (Name P) (Threshold theta) (Refractory b-a) (Last t-b+a))
)
(set_P_threshold G0 P3 s t a b -27 dT)
(set_P_threshold G1 P3 s t a b -25 2dT)
(set_P_threshold G2 P3 s t a b -23 3dT)
(set_P_threshold G3 P3 s t a b -21 4dT)
(set_P_threshold G4 P3 s t a b -19 5dT)
(set_P_threshold G5 P3 s t a b -17 6dT)
(set_P_threshold G6 P3 s t a b -15 7dT)
(set_P_threshold G7 P3 s t a b -13 8dT)
(set_P_threshold G8 P3 s t a b -11 9dT)
(set_P_threshold G9 P3 s t a b -9 10dT)
(set_P_threshold G10 P3 s t a b -7 11dT)
```

```
(set_P_threshold G11 P3 s t a b -5 12dT)
(set_P_threshold G12 P3 s t a b -3 13dT)
(set_P_threshold G13 P3 s t a b -1 14dT)
(set_P_threshold G14 P3 s t a b 1 15dT)
```

Set up dynamical connections from $D_0, D_1, \ldots D_{13}$ to $P_3$ based on the random bits stored by $R_0, R_1, \ldots R_{13}$. These connections are based on meta commands that use the firing pattern from elements $R_0, R_1, \ldots R_{13}$.

```
(Program set_from_Xk_to_Pj (Args s t Xk Pj amp w tau Rk)
    (Connection (Time s-dT) (From Xk) (To Pj) (Amp -amp) (Width w) (Delay tau))
    (Meta (Name Rk) (Window s t)
        (Connection (Time t) (From Xk) (To Pj) (Amp amp) (Width w) (Delay tau))
)
(set_from_Xk_to_Pj s t D0 P3 2 b-a 1 R0)
(set_from_Xk_to_Pj s t D1 P3 2 b-a 1 R1)
(set_from_Xk_to_Pj s t D2 P3 2 b-a 1 R2)
(set_from_Xk_to_Pj s t D3 P3 2 b-a 1 R3)
(set_from_Xk_to_Pj s t D4 P3 2 b-a 1 R4)
(set_from_Xk_to_Pj s t D5 P3 2 b-a 1 R5)
(set_from_Xk_to_Pj s t D6 P3 2 b-a 1 R6)
(set_from_Xk_to_Pj s t D7 P3 2 b-a 1 R7)
(set_from_Xk_to_Pj s t D8 P3 2 b-a 1 R8)
(set_from_Xk_to_Pj s t D9 P3 2 b-a 1 R9)
(set_from_Xk_to_Pj s t D10 P3 2 b-a 1 R10)
(set_from_Xk_to_Pj s t D11 P3 2 b-a 1 R11)
(set_from_Xk_to_Pj s t D12 P3 2 b-a 1 R12)
(set_from_Xk_to_Pj s t D13 P3 2 b-a 1 R13)
```

Similar procedures use random firing patterns on active elements $\{A_0, A_1, \ldots A_{14}\}$, $\{B_0, B_1, \ldots B_{15}\}$, $\{C_0, C_1, \ldots C_{14}\}$, $\{E_0, E_1, \ldots E_{12}\}$, and $\{F_0, F_1, \ldots F_{13}\}$ to compute $\eta_0, \eta_1, \eta_2, \eta_4$ and $\eta_5$, respectively. The outputs of $\eta_0, \eta_1, \eta_2, \eta_4$ and $\eta_5$ are represented by active elements $P_0$, $P_1$, $P_2$, $P_4$ and $P_5$, respectively. The level set rules for $\eta_0, \eta_1, \eta_2, \eta_4$ and $\eta_5$ are shown, respectively in tables 4, 5, 6, 8 and 9.

Since the firing activity of element $P_k$ represents a single bit that helps determine the next state or next memory symbol during a UDM computational step, its firing activity and parameters can be assumed to remain perfectly secret. Alternatively, if an eavesdropper is able to listen to the firing activity of $P_0$, $P_1$, $P_2$, $P_3$, $P_4$ and $P_5$, which collectively represent the computation of $\eta(UXW, YZ)$, then this leaking of information could be used to reconstruct some or all of the UDM memory contents.

This weakness can be rectified as follows. For each UDM computational step, the active element machine uses six additional quantum random bits $b_0, b_1, b_2, b_3, b_4$ and $b_5$. For element $P_3$, if random bit $b_3=1$, then the dynamical connections from $D_0, D_1, \ldots D_{13}$ to $P_3$ are chosen as described above. However, if random bit $b_3=0$, then the amplitudes of the connections from $D_0, D_1, \ldots D_{13}$ to $P_3$ and the threshold of $P_3$ are multiplied by $-1$. This causes $P_3$ to fire when $\eta(UXW, YZ)=0$ and $P_3$ doesn't fire when $\eta(UXW, YZ)=1$.

This cloaking of $P_3$'s firing activity can be coordinated with a meta command based on the value of $b_3$ so that $P_3$'s firing can be appropriately interpreted to dynamically change the active elements and connections that update the memory contents and state after each UDM computational step. This cloaking procedure can also be used for element $P_0$ and random bit $b_0$, $P_1$ and random bit $b_1$, $P_2$ and random bit $b_2$, $P_4$ and random bit $b_4$, and $P_5$ and random bit $b_5$.

Besides representing and computing the program t with quantum random firing patterns, there are other important functions computed by active elements executing the UDM. Assume that these connections and the active element firing activity are kept perfectly secret as they represent the state and the memory contents of the UDM memory contents. These functions are described below.

Three active elements (q 0), (q 1) and (q 2) store the current state of the UDM.

There are a collection of elements to represent the machine address k (memory address k of the digital computer) where k is an integer.

A marker active element L locates the leftmost machine address (lowest memory address used by the digital computer) and a separate marker active element R locates the rightmost memory address (highest memory address used by the digital computer). Any memory symbols outside these markers are assumed to be blank i.e. 0. If the machine head moves beyond the leftmost memory address, then L's connection is removed and updated one memory address to the left (one memory cell lower in the digital computer) and the machine is reading a 0. If the machine head moves beyond the rightmost memory address, then R's connection is removed and updated one memory address to the right (one memory cell higher in the digital computer) and the machine (digital computer) is reading a 0.

There are a collection of elements that represent the tape contents (memory contents) of the UDM (digital computer). For each memory address k inside the marker elements, there are two elements named (S k) and (T k) whose firing pattern determines the alphabet symbol at memory address k (memory cell k). For example, if elements (S 5) and (T 5) are not firing, then memory address 5 (memory cell 5 of the digital computer) contains alphabet symbol 0. If element (S −7) is firing and element (T −7) is not firing, then memory address −7 (memory cell −7) contains alphabet symbol 1. If element (S 13) is firing and element (T 13) is firing, then memory address 13 (memory cell 13 of the digital computer) contains alphabet symbol A.

Representing alphabet symbol 0 with two active elements that are not firing is convenient because if the machine head moves beyond the initial tape contents (memory contents) of the UDM (digital computer), then the Meta command can add two elements that are not firing to represent the contents of the new square.

The copy program can be used to construct important functionality in the Universal Deterministic machine (digital computer). The following active element machine program enables a new alphabet symbol to be copied to the tape (memory of the digital computer).

```
(Program copy_symbol (Args s t b0 a0 b1 a1)
    (copy s t b0 a0)
    (copy s t b1 a1)
)
```

The following program enables a new state to be copied.

```
(Program copy_state (Args s t b0 a0 b1 a1 b2 a2)
    (copy s t b0 a0)
    (copy s t b1 a1)
    (copy s t b2 a2)
)
```

The sequence of steps by which the UDM (digital computer) is executed with an AEM are described.

1. Tape contents (memory contents) are initialized and the marker elements L and R are initialized.

2. The machine head (location of the next instruction in memory) is initialized to memory address k=0 and the current machine state is initialized to $q_2$. In other words, (q 0) is not firing (q 1) is firing and (q 2) is not firing.

3. (S k) and (T k) are copied to $a_{in}$ and the current state (q 0), (q 1), (q 2) is copied to $q_{in}$.

4. $r/(q_{in}, a_{in})=(q_{out}, a_{out}, m)$ is computed where $q_{out}$ represents the new state, $a_{out}$ represents the new tape symbol and m represents the machine head move.

5. If $q_{out}$=h, then the UDM halts. The AEM reaches a static firing pattern that stores the current tape contents indefinitely and keeps the machine head fixed at memory address k where the UDM halted (where the digital computer stopped executing its computer program).

6. Otherwise, the firing pattern of the three elements representing $q_{out}$ are copied to (q 0), (q 1), (q 2). $a_{out}$ is copied to the current memory address (memory cell) represented by (S k), (T k).

7. If m=L, then first determine if the machine head has moved to the left of the memory address marked by L. If so, then have L remove its current marker and mark memory address k−1. In either case, go back to step 3 where (S k−1) and (T k−1) are copied to $a_{in}$.

8. If m=R, then first determine if the machine head (location of the next instruction in memory) has moved to the right of the memory address marked by R. If so, then have R remove its current marker and mark memory address k+1. In either case, go back to step 3 where (S k+i) and (T k+i) are copied to $a_{in}$.

In reference [5], it was shown that quantum randomness is Turing incomputable (digital computer incomputable). Since the firing pattern of the active elements $\{A_0, A_1, \ldots A_{14}\}$ computing $\eta_0$; the firing pattern of elements $\{B_0, B_1, \ldots B_{15}\}$ computing $\eta_1$; the firing pattern of elements $\{C_0, C_1, \ldots C_{14}\}$ computing $\eta_2$; the firing pattern of active elements $\{D_0, D_1, \ldots D_{13}\}$ computing $\eta_3$; the firing pattern of active elements $\{E_0, E_1, \ldots E_{12}\}$ computing $\eta_4$; and the firing pattern of active elements $\{F_0, F_1, \ldots F_{13}\}$ computing are all generated from quantum randomness, these firing patterns are Turing incomputable. As a consequence, there does not exist a Deterministic machine (digital computer program) that can map these firing patterns back to the sequence of instructions executed by the universal Deterministic machine (universal digital computer). In summary, these methods demonstrate a new class of computing machines and a new type of computational procedure where the purpose of the program's execution is incomprehensible (Turing incomputable) to malware.

Machine and Affine Map Correspondence

Definition 2.1 Deterministic Machine

A deterministic machine (Q, A, η) satisfies

There is a unique machine state h, called the halt state.

Q is a finite set of machine states that does not contain the halt state h. The machine states are represented as $Q=\{q_1, q_2, \ldots q_K\}$ or as the natural numbers $Q=\{2, \ldots, K\}$ and the halt state as 1. Before machine execution begins, there is a starting machine state s and s is an element of Q.

L and R are special symbols that instruct the machine to advance to the left adjacent memory address or to the right adjacent memory address of the memory T.

A is a finite set of alphabet symbols that are read from and written to memory. The alphabet symbols are denoted as $A=\{a_1, a_2, \ldots, a_J\}$ or as the natural numbers $A=\{1, 2, \ldots, J\}$. A does not contain the symbols L, R.

η is a function where η: $Q \times A \rightarrow (Q \cup \{h\}) \times A \times \{L, R\}$.

The η function serves as the machine instructions (computer program) for the machine in the following manner. For each q in Q and α in A, the expression $\eta(q, \alpha)=(r, \beta, x)$ describes how machine (Q, A, η) executes one computational step. When in state q and read alphabet symbol a in memory:

1) Machine (Q, A, η) changes to state r.
2) Machine (Q, A, η) rewrites alphabet symbol α as symbol β in memory.
3.) If x=L, then machine (Q, A, η) moves to memory index one to the left in the memory and is subsequently reads the symbol at this memory address.
4.) If x=R, then machine (Q, A, η) moves its memory index one to the right in memory and is subsequently reading the symbol in this memory address.
5) If r=h, machine (Q, A, η) enters the halting state h, and the machine stops (halts).

Definition 2.2 Memory Contents of the Machine

The machine's memory contents is represented as a function T: $Z \rightarrow A$ where Z denotes the integers. The memory contents T are M-bounded if there exists a bound M>0 such that for T(k)=T(j) whenever |j|, |k|>M. (In some cases, the blank symbol # is used and T(k)=# when |k|>M) The symbol stored in the kth address of memory is denoted as $T_k$.

Definition 2.3 Machine Configuration with Memory Address Location

Let (Q, A, η) be a machine with memory contents T. A configuration is an element of the set $C=(Q \cup \{h\}) \times Z \times \{T: T$ is the memory with range A}. A physical machine has the initial memory contents, which are M-bounded and the memory contents contain only blank symbols, denoted as #, outside the bound M.

If (q, k, T) is a configuration in $C$, then k is called the memory address location. The memory address location is M-bounded if there exists a natural number M>0 such that the address k of memory being read or scanned satisfies |k|≤M. A configuration whose first coordinate equals h is called a halted configuration. The set of non-halting configurations is $N=\{(q, k, T)\in C: q\neq h\}$ The purpose of the definition of a configuration is that the first coordinate stores the current state of the machine, the third coordinate stores the contents of the memory, and the second coordinate stores the location (address) of the head reading or scanning the memory. Before presenting some examples of configurations, it is noted that there are different methods to describe the memory contents. One method is $$T(k) = \begin{cases} \alpha_k & \text{if } l \leq k \leq n \\ \# & \text{otherwise} \end{cases}.$$

This is a max. $\{|l|, |n|\}$-bounded memory. Another convenient representation is to list the memory contents and underline the symbol to indicate the location of the machine head. ( . . . ##α$\underline{\beta}$## . . . ).

A diagram can also represent the memory, location of the head reading memory, and the machine configuration (q, k, T). See FIG. 14.

Example 2.4 Deterministic Machine Configuration

Consider configuration (p, 2, . . . ##α$\underline{\beta}$## . . . ). The first coordinate indicates that the machine is in machine state p. The second coordinate indicates that the machine is currently scanning memory address 2, denoted as $T_2$ or T(2). The third coordinate indicates that memory address 1 stores symbol α, memory address 2 stores symbol β, and all other memory addresses contain the # symbol.

Example 2.5 Halt Configuration Represented as Natural Numbers

A second example of a configuration is (1, 6, . . . 1111$\underline{2}$33111 . . . ). This configuration is a halted configuration. The first coordinate indicates that the machine is in halt state 1. The second coordinate indicates that the machine head is scanning memory address 6. The underlined 2 in the third coordinate indicates that the machine head is currently scanning a 2. In other words, T(6)=2, T(7)=3, T(8)=3, and T(k)=1 when k<6 OR k>8.

Definition 2.6 Deterministic Machine Computational Step

Consider machine (Q, A, η) with machine configuration (q, k, T) such that T(k)=a, which means that memory address k stores symbol α. After the execution of one computational step, the new configuration is one of the three cases such that for all three cases S(k)=β and S(j)=T(j) whenever j≠k:

Case I. (r, k−1, S) if η(q, α)=(r, β, L).
Case II. (r, k+1, S) if η(q, α)=(r, β, R).
Case III. (h, k, T). In this case, the machine execution stops (halts).

If the machine is currently in machine configuration ($q_0$, $k_0$, $T_0$) and over the next n steps the sequence of machine configurations (points) is ($q_0$, $k_0$, $T_0$), ($q_1$, $k_1$, $T_1$), . . . , ($q_n$, $k_n$, $T_n$) then this execution sequence is sometimes called the next n+1 computational steps.

If Deterministic machine (Q, A, η) with initial configuration (s, k, T) reaches the halt state h after a finite number of execution steps, then the machine execution halts.

Otherwise, it is said that the machine execution is immortal on initial machine configuration (s, k, T).

The program symbol η, representing the deterministic computer program induces a map η: $N \to C$ where η(q, k, T)=(r, k−1, S) when η(q, α)=(r, β, L) and η(q, k, T)=(r, k+1, S) when η(q, α)=(r, β, R).

Definition 2.7 Computer Program Size

The program size is the number of elements in the domain of η. The program size is denoted as |η|. Observe that |η|=|Q×A|=|Q||A|. Note that in [7] and [32], they omit quintuples. (q, a, r, b, x) when r is the halting state. In our representation, η(q, a)=(1, b, x) or η(q, a)=(h, b, x).

Definition 2.8 Memory Head glb $\mathcal{L}$, lub $\mathcal{U}$, Window of Execution [ $\mathcal{L}$, $\mathcal{U}$]

Suppose a deterministic machine begins or continues its execution with machine head at memory address k. During the next N computational steps, the greatest lower bound $\mathcal{L}$ of the machine head is the left most (smallest integer) memory address that the machine head reads during these N computational steps; and the least upper bound $\mathcal{U}$ of the machine head is the right most (largest integer) memory address that the machine head visits during these N computational steps. The window of execution denoted as [ $\mathcal{L}$, $\mathcal{U}$] or [ $\mathcal{L}$, $\mathcal{L}$+1, . . . , $\mathcal{U}$−1, $\mathcal{U}$] is the sequence of integers representing the memory address that the machine head visited during these N computational steps. The length of the window of execution is $\mathcal{U}$− $\mathcal{L}$+1 which is also the number of distinct memory addresses visited (read) by the machine head during these N steps. To express the window of execution for the next n computational steps, the lower and upper bounds are expressed as a function of n: [ $\mathcal{L}$(n), $\mathcal{U}$(n)].

Example 2.9 Q={q, r, s, t, u, v, w, x}. A={1, 2}

Halting state=h

| η(q, 1) = (r, 1, R). | η(q, 2) = (h, 2, R). | η(r, 1) = (h, 1, R). | η(r, 2) = (s, 2, R). |
| η(s, 1) = (t, 1, R). | η(s, 2) = (h, 2, R). | η(t, 1) = (h, 1, R). | η(t, 2) = (u, 2, R). |
| η(u, 1) = (h, 1, R). | η(u, 2) = (v, 1, R). | η(v, 1) = (h, 1, R). | η(v, 2) = (w, 2, R). |
| η(w, 1) = (h, 1, R). | η(w, 2) = (x, 1, L). | η(x, 1) = (h, 1, R). | η(x, 2) = (q, 2, R). |
| Left pattern = 12. | Spanning Middle Pattern = 121 2212. | | Right pattern = 212. |

The machine execution steps are shown in FIG. 15 with machine head initially reading memory address 1. The machine head address is underlined. The machine head moves are $\{R^6LR\}^n$. The point p=[q, $\overline{12\langle 1\rangle 212222}$] is an immortal periodic point with period 8 and hyperbolic degree 6.

Remark 2.10

If j≤k, then [ $\mathcal{L}$(j), $\mathcal{U}$(j)]⊆[ $\mathcal{L}$(k), $\mathcal{U}$(k)]

This follows immediately from the definition of the window of execution.

Since the machine addresses may be renumbered without changing the results of the machine execution, for convenience it is often assumed that the machine starts execution at memory address 0. In example 2.9, during the next 8 computational steps—one cycle of the immortal periodic point—the window of execution is [0, 6]. The length of the window of execution is 7. Observe that if the machine addresses are renumbered and the goal is to refer to two different windows of execution, for example [ $\mathcal{L}$(j), $\mathcal{U}$(j)]

and [$\mathcal{L}(k)$, $\mathcal{U}(k)$], then both windows are renumbered with the same relative offset so that the two windows can be compared.

Definition 2.11 Value Function and Base

Suppose the alphabet $A=\{a_1, a_2, \ldots, a_J\}$ and the machine states are $Q=\{q_1, q_2, \ldots q_K\}$. Define the symbol value function $v: A \cup Q \cup \{h\} \to N$ where N denotes the natural numbers. $v(h)=0$. $v(a_k)=k$. $v(q_k)=k+|A|$. $v(q_K)=|Q|+|A|$. Choose the number base $B=|Q|+|A|+1$. Observe that $0 \leq v(x) < B$ and that each symbol chosen from $A \cup Q \cup \{h\}$ has a unique value in base B.

Definition 2.12 Deterministic Machine Program Isomorphism

Two deterministic computing machines $M_1(Q_1, A_1, \eta_1)$ and $M_2(Q_2, A_2, \eta_2)$ have a program isomorphism denoted as $\Psi: M_1 \to M_2$ if A. There is a function $\phi: Q_1 \to Q_2$ that is a bijection.
B. There is a function $\gamma: A_1 \to A_2$ that is a bijection.
C. There is a function $\Psi: M_1 \to M_2$ such that for each pair (q, a) in $Q_1 \times A_1 \Psi(\eta_1(q,a))=\eta_2(\phi(q), \gamma(a))$ Remark 2.13

If alphabet $A=\{a\}$, then the halting behavior of the deterministic machine is completely determined in $\leq |Q|+1$ execution steps.

Proof.

Suppose $Q=\{q_1, q_2, \ldots q_K\}$. Observe that the program length is $|\eta|=|Q|$. Also, after an execution step every tape symbol on the tape must be a. Consider the possible execution steps: $\eta(q_{S(1)}, a) \to \eta(q_{S(2)}, a) \to \eta(q_{S(3)}, a) \ldots \to \eta(q_{S(K+1)}, a)$. If the program execution does not halt in these $|Q|+1$ steps, then $S(i)=S(j)$ for some $i \neq j$; and the tape contents are still all a's. Thus, the program will exhibit periodic behavior whereby it will execute $\eta(q_{S(i)}, a) \to \ldots \to \eta(q_{S(j)}, a)$ indefinitely. If the program does not halt in $|Q|+1$ execution steps, then the computer program will never halt.

As a result of Remark 2.13, from now on, it is assumed that $|A| \geq 2$. Further, since at least one state is needed, then from here on, it is assumed that the base $B \geq 3$.

Definition 2.14

Register Machine Configuration to x-y plane P correspondence. See FIG. 14. For a fixed machine (Q, A, $\eta$), each configuration (q, k, T) represents a unique point (x, y) in P. The coordinate functions $x: \mathcal{C} \to P$ and $y: \mathcal{C} \to P$, where $\mathcal{C}$ is the set of configurations, are $x(q, k, T)=T_k T_{k+1} \cdot T_{k+2} T_{k+3} T_{k+4} \ldots$ where this decimal sequence in base B represents the rational number $$Bv(T_k) + v(T_{k+1}) + \sum_{j=1}^{\infty} v(T_{k+j+1})B^{-j}$$

$y(q, k, T)=q\, T_{k-1} \cdot T_{k-2}\, T_{k-3}\, T_{k-4} \ldots$ where this decimal sequence in base B represents a rational number as $$Bv(q) + v(T_{k-1}) + \sum_{j=1}^{\infty} v(T_{k-j-1})B^{-j}$$

Define function $\varphi: \mathcal{C} \to P$ as $\varphi(q, k, T)=(x(q, k, T), y(q, k, T))$. $\varphi$ is the function that maps machine configurations into points into the plane P.

Definition 2.15 Equivalent Configurations

With respect to Deterministic machine (Q, A, $\eta$), the two configurations (q, k, T) and (q, j, V) are equivalent [i.e. (q, k, T)~(q, j, V)] if $T(m)=V(m+j-k)$ for every integer m. Observe that ~ is an equivalence relation on $\mathcal{C}$. Let $\hat{\mathcal{C}}$ denote the set of equivalence classes [(q, k, T)] on $\mathcal{C}$. Also observe that $\varphi$ maps every configuration in equivalence class [(q, k, T)] to the same ordered pair of real numbers in P. Recall that (D, X) is a metric space if the following three conditions hold.

1. $D(a, b) \geq 0$ for all a, b in X where equality holds if and only if a=b.
2. $D(a, b)=D(b, a)$ for all a, b. (Symmetric)
3. $D(a, b)=D(a, c)+D(c, b)$ for all a, b, c in X. (Triangle inequality.)

$(\rho, \hat{\mathcal{C}})$ is a metric space where $\rho$ is induced via $\varphi$ by the Euclidean metric in P. Consider points $p_1$, $p_2$ in P with $p_1=(x_1, y_1)$ and $p_2=(x_2, y_2)$ where (d, P) is a metric space with Euclidean metric $d(p_1, p_2)=\sqrt{(x_1-x_2)^2+(y_1-y_2)^2}$ Let $u=[(q, k, S)]$, $w=[(r, l, T)]$ be elements of $\hat{\mathcal{C}}$. Define $\rho: \hat{\mathcal{C}} \times \hat{\mathcal{C}} \to R$ as $\rho(u, w)=d(\varphi(u), \varphi(w))=\sqrt{[x(q,k,S)-x(r,l,T)]^2+[y(q,k,S)-y(r,l,T)]^2}$ The symmetric property and the triangle inequality hold for $\rho$ because d is a metric. In regard to property (i), $\rho(u, w) \geq 0$ because d is a metric. The additional condition that $\eta(u, w)=0$ if and only if u=w holds because d is a metric and because the equivalence relation ~ collapses non-equal equivalent configurations (i.e. two configurations in the same state but with different machine head locations and with all corresponding symbols on their respective tapes being equal) into the same point in $\hat{\mathcal{C}}$.

The unit square $U_{(\lfloor x \rfloor, \lfloor y \rfloor)}$ has a lower left corner with coordinates $(\lfloor x \rfloor, \lfloor y \rfloor)$ where $\lfloor x \rfloor=Bv(T_k)+v(T_{k+1})$ and $\lfloor y \rfloor=Bv(q)+v(T_{k-1})$. See FIG. 16.

Definition 2.16 Left Affine Function

Figure 17:
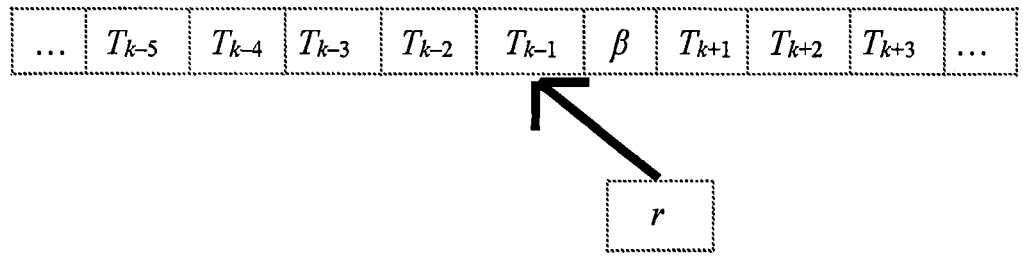
FIG. 17 shows a deterministic machine computational step that corresponds to one iteration of a corresponding left affine function (2.16).

This is for case I. where $\eta(q, T_k)=(r, \beta, L)$. See FIG. 17.

x a $T_{k-1} \beta \cdot T_{k+1}\, T_{k+2}\, T_{k+3} \ldots$
$B^{-1}$ x=$T_k \cdot T_{k+1}\, T_{k+2}\, T_{k+3}\, T_{k+4}$ Thus, $m=T_{k-1}\beta-T_k$ where the subtraction of integers is in base B.

y a r $T_{k-2}\, T_{k-3}\, T_{k-4}\, T_{k-5} \ldots$
By=q $T_{k-1}\, T_{k-2} \cdot T_{k-3}\, T_{k-4}\, T_{k-5} \ldots$ Thus, $n=rT_{k-2}-qT_{k-1}\, T_{k-2}$ where the subtraction of integers is in base B.

Define the left affine function $F_{(\lfloor x \rfloor, \lfloor y \rfloor)}: U_{(\lfloor x \rfloor, \lfloor y \rfloor)} \to P$ where $$F_{(\lfloor x \rfloor, \lfloor y \rfloor)}\begin{pmatrix} x \\ y \end{pmatrix} = \begin{pmatrix} \frac{1}{B} & 0 \\ 0 & B \end{pmatrix}\begin{pmatrix} x \\ y \end{pmatrix} + \begin{pmatrix} m \\ n \end{pmatrix},$$

$m=Bv(T_{k-1})+v(\beta)-v(T_k)$ and $n=Bv(r)-B^2v(q)-Bv(T_{k-1})$.

Lemma 2.17 Left Affine Function ⇔ Register Machine Computational Step

Let (q, k, T) be a Deterministic machine configuration. Suppose $\eta(q, T_k)=(r, b, L)$ for some state r in $Q \cup \{h\}$ and some alphabet symbol b in A and where $T_k=a$. Consider the next Deterministic Machine computational step. The new configuration is $(r, k-1, T_k)$ where $T^b(j)=T(j)$ for every $j \neq k$ and $T^b(k)=b$. The commutative diagram $\varphi\, \eta(q, k, T)=$ $F_{(\lfloor x \rfloor, \lfloor y \rfloor)} \varphi(q, k, T)$ holds. In other words, $F_{(\lfloor x \rfloor, \lfloor y \rfloor)}[x(q, k, T), y(q, k, T)] = [x(r, k-1, T^b), y(r, k-1, T^b)]$.

Proof.

$x(r, k-1, T^b) = T_{k-1} b \cdot T_{k+1} T_{k+2} \ldots$

The x coordinate of $F_{(\lfloor x \rfloor, \lfloor y \rfloor)}[x(q, k, T), y(q, k, T)] = B^{-1} x(q, k, T) + Bv(T_{k-1}) + v(b) - v(a) =$ $B^{-1}(a T_{k+1} \cdot T_{k+2} T_{k+3} \ldots) + Bv(T_{k-1}) + v(b) - v(a) =$ $a \cdot T_{k+1} T_{k+2} T_{k+3} \ldots + Bv(T_{k-1}) + v(b) - v(a) = T_{k-1} b \cdot T_{k+1} T_{k+2} T_{k+3} \ldots$ $y(r, k-1, T^b) = rT_{k-2} \cdot T_{k-3} T_{k-4} \ldots$ The y coordinate of $F_{(\lfloor x \rfloor, \lfloor y \rfloor)}[x(q, k, T), y(q, k, T)] = By(q, k, T) + Bv(r) - B^2v(q) - Bv(T_{k-1})$.

$= B(qT_{k-1} \cdot T_{k-2} T_{k-3} \ldots) + Bv(r) - B^2v(q) - Bv(T_{k-1})$.

$= qT_{k-1} T_{k-2} \cdot T_{k-3} \ldots + Bv(r) - B^2v(q) - Bv(T_{k-1})$.

$= rT_{k-2} \cdot T_{k-3} T_{k-4} \ldots$ $= y(r, k-1, T^b)$.

Remark 2.18 Minimum Vertical Translation for Left Affine Function

As in 2.16, n is the vertical translation. $|Bv(r) - Bv(T_{k-1})| = B|v(r) - v(T_{k-1})| \leq B(B-1)$. Since q is a state, $v(q) \geq (|A|+1)$. This implies $|-B^2v(q)| \geq (|A|+1)B^2$ This implies that $|n| \geq (|A|+1)B^2 - B(B-1) \geq |A| B^2 + B$.

Thus, $|n| \geq |A| B^2 + B$.

Definition 2.19 Right Affine Function

Figure 18:
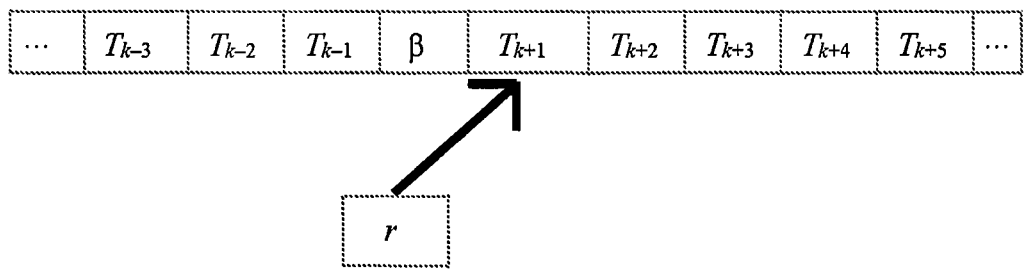
FIG. 18 shows a deterministic machine computational step that corresponds to one iteration of a right affine function (2.19).

This is for case II. where $\eta(q, T_k) = (r, \beta, R)$. See FIG. 18.

$x \ a \ T_{k+1} \ T_{k+2} \cdot T_{k+3} \ T_{k+4} \ldots$ $B \ x = T_k \ T_{k+1} \ T_{k+2} \cdot T_{k+3} \ T_{k+4} \ldots$ Thus, $m = T_{k-1}\beta - T_k$ where the subtraction of integers is in base B.

$y \ a \ r\beta \cdot T_{k-1} \ T_{k-2} \ T_{k-3} \ldots$ $By = q \ T_{k-1} \ T_{k-2} \cdot T_{k-3} \ T_{k-4} \ T_{k-5} \ldots$ Thus, $n = r\beta - q$ where the subtraction of integers is in base B.

Define the right affine function $G_{(\lfloor x \rfloor, \lfloor y \rfloor)}: U_{(\lfloor x \rfloor, \lfloor y \rfloor)} \to P$ such that $$G_{(\lfloor x \rfloor, \lfloor y \rfloor)} \begin{pmatrix} x \\ y \end{pmatrix} = \begin{pmatrix} B & 0 \\ 0 & \frac{1}{B} \end{pmatrix} \begin{pmatrix} x \\ y \end{pmatrix} + \begin{pmatrix} m \\ n \end{pmatrix}$$

where $m = -B^2 v(T_k)$ and $n = Bv(r) + v(\beta) - v(q)$.

Lemma 2.20 Right Affine Function ⇔ Deterministic Machine Computational Step

Let (q, k, T) be a Deterministic machine configuration. Suppose $\eta(q, T_k) = (r, b, R)$ for some state r in Q∪{h} and some alphabet symbol b in A and where $T_k = a$. Consider the next Deterministic Machine computational step. The new configuration is $(r, k+1, T^b)$ where $T^b(j) = T(j)$ for every $j \neq k$ and $T^b(k) = b$. The commutative diagram $\varphi\eta(q, k, T) = G_{(\lfloor x \rfloor, \lfloor y \rfloor)} \varphi(q, k, T)$ holds.

In other words, $G_{(\lfloor x \rfloor, \lfloor y \rfloor)}[x(q, k, T), y(q, k, T)] = [x(r, k+1, T^b), y(r, k+1, T^b)]$.

Proof.

From $\eta(q, T_k) = (r, b, R)$, it follows that $x(r, k+1, T^b) = T_{k+1} T_{k+2} \cdot T_{k+3} T_{k+4} \ldots$ The x coordinate of $G_{(\lfloor x \rfloor, \lfloor y \rfloor)}[x(q, k, T), y(q, k, T)] =$ $Bx(q, k, T) - B^2 v(a) = B(a T_{k+1} \cdot T_{k+2} T_{k+3} T_{k+4} \ldots) - B^2 v(a) =$ $a T_{k+1} T_{k+2} \cdot T_{k+3} T_{k+4} \ldots - B^2 v(a) =$ $T_{k+1} T_{k+2} \cdot T_{k+3} T_{k+4} = x(r, k+1, T^b)$ From $\eta(q, T_k) = (r, b, R)$, it follows that $y(r, k+1, T^b) = rb \cdot T_{k-1} T_{k-2} T_{k-3} \ldots$ They coordinate of $G_{(\lfloor x \rfloor, \lfloor y \rfloor)}[x(q, k, T), y(q, k, T)] = B^{-1} y(q, k, T) + Bv(r) + v(b) - v(q) =$ $B^{-1}(q T_{k-1} \cdot T_{k-2} T_{k-3} \ldots) + Bv(r) + v(b) - v(q) =$ $q \cdot T_{k-1} T_{k-2} T_{k-3} \ldots + Bv(r) + v(b) - v(q) =$ $rb \cdot T_{k-1} T_{k-2} T_{k-3} \ldots = y(r, k+1, T^b)$.

Remark 2.21 Minimum Vertical Translation for Right Affine Function

First, $|v(\beta) - v(q)| \leq B - 1$.

$|n| = |Bv(r) + v(\beta) - v(q)| \geq Bv(r) - (B-1) \geq$ $(|A|+1)B - (B-1)$ because $v(r) \geq |A| + 1 = |A|B + 1$.

Thus, $|n| \geq |A|B + 1$.

Definition 2.22 Function Index Sequence and Function Sequence

Let $\{f_1, f_2, \ldots, f_I\}$ be a set of functions such that each function $f_k: X \to X$. Then a function index sequence is a function $S: N \to \{1, 2, \ldots, I\}$ that indicates the order in which the functions $\{f_1, f_2, \ldots, f_I\}$ are applied. If p is a point in X, then the orbit with respect to this function index sequence is $[p, f_{S(1)}(p), f_{S(2)} f_{S(1)}(p), \ldots, f_{S(m)} f_{S(m-1)} \cdots f_{S(2)} f_{S(1)}(p), \ldots]$. Square brackets indicate that the order matters. Sometimes the first few functions will be listed in a function sequence when it is periodic. For example, $[f_0, f_1, f_0, f_1, \ldots]$ is written when formally this function index sequence is $S: N \to \{0, 1\}$ where $S(n) = n \mod 2$.

Example 2.23

$$f\begin{pmatrix} x \\ y \end{pmatrix} = \begin{pmatrix} \frac{1}{4} & 0 \\ 0 & 4 \end{pmatrix} \begin{pmatrix} x \\ y \end{pmatrix} + \begin{pmatrix} 4 \\ 0 \end{pmatrix}$$

on domain $U_{(0,0)}$ and $$g\begin{pmatrix} x \\ y \end{pmatrix} = \begin{pmatrix} \frac{1}{4} & 0 \\ 0 & 4 \end{pmatrix} \begin{pmatrix} x \\ y \end{pmatrix} + \begin{pmatrix} -1 \\ 0 \end{pmatrix}$$

on $U_{(4,0)}$ $$g \circ f\begin{pmatrix}x\\y\end{pmatrix} = \begin{pmatrix}\frac{1}{16} & 0\\ 0 & 16\end{pmatrix}\begin{pmatrix}x\\y\end{pmatrix} + \begin{pmatrix}0\\0\end{pmatrix} \text{ and}$$

$$f\begin{pmatrix}0\\0\end{pmatrix}=\begin{pmatrix}4\\0\end{pmatrix} \quad f\begin{pmatrix}1\\0\end{pmatrix}=\begin{pmatrix}4.25\\0\end{pmatrix} \quad f\begin{pmatrix}0\\1\end{pmatrix}=\begin{pmatrix}4\\1\end{pmatrix}$$

(0, 0) is a fixed point of $gf$. The orbit of any point p chosen from the horizontal segment connected by the points (0, 0) and (1,0) with respect to the function sequence $[f, g, f, g, \ldots]$ is a subset of $U_{(0, 0)} \cup U_{(4, 0)}$. The point p is called an immortal point. The orbit of a point Q outside this segment exits (halts) $U_{(0, 0)} \cup U_{(4, 0)}$.

Definition 2.24 Halting and Immortal Orbits in the Plane.

Let P denote the two dimensional x,y plane. Suppose $f_k:U_k \to P$ is a function for each k such that whenever $j \ne k$, then $U_j \cap U_k = \emptyset$. For any point p in the plane P an orbit may be generated as follows. The $0^{th}$ iterate of the orbit is p. Given the kth iterate of the orbit is point q, if point q does not lie in any $U_k$, then the orbit halts. Otherwise, q lies in at least one $U_j$. Inductively, the k+1 iterate of q is defined as $f_j(q)$. If p has an orbit that never halts, this orbit is called an immortal orbit and p is called an immortal point. If p has an orbit that halts, this orbit is called a halting orbit and p is called a halting point.

Theorem 2.25 Register Machine Execution⇔Affine Map Orbit Halting/Immortal Orbit Correspondence Theorem Consider Register machine (Q, A, η) with initial machine configuration (s, 0, T). W.L.O.G., it is assumed that the machine begins executing with the machine head at zero. Let $f_1, f_2, \ldots, f_I$ denote the I affine functions with corresponding unit square domains $W_1, W_2, W_3, \ldots, W_I$ determined from 2.14, 2.15, 2.16 and 2.19. Let p=(x(s, 0, T), y(s, 0, T)). Then from 2.14, $$x(s, 0, T) = Bv(T_0) + v(T_1) + \sum_{j=1}^{\infty} v(T_{j+1})B^{-j}.$$

Also, $$y(s, 0, T) = Bv(s) + v(T_{-1}) + \sum_{j=1}^{\infty} v(T_{-j-1})B^{-j}.$$

There is a 1 to 1 correspondence between the mth point of the orbit $$[p, f_{S(1)}(p), f_{S(2)}f_{S(1)}(p), \ldots, f_{S(m)}f_{S(m-1)}\cdots f_{S(2)}f_{S(1)}(p), \ldots] \subseteq \bigcup_{k=1}^{I} W_k$$

and the mth computational step of the deterministic machine (Q, A, η) with initial configuration (s, 0, T). In particular, the Deterministic Machine halts on initial configuration (s, 0, T) if and only if p is a halting point with respect to affine functions $f_k:W_k \to P$ where $1 \le k \le I$ Dually, the Deterministic Machine is immortal on initial configuration (s, 0, T) if and only if p is an immortal point with respect to affine functions $f_k:W_k \to P$ where $1 \le k \le I$.

Proof.

From lemmas 2.17, 2.20, definition 2.14 and remark 2.15, every computational step of (Q, A, η) on current configuration (q, k, T') corresponds to the application of one of the unique affine maps $f_k$, uniquely determined by remark 2.15 and definitions 2.16, 2.19 on the corresponding point p=[x(r, k, T'), y(r, k, T')]. Thus by induction, the correspondence holds for all n if the initial configuration (s, 0, T) is an immortal configuration which implies that [x(s, 0, T), y(s, 0, T)] is an immortal point. Similarly, if the initial configuration (s, 0, T) is a halting configuration, then the machine (Q, A, η) on (s, 0, T) halts after N computational steps. For each step, the correspondence implies that the orbit of initial point $$p_0 = [x(s, 0, T), y(s, 0, T)] \text{ exits } \bigcup_{k=1}^{I} W_k$$

on the Nth iteration of the orbit. Thus, $p_0$ is a halting point.

Corollary 2.26 Immortal Periodic Points, Induced by Configurations, Correspond to Equivalent Configurations that are Immortal Periodic.

$$\bigcup_{k=1}^{I} W_k$$

Proof.

Suppose p [x(q, k, T), y(q, k, T)] with respect to (Q, A, η) and p lies in k=1 such that $f_{S(N)} f_{S(N-1)} \cdots f_{S(1)}(p)=p$. Starting with configuration (q, k, T), after N execution steps of (Q, A, η), the resulting configuration (q, j, V) satisfies x(q, k, T)=x(q, j, V) and y(q, k, T)=y(q, j, V) because of $f_{S(N)} f_{S(N-1)} \cdots f_{S(1)}(p)=p$ and Theorem 2.25. This implies that (q, k, T) is translation equivalent to (q, j, V).

By induction this argument may be repeated indefinitely. Thus, (q, k, T) is an immortal configuration such that for every N computational steps of (Q, A, η), the kth resulting configuration (q, $j_k$, $V_k$) is translation equivalent to (q, k, T).

Corollary 2.27 Immortal Periodic Points, Induced by Configurations, Correspond to Equivalent Configurations that are Immortal Periodic.

Proof.

Suppose p [x(q, k, T), y(q, k, T)] with respect to (Q, A, η) and p lies in $$\bigcup_{k=1}^{I} W_k$$

such that $f_{S(N)} f_{S(N-1)} \cdots f_{S(1)}(p)=p$. Starting with configuration (q, k, T), after N execution steps of (Q, A, η), the resulting configuration (q, j, V) satisfies x(q, k, T)=x(q, j, V) and y(q, k, T)=y(q, j, V) because of $f_{S(N)} f_{S(N-1)} \cdots f_{S(1)}(p)=p$ and Theorem 2.25. This implies that (q, k, T) is translation equivalent to (q, j, V).

By induction this argument may be repeated indefinitely. Thus, (q, k, T) is an immortal configuration such that for every N computational steps of (Q, A, η), the kth resulting configuration (q, $j_k$, $V_k$) is translation equivalent to (q, k, T).

Lemma 2.28

Two affine functions with adjacent unit squares as their respective domains are either both right affine or both left affine functions. (Adjacent unit squares have lower left x and y coordinates that differ at most by 1. It is assumed that $|Q| \ge 2$, since any deterministic program with only one state has a trivial halting behavior that can be determined in |A| execution steps when the tape is bounded.)

Proof.

The unit square $U_{(\lfloor x \rfloor, \lfloor y \rfloor)}$ has a lower left corner with coordinates $(\lfloor x \rfloor, \lfloor y \rfloor)$ where $\lfloor x \rfloor = Bv(T_k) + v(T_{k+1})$ and $\lfloor y \rfloor = Bv(q) + v(T_{k-1})$. A left or right affine function (left or right move) is determined by the state q and the current memory address $T_k$. If states $q \neq r$, then $|Bv(q) - Bv(r)| \geq B$. If two alphabet symbols a, b are distinct, then $|v(a) - v(b)| < |A|$.

Thus, if two distinct program instructions have different states $q \neq r$, then the corresponding unit squares have y-coordinates that differ by at least $B - |A| = |Q| \geq 2$, since any Deterministic program with just one state has trivial behavior that can be determined in |A| execution steps when the tape is bounded. Otherwise, two distinct program instructions must have distinct symbols at $T_k$. In this case, the corresponding unit squares have x-coordinates that differ by at least $B - |A| = |Q| \geq 2$.

Definition 2.29 Rationally Bounded Coordinates

Let $f_1, f_2, \ldots, f_I$ denote the I affine functions with corresponding unit square domains $W_1, W_2, \ldots, W_I$. Let p be a point in the plane P with orbit [p, $f_{S(1)}(p)$, $f_{S(2)}f_{S(1)}(p)$, ..., $f_{S(m)} f_{S(m-1)} \cdots f_{S(2)} f_{S(1)}(p)$, ...]. The orbit of p has rationally bounded coordinates if conditions I & II hold.

I) For every point in the orbit $z = f_{S(k)} f_{S(k-1)} \cdots f_{S(2)} f_{S(1)}(p)$ the x-coordinate of z, x(z), and the y-coordinate of z, y(z), are both rational numbers.

II) There exists a natural number M such that for every point $$z = \left( \frac{p_1}{q_1}, \frac{p_2}{q_2} \right)$$

in the orbit, where $p_1, p_2, q_1$, and $q_2$ are integers in reduced form, then $|p_1| < M$, $|p_2| < M$, $|q_1| < M$, and $|q_2| < M$.

An orbit is rationally unbounded if the orbit does not have rationally bounded coordinates.

Theorem 2.30

An orbit with rationally bounded coordinates is periodic or halting.

Proof.

Suppose both coordinates are rationally bounded for the whole orbit and M is the natural number. If the orbit is halting we are done. Otherwise, the orbit is immortal. Since there are less than 2 M integer values for each one of $p_1, p_2, q_1$ and $q_2$ to hold, then the immortal orbit has to return to a point that it was already at. Thus it is periodic.

Corollary 2.31

A Deterministic machine execution whose machine head location is unbounded over the whole program execution corresponds to an immortal orbit.

Theorem 2.32

Suppose the initial tape contents is bounded as defined in definition 2.2. Then an orbit with rationally unbounded coordinates is an immortal orbit that is not periodic.

Proof.

If the orbit halts, then the orbit has a finite number of points. Thus, it must be an immortal orbit. This orbit is not periodic because the coordinates are rationally unbounded.

Corollary 2.33

If the Deterministic Machine execution is unbounded on the right half of the tape, then in regard to the corresponding affine orbit, there is a subsequence S(1), S(2), ..., S(k), ... of the indices of the function sequence $g_1$, $g_2, \ldots, g_k, \ldots$ such that for each natural number n the composition of functions $g_{S(n)} g_{S(n-1)} \cdots g_{S(1)}$ iterated up to the s(n)th orbit point is of the form $$\begin{pmatrix} B^n & 0 \\ 0 & \frac{1}{B^n} \end{pmatrix} \begin{pmatrix} x \\ y \end{pmatrix} + \begin{pmatrix} m_{s(n)} \\ t_{s(n)} \end{pmatrix}$$

where $m_{s(n)}, t_{s(n)}$ are rational numbers.

Corollary 2.34

If the Deterministic Machine execution is unbounded on the left half of the tape, then in regard to the corresponding affine orbit, there is a subsequence S(1), S(2), ..., S(k), ... of the indices of the function sequence $g_1$, $g_2, \ldots, g_k, \ldots$ such that for each natural number n the composition of functions $g_{S(n)} g_{S(n-1)} \cdots g_{S(1)}$ iterated up to the s(n)th orbit point is of the form:

$$\begin{pmatrix} \frac{1}{B^n} & 0 \\ 0 & B^n \end{pmatrix} \begin{pmatrix} x \\ y \end{pmatrix} + \begin{pmatrix} m_{s(n)} \\ t_{s(n)} \end{pmatrix}$$

where $m_{s(n)}, t_{s(n)}$ are rational numbers.

Theorem 2.35 M-Bounded Execution Implies a Halting or Periodic Orbit

Suppose that the Deterministic Machine (Q, A, η) begins or continues execution with a configuration such that its machine head location is M-bounded during the next $(2M+1)|Q||A|^{2M+1}+1$ execution steps. Then the Deterministic Machine program halts in at most $(2M+1)|Q||A|^{2M+1}+1$ execution steps or its corresponding orbit is periodic with period less than or equal to $(2M+1)|Q||A|^{2M+1}+1$.

Proof.

If the program halts in $(2M+1)|Q||A|^{2M+1}+1$ steps, then the proof is completed. Otherwise, consider the first $(2M+1)|Q||A|^{2M+1}+1$ steps. There are a maximum of $|Q||A|$ program commands for each machine head location. There are a maximum of $(2M+1)$ machine head locations. For each of the remaining 2M memory address, each square can have at most $|A|$ different symbols, which means a total of $|A|^{2M}$ possibilities for these memory address. Thus, in the first $(2M+1)|Q||A|^{2M+1}+1$ points of the corresponding orbit in P, there are at most distinct $(2M+1)|Q||A|^{2M+1}$ points so at least one point in the orbit must occur more than once.

Prime Edge Machine Computation

Any digital computer program (e.g., a program written in C, Python, C++, JAVA, Haskell) can be compiled to a finite number of prime directed edges. Prime directed edges acts as machine instructions. Overlap matching and intersection patterns determine how the prime directed edges store the result of one step of the computation in the memory.

Definition 3.1 Overlap Matching & Intersection Patterns

The notion of an overlap match expresses how a part or all of one pattern may match part or all of another pattern. Let V and W be patterns. (V, s) overlap matches (W, t) if and only if V(s+c)=W(t+c) for each integer c satisfying $\lambda \leq c \leq \mu$ such that $\lambda = \min\{s, t\}$ and $\mu = \min\{|V|-1-s, |W|-1-t\}$ where $0 \leq s < |V|$ and $0 \leq t < |W|$. The index s is called the head of pattern V and t is called the head of pattern W. If V is also a subpattern, then (V, s) submatches (W, t).

If (V, s) overlap matches (W, t), then define the intersection pattern I with head $u = \lambda$ as (I, u) = (V, s) ∩ (W, t), where $I(c) = V(c+s-\lambda)$ for every integer c satisfying $0 \leq c \leq (\mu+\lambda)$ where $\lambda = \min\{s, t\}$ and $\mu = \min\{|V|-1-s, |W|-1-t\}$.

Definition 3.2 Edge Pattern Substitution Operator

Consider pattern $V=v_0 v_1 \ldots v_n$, pattern $W=w_0 w_1 \ldots w_n$ with heads s, t satisfying $0 \leq s$, $t \leq n$ and pattern $P=p_0 p_1 \ldots p_m$ with head u satisfying $0 \leq u \leq m$. Suppose (P, u) overlap matches (V, s). Then define the edge pattern substitution operator $\oplus$ as $E=(P, u) \oplus [(V, s) \Rightarrow (W, t)]$ according to the four different cases A., B., C. and D.

Figure 19:
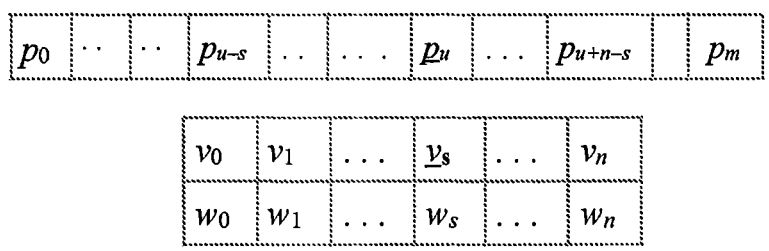
FIG. 19 shows case A of the definition the Edge Pattern Substitution Operator.

Case A.) u>s and m−u>n−s. See FIG. 19.

$$E(k) = \begin{cases} W(k+s-u) & \text{when } u \leq k+s \leq u+n \\ P(k) & \text{when } 0 \leq k < u-s \text{ OR } u+n-s < k \leq m \end{cases}$$

where the head of E is u+t−s. Observe that |E|=m+1
Case B.) u>s and m−u≤n−s. See FIG. 20.

$$E(k) = \begin{cases} W(k+s-u) & \text{when } u-s \leq k \leq n+s-u \\ P(k) & \text{when } 0 \leq k < u-s \end{cases}$$

where the head of E is u+t−s. Also, |E|=n+s−u+1
Case C.) u≤s and m−u≤n−s. See FIG. 21.
E(k)=W(k) when 0≤k≤n and the head of E is t. Also, |E|=|W|=n+1.
Case D.) u≤s and m−u>n−s. See FIG. 22.

$$E(k) = \begin{cases} P(k+u-s) & \text{when } n < k \leq m+s-u \\ W(k) & \text{when } 0 \leq k \leq n \end{cases}$$

where the head of E is t. Also, |E|=m+s−u+1

Overlap and intersection matching and edge pattern substitution are useful for computing algorithms that execute all possible finite machine configurations for a digital computer program.

Example 3.3 Overlap Matching and Edge Substitution

Set pattern P=0101 110. Set pattern V=11 0101. Set pattern W=01 00$\underline{1}$0. Then (P, 0) overlap matches ($\overline{V}$, 2). Edge pattern substitution is well-defined so E=(P, 0)⊕[(V, 2)⇒(W, 4)]=01 00$\underline{1}$0 110. The head or index of pattern E=4. Also, (P, 4) overlap matches (V, 0). F=(P, 4)⊕[(V, 0)⇒(W, 4)]=0101 0100$\underline{1}$0. The index of pattern F=u+t−s=4+4−0=8.

Remark 3.5 Any Prime State Cycle has Length≤|Q|

This follows from the Dirichlet principle and the definition of a prime machine state cycle.

Remark 3.6 Maximum Number of Distinct Prime State Cycles

Given an alphabet A and states Q, consider an arbitrary prime state cycle with length 1, $(q, a) \rightarrow (q, b)$. There are |Q||A| choices for the first input machine instruction and |A| choices for the second input machine instruction since the machine states must match. Thus, there are $|Q||A|^2$ distinct prime state cycles with length 1. Similarly, consider a prime state cycle with window of execution whose length is 2, this can be represented as $(q_1, a_1) \rightarrow (q_2, a_2) \rightarrow (q_1, b_1)$.

Then there are |Q||A| choices for $(q_1, a_1)$ and once $(q_1, a_1)$ is chosen there is only one choice for $q_2$ because it is completely determined by $\eta(q_1, a_1)=(q_2, b_1)$ where $\eta$ is the program in (Q, A, $\eta$). Similarly, there is only one choice for $b_1$. There are |A| choices for $a_2$. Thus, there are $|Q||A|^2$ distinct choices.

For an arbitrary prime state cycle $(q_1, a_1) \rightarrow (q_2, a_2) \rightarrow \ldots \rightarrow (q_n, a_n) \rightarrow (q_1, a_{n+1})$ with window of execution of length k then there are |Q||A| choices for $(q_1, a_1)$ and |A| choices for $a_2$ since the current window of execution length after the first step increases by 1. There is only one choice for $q_2$ because it is determined by $\eta(q_1, a_1)$. Similarly, for the jth computational step, if the current window of execution length increases by 1, then there are |A| choices for $(q_{j+1}, a_{j+1})$. Similarly, for the jth computational step, if the current window of execution stays unchanged, then there is only one choice for $a_{j+1}$ that was determined by one of the previous j computational steps. Thus, there are at most $|Q||A|^k$ distinct prime state cycles whose window of execution length equals k. Definitions 2.8 and remark 2.10 imply that a prime k-state cycle has a window of execution length less than or equal to k. Thus, from the previous and 3.5, there are at most $$|Q| \sum_{k=1}^{|Q|} |A|^k$$

distinct prime state cycles in (Q, A, $\eta$).

Remark 3.7 any State Cycle Contains a Prime State Cycle
Proof.

Relabeling if necessary let $S(q_1, q_1)=(q_1, a_1) \rightarrow \ldots \rightarrow (q_n, a_n) \rightarrow (q_1, a_{n+1})$ be a state cycle. If $q_1$ is the only state visited twice, then the proof is completed. Otherwise, define $\mu=\min\{|S(q_k, q_k)|: S(q_k, q_k)$ is a subcycle of $S(q_1, q_1)\}$. Then exists because $S(q_1, q_1)$ is a subcycle of $S(q_1, q_1)$. Claim: Any state cycle $S(q_j, q_j)$ with $|S(q_j, q_j)|=\mu$ must be a prime state cycle. Suppose not. Then there is a state r≠$q_j$ that is visited twice in the state cycle $S(q_j, q_j)$. But then $S(q_r, q_r)$ is a cycle with length less than which contradicts $\mu$'s definition.

Definition 3.9 Execution Node for (Q, A, $\eta$)

An execution node (or node) is a triplet $H=[q, w_0 w_1 \ldots w_n, t]$ for some state q in Q where $w_0 w_1 \ldots w_n$ is a pattern of n+1 alphabet symbols each in A such that t is a non-negative integer satisfying $0 \leq t \leq n$. Intuitively, $w_0 w_1 \ldots w_n$ is the pattern of alphabet symbols on n+1 consecutive memory addresses in the computer memory and t represents the location (address) of memory, where the next computational step (i.e. machine instruction) of the prime directed edge computation will be stored in memory.

Prime Directed Sequences

Definition 4.1 Prime Directed Edge from Head and Tail Execution Nodes a Prime Head Execution Node $\Delta=[q, v_0 v_1 \ldots v_n, s]$ and Prime Tail Execution Node $\Gamma=[r, w_0 w_1 \ldots w_n, t]$ are called a prime directed edge if and only if all of the following hold:

When register machine (Q, A, $\eta$) starts execution, it is in state q; the machine head is pointing to memory address s. For each j satisfying $0 \leq j \leq n$ memory address j contains symbol $v_j$. In other words, the initial pattern stored in memory is $v_0 v_1 \ldots \underline{v}_s \ldots v_n$.

During the next N computational steps, machine state r is visited twice and all other states in Q are visited at most once. In other words, the corresponding sequence of input instructions during the N computational steps executed contains only one prime state cycle.

After N computational steps, where $1 \leq N \leq |Q|$, the register machine is in machine state r. The machine head is located at memory address t. For each j satisfying $0 \leq j \leq n$ memory address j contains symbol $w_j$. The tape pattern after the N computational steps is $w_0 w_1 \ldots \underline{w}_t \ldots w_n$.

The window of execution for these N computational steps is [0, n].

A prime directed edge is denoted as $\Delta \Rightarrow \Gamma$ or $[q, v_0 v_1 \ldots v_n, s] \Rightarrow [r, w_0 w_1 \ldots w_n, t]$. The number of computational steps N is denoted as $|\Delta \Rightarrow \Gamma|$.

Definition 4.2 Prime Input Instruction Sequence 3.4 introduced input instructions. If $(q_1, a_1) \to \ldots \to (q_n, a_n)$ is an execution sequence of input instructions for $(Q, A, \eta)$, then $(q_1, a_1) \to \ldots \to (q_n, a_n)$ is a prime input command sequence if $q_n$ is visited twice and all other states in the sequence are visited once. In other words, a prime input command sequence contains exactly one prime state cycle.

Definition 4.23 Prime Directed Edge Complexity

Let $P = \{\Delta_1 \Rightarrow \Gamma_1, \ldots, \Delta_k \Rightarrow \Gamma_k, \ldots, \Delta_N \Rightarrow \Gamma_N\}$ denote the finite set of prime directed edges for machine $(Q, A, \eta)$. Define the prime directed edge complexity of deterministic machine $(Q, A, \eta)$ to be the number of prime directed edges denoted as $|P|$.

Observe that any digital computer program also has a finite prime directed edge complexity. This follows from the fact that any digital computer program can be executed by a deterministic machine.

Definition 4.24 Overlap Matching of a Node to a Prime Head Node

Execution node $\Pi$ overlap matches prime head node $\Delta$ if and only if the following hold.

$\Pi = [r, w_0 w_1 \ldots w_n, t]$ is an execution node satisfying $0 \leq t \leq n$ $\Delta = [q, v_0 v_1 \ldots v_n, s]$ is a prime head node satisfying $0 \leq s \leq m$ Machine State q=Machine State r.

W denotes pattern $w_0 w_1 \ldots w_n$ and V denotes pattern $v_0 v_1 \ldots v_m$ Pattern (W, t) overlap matches (V, s) as defined in definition 3.1.

Lemma 4.25 Overlap Matching Prime Head Nodes are Equal

If $\Delta_j = [q, P, u]$ and $\Delta_k = [q, V, s]$ are prime head nodes and they overlap match, then they are equal. (Distinct edges have prime head nodes that do not overlap match.)

Proof.

$0 \leq u \leq |\Delta_j|$ and $0 \leq s \leq |\Delta_k|$. Let $(I, m) = (P, u) \cap (V, s)$ where $m = \min\{s, u\}$. Suppose the same machine begins execution on memory I, pointing to memory address m in the machine is in state q. If s=u and $|\Delta_j| = |\Delta_k|$, then the proof is complete.

Otherwise, $s \neq u$ or $|\Delta_j| \neq |\Delta_k|$ or both. $\Delta_j$ has a window of execution $[0, |\Delta_j| - 1]$ and $\Delta_k$ has window of execution $[0, |\Delta_k| - 1]$. Let the ith step be the first time that the machine head exits finite tape I. This means the machine would execute the same machine instructions with respect to $\Delta_j$ and $\Delta_k$ up to the ith step, so on the ith step, $\Delta_j$ and $\Delta_k$ must execute the same machine instruction. Since it exits memory I at the ith computational step, this would imply that either pattern P stored in memory or pattern V stored in memory, are exited at the ith computational step. This contradicts either that $[0, |\Delta_j| - 1]$ is the window of execution for $\Delta_j$ or $[0, |\Delta_k| - 1]$ is the window of execution for $\Delta_k$.

The Edge Node Substitution Operator is a method of machine computation.

Definition 4.26 Edge Node Substitution Operator $\Pi \oplus (\Delta \Rightarrow \Gamma)$ Let $\Delta \Rightarrow \Gamma$ be a prime directed edge with prime head node $\Delta = [q, v_0 v_1 \ldots v_n, s]$ and tail node $\Gamma = [r, w_0 w_1 \ldots w_n, t]$. If execution node $\Pi = [q, p_0 p_1 \ldots p_m, u]$ overlap matches $\Delta$, then the edge pattern substitution operator from 3.2 induces a new execution node $\Pi \oplus (\Delta \text{ q} \Gamma) = [r, (P, u) \oplus [(V, s) \text{ q}(W, t)], k]$ with head k=u+t−s if u>s and head k=t if u≤s such that $0 \leq s$, $t \leq n$ and $0 \leq u \leq m$ and patterns $V = v_0 v_1 \ldots v_n$ and $W = w_0 w_1 \ldots w_n$ and $P = p_0 p_1 \ldots p_m$.

Definition 4.27 Prime Directed Edge Sequence and Link Matching

A prime directed edge sequence is defined inductively. Each element is a coordinate pair with the first computational element being a prime directed edge and the second computational element is an execution node. Each computational element is expressed as $(\Delta_k \text{ q}\Gamma_k, \Pi_k)$.

The first computational element of a prime directed edge sequence is $(\Delta_1 \Rightarrow \Gamma_1, \Pi_1)$ where $\Pi_1 = \Gamma_1$, and $\Delta_1 \Rightarrow \Gamma_1$ is some prime directed edge in P. In some embodiments, $(\Delta_1 \Rightarrow \Gamma_1, \Pi_1)$ is executed with one or more register machine instructions. For simplicity in this definition, the memory indices (addresses) in P are relabeled if necessary so the first element has memory indices (addresses) equal to 1. If $\Pi_1$ overlap matches some non-halting prime head node $\Delta_2$, the second element of the prime directed edge sequence is $(\Delta_2 \Rightarrow \Gamma_2, \Pi_2)$ where $\Pi_2 = \Pi_1 \oplus (\Delta_2 \Rightarrow \Gamma_2)$. This machine computation is called a link match step.

Otherwise, $\Pi_1$ overlap matches a halting node, then the prime directed edge sequence terminates. This is expressed as $[(\Delta_1 \Rightarrow \Gamma_1, \Gamma_1), \text{HALT}]$. In this case it is called a halting match step.

If the first k−1 steps are link match steps, then the prime directed edge sequence is denoted as $[(\Delta_1 \Rightarrow \Gamma_1, \Pi_1), (\Delta_2 \Rightarrow \Gamma_2, \Pi_2), \ldots, (\Delta_k \Rightarrow \Gamma_k, \Pi_k)]$ where $\Pi_j$ overlap matches prime head node $\Delta_{j+1}$ and $\Pi_{j+1} = \Pi_j \oplus (\Delta_{j+1} = \Rightarrow \Gamma_{j+1})$ for each j satisfying $0 \leq j < k$.

Notation 4.28 Edge Sequence Notation $E([p_1, p_2, \ldots, p_k], k)$

To avoid subscripts of a subscript, $p_k$ and the subscript $_{p(j)}$ represent the same number. As defined in 4.27, $P = \{\Delta_1 \Rightarrow \Gamma_1, \ldots, \Delta_k \Rightarrow \Gamma_k, \ldots, \Delta_N \Rightarrow \Gamma_N\}$ denotes the set of all prime directed edges. $E([p_1], 1)$ denotes the edge sequence $[(\Delta_{p(1)} = \Rightarrow \Gamma_{p(1)}, \Pi_{p(1)})]$ of length 1 where $\Pi_{p(1)} = \Gamma_{p(1)}$ and $1 \leq p_1 \leq |P|$. Next $E([p_1, p_2], 2)$ denotes the edge sequence $[(\Delta_{p(1)} \Rightarrow \Gamma_{p(1)}, \Pi_{p(1)}), (\Delta_{p(2)} \Rightarrow \Gamma_{p(2)}, \Pi_{p(2)})]$ of length 2 where $\Pi_{p(2)} = \Pi_{p(1)} \oplus (\Delta_{p(2)} \Rightarrow \Gamma_{p(2)})$ and $1 \leq p_1, p_2 \leq |P|$.

In general, $E([p_1, p_2, \ldots, p_k], k)$ denotes the edge sequence of length k which is explicitly $[(\Delta_{p(1)} \Rightarrow \Gamma_{p(1)}, \Pi_{p(1)}), (\Delta_{p(2)} \Rightarrow \Gamma_{p(2)}, \Pi_{p(2)}), \ldots, (\Delta_{p(k)} \Rightarrow \Gamma_{p(k)}, \Pi_{p(k)})]$ where $\Pi_{p(j+1)} = \Pi_{p(j)} \oplus (\Delta_{p(j+1)} \Rightarrow \Gamma_{p(j+1)})$ for each j satisfying $1 \leq j \leq k-1$ and $1 \leq p(j) \leq |P|$.

Definition 4.29 Edge Sequence Contains a Consecutive Repeating State Cycle

Lemma 4.19 implies that an edge sequence corresponds to a composition of prime input instructions. The expression an edge sequence contains a consecutive repeating state cycle is used if the corresponding sequence of prime input instructions contains a consecutive repeating state cycle.

Theorem 4.30 Any consecutive repeating state cycle of $(Q, A, \eta)$ is contained in an edge sequence of $(Q, A, \eta)$.

Proof.

This follows immediately from definition 4.29 and lemmas 4.15 and 4.19.

Remark 4.31 Period of an Immortal Periodic Point Contained in Edge Sequence

If $E([p_1, p_2, \ldots, p_r], r)$ contains a consecutive repeating state cycle, then the corresponding immortal periodic point has $$\text{period} \leq \frac{1}{2} \sum_{k=1}^{r} |\Delta_{p(k)} \Rightarrow \Gamma_{p(k)}|.$$

Proof.

This follows from lemma 3.11 that a consecutive repeating state cycle induces an immortal periodic point. The length of the state cycle equals the period of the periodic point. Further, the number of input instructions corresponding to the number of computational steps equals $|\Delta_{p(k)} \Rightarrow \Gamma_{p(k)}|$ in directed edge $\Delta_{p(k)} \Rightarrow \Gamma_{p(k)}$.

Method 4.32 Finding a Consecutive Repeating State Cycle in an Edge Sequence

```
Given an edge sequence whose corresponding prime input
instruction sequence (q₀, a₀) —>
(q₁, a₁) —> . . . —> (q_N, a_N) has length N.
Set n = N/2 if N is even; otherwise, set n = (N + 1)/2 if N is odd
for each k in {1, 2, . . ., n}
{
    for each j in {0, 1, . . ., N − 2k − 1}
    {
        if input instruction sequence (q_j, a_j) —> (q_{j + 1}, a_{j + 1})
        —>. . .—> (q_{j + k}, a_{j + k}) equals
        input instruction sequence (q_{j + k + 1}, a_{j + k + 1}) —>
        (q_{j + k + 2}, a_{j + k + 2}) —>. . .—> (q_{j + 2k + 1}, a_{j + 2k + 1})
        then
        {
            return consecutive repeating state cycle
                (q_j, a_j) —> (q_{j + 1}, a_{j + 1}) —>. . .—>
                (q_{j + k}, a_{j + k}) —>. . .—> (q_{j + 2k + 1}, a_{j + 2k + 1})
        }
    }
}
If exited outer for loop without finding a consecutive
repeating state cycle
Return NO consecutive repeating state cycles were found.
```

Example 4.33 A newLISP Computational Machine that Finds a Consecutive Repeating Sequence

```
(define (find_pattern_repeats p_length seq)
  (let
    (
      (k 0)
      (max_k (− (length seq) (+ p_length p_length)) )
      (pattern nil)
      (repeat_pair nil)
      (no_repeats true)
    )
    (while (and ( <= k max_k) no_repeats)
      (set 'pattern (slice seq k p_length))
      (if (= pattern (slice seq (+ k p_length) p_length))
        (begin
          (set 'repeat_pair (list pattern k))
          (set 'no_repeats false)
        )
      )
      (set 'k (+ k 1))
    )
    repeat_pair
))
(define (find_repeats seq)
  (let
    (
      (p_length 1)
      (max_p_length (/ (length seq) 2) )
      (repeat_pair nil)
    )
    (while (and (<= p_length max_p_length) (not repeat_pair) )
      (set 'repeat_pair (find_pattern_repeats p_length seq))
      (set 'p_length (+ p_length 1))
    )
    repeat_pair
))
(set 's1' (3 5 7 2 3 5 7 11 5 7) )
;; s1 does not have a consecutive repeating sequence.
(set 's2' (3 5 7 2 3 5 7 11 5 7 11 2 4 6 8) )
;; 5 7 11 5 7 11 is a consecutive repeating sequence starting
at element in list s2
(set 's3' (1 2 0 2 1 0 2 0 1 2 0 2 1 0 1 2 1 0 2 1 2 0 2 1 0 1
2 0 2 1 2 0 1 2 1 0 1 2 0 1 0 1))
;; 0 1 0 1 is a consecutive repeating sequence starting
at element 38 in list s3
> (find_repeats s1)
nil
> (find_repeats s2)
( (5 7 11) 5)
> (find_repeats s3)
( (0 1) 38)
```

Method 4.34 Prime Directed Edge Search Method

```
With Machine (Q, A, η) as input, the search computational
method executes as follows.
Set P = Ø.
For each non-halting state q in Q
For each memory pattern a_{−|Q|}...a_{−2} a_{−1} a₀a₁a₂ . . .
    a_{|Q|} selected from A^{2|Q| + 1}
Memory Indices −|Q| −2 −1 0 1 2 |Q|
Memory Contents a_{−|Q|}...a_{−2} a_{−1} a₀a₁a₂ . . . a_{|Q|}
{
    Initial Machine State q
    With memory index pointing to address a₀, start executing
    machine (Q, A, η) until one
    state has been visited twice or (Q, A, η) reaches a halting state.
    The Dirichlet principle implies this will take at most |Q|
    computational steps. If it does not halt, let r be the
    state that is first visited twice. As defined in 4.1, over
    this window of execution, a prime directed edge Δ => Γ is
    constructed where Δ = [q,v₀ v₁ . . . v_n, s], Γ = [r, w₀ w₁ . . .
    w_n, t]and 0 ≤ s, t ≤ n ≤ |Q|.
    Set P = P ∪ {Δ = Γ}
}
```

Remark 4.35 Prime Directed Edge Search Method Finds all Prime Directed Edges

Method 4.34 Finds all prime directed edges of $(Q, A, \eta)$ and all halting nodes.

Proof.

Let $\Delta \Rightarrow \Gamma$ be a prime directed edge of $(Q, A, \eta)$. Then $\Delta \Rightarrow \Gamma$ has a head node $A=[r, v_0 v_1 \ldots v_n, s]$, for some state $r$ in Q, for some tape pattern $v_0 v_1 \ldots v_n$ that lies in $\Delta^{n+1}$ such that $n \le |Q|$ and $0 \le s \le n$. In the outer loop of 4.34, when r is selected from Q and in the inner loop when the tape pattern $a_{-|Q|} \ldots a_{-2} a_{-1} a_0 a_1 a_2 \ldots a_{|Q|}$ is selected from $A^{2|Q|+1}$ such that

| | | | | | | |
|---|---|---|---|---|---|---|
| $\alpha_0 = v_s$ | $\alpha_1 = v_{s+1}$ | ... | $\alpha_k = v_{s+k}$ | ... | $\alpha_{n-s} = v_n$ |
| $\alpha_{-1} = v_{s-1}$ | $\alpha_{-2} = v_{s-2}$ | ... | $\alpha_{-k} = v_{s-k}$ | ... | $\alpha_{-s} = v_0$ | then the machine execution in 4.34 will construct prime directed edge $\Delta \Rightarrow \Gamma$. When the head node is a halting node, the machine execution must halt in at most $|Q|$ steps. Otherwise, it would visit a non-halting state twice and thus, be a non-halting head node. The rest of the argument for this halting node is the same as for the non-halting head node.

Method 4.36 Immortal Periodic Point Search Method

```
With Register Machine program (Q, A, η) as input, this
computational method executes as
follows. Use method 4.34 to find all prime directed edges, P.
set k = 1.
set Φ(1) = {E( [1], 1), E( [2], 1), . . ., E([ |P| ], 1) }
while (Φ (k) ≠ Ø)
```

-continued

```
{
  set Φ(k + 1) = Ø.
  for each E([p₁, p₂, . . ., pₖ], k) in Φ(k)
  {
    for each prime directed edge Δⱼ => Γⱼ in P
    {
      if Δⱼ => Γⱼ link matches with Π_{p(k)} then
      {
        set p_{k + 1} = j
        set Φ(k + 1) = Φ(k + 1) ∪ E([p₁, p₂, . . ., pₖ, p_{k + 1}], k + 1)
        if E([p₁, p₂, . . ., pₖ, p_{k + 1}], k + 1) contains a
        consecutive repeating state cycle
        then return the consecutive repeating state cycle
      }
    }
  }
  k is incremented.
}
if (while loop exited because Φ(m) = Ø for some m) then return Ø
```

Remark 4.37 $|\Phi(k)|$ is finite and $|\Phi(k)| \le |P|^k$

Proof.

$|\Phi(1)| = |P|$. Analyzing the nested loops, in method 4.36 for each $E([p_1, p_2, \ldots, p_k], k)$ in $\Phi(k)$
  for each $\Delta_j \Rightarrow \Gamma_j$ in P $\{ \ldots \}$ For each edge sequence $E([p_1, p_2, \ldots, p_k], k)$ chosen from $\Phi(k)$, at most $|P|$ new edge sequences are put in $\Phi(k+1)$. Thus $|\Phi(k+1)| \le |P||\Phi(k)|$, so $|\Phi(k)| \le |P|^k$.

Each embodiment disclosed herein may be used or otherwise combined with any of the other embodiments disclosed. Any element of any embodiment may be used in any embodiment.

Although the invention has been described with reference to specific embodiments, it will be understood by those skilled in the art that various changes may be made and equivalents may be substituted for elements thereof without departing from the true spirit and scope of the invention. In addition, modifications may be made without departing from the essential teachings of the invention.

REFERENCES

[1] G. Agnew. Random Source for Cryptographic Systems. Advances in Cryptology—EUROCRYPT 1987 Proceedings. Springer Verlag, 77-81 (1988)

[2] John Bell. On the Einstein Podolsky Rosen Paradox. Physics. 1, 1964, pp. 195-200.

[3] P. Benioff. The computer as a physical system: A microscopic quantum mechanical Hamiltonian model of computers as represented by Turing machines. Journal of Statistical

[4] P. Benioff. Quantum mechanical Hamiltonian models of Turing machines that dissipate no energy. Physics Review Letter. 48, 1581-1585 (1980)

[5] Simon Kochen and E. P Specker. The Problem of Hidden Variables in Quantum Mechanics. Journal of Mathematics and Mechanics. Vol. 17, No. 1, 59-87 (1967)

[6] A. A. Abbott, C. S. Calude, J. Conder, and K. Svozil. Strong Kochen-Specker theorem and incomputability quantum randomness. Phys. Rev. A 86, 062109, 1-11 (2012)

[7] Martin Davis. Computability and Unsolvability. Dover Publications, New York, (1982)

[8] David Deutsch. Quantum Theory, the Church-Turing Principle and the Universal Quantum Computer. Proc. London Math. Soc. Series A. 400, No. 1818, 97-117 (1985)

[9] Richard Feynman. Simulating physics with computers. International Journal of Theoretical Physics. 21, 467-488 (1982)

[10] Richard Feynman. Quantum mechanical computers. Foundations of Physics. 16, 507-531 (1986)

[11] Michael Stephen Fiske. Active Element Machine Computation. U.S. Pat. No. 8,010,467. (2007)

[12] Michael R. Garey and David S. Johnson. Computers and Intractability: A Guide to the Theory of NP-Completeness. W.H. Freeman, (1979)

[13] L. K. Grover. Quantum mechanics helps in searching for a needle in a haystack. Physics Review Letters. 79, 325-328. (1997)

[14] James M. Henle and Eugene M. Kleinberg. Infinitesimal Calculus. Mineola, NY. Dover Publications. (2003)

[15] John Hertz, Anders Krogh and Richard G. Palmer. Introduction To The Theory of Neural Computation. Addison-Wesley Publishing Company. Redwood City, California, (1991)

[16] John J. Hopfield. Neural networks and physical systems with emergent collective computational abilities. Proceedings of the National Academy of Sciences, USA. 79, 2554-2558. (1982)

[17] John J. Hopfield and D. W. Tank. Neural Computation of Decisions in Optimization Problems. Biological Cybernetics. 52, 141-152. Springer Verlag (1985)

[18] John J. Hopfield. Pattern recognition computation using action potential timing for stimulus representation. Nature. 376, 33-36. (1995)

[19] Paul Kocher, Joshua Jaffe and Benjamin Jun. Advances in Cryptology—Crypto 99 Proceedings. Lecture Notes in Computer Science Volume 1666, M. Weiner, edited, Springer-Verlag (1999)

[20] Harry R. Lewis and Christos H. Papadimitriou. Elements Of The Theory Of Computation. 222-223. Prentice-Hall (1981)

[21] Yuri Manin. A Course in Mathematical Logic. Springer Verlag (1977)

[22] Yuri Manin. Computable and Uncomputable (in Russian). Moscow, Sovetskoye Radio (1980)

[23] Warren S. McCulloch, Walter Pitts. A logical calculus immanent in nervous activity. Bulletin of Mathematical Biophysics. 5, 115-133. (1943)

[24] Marvin Minsky. Computation: Finite and Infinite Machines (1st edition). Englewood Cliffs, NJ. Prentice-Hall, Inc, (1967)

[25] Marvin L. Minsky and Seymour A. Papert. Perceptrons. Cambridge, MA. MIT Press, (1969)

[26] Abraham Robinson. Non-standard Analysis. Revised Edition. Princeton, NJ. Princeton University Press, (1996)

[27] Frank Rosenblatt. Two theorems of statistical separability in the perceptron. Proceedings of a Symposium on the Mechanization of Thought Processes, Her Majesty's Stationary Office, London, 421M56 (1959)

[28], Alfred A. Schmitt. The State Complexity of Turing Machines. Information and Control. 17, 1970, pp. 217-225.

[29] Claude Shannon. Communication Theory of Secrecy Systems. netlab.cs.edu/wiki/fdes/shannon1949.pdf. (1949)

[30] Peter W. Shor. Algorithms for quantum computation: discrete log and factoring. Proceedings of the 35th Annual IEEE Symposium on Foundations of Computer Science. 2-22 (1994)

[31] Andre Stefanov, Nicolas Gisin, Olivier Guinnard, Laurent Guinnard and Hugo Zbinden. Optical quantum random number generator. Journal of Modern Optics. 1362-3044, 47, 4, 595-598 (2000) http://arxw.org/pdf/quant-ph/9907006

[32] H. E. Sturgis, and J. C. Shepherdson. Computability of Recursive Functions. J. Assoc. Comput. Mach. 10, 217-255 (1963)

[33] Alan M. Turing. On computable numbers, with an application to the Entscheidungsproblem. Proc. London Math. Soc. Series 2 42 (Parts 3 and 4), 230-265 (1936). A correction, ibid. 43, 544-546 (1937).

[34] Michael Wahl, Matthias Leifgen, Michael Berlin, Tino Rohlicke, Hans-Jurgen Rahn, and Oliver Benson. An ultrafast quantum random number generator with provably bounded output bias based on photon arrival time measurements. Applied Physics Letters. 98, 171105, 2011.

[35] Jie Yang, Jinlu Liu, Qi Su, Zhengyu Li, Fan Fan, Bingjie Xu and Hong Guo. A 5.4 Gbps real time quantum random number generator with compact implementation. Optics Express. 24(24), 2016, pp. 27475-27481.

[36] David A. Patterson and John L. Hennessy. Computer Architecture: A Quantitative Approach. 5th Edition, Morgan Kaufmann, 2011.

The invention claimed is:

1. A machine implemented method for performing computations comprising:
   constructing a procedure;
   constructing a first method of a multiplicity of possible methods for a first instance of the procedure;
   performing computations using the first instance of the procedure;
   constructing a second method of the multiplicity of possible methods for computing a second instance of the procedure, wherein the first instance of the procedure and the second instance of the procedure implement a same task; and
   performing computations using the second instance of the procedure,
   wherein an unpredictable process generates the first instance of the procedure and the second instance of the procedure by adding unpredictability to the first instance of the procedure and the second instance of the procedure by measuring a physical process that is non-deterministic to create the unpredictability.

2. The machine implemented method of claim 1, wherein said procedure is implemented with digital computer instructions.

3. The machine implemented method of claim 1, wherein said physical process is generated from quantum events.

4. The machine implemented method of claim 3, wherein said quantum events involve emission and detection of photons.

5. The machine implemented method of claim 4, wherein said detection of photons uses the arrival times of photons to generate randomness in said unpredictable process.

6. The machine implemented method of claim 3, wherein said quantum events are generated from particles with spin.

7. The machine implemented method of claim 2, wherein said digital computer instructions execute edge pattern substitution.

8. The machine implemented method of claim 1, wherein said procedure is implemented with a digital computer program.

9. The machine implemented method of claim 8, wherein said digital computer program contains instructions that are expressed in one or more of the following languages: C, C++, Fortran, Go, JAVA, Haskell, LISP, Python, Ruby, assembly language, RISC machine instructions, JAVA virtual machine, prime directed edge sequences, or standard instructions.

10. A machine implemented method for performing computations comprising:
    constructing a procedure;
    constructing a first method of a multiplicity of possible methods for a first instance of the procedure;
    performing computations using the first instance of the procedure;
    constructing a second method of the multiplicity of possible methods for computing a second instance of the procedure, wherein the first instance of the procedure and the second instance of the procedure implement a same task; and
    performing computations using the second instance of the procedure,
    wherein an unpredictable process generates the first instance of the procedure and the second instance of the procedure by adding unpredictability to the first instance of the procedure and the second instance of the procedure by using instructions that are self-modifying to construct the first instance of the procedure and the second instance of the procedure.

11. A system for performing computations comprising:
    a processor;
    a memory storing computer-readable instructions that, when executed by the processor, causes the processor to perform operations comprising:
    constructing a computational procedure;
    constructing a first computation, from a multiplicity of possible machine instructions for computing the computational procedure, producing a first instance of the computational procedure;
    performing computations using the first instance of the computational procedure;
    constructing a second computation, from the multiplicity of possible machine instructions for computing the computational procedure, producing a second instance of the computational procedure, wherein the first instance of the computational procedure and the second instance of the computational procedure implement a same task; and
    performing computations using the second instance of the computational procedure,
    wherein an unpredictable process generates the first instance of the computational procedure and the second instance of the computational procedure by adding unpredictability to the first instance of the procedure and the second instance of the procedure, and wherein instructions that perform self-modification create the unpredictability.

12. The system of claim 11, wherein the self-modification used in said constructing the computational procedure increases a number of states.

13. The system of claim 11, wherein said first instance of the computational procedure is constructed with digital computer instructions.

14. The system of claim 11, wherein said second instance of the computational procedure is implemented with digital computer instructions.

15. The system of claim 14, wherein said digital computer instructions are expressed in one or more of the following languages: C, C++, Fortran, JAVA, Go, Haskell, LISP, Python, Ruby, assembly language, RISC machine instructions, JAVA virtual machine instructions, or prime directed edge sequences.

16. The system of claim 11, wherein a non-deterministic process generates the first instance of the computational procedure and the second instance of the computational procedure.

17. The system of claim 16, wherein the non-deterministic process measures quantum events.

18. The system of claim 17, wherein the quantum events are measurements of photons.

19. The system of claim 17, wherein the quantum events are generated from particles with spin.

20. The system of claim 17, wherein the quantum events are spin measurements.

21. The system of claim 11, wherein said first instance of the computational procedure computes edge pattern substitution.

22. A machine implemented method for performing computations comprising:
- constructing a procedure;
- constructing a first method of a multiplicity of possible methods for a first instance of the procedure;
- performing computations using the first instance of the procedure;
- constructing a second method of the multiplicity of possible methods for computing a second instance of the procedure, wherein the first instance of the procedure and the second instance of the procedure implement a same task; and
- performing computations using the second instance of the procedure,
- wherein an unpredictable process generates the first instance of the procedure and the second instance of the procedure by adding unpredictability to the first instance of the procedure and the second instance of the procedure by using a non-deterministic process to construct the first instance of the procedure and the second instance of the procedure.

23. The machine implemented method of claim 22, wherein measurement of quantum events implement the non-deterministic process.

24. A system for performing computations comprising:
- a processor;
- a memory storing computer-readable instructions that, when executed by the processor, causes the processor to perform operations comprising:
  - constructing a computational procedure;
  - constructing a first computation, from a multiplicity of possible machine instructions for computing the computational procedure, producing a first instance of the computational procedure;
  - performing computations using the first instance of the computational procedure;
  - constructing a second computation, from the multiplicity of possible machine instructions for computing the computational procedure, producing a second instance of the computational procedure, wherein the first instance of the computational procedure and the second instance of the computational procedure implement a same task; and
  - performing computations using the second instance of the computational procedure,
  - wherein an unpredictable process generates the first instance of the computational procedure and the second instance of the computational procedure by adding unpredictability to the first instance of the computational procedure and the second instance of the computational procedure by using a non-deterministic process to construct the first instance of the computational procedure and the second instance of the computational procedure.

25. The system of claim 24, wherein measurement of quantum events implement the non-deterministic process.

* * * * *